United States Patent
Okada

[11] Patent Number: 6,026,198
[45] Date of Patent: Feb. 15, 2000

[54] DATA COMPRESSION AND RESTORATION SYSTEM FOR ENCODING AN INPUT CHARACTER ON THE BASIS OF A CONDITIONAL APPEARANCE RATE OBTAINED IN RELATION TO AN IMMEDIATELY PRECEDING CHARACTER STRING

[75] Inventor: Yoshiyuki Okada, Kawasaki, Japan

[73] Assignee: Fujitsu Limited, Kawasaki, Japan

[21] Appl. No.: 08/774,346

[22] Filed: Dec. 27, 1996

[30] Foreign Application Priority Data

Feb. 9, 1996 [JP] Japan ..................................... 8-023522
Oct. 22, 1996 [JP] Japan ..................................... 8-279190

[51] Int. Cl.[7] ................................................. H04N 1/413
[52] U.S. Cl. .......................... 382/247; 382/233; 382/234; 382/239; 382/303; 382/304; 341/51; 341/107
[58] Field of Search ............................... 341/107, 51, 65; 382/247, 229, 303, 304, 244, 245, 246, 239, 170, 203, 302, 233, 232, 234, 235; 348/387; 358/427; 345/202

[56] References Cited

U.S. PATENT DOCUMENTS

| | | |
|---|---|---|
| 5,142,283 | 8/1992 | Chevion ................................. 341/107 |
| 5,272,478 | 12/1993 | Allen ....................................... 341/107 |
| 5,379,036 | 1/1995 | Storer ........................................ 341/51 |
| 5,471,207 | 11/1995 | Zandi et al. ............................ 341/107 |
| 5,550,540 | 8/1996 | Furlan et al. .............................. 341/51 |
| 5,583,500 | 12/1996 | Allen et al. ............................. 341/107 |
| 5,710,562 | 1/1998 | Gormish et al. ........................ 341/107 |
| 5,717,394 | 2/1998 | Schwartz et al. .......................... 341/51 |
| 5,838,964 | 11/1998 | Gubser ................................... 707/101 |

OTHER PUBLICATIONS

Dougherty, Edward R., "Introduction to Real–Time Imaging", 1995, pp. 23–25, 119–121.

*Primary Examiner*—Edward L. Coles
*Assistant Examiner*—David Rosenblum
*Attorney, Agent, or Firm*—Staas & Halsey

[57] ABSTRACT

For handling data having a fixed-order context, a data compression system uses a pipeline control unit to enable an occurrence frequency modeling unit and entropy coding unit to operate in pipelining. A data restoration system uses a pipeline control unit to enable an entropy decoding unit and occurrence frequency modeling unit to operate in pipelining. For handling data having a blend context, occurrence frequency modeling units associated with orders are operated in parallel for data compression or data restoration. Furthermore, word data is separated byte by byte, and byte data items are encoded or restored on the basis of the correlation thereof in a word-stream direction.

23 Claims, 98 Drawing Sheets

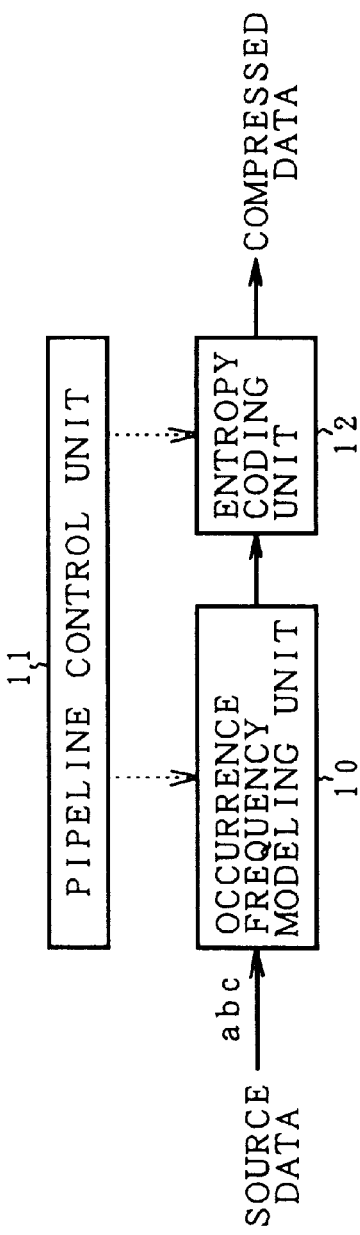
F I G. 7A
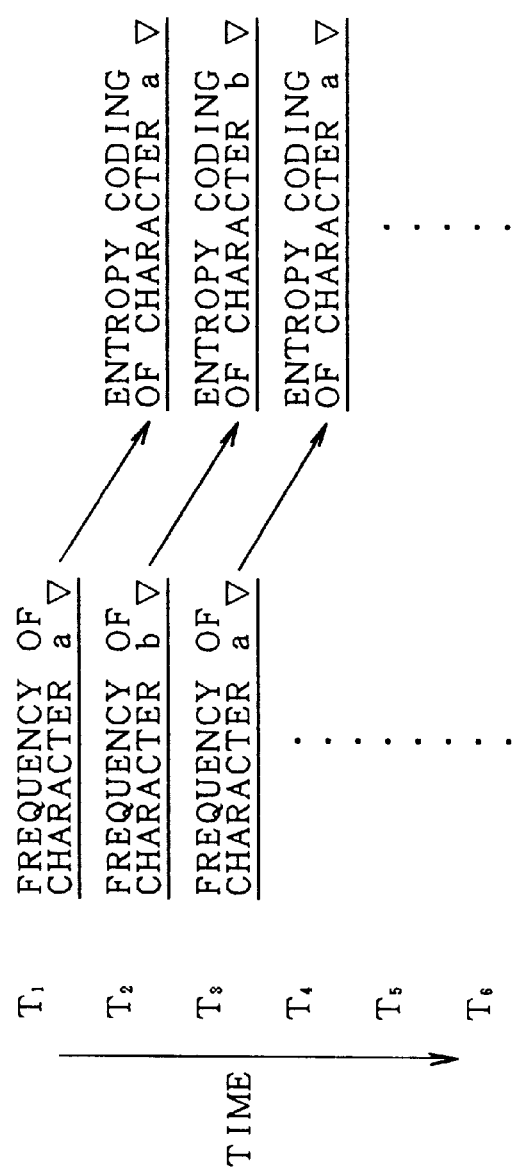
F I G. 7B

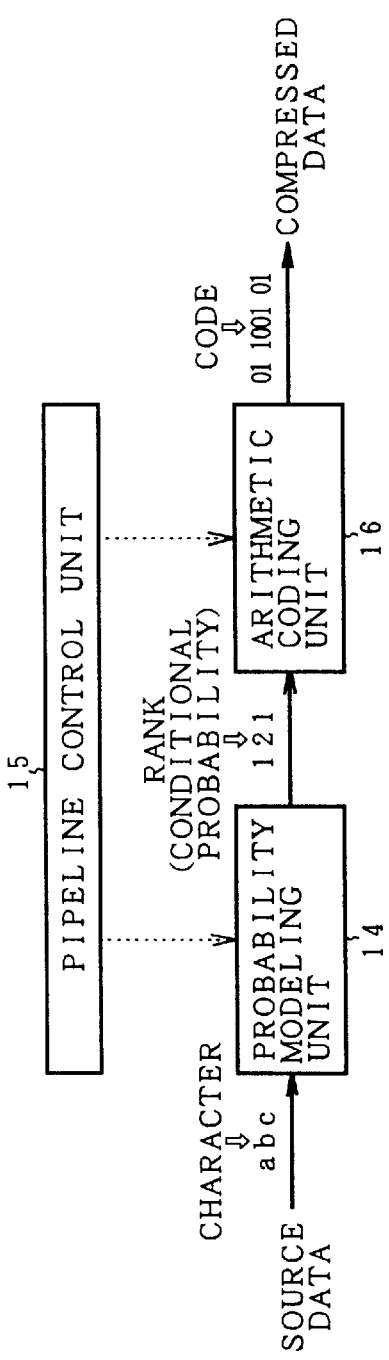
F I G. 8A
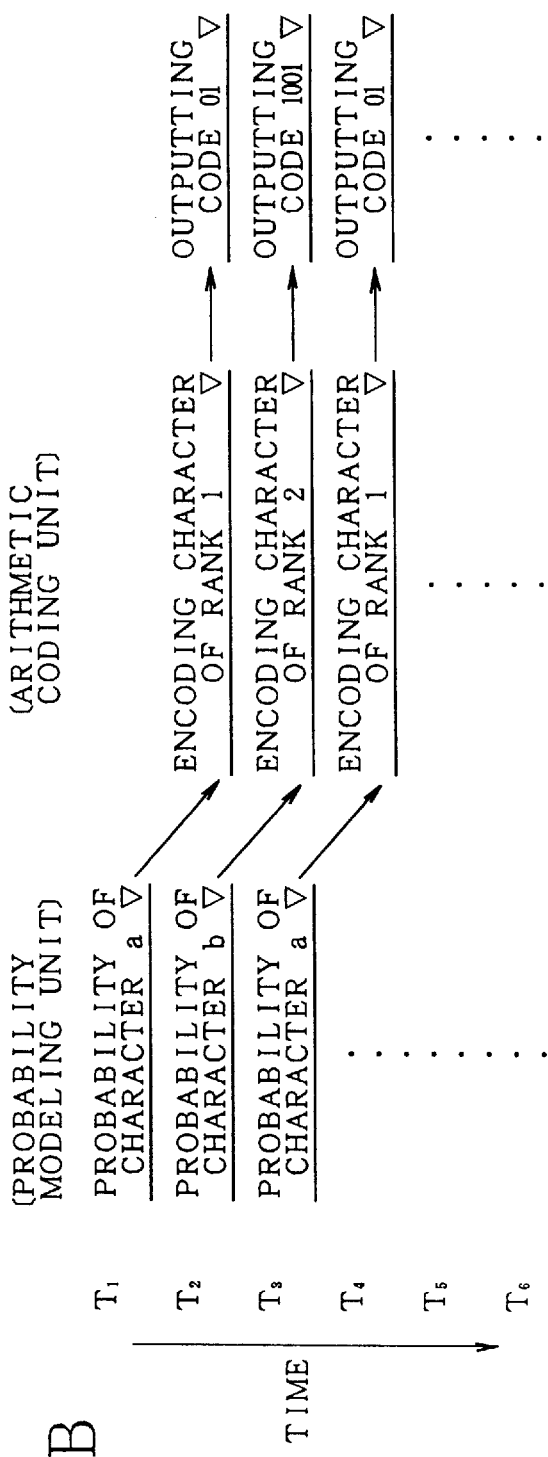
F I G. 8B

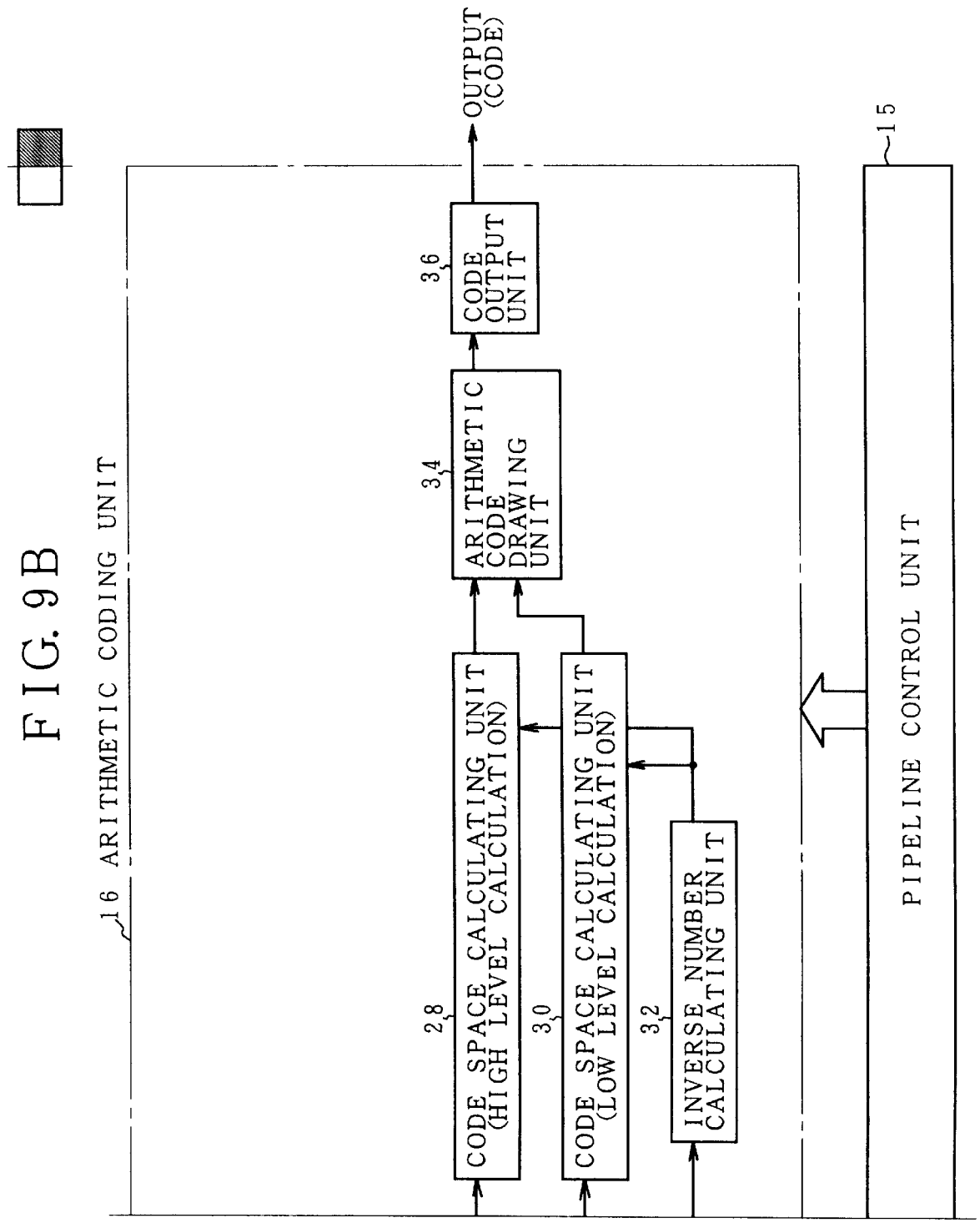

FIG. 10

| RANK (REGISTER NUMBER) | CHARACTER SYMBOL | NUMBER OF OCCURRENCES | CUMULATIVE NUMBER OF OCCURRENCES |
|---|---|---|---|
| 1 | K1 | f (1) | c f (1) |
| 2 | K2 | f (2) | c f (2) |
| 3 | K3 | f (3) | c f (3) |
| ... | ... | ... | ... |
| s−3 | Ks−3 | f (s−3) | c f (s−3) |
| s−2 | Ks−2 | f (s−2) | c f (s−2) |
| s−1 | Ks−1 | f (s−1) | c f (s−1) |
| s | Ks | f (s) | c f (s) |
| ... | ... | ... | ... |
| 256 | K256 | f (256) | c f (256) |
| TOTAL NUMBER OF OCCURRENCES c f (0) = S0 | | | |

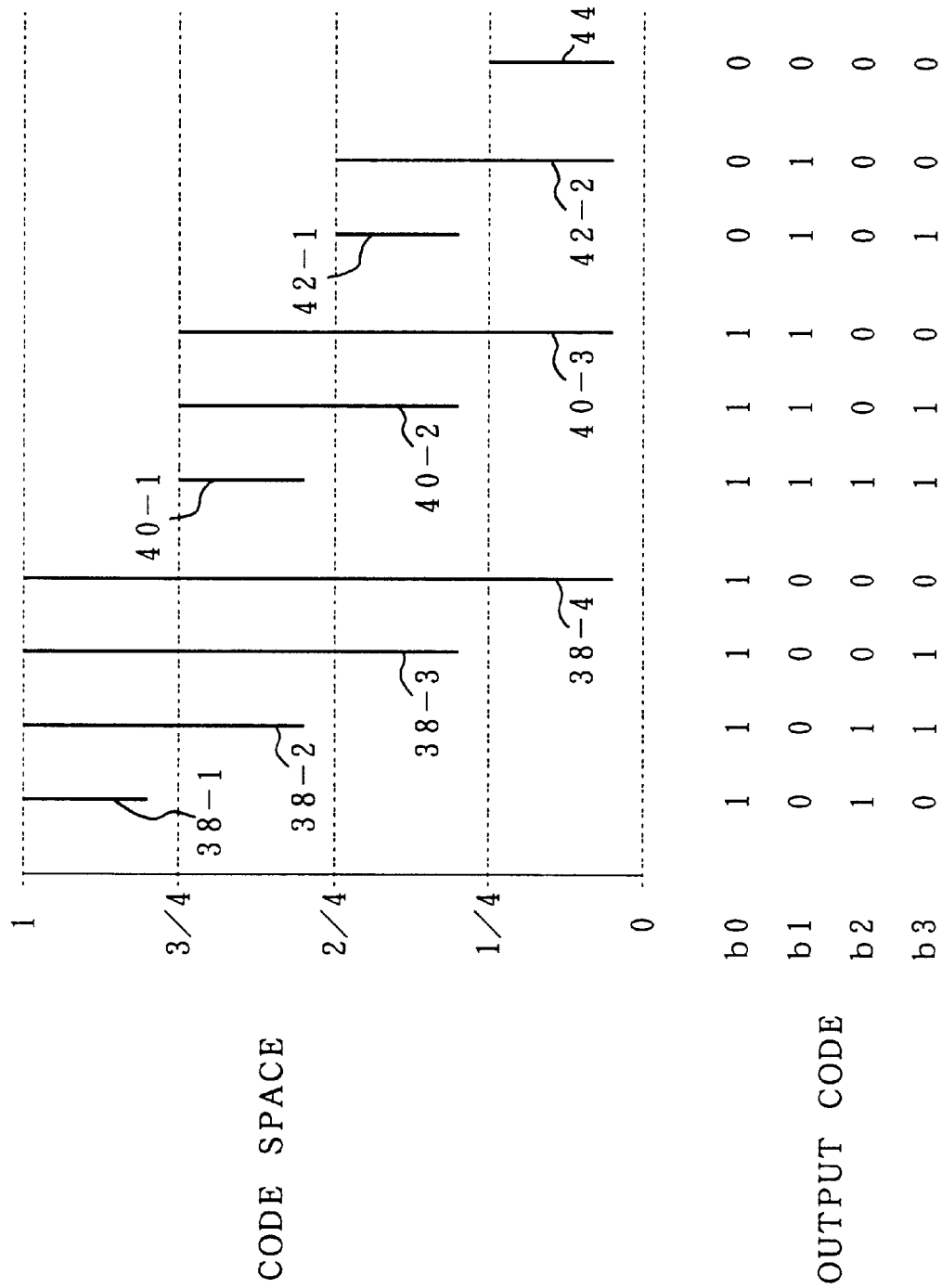

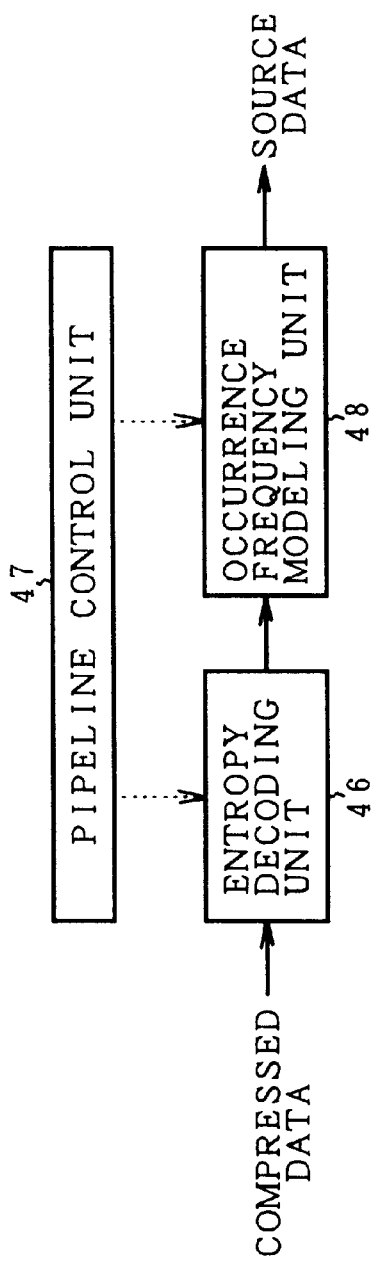
F I G. 14A
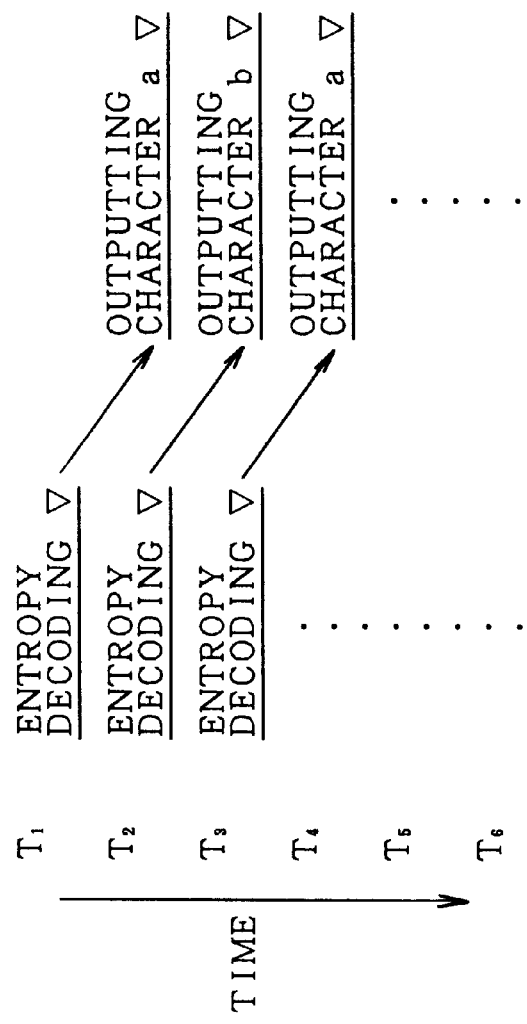
F I G. 14B

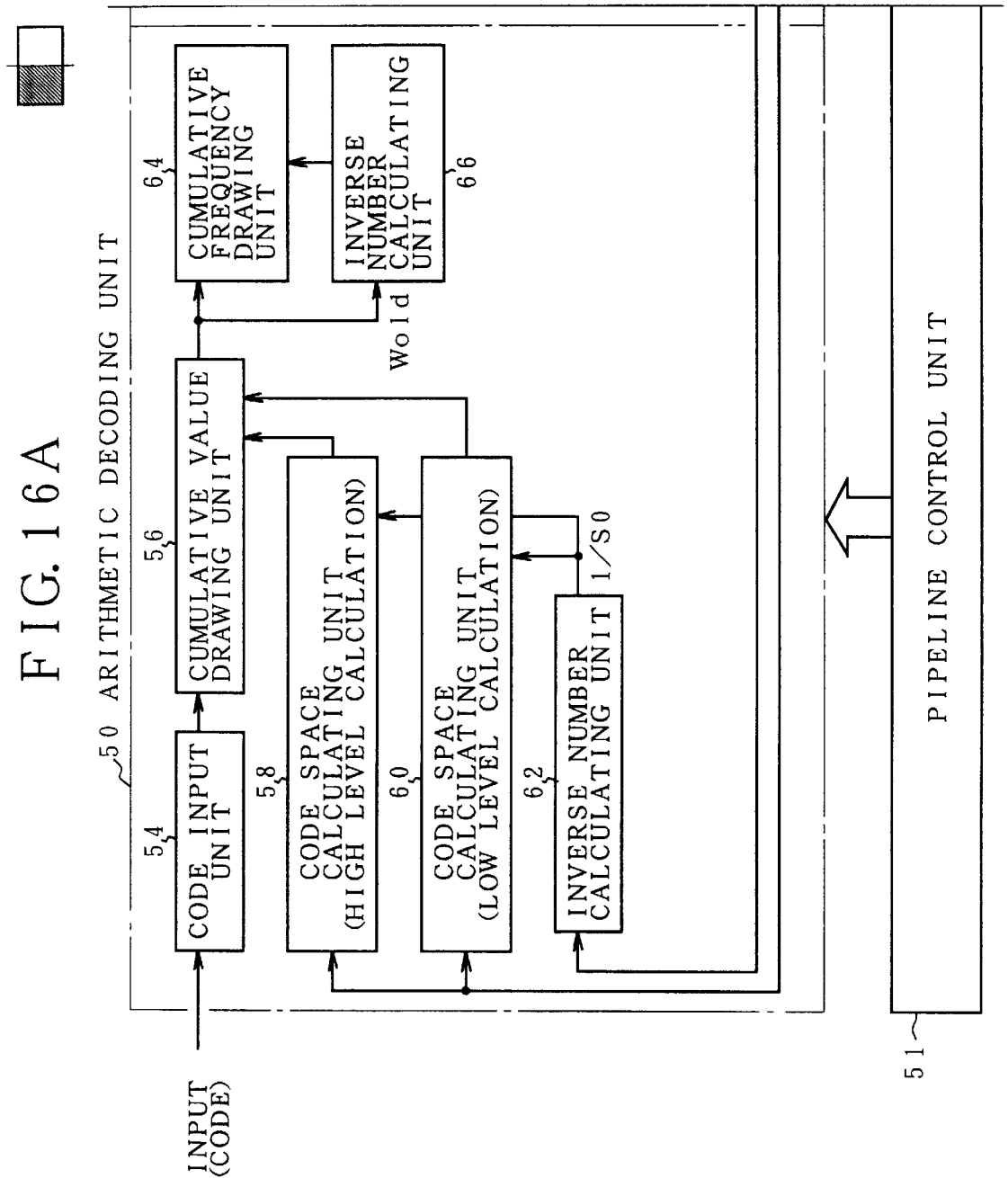

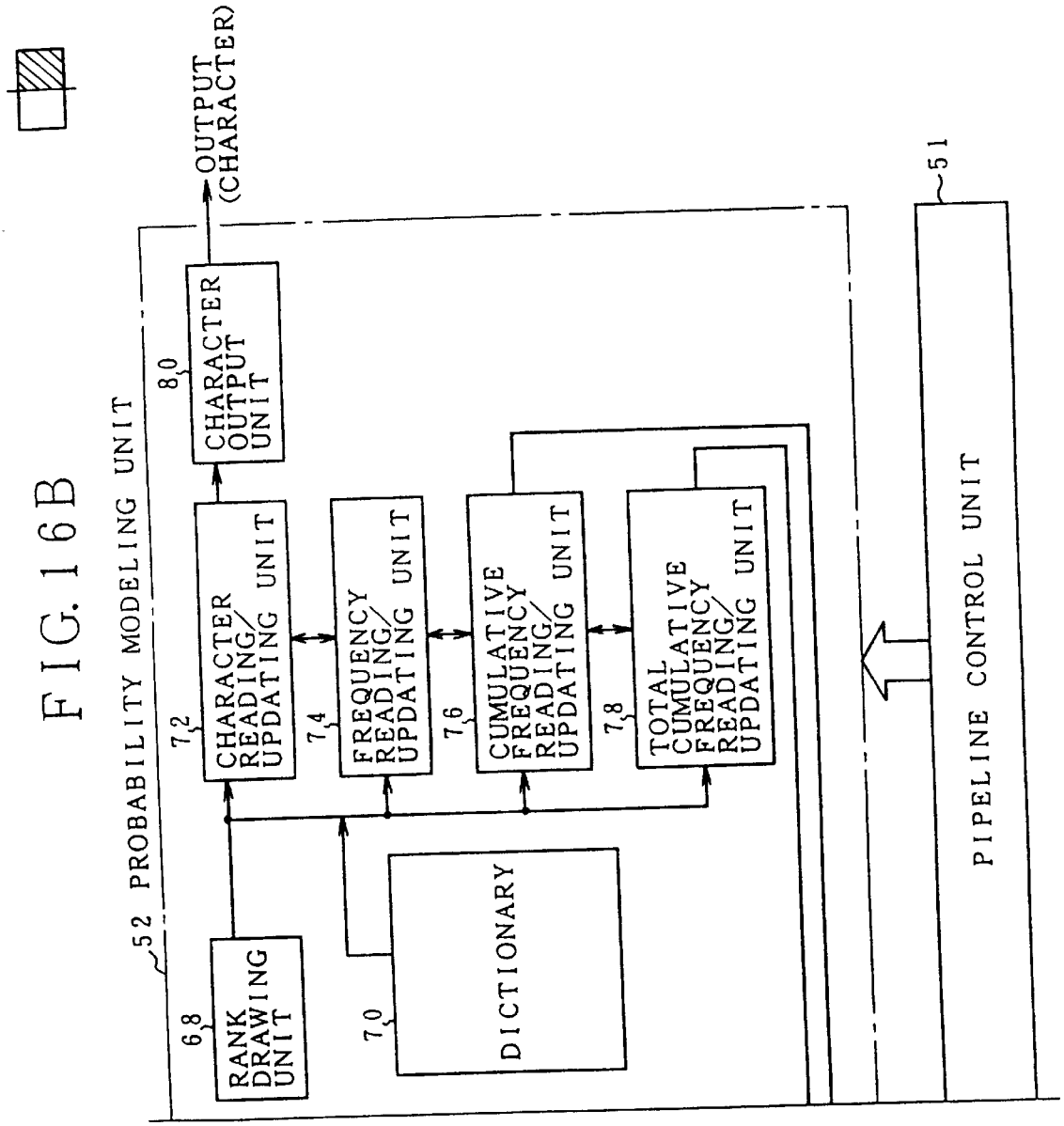

FIG.17A

| KIND OF SEQUENCE | | NORMAL SEQUENCE | | | | | |
|---|---|---|---|---|---|---|---|
| | | TIME CYCLE | | | | | |
| | BLOCK NAME | T1 | T2 | T3 | T4 | T5 | T6 |
| ARITHMETIC DECODING UNIT 50 | CODE BIT INPUT | 1 ▽ | | | | | |
| | CODE→CUMULATIVE VALUE DRAWING | | COMP▽COMP▽ | | | | |
| | CUMULATIVE VALUE→CUMULATIVE FREQUENCY INVERSE NUMBER DRAWING (C→1/c) | | | ⇓ADD·SUB | ▽MULP▽SUB ⇑ 1/Mold ▽ | ▽MULP▽SUB ▽ | ▽MULP▽ ⇨⇨⇨⇨⇨⇨ |
| | CODE SPACE CALCULATION (HIGH LEVEL CALCULATION) | | | | | | |
| | CODE SPACE CALCULATION (LOW LEVEL CALCULATION) | | | | | | |
| PROBABILITY MODELING UNIT 52 | RANK⇔CUMULATIVE NUMBER OF OCCURRENCES (CUMULATIVE REQUENCY⇔RANK) | | ①COMPARISON OF CUMULATIVE NUMBERS OF OCCURRENCES | | | | |
| | RANK⇔TOTAL NUMBER OF OCCURRENCES | | | | | | |
| | RANK⇔NUMBER OF OCCURRENCES | | ①COMPARISON OF ADJOINING NUMBERS OF OCCURRENCES | | | | |
| | RANK⇔CHARACTER | | | | | | |
| | CHARACTER OUTPUT | | | | | | |

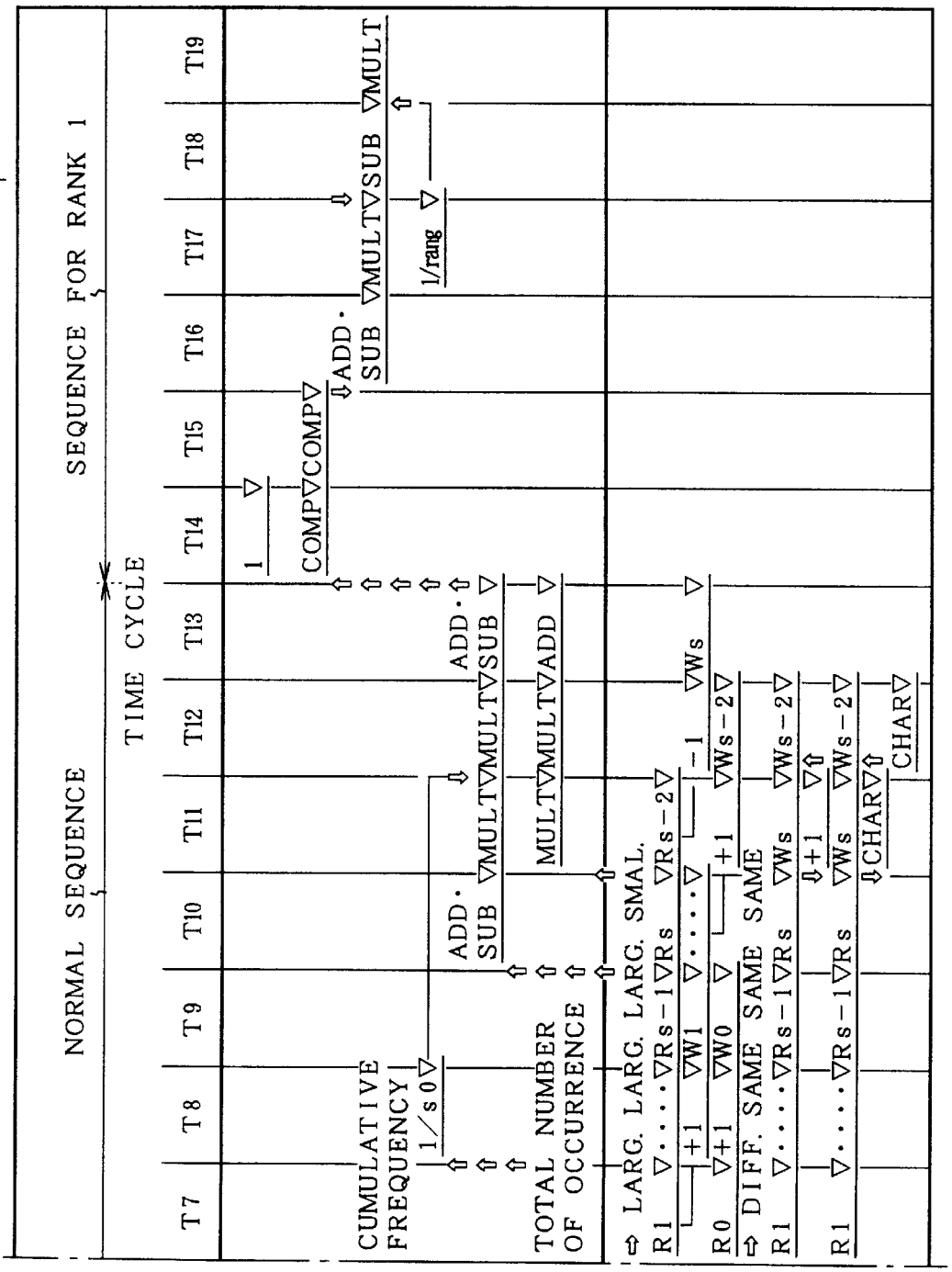

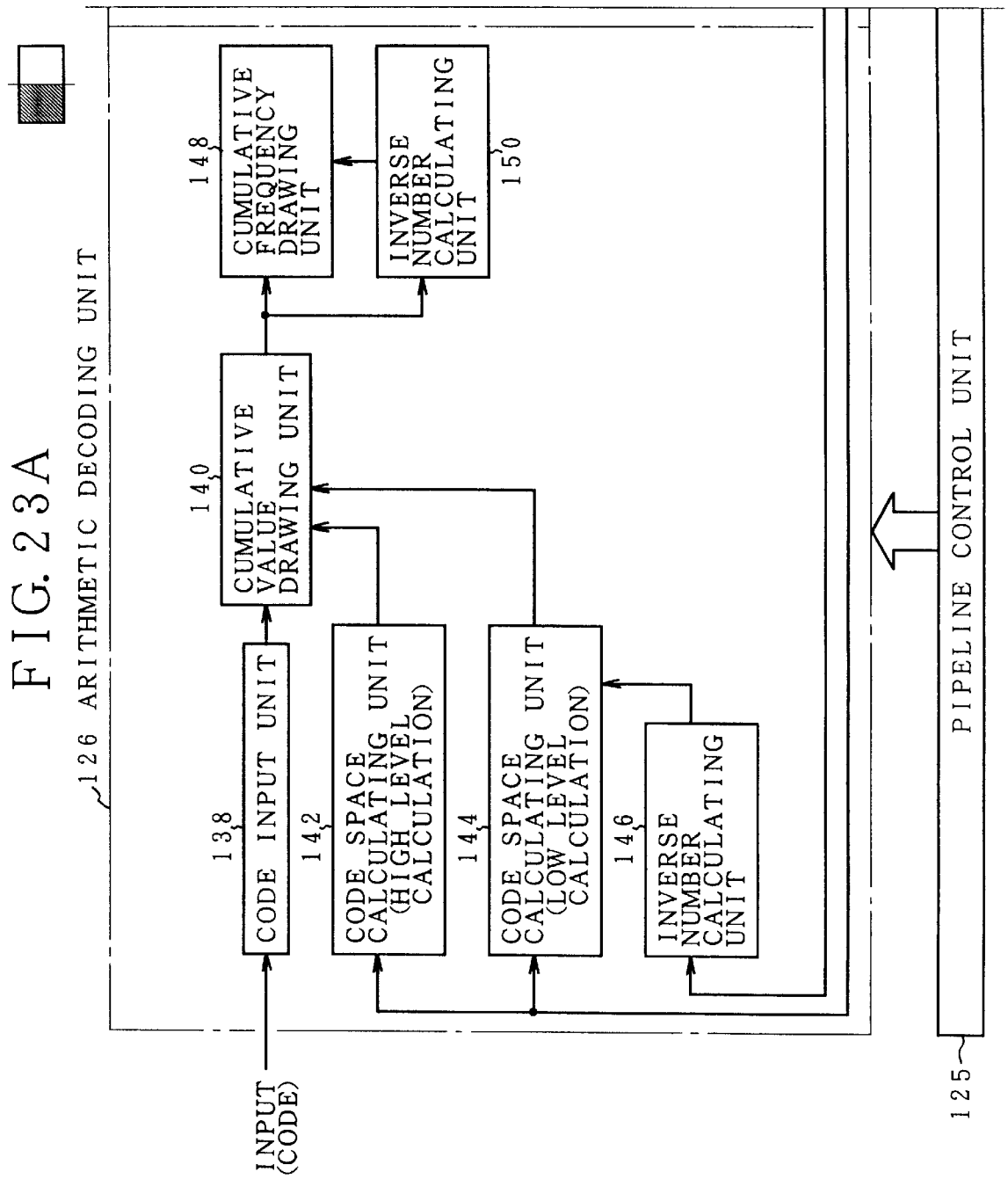

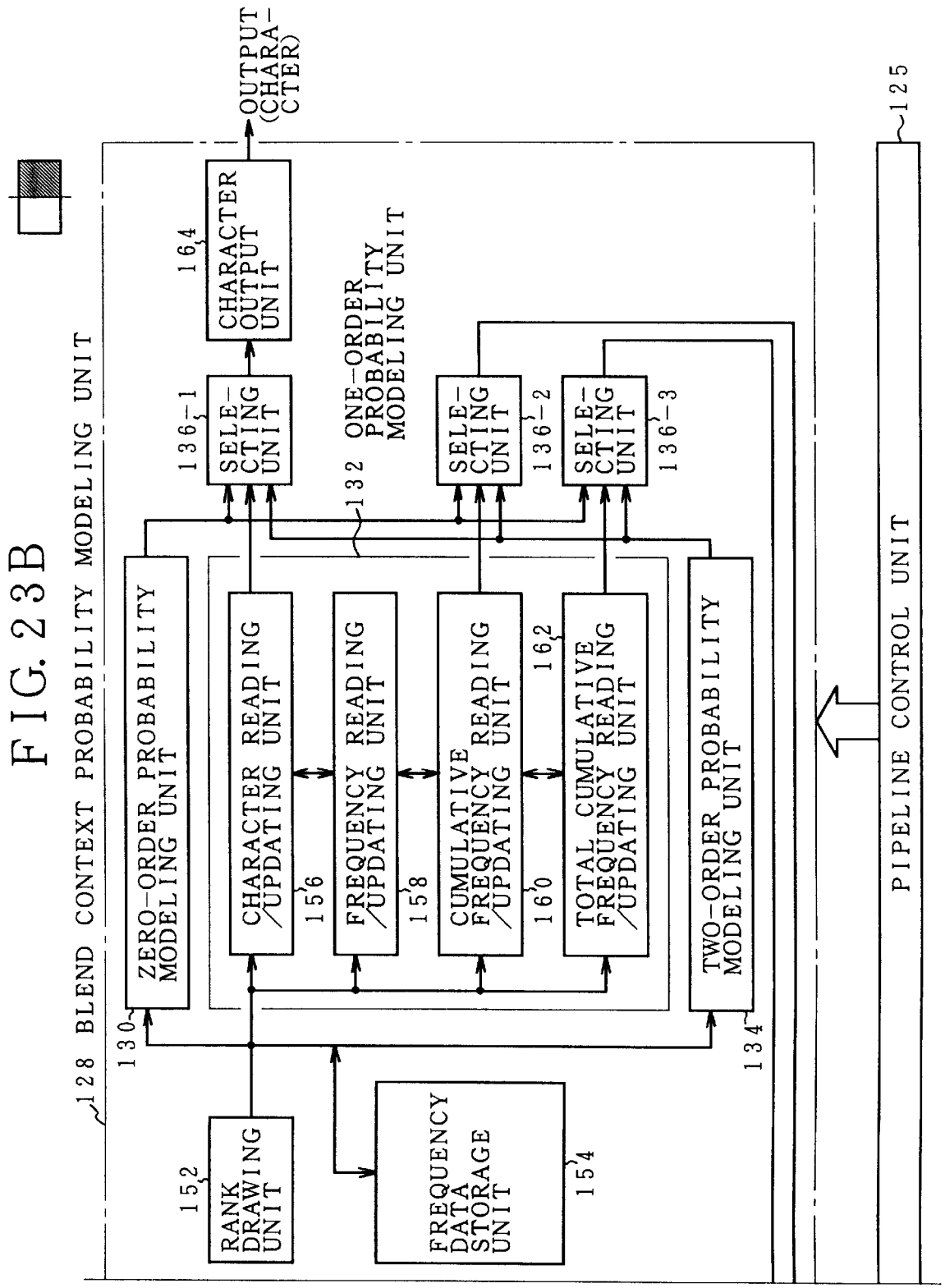

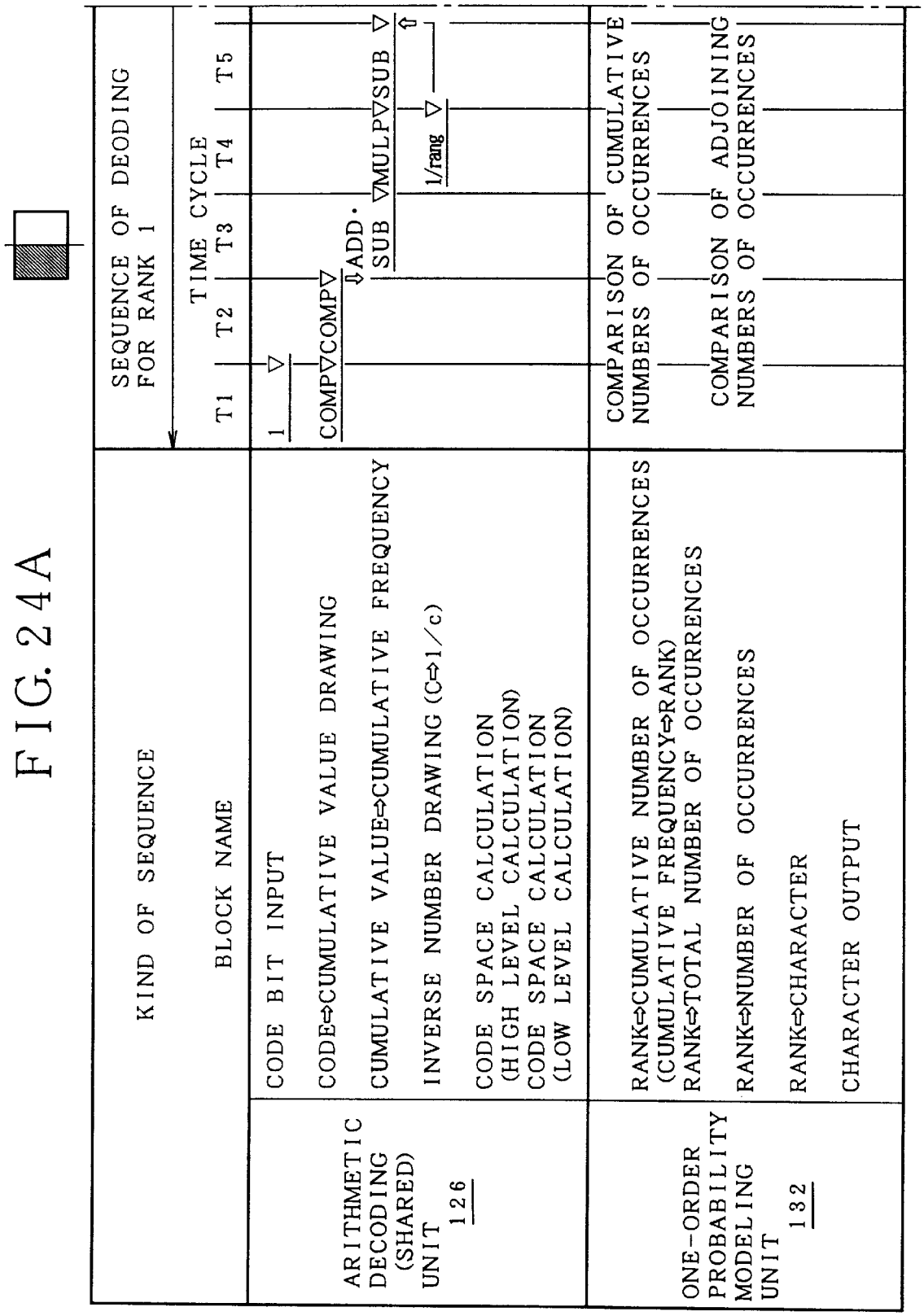

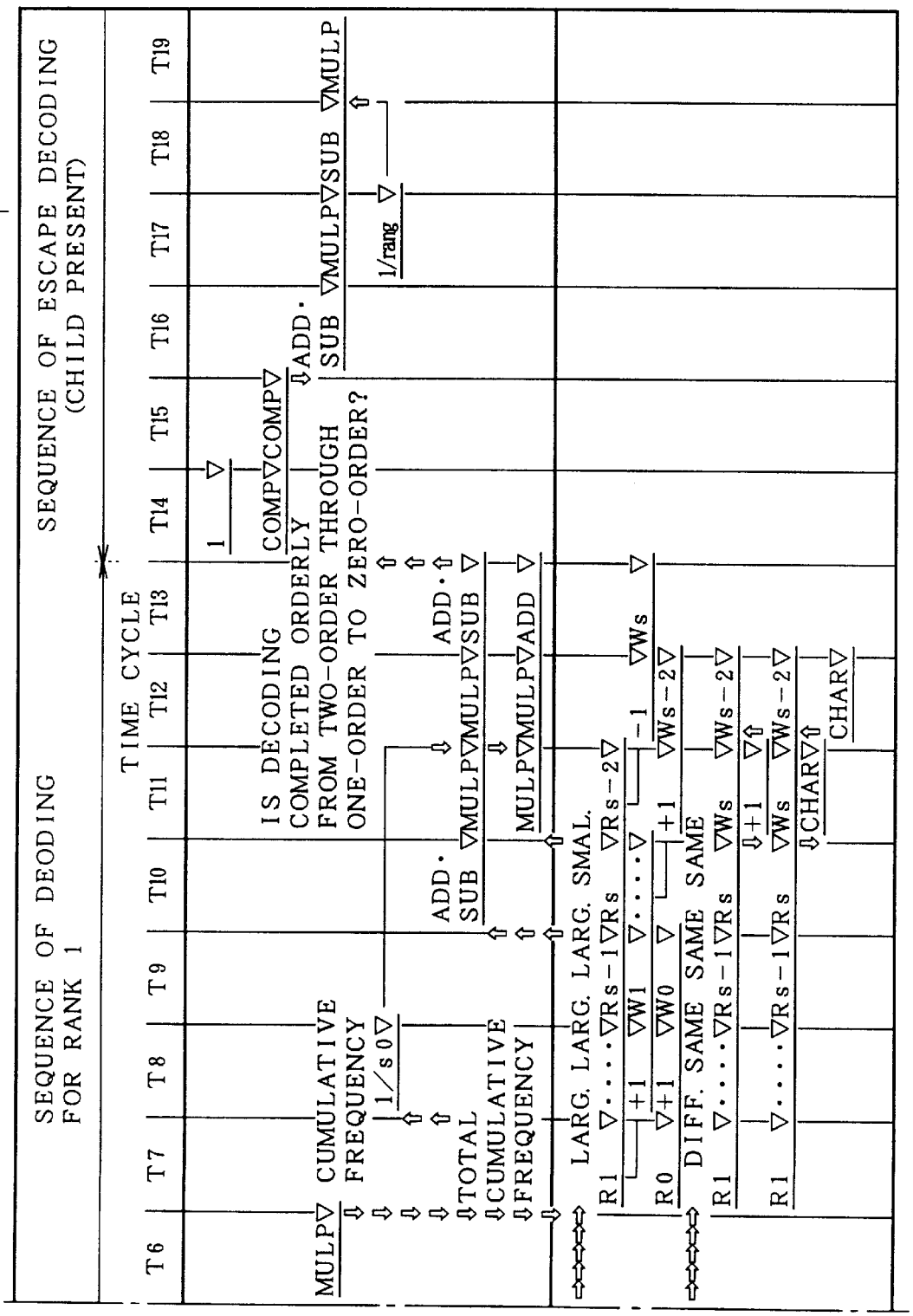

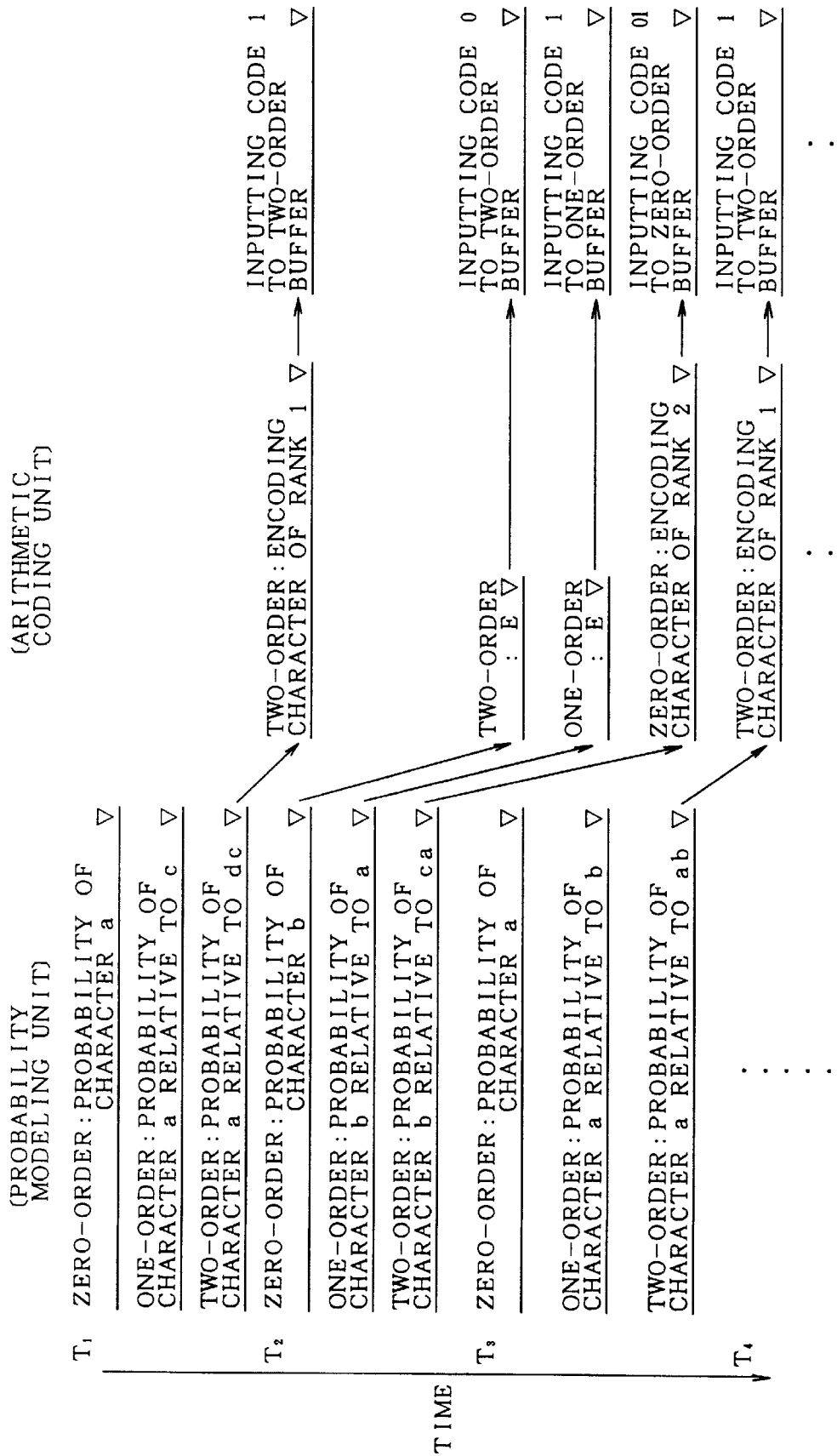

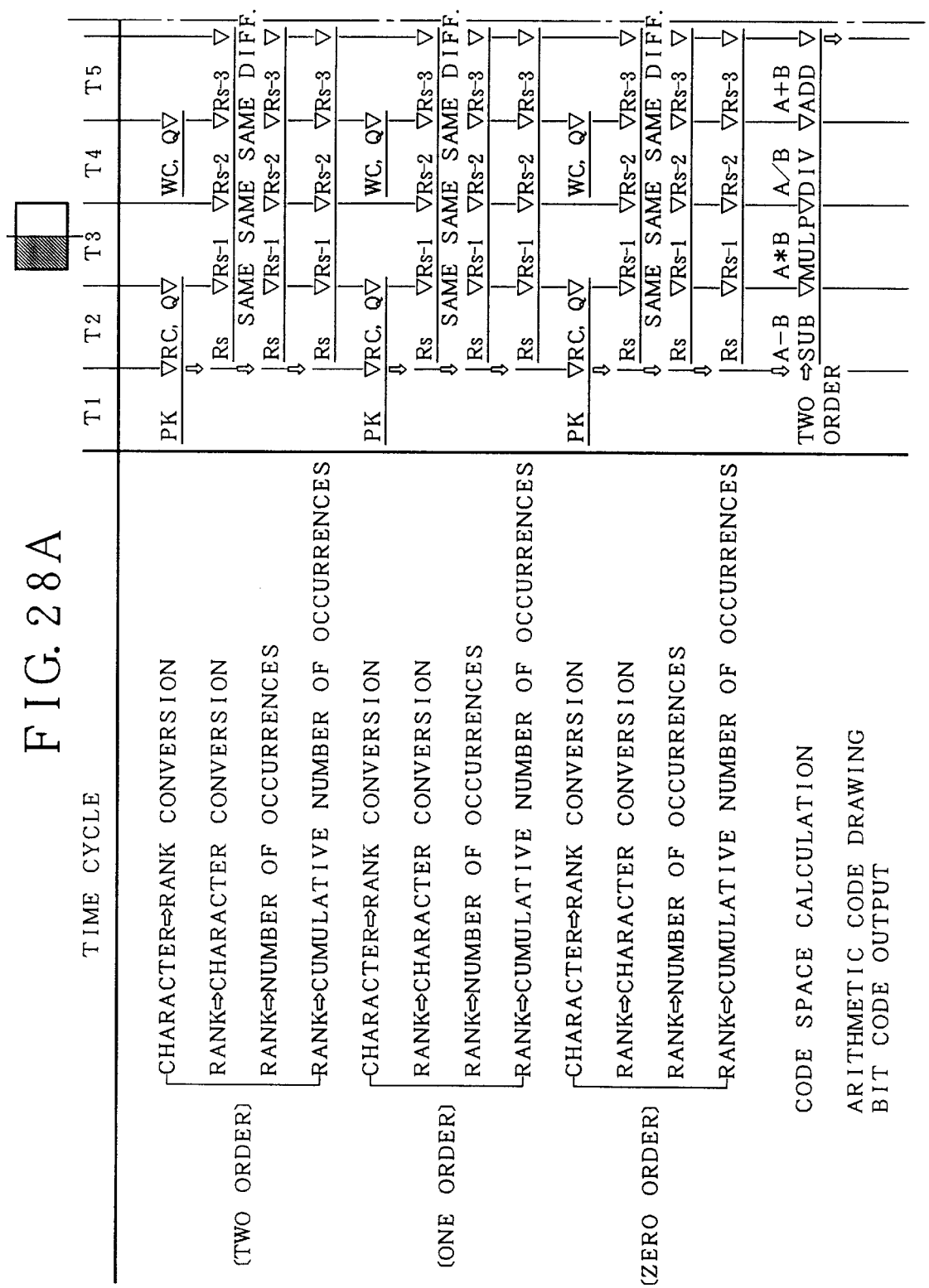

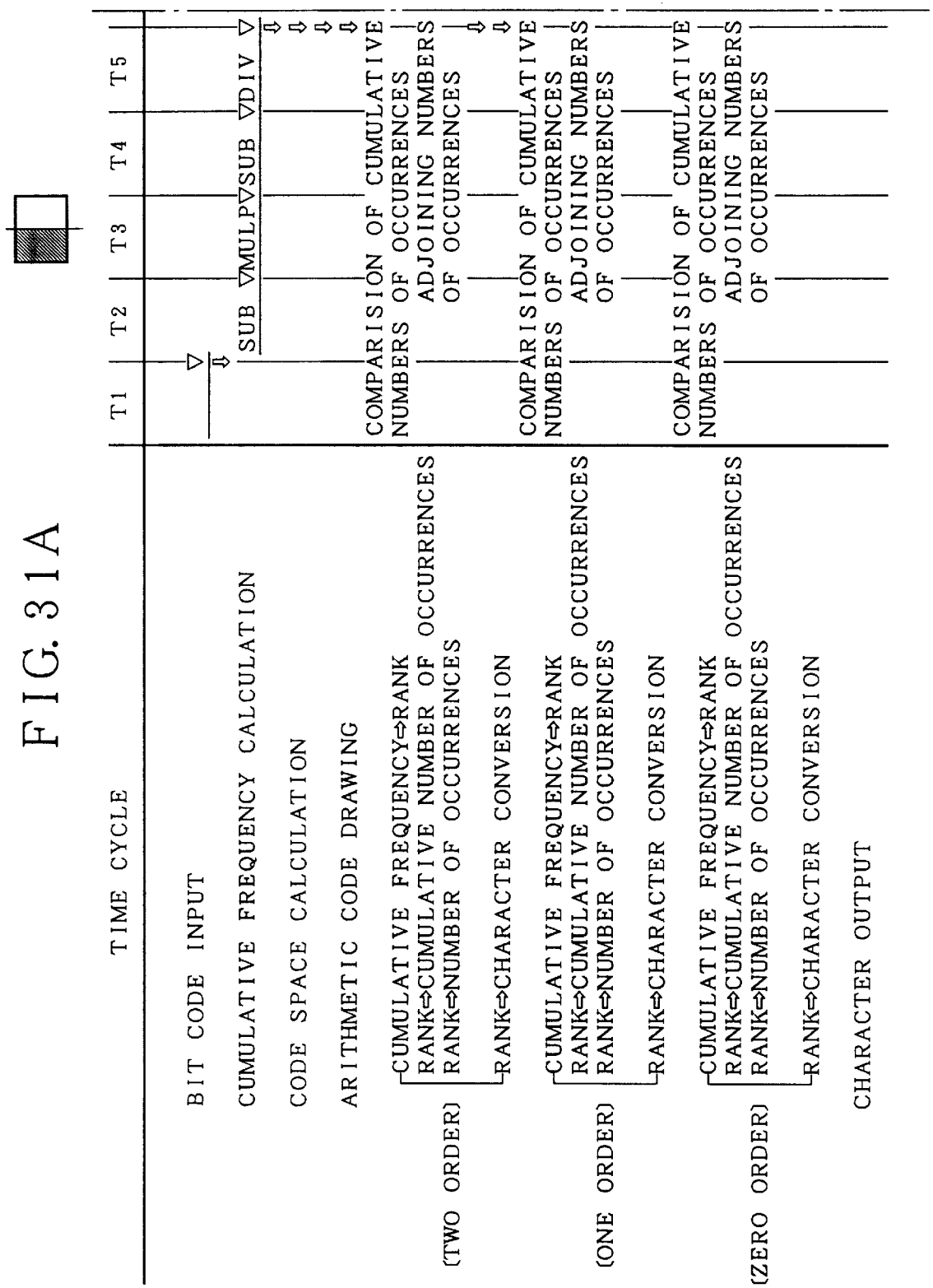

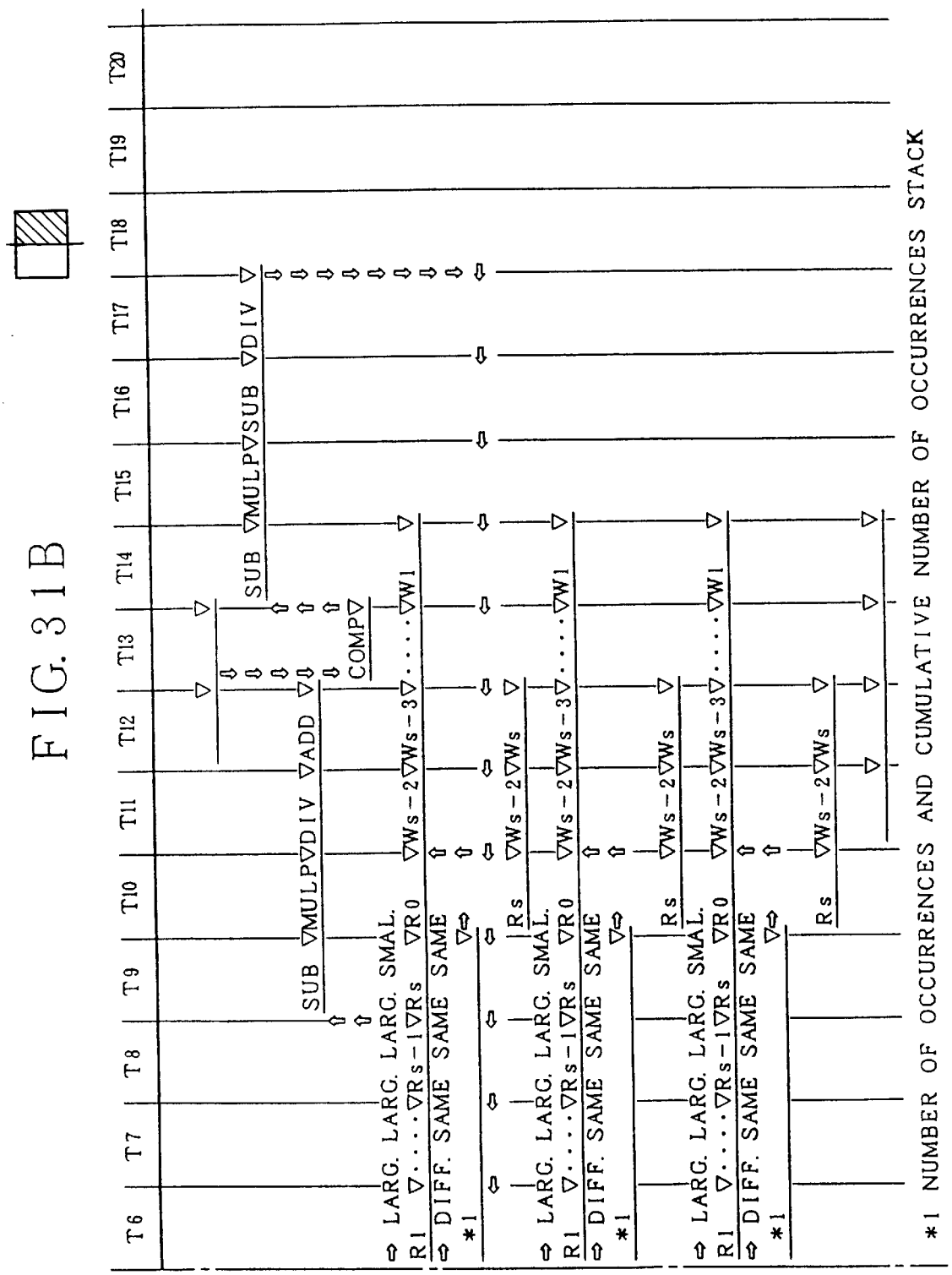

FIG. 35A ENCODING OF FIRST BYTE

FIG. 35B ENCODING OF SECOND BYTE

FIG. 35C ENCODING OF n-TH BYTE

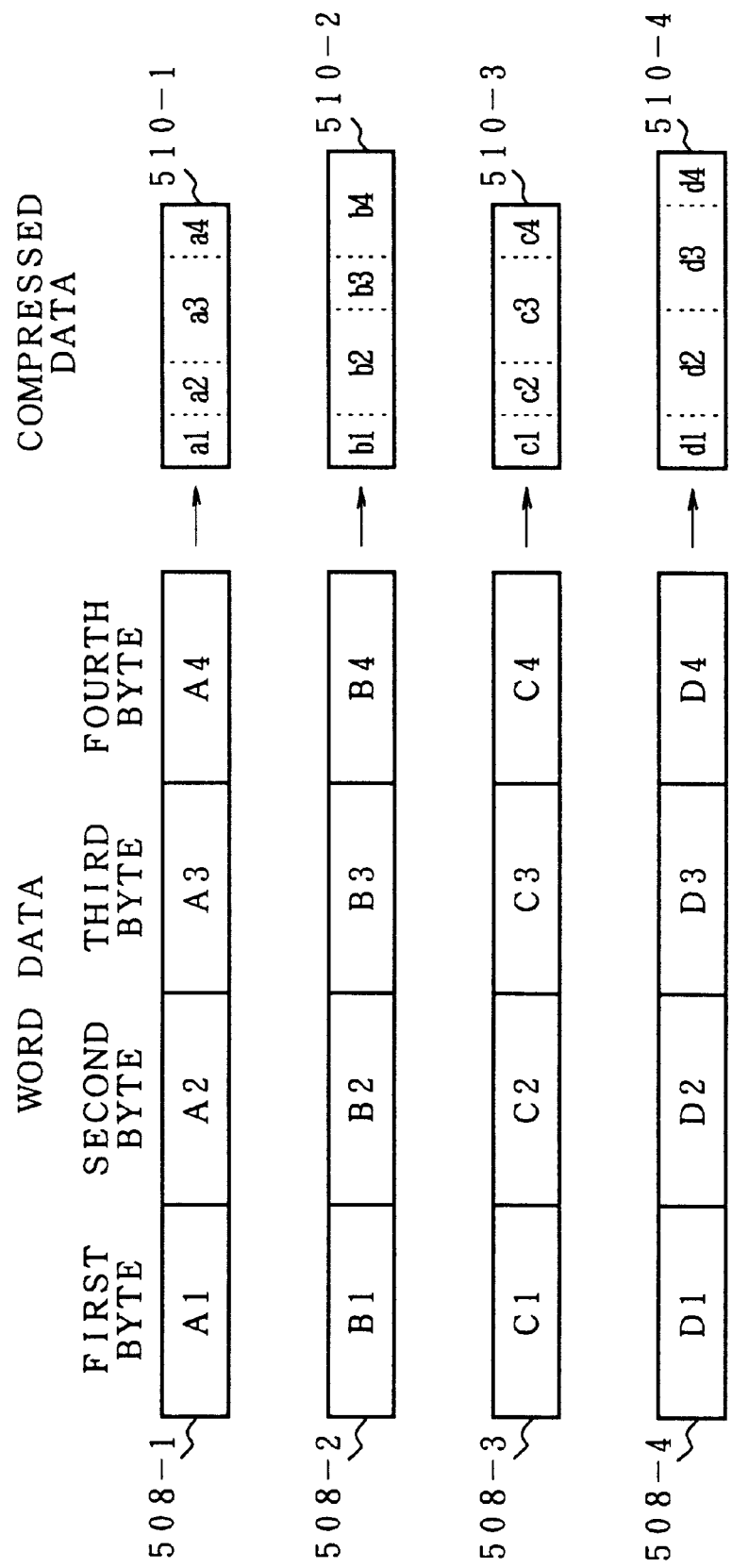

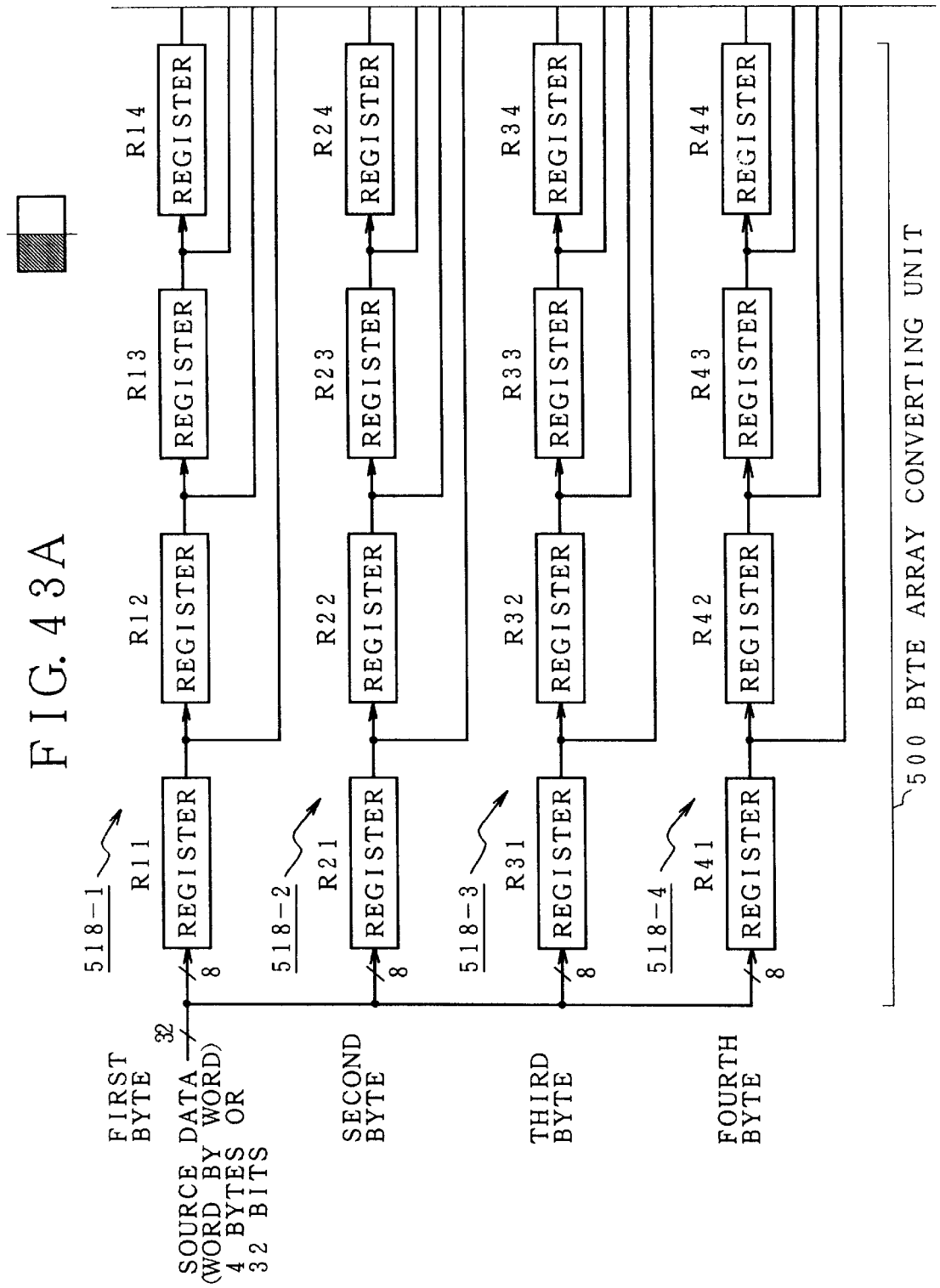

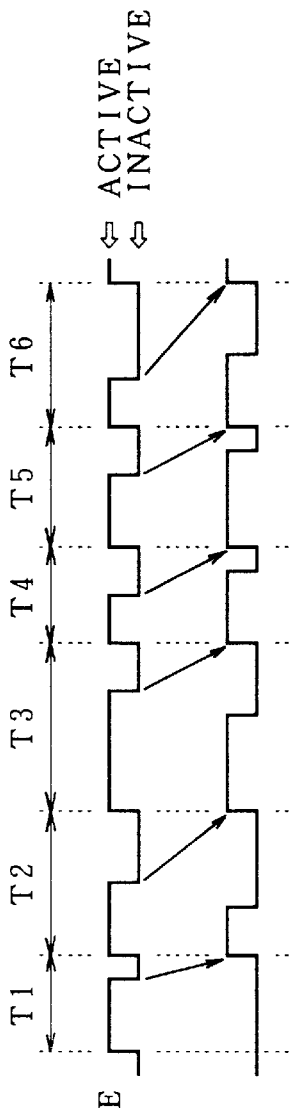
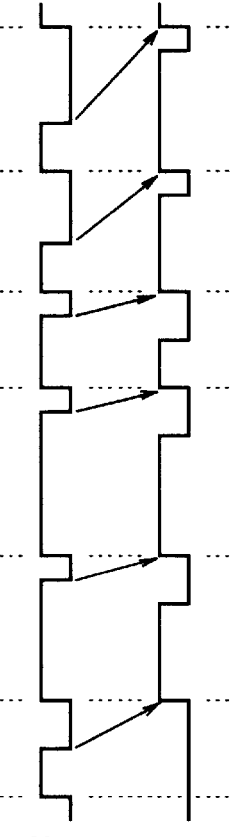
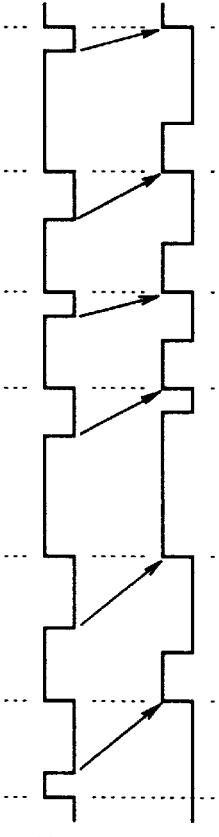
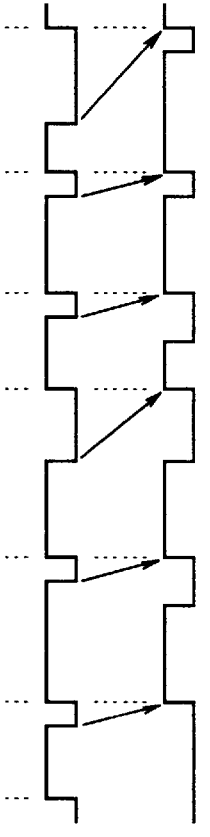
FIG. 44A FIRST BYTE
FIG. 44B SECOND BYTE
FIG. 44C THIRD BYTE
FIG. 44D FOURTH BYTE

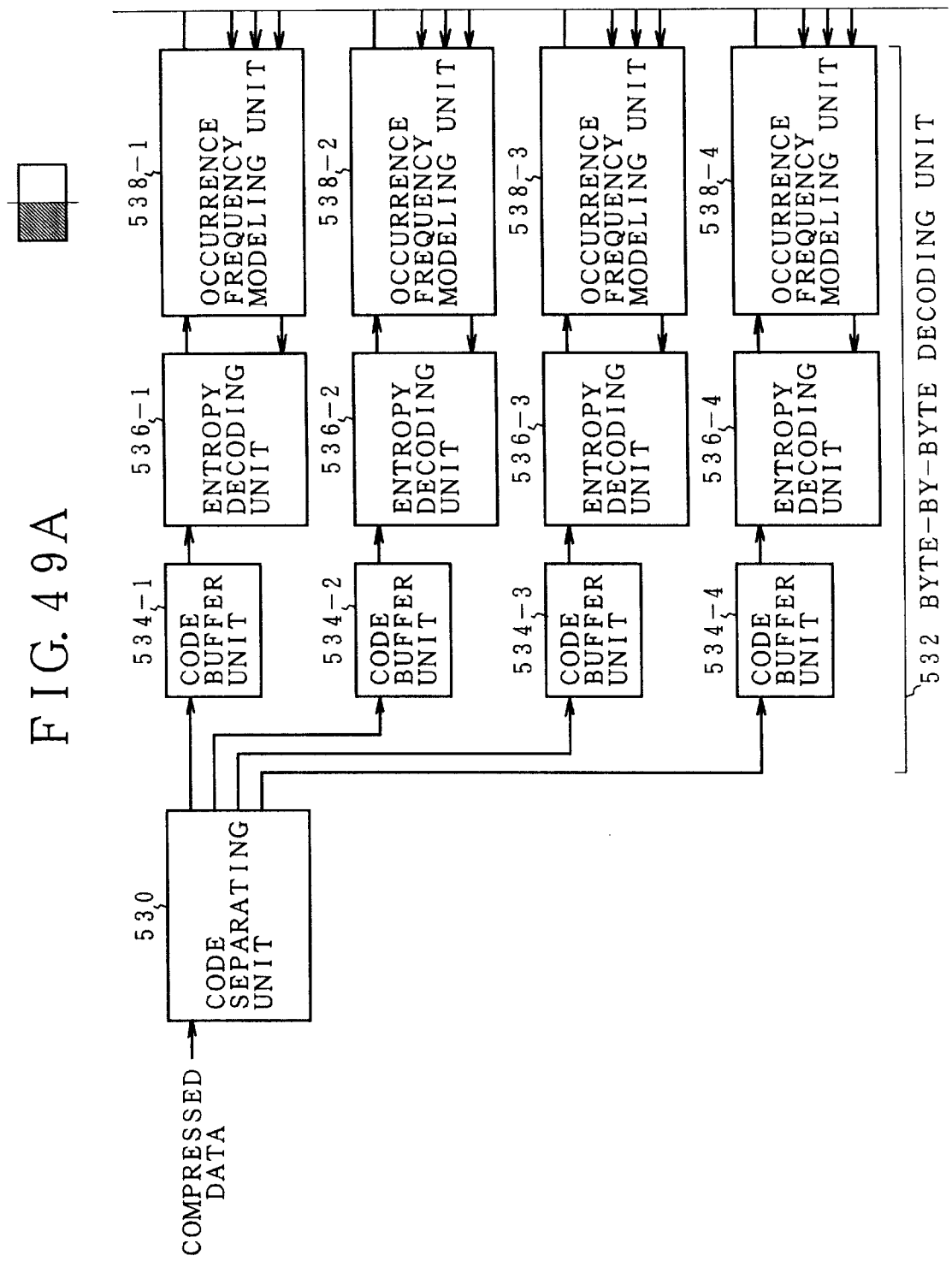

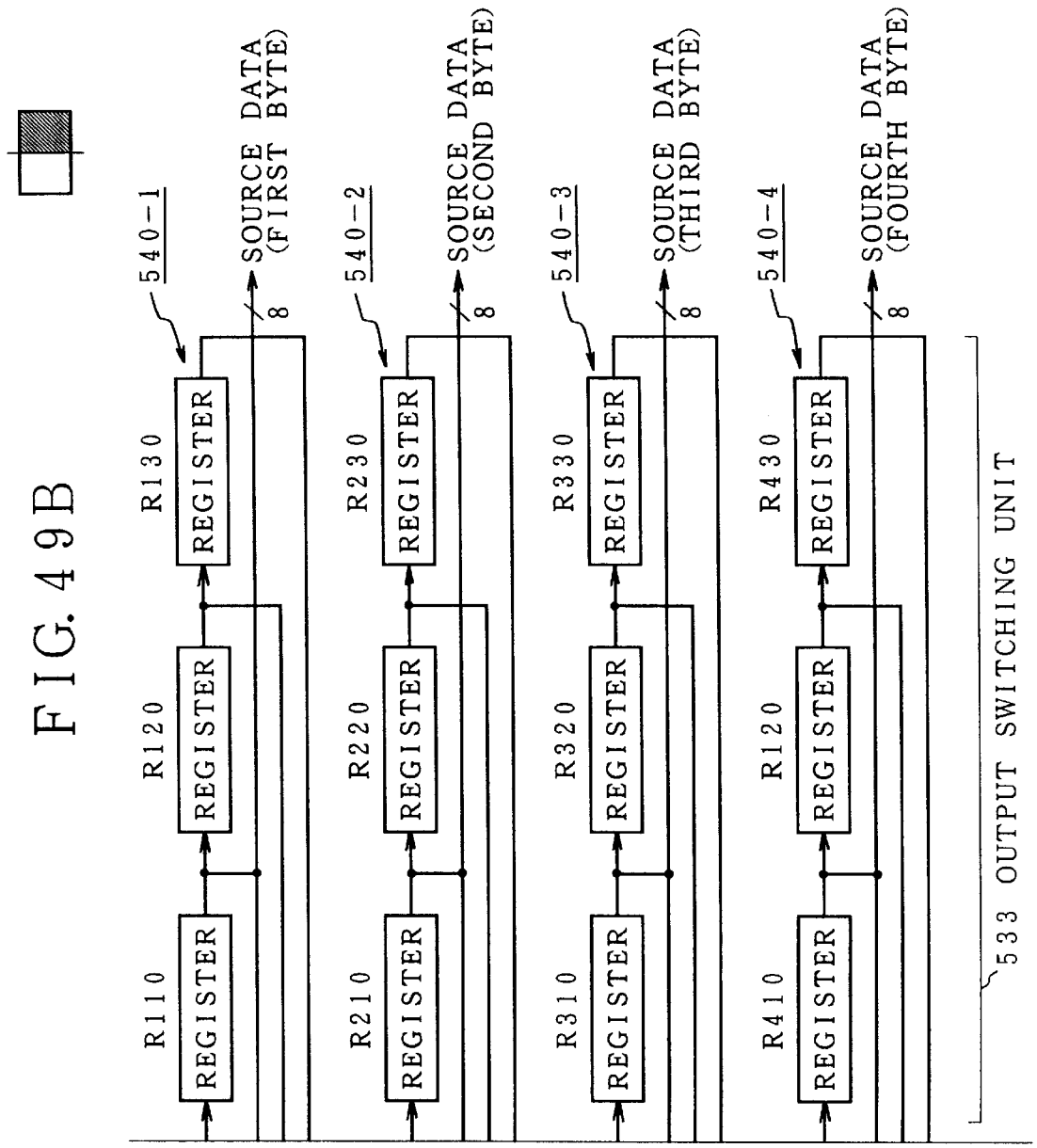

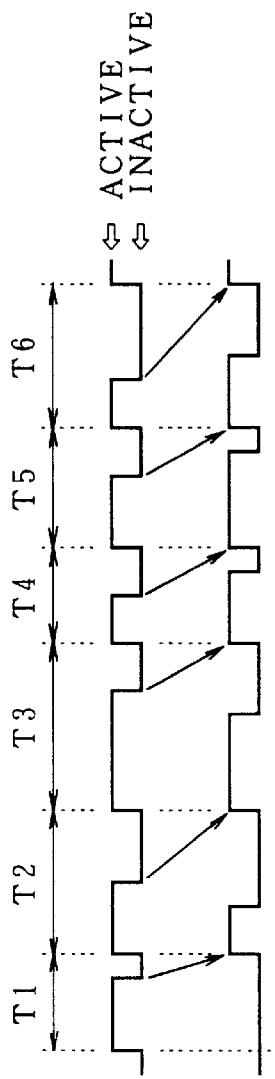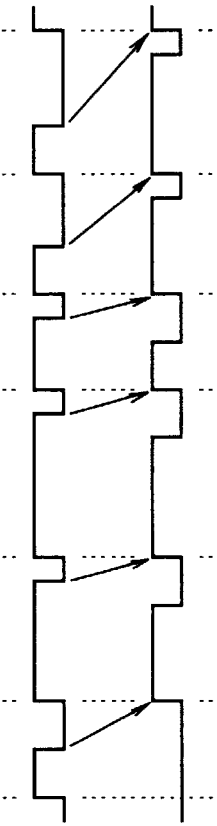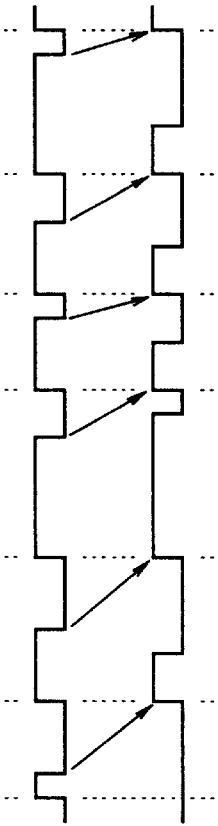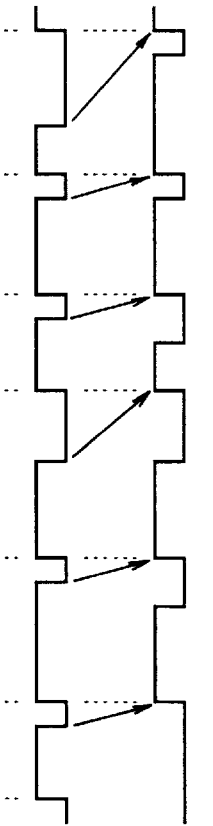
FIG. 50A FIRST BYTE [ENTROPY DECODING / OCCURRENCE FREQUENCY MODELING]
FIG. 50B SECOND BYTE [ENTROPY DECODING / OCCURRENCE FREQUENCY MODELING]
FIG. 50C THIRD BYTE [ENTROPY DECODING / OCCURRENCE FREQUENCY MODELING]
FIG. 50D FOURTH BYTE [ENTROPY DECODING / OCCURRENCE FREQUENCY MODELING]

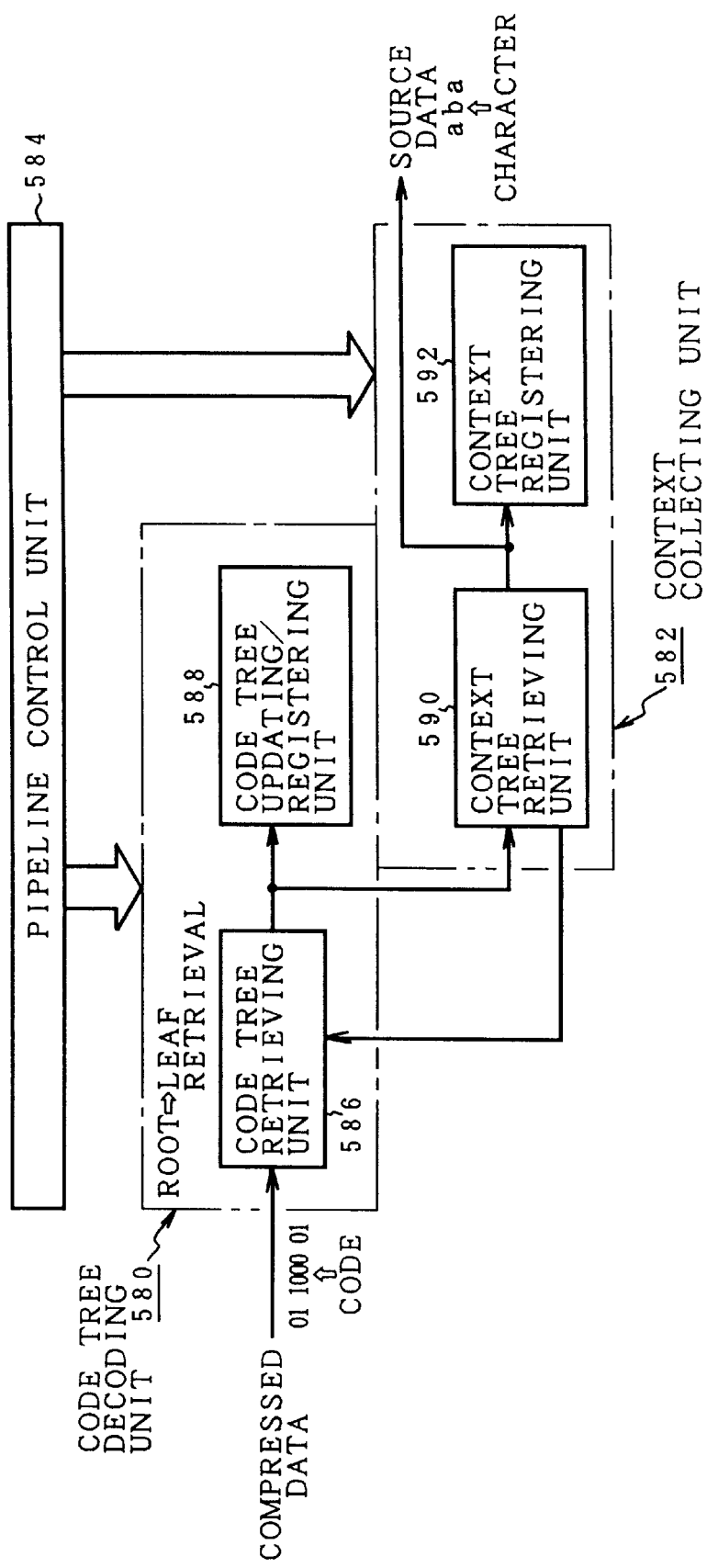

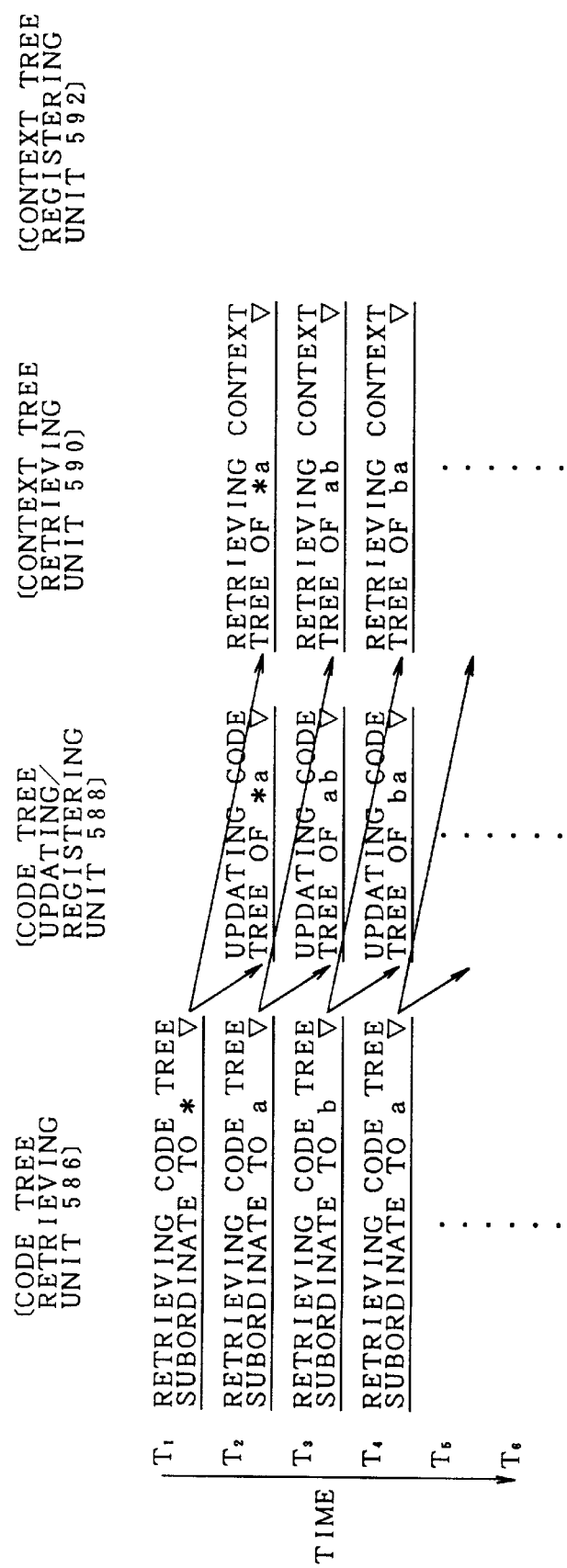

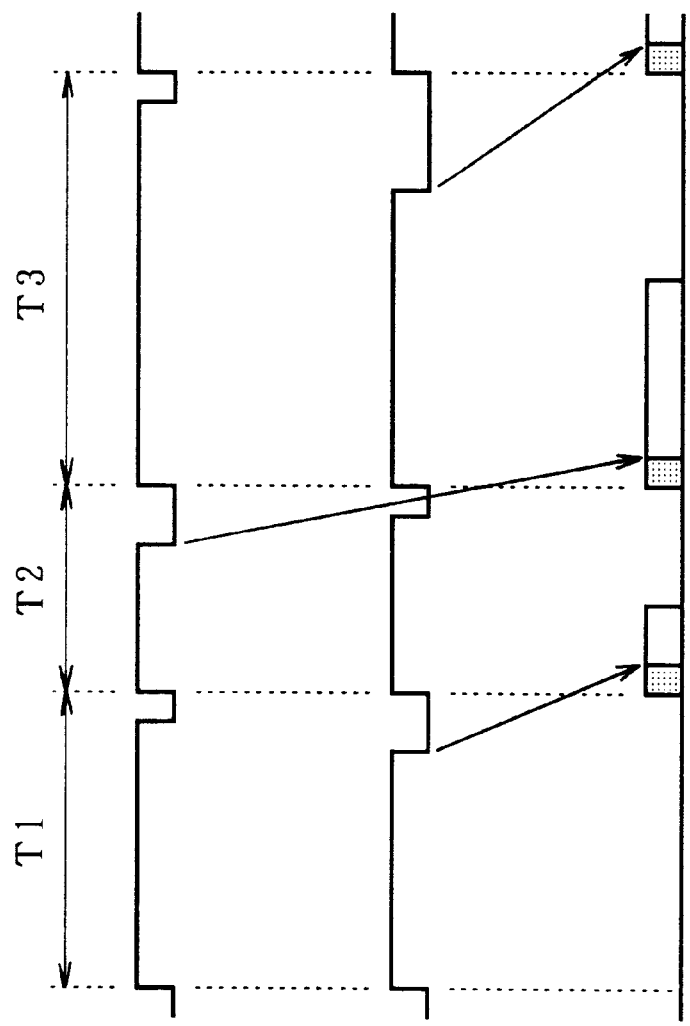

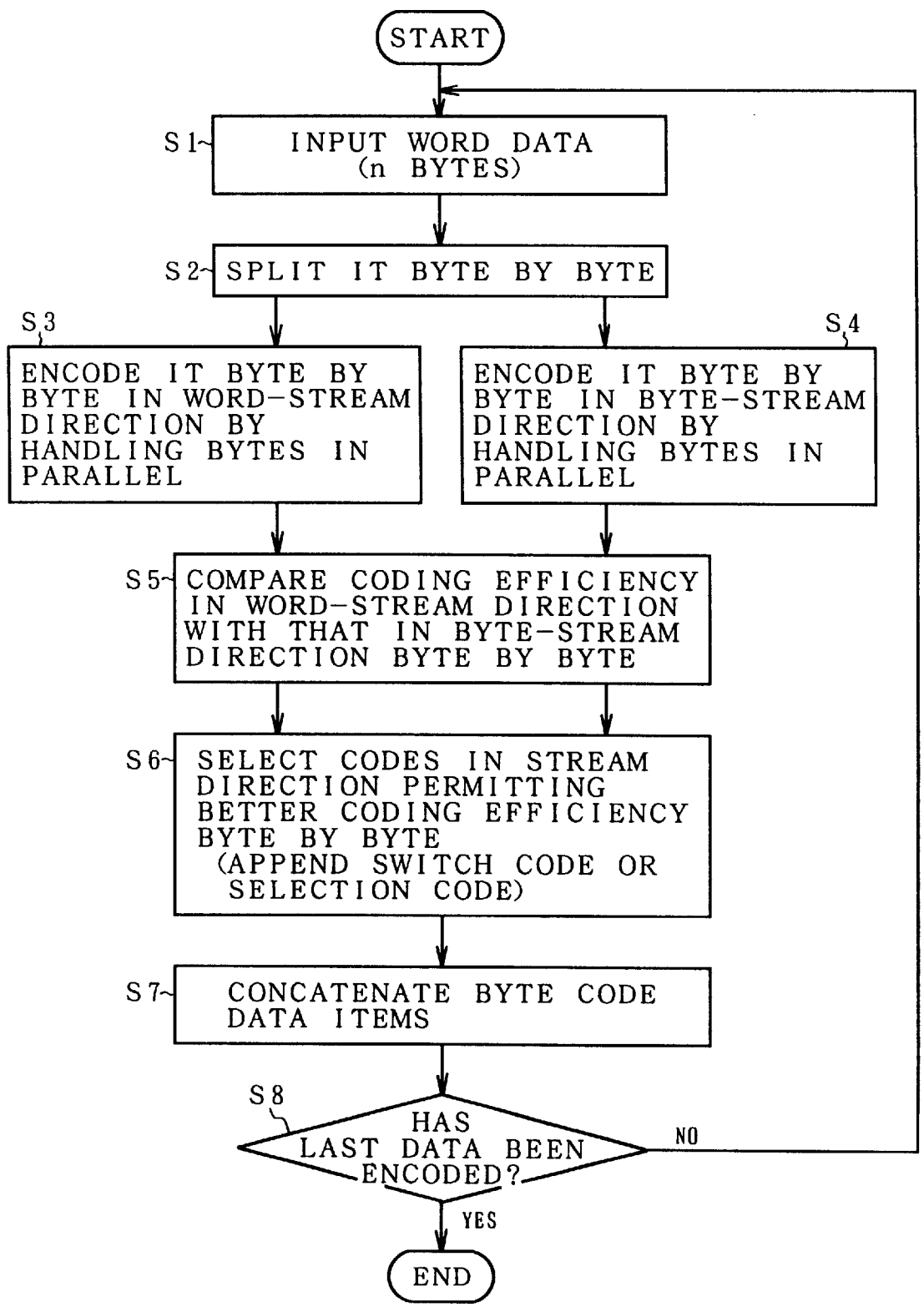

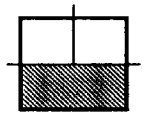
FIG. 60A
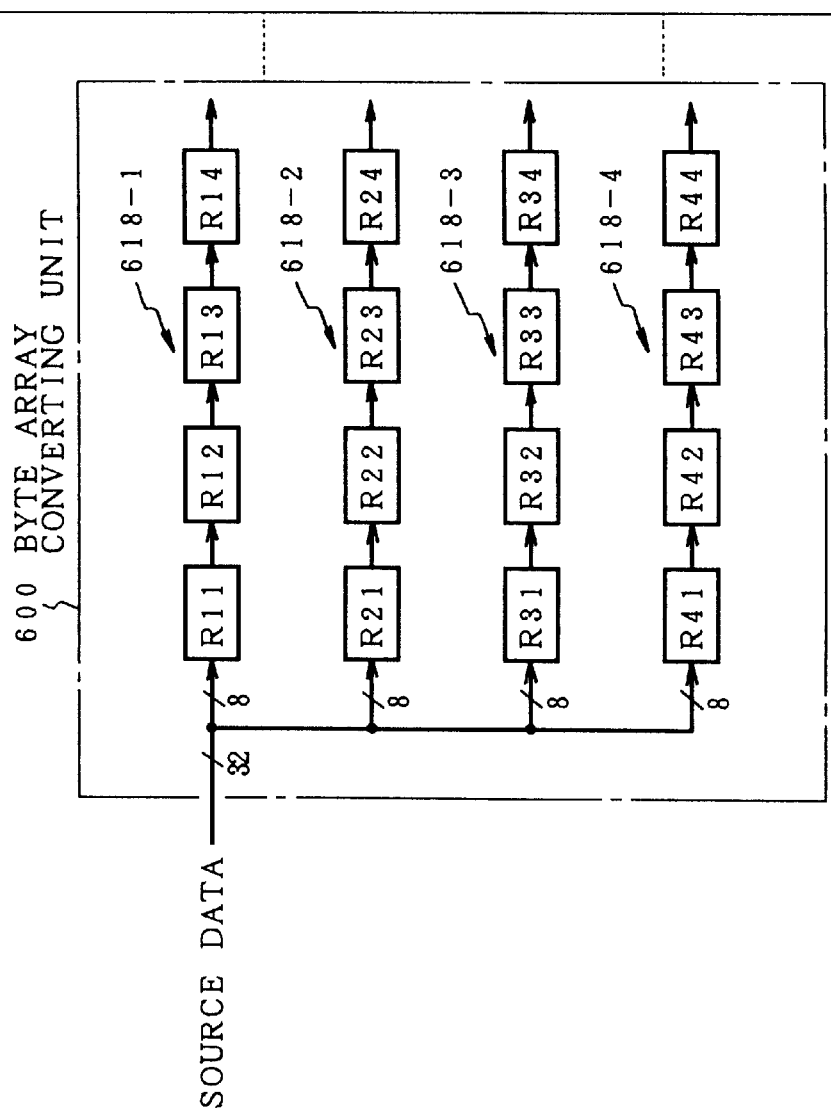

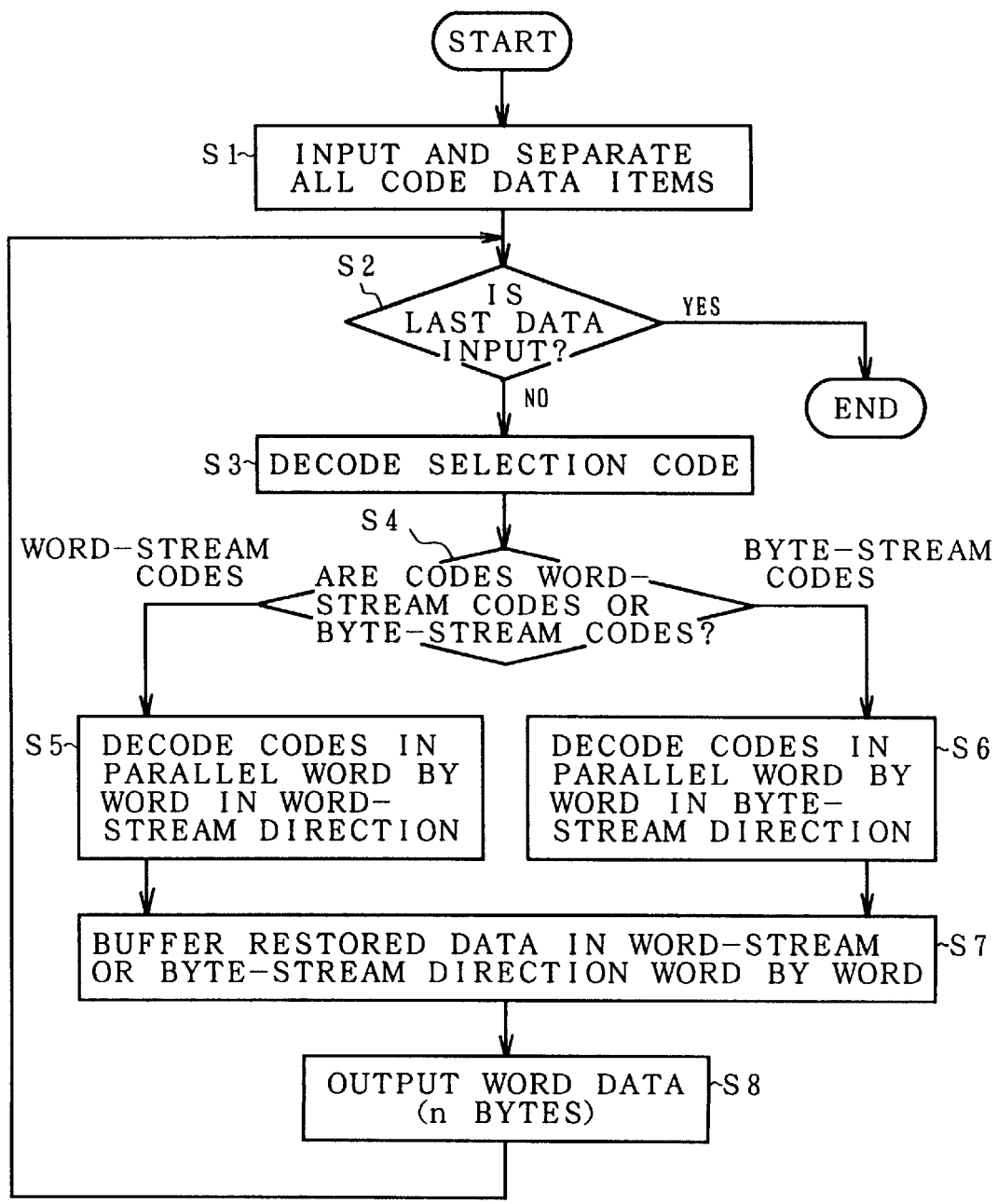

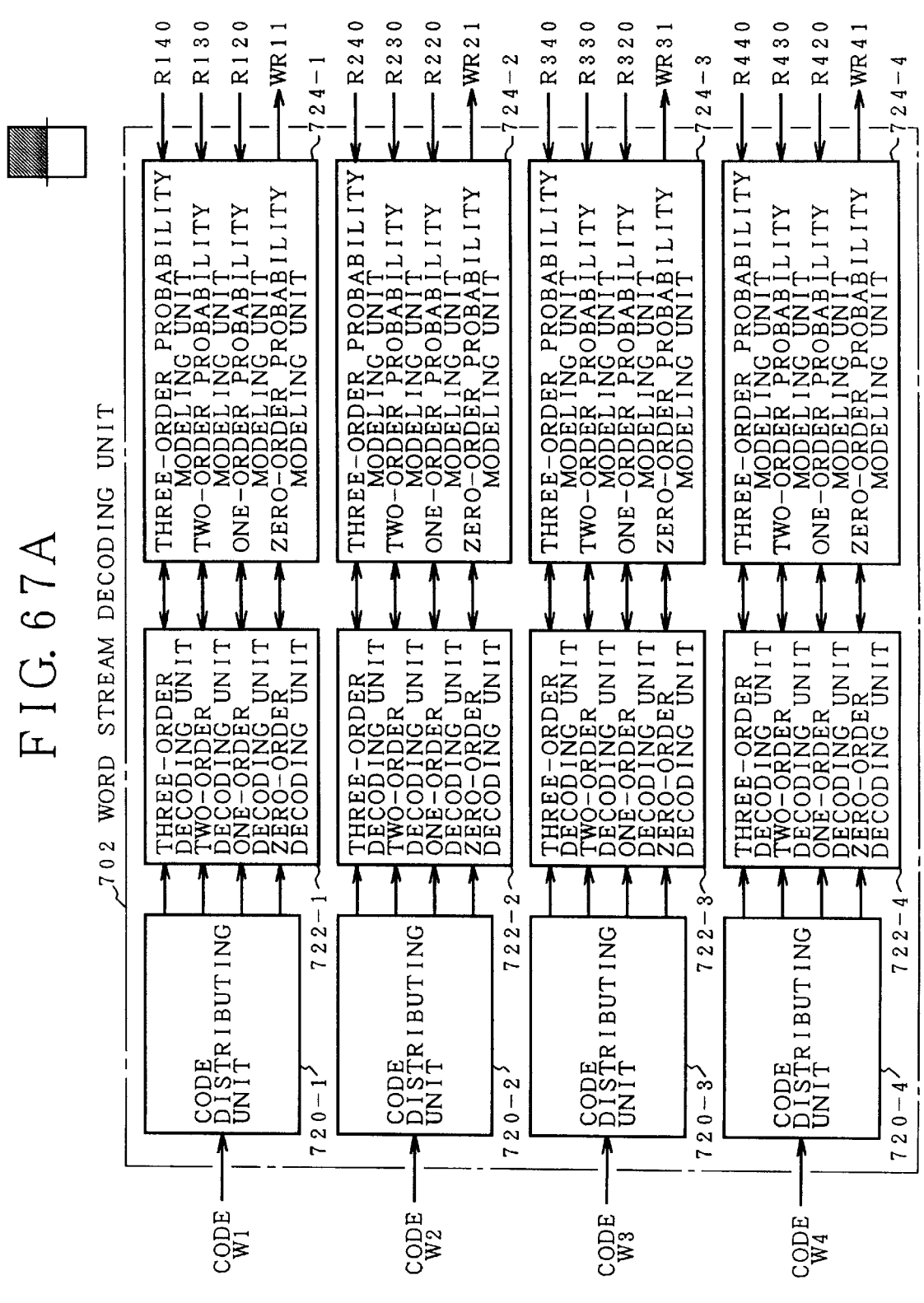

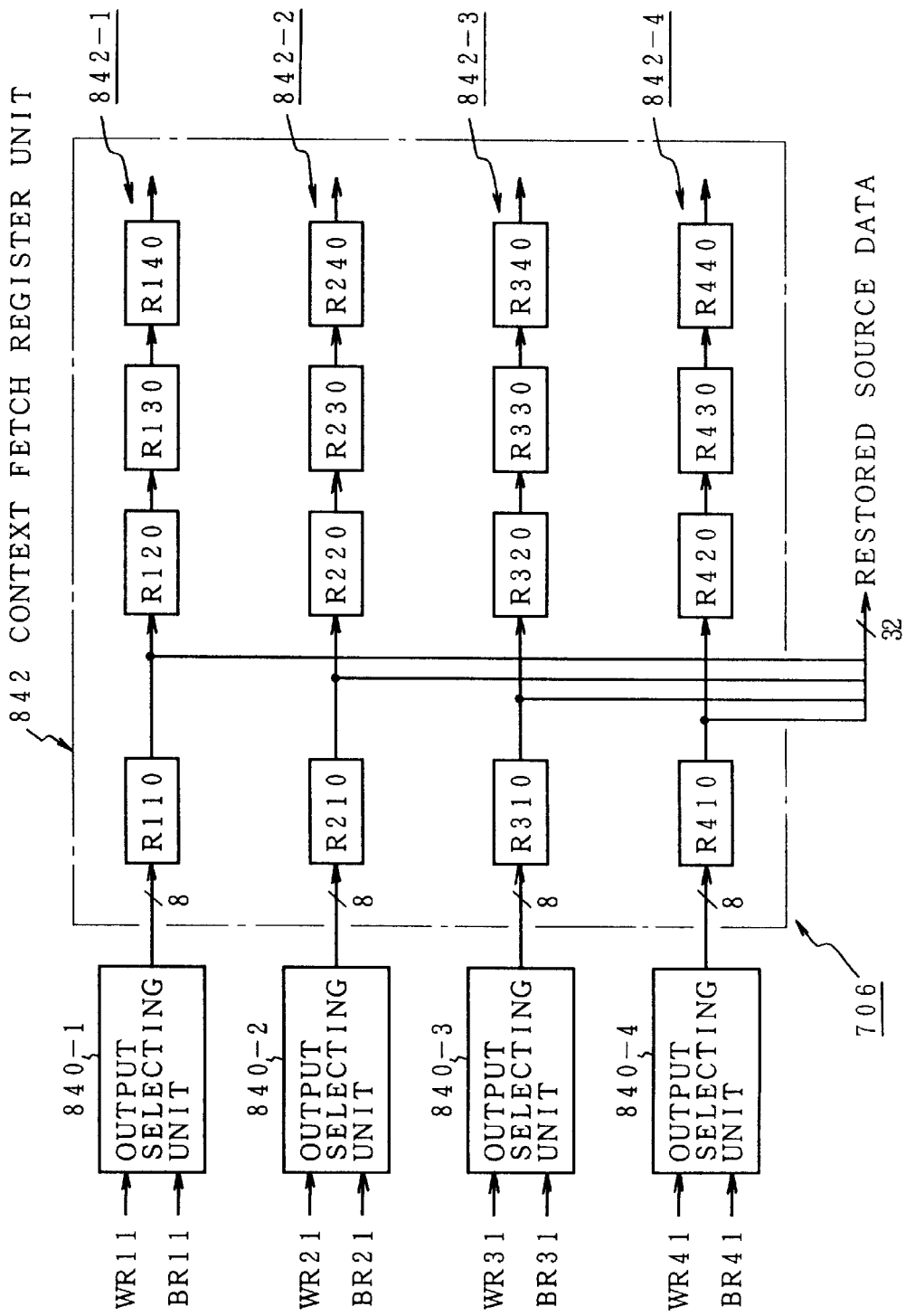

DATA COMPRESSION AND RESTORATION SYSTEM FOR ENCODING AN INPUT CHARACTER ON THE BASIS OF A CONDITIONAL APPEARANCE RATE OBTAINED IN RELATION TO AN IMMEDIATELY PRECEDING CHARACTER STRING

BACKGROUND OF THE INVENTION

1. Field of the Invention

The present invention relates to a data compression system and data restoration system that adopts probability statistical coding such as arithmetic coding in which data such as character codes or images is encoded byte by byte. More particularly, this invention is concerned with a data compression system and data restoration system enjoying improved processing performance due to pipelined processing.

2. Description of the Related Art

In recent years, various kinds of data such as character codes, vector information, and images have been handled by a computer. The amount of data to be handled is increasing rapidly. For handing a large amount of data, redundancies in data are eliminated to reduce the amount of data. Consequently, storage capacity can be reduced and data can be transmitted far away to remote places.

One of the methods of compressing various kinds of data using one algorithm is universal coding. The universal coding falls into various techniques. Probability statistical coding such as arithmetic coding is a typical one of the techniques. The present invention can be adapted to various kinds of data not limited to character codes. Hereinafter, according to the terms employed in the information theory, a unit of data or one word shall be referred to as a character, and data composed of any number of consecutive words shall be referred to as a character string.

One of the methods of compressing various kinds of data using one algorithm is universal coding. The universal coding falls into various techniques. There are two typical techniques; dictionary coding and statistical coding.

1. Dictionary coding or Lempel-Ziv coding

Typical technique: LZW, LZSS

2. Statistical coding

Typical technique: multi-value arithmetic coding, dynamic Huffman coding

The dictionary coding is such that past character strings (whose length is variable) are registered in a table called a dictionary, and a subsequent character string is encoded according to information (whose code length is constant) of the location in the dictionary of the longest character string registered in the dictionary. This technique is based on variable-fixed coding (VF) in which a long variable-length character string, for example, several tens of characters are encoded according to fixed-length information of, for example, 12 bits.

For the details of a dictionary coding algorithm, refer to Section 8 Dictionary Techniques in "Text Compression" (Prentice-Hall, 1990) written by T. C. Bell et al[1]. By contrast, the probability statistical coding is such that the probability of occurrence of a past individual character (since one character is concerned, the code length is fixed) (including a conditional probability subordinate to an immediately preceding character string) is calculated, and a succeeding character is encoded according to statistical (entropy) information (whose code length is variable) reflecting the probability of occurrence calculated. This technique is based on fixed-variable coding (FV) in which characters (with fixed lengths) are encoded one by one according to statistical information (variable) reflecting the probabilities of occurrence thereof (fixed).

For the details of a probability statistical coding algorithm, refer to Section 5 From Probabilities to Bits in "Test Compression" (Prentice-Hall, 1990) written by T. C. Bell et al[2]. Typical statistical coding techniques include Huffman coding and arithmetic coding.

For the details of context modeling for obtaining the subordinate relationship of an immediately preceding character string, refer to Section 6 Context Modeling in "Text Compression" (Prentice-Hall, 1990) written by T. C. Bell et al[3]. Herein, the subordinate relationship to an immediately preceding character string is expressed with several characters at most, though an infinitely long character string is used in the dictionary coding.

Consequently, the dictionary coding and probability statistical coding are different from each other in the following points:

1. the dictionary coding handles past data in the form of a character string itself, while the probability statistical coding handles it in the form of a probability of occurrence; and
2. the dictionary coding handles fixed-length data as an object of encoding, while the probability statistical coding handles variable-length (in principle) data. Thus, the dictionary coding and probability statistical coding are fundamentally different from each other in terms of compression mechanism. Herein, multi-value arithmetic coding that handles mainly a data stream or byte stream of an English text or the like is taken as an example of universal coding.

Two encoding techniques to which the arithmetic coding is broadly divided have been proposed; binary arithmetic coding and multi-value arithmetic coding. The encoding techniques differ from each other in a point that the binary arithmetic coding handles two digits corresponding to bits 0 and 1 as a unit of data to be encoded, while the multi-value arithmetic coding handles many digits corresponding to, for example, one byte of 8 bits as a unit of data to be encoded. A typical example of implementation of the binary arithmetic coding is a QM coder employed in JBIG entropy coding that is a standard technique of binary image compression recommended by the CCITT or ISO. For details, for example, refer to Chapter 3 Arithmetic Coding in "International Standards of Multiprocessor Media Coding" (Maruzen, p68–82, June 1991)[4].

Typical examples of the multi-value arithmetic coding are Witten coding and Abrahanson coding. For details, for example, refer to "Arithmetic Coding for Data Compression" (Communications of Association for Computing Machinery, Vol. 30(6), p.520–540, July 1987) written by I. H. Witten et al[5]. and "An Adaptive Dependency Source Mode for Data Compression" (Communications of Association for Computing Machinery, Vol. 32(1), p.77–83, January 1989)[6]. The binary arithmetic coding alone is utilized in practice for the reason that it is suitable for images. However, since the multi-value arithmetic coding enjoys the highest compression performance, practical utilization of the multi-value arithmetic coding is expected.

The probability statistical coding requires, as shown in FIG. 1, an occurrence frequency modeling unit 400 and entropy coding unit 402. The occurrence frequency modeling unit 400 fetches an input character and an immediately preceding character string (context) and calculates the occurrence frequency of the input character in terms of the subordinate relationship to the immediately preceding character string. The entropy coding unit 402 carries out variable-length encoding to produce a code dynamically on the basis of the occurrence frequency calculated by the occurrence frequency modeling unit 400. The further details will be described. Take for instance a character string abc composed of three characters a, b, and c as shown in FIG. 2A. The relationship to the immediately preceding character string is expressed in the form of a tree structure shown in FIG. 2B. The occurrence frequency modeling unit 400 counts up the number of occurrences at every occurrence of a character string linking characters at nodes of the tree structure shown in FIG. 2B, and thus obtains the subordinate relationship to the immediately preceding character string, for example, a conditional probability. A context acquisition method for obtaining the subordinate relationship of such an input character to an immediately preceding character string falls into a method of acquiring a fixed-order context and a method of acquiring a blend context. Herein, the number of characters implied by a context is referred to as an order. The method of acquiring a fixed-order context is a method for fixing the number of characters in a context. Taking a two-order context for instance, the occurrence frequency modeling unit 400 acquires the context of a character linked to two immediately preceding characters $x_2$ and $x_1$, obtains the subordinate relationship of a character y succeeding the immediately preceding characters $x_2$ and $x_1$, for example, a conditional probability $\rho$ ($y|x_1, x_2$), and hands the obtained probability to the entropy coding unit 402. Here, y is an input character concerned, and $x_1$ and $x_2$ are first and second immediately preceding characters. The method of acquiring a blend context is a method in which the orders of contexts are mixed. In the case of a fixed-order context, if an immediately preceding character string hardly appears, the estimate of the subordinate relationship to the immediately preceding character string becomes uncertain. By contrast, if the immediately preceding character string appears frequently, the estimate of the subordinate relationship to the immediately preceding character string becomes more accurate and offers the possibility of increasing the order of a context. In general, as the larger-order context in which an immediately preceding character string is longer is used, a bias of characters can be grasped more easily, and high compression efficiency can be provided. However, when data that is a large-order context whose characters have a feeble correlation is compressed, the compression efficiency is low. An attempted solution of this kind of problem is a blend context made by mixing contexts having different orders. The method of acquiring a blend context is such that the order of an immediately preceding context is not fixed, when a context of individual contexts appears frequently, the subordinate relationship to a large-order context is drawn out. When a context appears hardly, the subordinate relationship to a small-order context is drawn out.

The entropy coding unit 402 produces a code according to an occurrence frequency provided by the occurrence frequency modeling unit 400. Typical coding to be implemented in the entropy coding unit 402 for producing a code dynamically according to the number of occurrences obtained by the occurrence frequency modeling unit 400 includes arithmetic coding, dynamic Huffman coding, and self-organization coding. The arithmetic coding is thought to offer the highest encoding efficiency because since a code is produced through computation based on the occurrence probability of each character, a code can be assigned even at a rate of one bit per one character or less.

FIGS. 3A to 3C illustrate a procedure of multi-value arithmetic coding. A character string of input characters which has a length of a plurality of bits, for example, a plurality of bytes is associated with one point on a number line [0, 1] and expressed with one code. For brevity's sake, a character string composed of four characters a, b, c, and d will be discussed. First, as shown in FIG. 3A, the occurrence frequencies of the characters are calculated. What is referred to as an occurrence frequency is a probability calculated by dividing the number of occurrences of each character by a total number of occurrences. For example, the occurrence frequency of character a is 0.15, that of character b is 0.25, that of character c is 0.35, and that of character d is 0.25. Next, using the occurrence frequencies shown in FIG. 3A, the characters are rearranged in descending order of frequency. As shown in FIG. 3B, cumulative occurrence frequencies are calculated. What is referred to as a cumulative occurrence frequency is a sum of occurrence frequencies of characters ranking lower than a character concerned. Specifically, the cumulative occurrence frequency of character c having the highest occurrence frequency is a sum of the occurrence frequencies of characters b, d, and a, that is, 0.65. Likewise, the cumulative occurrence frequencies of the other characters b, d, and a are 0.40, 0.15, and 0.0 respectively. In this state, for example, when character c is input, as shown in FIG. 3C, a new interval 404 within the encoding interval [0, 1] defined with a number line is obtained on the basis of the occurrence frequency freq[c] of input character c that is 0.35 and the cumulative occurrence frequency cum freq[c] thereof that is 0.65. More particularly, since the high level H1 of the encoding interval [0, 1] defined with a number line is 1, the low level L1 thereof is 0, and the interval width W1 thereof is 1, the high level H2, low level L2, and interval width W2 of the new interval 404 are calculated on the basis of the occurrence frequency freq[c] of input character c which is 0.35 and the cumulative occurrence frequency cum freq[c] thereof which is 0.65. That is to say, the low level L2 of the new interval 404 is calculated using the low level L1 of the previous interval and the interval width W1 thereof as follows:

$$L2 = L1 + W1 \times cum\ freq[c]$$
$$= 0.0 + 1.0 \times 0.65$$
$$= 0.65$$

The width W2 of the new interval 404 is calculated as follows:

$$W2 = W1 \times freq[c]$$
$$= 1.0 \times 0.35$$
$$= 0.35$$

The high level (upper extreme) H2 of the new interval 404 is calculated as follows:

$$H2 = L2 + W2$$
$$= 0.65 + 0.35$$
$$= 1.00$$

Since character c is input, the number of occurrences of character c is incremented by one, and the total number of occurrences is incremented by one. Accordingly, the occurrence frequencies of characters a, b, c, and d and the cumulative occurrence frequencies thereof are updated. For brevity's sake, the occurrence frequencies and cumulative occurrence frequencies shown in FIGS. 3A and 3B are supposed to remain unchanged. When character a is input, the previous interval 404 is regarded as a new interval [0, 1]. The low level L3, interval width W3, and high level H3 of the new interval 406 within the interval 404 are calculated on the basis of the occurrence frequency freq[a] of input character a that is 0.15 and the cumulative occurrence frequency cum freq[a] thereof that is 0.15.

$$L3 = L2 + W2 \times cum\ freq[a]$$
$$= 0.65 + 0.35 \times 0.15$$
$$= 0.7025$$

$$W3 = W2 \times freq[a]$$
$$= 0.35 \times 0.15$$
$$= 0.0525$$

$$H3 = L3 + W3$$
$$= 0.7025 + 0.0525$$
$$= 0.7550$$

When character d is input, the previous interval 406 is regarded as a new interval [0, 1]. The low level L4, interval width W4, and high level H4 of a new interval 408 within the interval 406 are calculated on the basis of the occurrence frequency freq[d] of input character d that is 0.25 and the cumulative occurrence frequency cum freq[d] thereof that is 0.4.

$$L4 = L3 + W3 \times cum\ freq[d]$$
$$= 0.7025 + 0.0525 \times 0.40$$
$$= 0.7235$$

$$W4 = W3 \times freq[d]$$
$$= 0.0525 \times 0.40$$
$$= 0.0210$$

$$H4 = L4 + W4$$
$$= 0.7235 + 0.0210$$
$$= 0.7445$$

If the input character d is a last character, any values defining the interval 408, for example, any values determined by the high level and low level of the interval 408 are output as an arithmetic code. To be more specific, the previous interval 406 is normalized to [0, 1] and divided into four subdivision intervals according to thresholds ¼, ½, and ¾. A subdivision interval within the normalized previous interval 406 to which the high level H4 and low level L4 of the last interval 408 belong is detected and used to produce a code. A code is produced under the following conditions in relation to the previous interval 406:

1. if the high level H4 or low level L4 is equal to or larger than ½, bit 1 is produced, while if it falls below ½, bit 0 is produced; and
2. if the high level H4 or low level L4 is equal to or larger than ¼ and is equal to or smaller than ¾, bit 1 is produced, while if it falls outside this range, bit 0 is produced.

In the case of the last interval 408, since the high level H4 equals to 0.7445, bit 1 is produced under the above Condition 1. Under Condition 2, bit 1 is also produced. Since the low level L4 equals to 0.7235, bit 1 is produced under Condition 1. Under Condition 2, bit 1 is also produced. The arithmetic code of the character string cad is 1111. In practice, the occurrence frequency and cumulative occurrence frequency of a character are not dealt with directly. That is to say, when a character is input and encoded, the number of occurrences of the character, a cumulative number of occurrences thereof, and a total number of occurrences are calculated. When an occurrence frequency and cumulative occurrence frequency are needed, the number of occurrences is divided by the total number of occurrences. Thus, an occurrence frequency is calculated. The cumulative number of occurrences is divided by the total number of occurrences, whereby a cumulative occurrence frequency is calculated. From this viewpoint, the occurrence frequency is the number of occurrences normalized relative to the total number of occurrences, and the cumulative occurrence frequency is a cumulative number of occurrences normalized relative to the total number of occurrences. According to this kind of multi-value arithmetic coding, a character string having a higher occurrence frequency provides a wider last interval and can be expressed with a shorter code. This results in a compressed amount of data. This method enjoys high compression efficiency because no restrictions are imposed on a minimum unit of bit representation of a code, and the minimum unit can be set to one bit or less.

FIG. 4 is a block diagram of a known data compression system adopting arithmetic coding. The data compression system comprises an occurrence frequency rank rearranging unit 410, counter 412, frequency data storage unit 414, dictionary 416, and arithmetic coding unit 418. In this example, the number of occurrences freq[ ] is used instead of an occurrence frequency, and a cumulative number of occurrences cum freq[ ] is used instead of a cumulative occurrence frequency. The dictionary 416 may be incorporated in the frequency data storage unit 414. The counter 412 counts up the number of occurrences of an input character, freq[ ], calculates the cumulative number of occurrences of the character, cum freq[ ], and a total number of occurrences, cum freq[0], and stores them in the frequency data storage unit 414. The frequency rank rearranging unit 410 rearranges all characters existent in the frequency data storage unit 414 in descending order of number of occurrences freq[ ] at every input of a character, and stores the numbers of occurrences freq[ ] and cumulative numbers of occurrences cum freq[ ] in relation to register numbers indicating ranks. At the same time, symbols in the dictionary 416 are rearranged in one-to-one correspondence with the register numbers indicating ranks in descending order of number of occurrences stored in the frequency data storage unit 414. In response to a register number, which indicates a rank of an input character k and is retrieved by referencing the dictionary 416, sent from the frequency rank rearranging unit 410, the arithmetic coding unit 418 references the frequency data storage unit 414 according to the register number and obtains the number of occurrences of the input character k, freq[k], the cumulative number of occurrences thereof, cum fre[k], and the total number of occurrences cum freq[0]. The number of occurrences freq[k] and cumulative number of occurrences cum freq[k] are divided by the total number of occurrences cum freq[0], whereby an occurrence frequency and cumulative occurrence frequency are calculated. Based on the calculated occurrence frequency and cumulative occurrence frequency, a new interval is computed.

The operations of the system shown in FIG. 4 will be described. The frequency rank rearranging unit 410 references the dictionary 416 according to an input character k so as to retrieve a register number indicating the rank of the character in terms of number of occurrences, and outputs the register number to the arithmetic coding unit 418. The arithmetic coding unit 418 references the frequency data storage unit 414 according to the register number (rank) sent from the frequency rank rearranging unit 410 so as to obtain the number of occurrences, freq[k], of the input character k, the cumulative number of occurrences thereof, cum freq[k], and the total number of occurrences, cum freq[0]. An occurrence frequency and cumulative occurrence frequency are calculated by dividing the number of occurrences freq[k] and cumulative number of occurrences cum freq[k] by the total number of occurrences cum freq[0]. Based on a previous interval width Wk-1, the high level Hk: and low level Lk of a new interval Wk are calculated. If the input character is a last character, any values defining the new interval are output as a code. By the way, the counter 412 increments by one the number of occurrences, freq[k], of the input character k, the cumulative number of occurrences thereof, cum freq[k], and the total number of occurrences cum freq[0], and updates values associated with the register numbers in the frequency data storage unit 414. The frequency rank rearranging unit 410 then rearranges the contents of the frequency data storage unit 414 and dictionary 416 in descending order of updated number of occurrences freq[ ]. The flowchart of FIG. 5 describes multi-value arithmetic coding, wherein the one-fold history of an occurring character not taking account of a history relative to characters including an immediately preceding character, that is, the subordinate relationship of the occurring character to a zero-order context is estimated. The initial values defining an encoding interval are as follows: the high level H0 is 1, the low level L0 is 1, and the interval width WO is 1.0. i denotes ranks (register numbers) of characters in the dictionary in which the characters are arranged in descending order of number of occurrences, and assumes 1, 2, 3, etc., and A. freq[i] denotes numbers of occurrences of i-th ranks (register numbers) in the dictionary in which the characters are rearranged in descending order of number of occurrences. cum freq[i] denotes cumulative numbers of occurrences of characters having i-th ranks in the dictionary. Moreover, I assumes 1, 2, 3, etc., and A. cum freq[1] denotes the cumulative number of occurrences of a character ranking first. cum freq[A] denotes the cumulative number of occurrences of a character having the lowest rank A. Furthermore, an encoding interval is normalized to [1, 0] where 1 is associated with cum freq[1] and 0 is associated with cum freq[A]. At: step S1, the initial values below are set.

1. All single characters are allocated to items i of the dictionary D.

D(i)=i where i is 1, 2, 3, etc., and A, and A is the number of alphabets or symbols and assumes 256.

2. The i-th ranks (register numbers) are assigned to the characters.

I(i)=i where i is 1, 2, etc., and A.

3. The numbers of occurrences of all the characters are initialized.

freq(i)=1 where i is 1, 2, etc., and A.

4. The cumulative numbers of all the characters are initialized.

cum freq(i)=A-1

After the foregoing initialization is completed, a leading character k of an input character string of source data is input at step S2. Control is then passed to step S3, and rank j of the input character k which is a register number is retrieved from the dictionary. The rank j is provided as j=I(k). A list table that lists cumulative numbers of occurrences in one-to-one correspondence with code intervals is referenced on the basis of rank j, whereby a cumulative number of occurrences cum freq[j] is retrieved. This operation is expressed as i=D(j). Arithmetic coding is carried out on the basis of rank j retrieved from the dictionary. The arithmetic coding based on rank j is such that: the cumulative number of occurrences of the character having the rank j, cum freq[j] is divided by the total number of occurrences cum freq[0] in order to obtain a cumulative occurrence frequency; a new interval is defined on the basis of a previous interval width and low level; and if an input character is a last character having a given number of bytes that is regarded as a unit of encoding, any values defining the new interval are output as a code. At step S4, if characters having the same number of occurrences as the input character k of rank j rank high, the characters ranking high are rearranged together with the numbers of occurrences and cumulative numbers: of occurrences. First, among characters ranking lower than the character of rank j, a character of rank r that is immediately lower than the character k of rank j and has the different number of occurrences freq[k] from the character k is searched for. In shorts, a character of rank r satisfying freq[r]!=freq[j] is searched for. Note that ! means "different." Furthermore, assume that the number of occurrences associated with an interval expressing the r-th character in the dictionary ranks I(r)=s in the list table, and the cumulative number of occurrences associated with the interval ranks D(r)=t in the list table. The j-th and r-th characters in the dictionary are switched, the j-th and s-th numbers of occurrences in the list table listing the numbers of occurrences vs. intervals are switched, and the j-th and t-th cumulative numbers of occurrences in the list table listing the cumulative numbers of occurrences vs. intervals are switched. In other words, switching of the numbers of occurrences I(j)=s, switching of cumulative numbers of occurrences D(j)=t, switching of dictionary ranks I(r)=j, and switching of dictionary characters D(r)=D(j) are carried out. Assuming that characters of, for example, ranks j-1, j-2, and j-3 higher than rank j of the input character k, which have the same number of occurrences as the input character k, are present, the highest rank r=j-3a is obtained as a switching destination, and the characters of ranks r and j are switched together with the numbers of occurrences and cumulative numbers of occurrences. At step S5, the number of occurrences freq[k] of the switched input character k is incremented by one. The cumulative numbers of occurrences cum freq[ ] associated with ranks r+1 and higher are incremented by one. Needless to say, the total number of occurrences cum freq[0] is also incremented by one. Control is then returned to step S2, and one character is input. The foregoing processing is repeated until no source data is present.

The flowchart of FIG. 6 describes multi-value arithmetic coding in which the two-fold history of an occurring character taking account of the history relative to an immediately preceding character, that is, the subordinate relationship of the character to a one-order context is estimated (refer to the reference literature (5) written by D. M. Abrahamson). In the two-fold history estimation, a combination of two consecutive characters is taken account, a dictionary is created for each character, and the occurrence frequencies of characters immediately succeeding each character are registered in the dictionary. For example, in the dictionary for character a, characters succeeding character a, for example, b of ab and c of ac, are registered. The numbers of occurrences of the characters succeeding character a are obtained and registered. At step S1 of initialization, values D(p, i) are allocated to the items of the dictionary D in one-to-one correspondence with characters i succeeding character p. Here, p and i assume 1, 2, etc., and A. A denotes the number of alphabets. Numbers assigned to characters shall be I(p, 1). Here, p and i assume 1, 2, etc. and A. The other operations are identical to those in the one-fold history estimation described in FIG. 5.

Aside from arithmetic coding, entropy coding in which the tree structure shown in FIG. 2B is used for dynamic encoding includes dynamic Huffman coding and splay coding that is a kind of self-organization coding. For the details of the dynamic Huffman coding, refer to "Dynamic Huffman Coding" (Journal of Algorithms, Vol. 6, p.163–180, 1985) written by D. E. Knuth, "Design and Analysis of Dynamic Huffman Codes" (Journal of ACM, Vol. 34, No. 4, p.825–845, 1987) written by J. S. Vitter, and Chapter 5 in "Guide to Document Data Compression Algorithms" (CQ Publishing Co., Ltd. (1994), Patent No. 94-11634) written by Tomohiko Uematsu[6]. For the details of the splay coding, refer to "Application of Splay Tree to Data Compression" (Commun. of ACM, Vol. 31, No. 8, p.996–1007, 1987) (Patent No. 94-01147) written by D. W. Jones[7].

However, the known probability statistical coding poses a problem that it is quite time-consuming. This is because, as shown in FIG. 1, after the occurrence frequency modeling unit 400 calculates an occurrence frequency, the entropy coding unit 402 carries out dynamic encoding. When the occurrence frequency modeling unit 402 handles a blend context, the subordinate relationship such as a conditional probability to a context is obtained orderly from a large-order context to a small-order context. The processing time is therefore very long. The known probability statistical coding cannot therefore be utilized in practice.

Moreover, the known coding is fundamentally intended to handle an English text mainly, for example, ASCII 8-bit codes and perform byte-by-byte encoding in a bytes-stream direction.

The known coding techniques are not very efficient in compression of data whose word structure consists of a plurality of bytes, such as, a Uni code of two bytes long adopted as an international language code, a Japanese code, full-color image data composed of three-byte red, green, and blue data, and a 4-byte or 8-byte program code.

In short, according to the known coding techniques, since data whose word structure consists of a plurality of bytes is processed byte by byte, the processing is time-consuming. For example, when byte-by-byte encoding is adapted to an example of extending the length of data into a word length, if one byte is extended to two bytes, an amount of data, processing time, and storage capacity that are 256 times as large as those needed for efficient compression of one byte are needed for satisfactorily efficient compression of two bytes. The known coding techniques cannot therefore be used in practice.

SUMMARY OF THE INVENTION

According to the present invention, there are provided a data compression system and data restoration system capable of efficiently carrying out probability statistical coding and decoding of multi-value data of multiple bytes long and shortening processing time to a practical level.
Pipelined processing of fixed-order content.

The present invention provides a data compression system for encoding an input character on the basis of a conditional appearance rate obtained in relation to an immediately preceding character string. The data compression system uses a pipeline control unit to cause an occurrence frequency modeling unit and entropy coding unit to operate in pipelining. To be more specific, the conditional appearance rate of an input character to be linked to an immediately preceding character string is registered for each character in a frequency date storage unit. The occurrence frequency modeling unit retrieves a conditional appearance rate by referencing the frequency data storage unit according to an input character, and updates the contents of the frequency data storage unit. The entropy coding unit encodes an input character on the basis of a conditional appearance rate retrieved by the occurrence frequency modeling unit. The pipeline control unit enables the occurrence frequency modeling unit for inputting a character and obtaining the conditional appearance rate of the character, and the entropy coding unit performs entropy coding on the input character on the basis of a conditional appearance rate obtained in relation to an immediately preceding input character to operate in pipelining. Owing to the pipelining of the occurrence frequency modeling unit and entropy coding unit, processing time can be shortened and probability statistical coding can be speeded up.

Moreover, the present invention provides a data restoration system for restoring a character from an input code on the basis of a conditional appearance rate obtained in relation to an already-restored immediately preceding character string. The data restoration system uses a pipeline control unit to cause an entropy decoding unit and occurrence frequency modeling unit to operate in pipelining. The entropy decoding unit obtains a conditional appearance rate on the basis of an input code in relation to an already-restored immediately preceding character string. In a frequency data storage unit, the conditional appearance rate of an input character to be linked to an immediately preceding character string is registered for each character. The occurrence frequency modeling unit restores a character by referencing the frequency data storage unit according to a conditional appearance rate derived from the input code, and updates the contents of the frequency data storage unit. The pipeline control unit causes the entropy decoding unit for obtaining a conditional appearance rate derived from an input code and the occurrence frequency modeling unit for restoring a character on the basis of a conditional appearance rate obtained in relation to an immediately preceding code to operate in pipelining. Owing to the pipelining of the entropy decoding unit and occurrence frequency modeling unit, processing time can be shortened and probability statistical decoding can be speeded up.
(Parallel processing of part of blend content)

The present invention provides a data compression system and data restoration system in which occurrence frequency modeling units associated with orders are operated in parallel for modeling a blend context. A data compression system for handling data having a blend context encodes a character on the basis of a conditional appearance rate relative to a context of each order orderly from a large-order context that is a immediately preceding long character string to a small-order context that is a immediately preceding short character string, and has occurrence frequency modeling units associated, for example, with zero-order, one-order, and two-order contexts operated in parallel. The occurrence frequency modeling units associated with orders each include a frequency data storage unit in which the conditional appearance rate of an input character to be linked to an immediately preceding character string is registered for each character relative to each order, retrieve the conditional appearance rate of an input character to be linked to an immediately preceding character string that is a context of each order by referencing the frequency data storage unit, and update the contents of the frequency data storage unit. The occurrence frequency modeling units associated with orders are succeeded by an entropy coding unit that encodes a character on the basis of a conditional appearance rate relative to each order, which is output from each of the occurrence frequency modeling units associated with orders, orderly from a large-order context to a small-order context. Moreover, pipelining is realized by installing a pipeline control unit for causing the occurrence frequency modeling units associated with orders and the entropy coding unit to operate in pipelining.

A data restoration system for handling data having a blend context restores a character from an input code in relation to a context of each order orderly from a large-order context that is an already-restored immediately preceding long character string to a small-order context that is an already-restored immediately preceding short character string. For parallel processing in the data restoration system, occurrence frequency modeling units associated with, for example, zero-order, one-order, and two-order contexts are operated in parallel. An entropy decoding unit obtains a conditional appearance rate on the basis of an input code in relation to a context of each order that is an already-restored immediately preceding character string orderly from a large-order context to a small-order context. The occurrence frequency modeling units, associated with orders each have a frequency data storage unit in which the conditional appearance rate of an input character to be linked to an immediately preceding character string is registered for each character relative to each order, operate in parallel with the other modeling units to restore a character by referencing the frequency data storage unit according to a conditional appearance rate relative to each order which is obtained by the entropy decoding unit, and to update the contents; of the frequency data storage unit. For pipelining in the data restoration system, a pipeline control unit is included to enable the entropy decoding unit and the occurrence frequency model units associated with orders to operate in pipelining.

The present invention also provides a data compression system and data restoration system in which occurrence frequency modeling units and entropy coding units are associated with orders and operated in parallel for the purpose of modeling a blend context. The data compression system has occurrence frequency modeling units and entropy coding units associated independently with orders, for example, a zero-order, one-order, and two-order and operated in parallel, and includes a code merging unit. The occurrence frequency modeling units associated with orders each include a frequency data storage unit in which the conditional appearance rate of an input character to be linked to an immediately preceding character string is registered for each character relative to each order, retrieve in parallel with the other modeling units the conditional appearance rate of an input character to be linked to an immediately preceding character string that is a context of each order by referencing the frequency data storage unit, and update the contents of the frequency data storage units. The entropy coding units associated with orders operate in parallel to carry out entropy coding on the basis of the conditional appearance rates of input characters to be linked to immediately preceding character strings that are contexts of orders which are output from the occurrence frequency modeling units. The code merging unit merges and outputs all codes supplied from the entropy coding units associated with orders. For pipelining in the data compression system, a pipeline control unit is included for enabling the plurality of occurrence frequency modeling units and the plurality of entropy coding units, which are associated with orders, to operate in pipelining.

A data restoration system includes a code separating unit, entropy decoding units independently associated with orders, and a plurality of occurrence frequency modeling units independently associated with the orders, and has the entropy decoding units and occurrence frequency modeling units operated in parallel in relation to the orders. The code separating unit separates input codes into codes corresponding to characters having contexts of orders. The entropy decoding units associated with orders operate in parallel to obtain conditional appearance rates relative to the orders on the basis of codes, which correspond to characters having contexts of the orders and are separated by the separating unit, in relation to already-restored immediately preceding character strings that are contexts of the orders. The occurrence frequency modeling units associated with orders each include a frequency data storage unit in which the conditional appearance rate of an input character to be linked to an immediately preceding character string is registered for each character relative to each order, and operate in parallel with the other modeling units so as to restore a character by referencing the frequency data storage unit thereof according to a conditional appearance rate relative to each order obtained by each of the entropy decoding units associated with orders, and to update the contents of the frequency data storage unit thereof. For pipelining in the data restoration system, a pipeline control unit is included for enabling the entropy decoding units and occurrence frequency modeling units to operate in pipelining in relation to orders. For modeling a blend context, when the occurrence frequency modeling units and entropy coding units associated with orders are operated in parallel, the occurrence frequency modeling units in the data compression system or data restoration system each retrieve, register, and update information needed to draw a conditional appearance rate, that is, a rank, the number of occurrences, a cumulative number of occurrences, and a total number of occurrences within a context. The entropy coding units and entropy decoding units carry out arithmetic coding and arithmetic decoding respectively. The pipeline control unit enables the occurrence frequency modeling units to achieve pipelined reading, addition, and writing of a rank, the number of occurrences, a cumulative number of occurrences, and a total number of occurrences within a context which are needed to draw a conditional appearance rate, for each information. Moreover, the pipeline control unit computes an upper extreme and lower extreme defining an arithmetic code space in parallel.

(Coding in a word-stream direction)

According to the present invention, there are provided a data compression system and data restoration system capable of efficiently performing dictionary coding and decoding or probability statistical coding and decoding byte by byte in a word-stream direction, and shortening processing time to a practical level.

A data compression system encodes word data of a plurality of bytes long word by word. The data compression system comprises a byte array converting unit for separating word data byte by byte and converting the word data into a byte data stream composed of byte positions, a plurality of byte-by-byte encoding units for encoding input byte data items of byte positions provided by the byte array converting unit according to conditional appearance rates relative to encoded byte data items, and a merging unit for merging and outputting all codes produced by the plurality of byte-by-byte encoding units. In encoding for compressing a Unicode or Japanese code of 2 bytes long, full-color image data composed of 3-byte red, green, and blue data, or a program code of 4 or 8 bytes long, byte data items of the same byte position within word data have a strong correlation. Unlike a prior art providing byte-by-byte encoding in a byte-stream direction, the present invention provides byte-by-byte encoding in a word-stream direction. The correlation at the same byte position within a word can be reflected on encoding, and satisfactory compression efficiency can be expected.

Dictionary coding units or probability statistical coding units are used as the byte-by-byte encoding units. If the byte-by-byte encoding units are probability statistical coding units, occurrence frequency modeling units, entropy coding units, and pipeline control units are included.

In the case of data having a fixed-order context in which the number of bytes implied by a context is fixed, the occurrence frequency modeling units each include a frequency data storage unit in which the conditional appearance rate of an input byte data item to be linked to an immediately preceding byte data stream is registered for each byte data item. The conditional appearance rate of an input byte data item to be linked to an immediately preceding byte data stream is retrieved by referencing the frequency data storage unit, and the contents of the frequency data storage unit are updated. The entropy coding units encode input byte data items on the basis of conditional appearance rates obtained by the occurrence frequency modeling units. The pipeline control units cause the occurrence frequency modeling units and entropy coding units to operate in pipelining.

If the byte-by-byte encoding units are probability statistical coding units, when data having a blend context in which the number of immediately preceding characters is not fixed but varied is handled, the occurrence frequency modeling units, which are associated with orders, each include a frequency data storage unit in which the conditional appearance rate of an input byte data item to be linked to an immediately preceding byte data stream is registered for each byte data item relative to a context of each order ranging from a large-order context that is an immediately preceding long byte data stream to a small-order context that is an immediately preceding short byte data stream, retrieve the conditional appearance rate of an input byte data item to be linked to an immediately preceding byte data stream that is a context of each order by referencing the frequency data storage unit, and update the contents of the frequency data storage unit.

Moreover, the entropy coding units encode input byte data items on the basis of conditional appearance rates relative to orders obtained by the plurality of occurrence frequency modeling units orderly from a large-order context to a small-order context. The pipeline control unit causes the plurality of occurrence frequency modeling units and entropy coding units to operate in pipelining. For encoding in a word-stream direction, parallel processing and pipelining realize a data compression system in which processing time is shortened to a practical level.

A data restoration system restores word data from codes produced by a data compression system. The data restoration system comprises a code separating unit for separating codes corresponding to byte positions constituting word data from an input code stream, a plurality of byte-by-byte decoding units for restoring byte data items from input codes corresponding to byte positions separated by the code separating unit on the basis of the conditional appearance rates of already-restored byte data items of the same byte positions as the input codes, and a switching output unit for arranging byte data items restored by the plurality of byte-by-byte decoding units by byte position and outputting word data.

Even in the data restoration system, in line with the data compression system, the byte-by-byte decoding units are realized with dictionary decoding units or probability statistical decoding units. For handling data having a fixed-order context, each probability statistical decoding unit includes an entropy decoding unit for obtaining a conditional appearance rate on the basis of an input code in relation to an already-restored immediately preceding byte data stream, an occurrence frequency modeling unit having a frequency data storage unit in which the conditional appearance rate of an input byte data item to be linked to an immediately preceding byte data stream is registered for each byte data item, restoring a byte data item by referencing the frequency data storage unit according to a conditional appearance rate obtained by the entropy decoding unit, and updating the contents of the frequency data storage unit, and a pipeline control unit for causing the entropy decoding unit and occurrence frequency modeling unit to operate in pipelining.

For data having a blend context, each probability statistical decoding unit comprises entropy decoding units for obtaining conditional appearance rates on the basis of input codes in relation to already-restored byte data streams that are contexts of orders ranging from a large-order context to a small-order context orderly from the large-order context to the small-order context, a plurality of occurrence frequency modeling units each having a frequency data storage unit in which the conditional appearance rate of an input byte data item to be linked to an immediately preceding byte data stream is registered for each byte data item relative to a context of each order, restoring a byte data item by referencing the frequency data storage unit according to a conditional appearance rate relative to each order obtained by the entropy decoding unit, and updating the contents of the frequency storage unit, and a pipeline control unit for causing the entropy decoding units and the plurality of occurrence frequency modeling units to operate in pipelining.

When arithmetic coding is adopted as probability statistical coding, in either the data compression system or data restoration system, the occurrence frequency modeling units each retrieve, register, and update information necessary for drawing a conditional appearance rate, that is, a rank, the number of occurrences, a cumulative number of occurrences, and a total number of occurrences within a context. The entropy coding units and entropy decoding units carry out arithmetic coding and arithmetic decoding respectively.

(Switching encoding and decoding in a word-stream direction into encoding and decoding in a byte-stream direction or vice versa)

According to another aspect of the present invention, byte-by-byte encoding and decoding in a word-stream direction is timely switched into byte-by-byte encoding and decoding in a byte-stream direction or vice versa. A data compression system for encoding word data of a plurality of bytes long word by word comprises a byte array converting unit, word-stream encoding unit, byte-stream encoding unit, and code switching unit. The byte array converting unit separates input word data into byte data items, then converts the byte data items into a two-dimensional array composed of a plurality of words arranged in the word-stream and byte-stream directions, and holds the two-dimensional array composed of ea plurality of words (corresponding to the order of a context). The word-stream encoding unit encodes byte data items of an input word, which are arranged in the word-stream direction in the two-dimensional array by the byte array converting unit, according to conditional appearance rates relative to byte data items of the same byte positions among a group of encoded word data items, and thus produces word-stream codes. This operation is equivalent to the one performed by the data restoration system shown in FIG. 3. The byte-stream encoding unit encodes byte data items of an input word, which are arranged in the byte-stream direction in the two-dimensional array by the byte array converting unit, according to conditional appearance rates relative to preceding byte data items, and thus produces bytes-stream codes. This operation is equivalent to the one performed by the known data compression system that fetches a byte data stream as it is and encodes it byte by byte. The code switching unit switches and outputs a word-stream code and byte-stream code. For example, the code switching unit switches code outputs according to the strengths of correlations between word-stream codes and between byte-stream codes. Between a word-stream code and byte-stream code, a code having a smaller code length is selected. The code switching unit switches and outputs word-stream codes and byte-stream codes byte by byte. Alternatively, the code switching unit may switch and output word-stream codes and byte stream codes word by word. Furthermore, the code switching unit appends a switch code at every switching of a word-stream code and byte-stream code. The code switching unit uses ea switch code based on the occurrence frequency of each past code as a switch code for switching a word-stream code and byte-stream code.

A data restoration system for restoring word data from codes produced by a data compression system comprises a code separating unit, word-stream decoding unit, byte-stream decoding unit, and output switching unit. The code separating unit inputs a code stream and separates it into word-stream codes or byte-stream codes corresponding to byte positions constituting one word. The word-stream decoding unit restores byte data items from word-stream codes separated by the separating unit on the basis of the conditional appearance rates of already-restored byte data items of the same byte positions as the word-stream codes. The byte-stream decoding unit restores byte data items from byte-stream codes separated by the code separating unit on the basis of the conditional appearance rates of already-restored preceding byte data items. The output switching unit outputs word data restored by concatenating byte data items, which are restored by the word stream decoding unit or byte stream decoding unit, by byte position.

According to the encoding in the word-stream direction, improved compression efficiency can be expected for encoding of word data of many bytes long, such as, a Uni-code or Japanese code of 2 bytes long, full-color image data composed of 3-byte red, green, and blue data, a program code of 4 bytes or 8 bytes long. However, depending on word data, the known encoding in the byte-stream direction may permit higher compression efficiency. In some cases, it cannot be determined which of the coding techniques is better. From this viewpoint, the same byte data is handled in both the word-stream direction and byte-stream direction, and either a word-stream code or byte-stream code resulting from encoding with higher compression efficiency is selected. This leads to further improvement of compression efficiency.

The above and other objects, features, and advantages of the present invention will become more apparent from the following detailed description with reference to the drawings.

BRIEF DESCRIPTION OF THE DRAWINGS

FIGS. 7A and 7B are block diagrams of the fundamental configuration of a data compression system in which pipelining is attained for handling a fixed-order context;

FIGS. 8A and 8B are block diagrams of a data compression system in which arithmetic coding is adopted as entropy coding illustrated in FIGS. 7A and 7B;

FIGS. 9A and 9B are block diagrams of the detailed configuration of the data compression system illustrated in FIG. 8A;

FIG. 10 is an explanatory diagram of a frequency data storage unit shown in FIG. 9A;

FIG. 12 is an explanatory diagram of comparison with an interval [1, 0] used to produce output codes illustrated in FIG. 11;

FIGS. 14A and 14B are block diagrams of the fundamental configuration of a data restoration system in which pipelining is attained for handling a fixed-order context;

FIGS. 16A and 16B are block diagrams of the detailed configuration of the data restoration system shown in FIG. 15A;

FIGS. 17A and 17B are timing charts of pipeline operations in the system shown in FIGS. 16A and 16B;

FIGS. 23A and 23B are block diagrams of the detailed configuration of the data restoration system shown in FIG. 22A;

FIGS. 24A and 24B are timing charts of pipeline operations in the system shown in FIGS. 23A and 23B;

FIGS. 26A and 26B are explanatory diagrams of a basic block of a data compression system the whole of which operates in parallel so as to handle a blend context, and operations of the basic block;

FIGS. 27A to 27C are block diagrams of the detailed configuration of the data compression system shown in FIG. 26A;

FIGS. 28A and 28B are timing charts of pipeline operations in the system shown in FIGS. 27A to 27C;

FIGS. 31A and 31B are timing charts of pipeline operations in the system shown in FIGS. 30A and 30B;

FIG. 38 is an explanatory diagram of encoding in a word-stream direction with one word of 4 bytes long taken for instance;

FIGS. 43A and 43B are block diagrams of the data compression system shown in FIG. 34 in which probability statistical coding is implemented;

FIGS. 44A to 44D are timing charts of pipelined encoding in the system shown in FIG. 43;

FIGS. 49A and 49B are block diagrams of the data restoration system shown in FIG. 45 in which probability statistical decoding is implemented;

FIGS. 50A to 50D are timing charts of pipelined decoding in the system shown in FIG. 49;

FIGS. 54A and 54B are explanatory diagrams of pipeline control given when arithmetic decoding is adapted for decoding byte data in a word-stream direction;

FIGS. 56A to 56C are timing charts of encoding in the system shown in FIG. 55;

FIG. 58 is a flowchart of encoding in which a switch selection code is appended to each compressed byte data item;

FIGS. 60A to 60C are block diagrams of a byte array converting unit, word stream encoding unit, and byte stream encoding unit included in an embodiment of the data compression system, shown in FIG. 55, in which probability statistical coding for processing all the contexts of a blend context in parallel is implemented;

FIG. 65 is a flowchart describing decoding of compressed data, in which a switch selection code is appended to each compressed word, in the system shown in FIG. 62;

FIGS. 67A and 67B are block diagrams of a word-stream encoding unit and byte-stream encoding unit included in the embodiment, shown in FIG. 62, in which probability statistical coding for processing all the contexts of a blend context in parallel is implemented; and FIG. 68 is a block diagram of a switching output unit included in the embodiment, shown in FIG. 62, in which probability statistical coding for processing all the contexts of a blend context in parallel is implemented.

Figure 1:
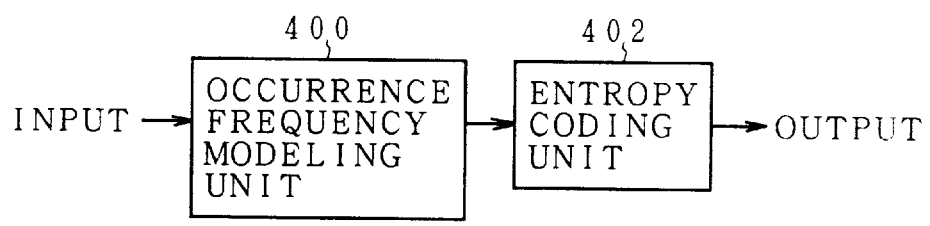
FIG. 1 is a block diagram of the fundamental configuration of a known probability statistical data compression system.
Figure 2A:
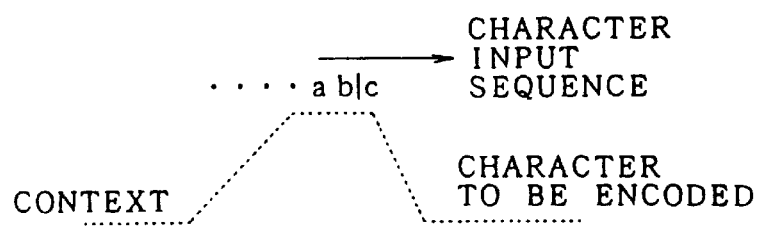
FIGS. 2A and 2B are explanatory diagrams of the tree structure of a context relative to a character string and a conditional probability.
Figure 2B:
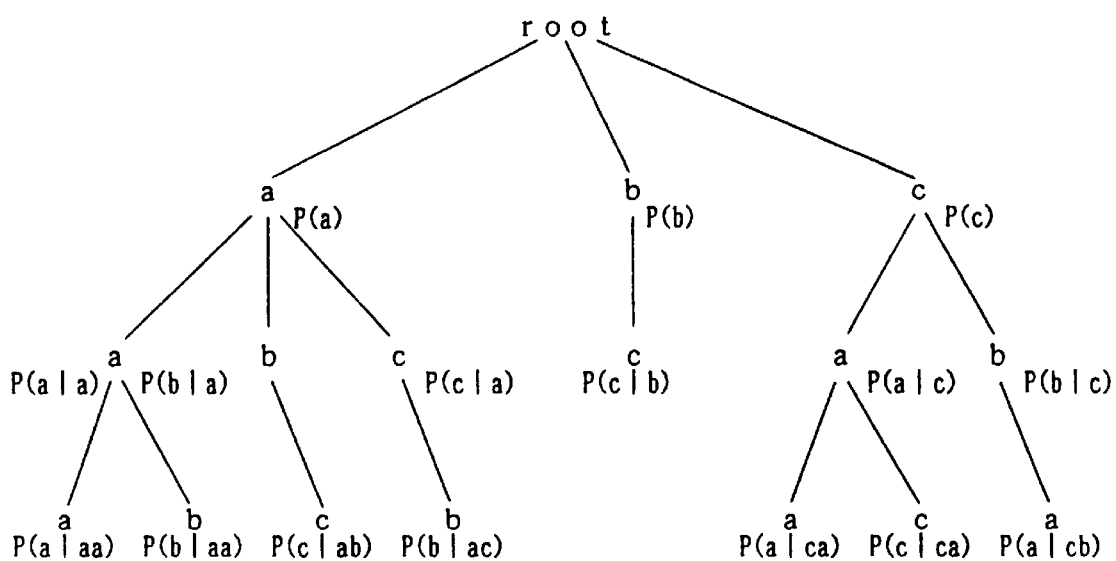
Figure 3A:
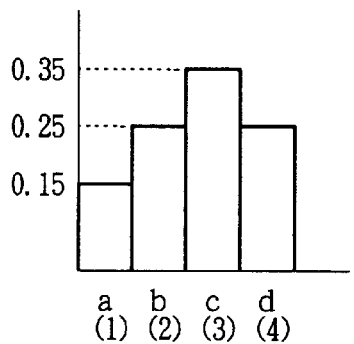
FIGS. 3A to 3C explanatory diagrams of the principles of known multi-value arithmetic coding.
Figure 3B:
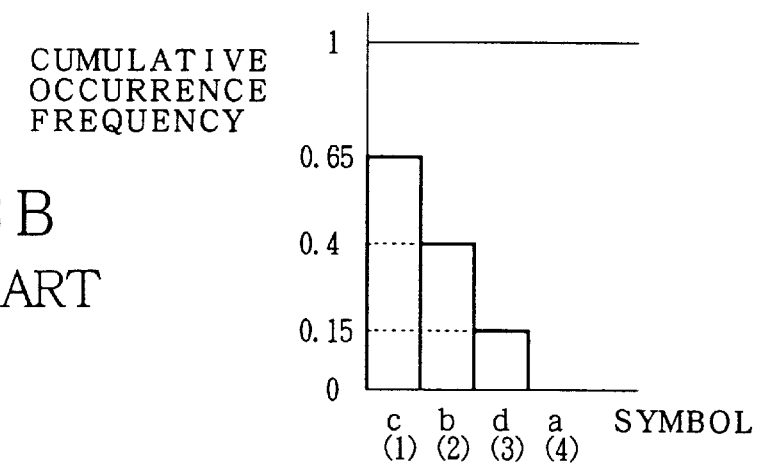
Figure 3C:
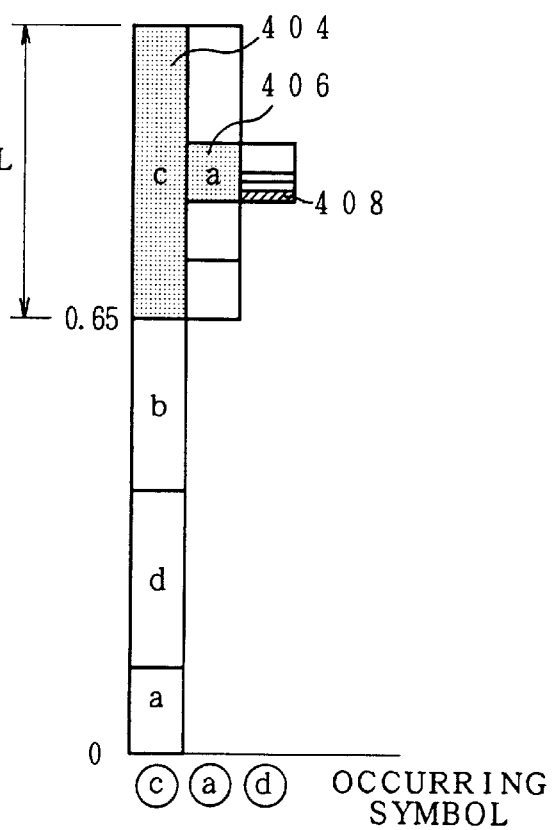

DESCRIPTION OF THE PREFERRED EMBODIMENTS (Pipelined processing of a fixed-order context)

FIGS. 7A and 7B show the fundamental configuration of a probability statistical type data compression system in accordance with the present invention. The data compression system comprises, as shown in FIG. 7A, an occurrence frequency modeling unit 10 and entropy coding unit 12. The occurrence frequency modeling unit 10 and entropy coding unit 12 are controlled to operate in pipelining by means of a pipeline control unit 11. The occurrence frequency modeling unit 10 inputs a leading character of a character string prepared as source data and retrieves the conditional appearance rate of the input character to be linked to an immediately preceding character string. Specifically, the occurrence frequency modeling unit 10 includes a frequency data storage unit in which the conditional appearance rate of an input character to be linked to an immediately preceding character string is registered for each character. The occurrence frequency modeling unit 10 references the frequency data storage unit according to an input character of source data and retrieves the conditional appearance rate associated with the input character. After the conditional appearance rate of the input character is retrieved, the contents of the frequency data storage unit are updated. The entropy coding unit 12 performs entropy coding on the basis of the conditional appearance of the input character provided by the occurrence frequency modeling unit 10. Coding adopted by the entropy coding unit 12 may be multi-value arithmetic coding, dynamic Huffman coding, or splay coding that is one kind of self-organization coding.

FIG. 7B illustrates the pipelined operations of the occurrence frequency modeling unit 10 and entropy coding unit 12 under the control of the pipeline control unit 11. In the drawing, the axis of time is defined with time cycles T1, T2, and T3. Assume that characters a, b, a, etc. of source data are input. First, the leading character a is input to the occurrence frequency modeling unit 10 during cycle T1, and the conditional appearance rate of the input character a is obtained. During the next cycle T2, the second character b is input to the occurrence frequency modeling unit 10, and the conditional appearance rate of the input character b is obtained. Concurrently, the conditional appearance rate of the first character a which is obtained during cycle T1 is fed to the entropy coding unit 12. Entropy coding is then carried out on the basis of the frequency of the input character a. Likewise, when the occurrence frequency modeling unit 10 inputs one character and obtains the conditional appearance rate of the character, the entropy coding unit 12 carries out entropy coding on the basis of the conditional appearance rate obtained previously by the occurrence frequency modeling unit 10 at the same time. Thus, the occurrence frequency modeling unit 10 and entropy coding unit 12 independently operate in pipelining under the control of the pipeline control unit 11. Consequently, probability statistical coding of a character string can be carried out more quickly.

FIG. 8A shows an embodiment of a data compression system of the present invention, that is, the data compression system shown in FIG. 7A in which arithmetic coding is implemented. When arithmetic coding is implemented, the data compression system comprises a probability modeling unit 14, arithmetic coding unit 16, and pipeline control unit 15. The probability modeling unit 14 inputs one by one characters, for example, a, b, a, etc. of a character string that is source data, and obtains a probability (occurrence frequency=normalized number of occurrences), which is a conditional appearance rate of an input character, of each input character. To be more specific, the probability modeling unit 14 includes a frequency data storage unit in which register numbers or ranks are arranged in order of number of occurrences of characters, a character symbol, the number of occurrences, and a cumulative number of occurrences are registered for each rank, and a total number of occurrences is also stored. The frequency data storage unit is referenced according to an input character a, and a rank associated with the input character a is retrieved as a conditional probability and then output to the arithmetic coding unit 16. Concurrently, the number of occurrences of the input character, a cumulative number of occurrences thereof, and a total number of occurrences, which are used to calculate an occurrence frequency and cumulative occurrence frequency through arithmetic coding, are output. The arithmetic coding unit 16 carries out multi-value arithmetic coding. Specifically, arithmetic coding is carried out on the basis of the rank, which is the conditional probability of the input character, output from the probability modeling unit 14. The arithmetic coding to be carried out on the basis of the rank of an input character that is the conditional probability of an input character is such that a code space along a number line [1, 0] is regarded as an initial space, part of a previous code space to be allotted to the input character is computed on the basis of the occurrence frequency and cumulative occurrence frequency deriving from the rank of the input character, and appropriate values defining the computed space are output as a code. In the example shown in FIG. 8A, a code is produced for each character and output as compressed data. Specifically, for the input character a, the probability modeling unit 14 obtains rank 1. The arithmetic coding unit 16 encodes the input character on the basis of rank 1, whereby code 01 is output. As for the next character b, the probability modeling unit 14 obtains rank 2. The arithmetic coding unit 16 encodes the character on the basis of rank 2, whereby code 1001 is output. As for the third character a, like the first character, arithmetical coding is carried out on the basis of rank 1. Code 01 is then output. In an actual system, characters corresponding to a given number of bytes, for example, a plurality of characters corresponding to 8 bytes are handled as one group. A code space associated with the rank of a character is computed orderly from the leading character of the group. Values defining a code space computed for the last character are output as a code.

FIG. 8B illustrates the pipelined operations of the probability modeling unit 14 and arithmetic coding unit 16 under the control of the pipeline control unit 15. During cycle T1, the probability modeling unit 14 inputs a leading character a and obtains the conditional probability of the character a, that is, rank 1. At this time, the arithmetic coding unit 16 does not perform encoding because there is no preceding rank. During the next cycle T2, the probability modeling unit 14 inputs the second character b and obtains rank 2. Concurrently, the arithmetic coding unit 16 carries out arithmetic coding on the basis of rank 1 of the input character a which is obtained during the previous cycle. Consequently, code 01 is output. During the next cycle T3, the probability modeling unit 14 inputs the same character as the first character, a, and obtains rank 1. Concurrently, the arithmetic coding unit 16 encodes the character b of rank 2 obtained during the previous cycle T2. Consequently, code 1001 is output. Likewise, the probability modeling unit 14 inputs one character and obtains the rank of the character. Concurrently, the arithmetic coding unit 16 carried out arithmetic coding on the basis of the rank obtained during the previous cycle. This sequence is repeated.

Figure 9A:
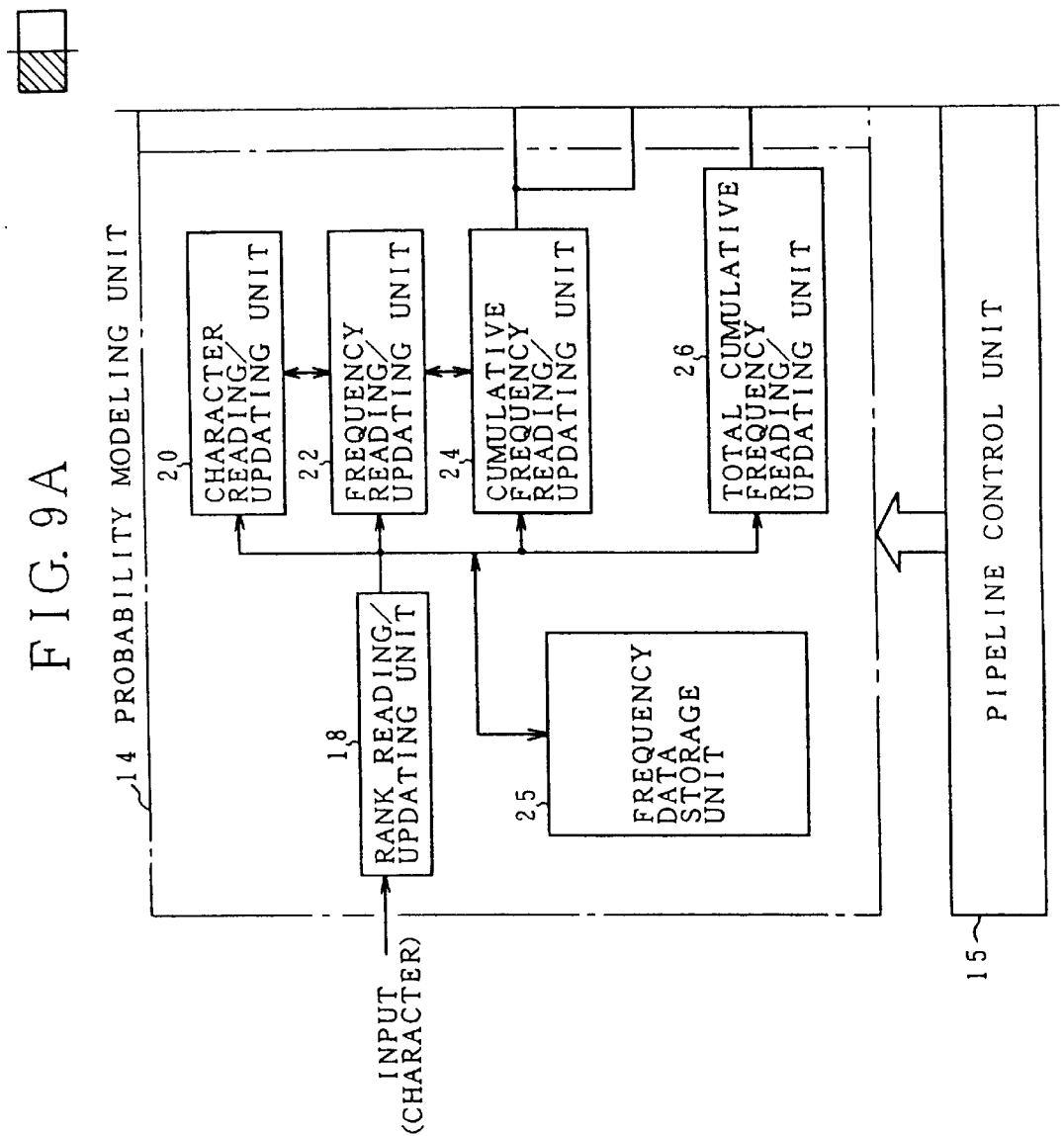

FIGS. 9A and 9B are block diagrams of the detailed configuration of a data compression system in which the arithmetic coding illustrated in FIG. 8A is implemented. The data compression system comprises a probability modeling unit 14 and arithmetic coding unit 16. The probability modeling unit 14 and arithmetic coding unit 16 are controlled to operate in pipelining by means of a pipeline control unit 15. The probability modeling unit 14 includes a rank reading/updating unit 18, character reading/updating unit 20, frequency reading/updating unit 22, cumulative frequency reading/updating unit 24, total cumulative frequency reading/updating unit 26, and frequency data storage unit 25. The arithmetic coding unit 16 includes a code space calculating unit 28 for calculating the high level of a code space, a code space calculating unit 30 for calculating the low level of the code space, and a code output unit 36. Frequency data, for example, data shown in FIG. 10 is stored in the frequency data storage unit 25 in the probability modeling unit 14.

Figure 4:
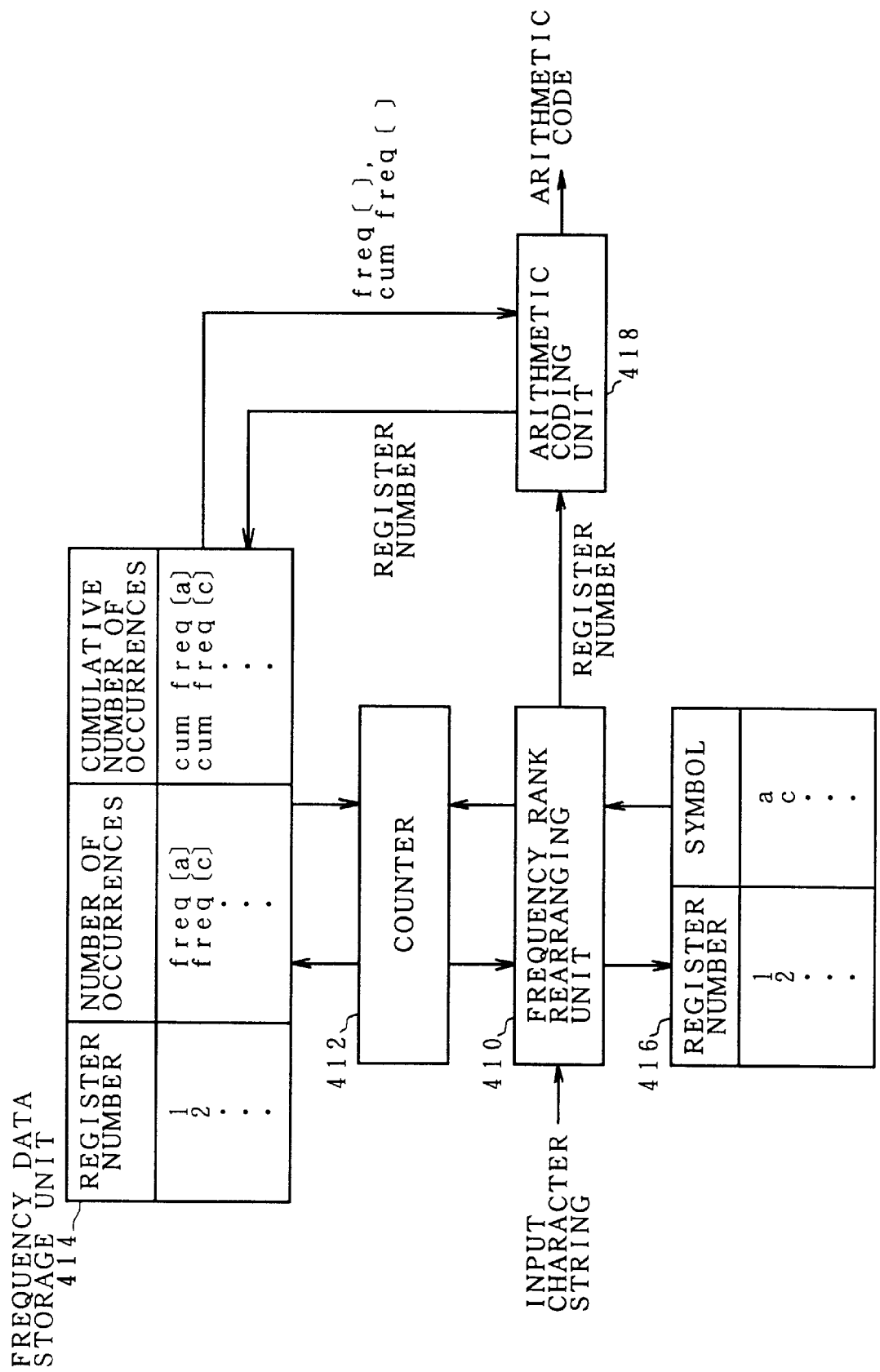
FIG. 4 is a functional block diagram of known multi-value arithmetic coding.
Figure 5:
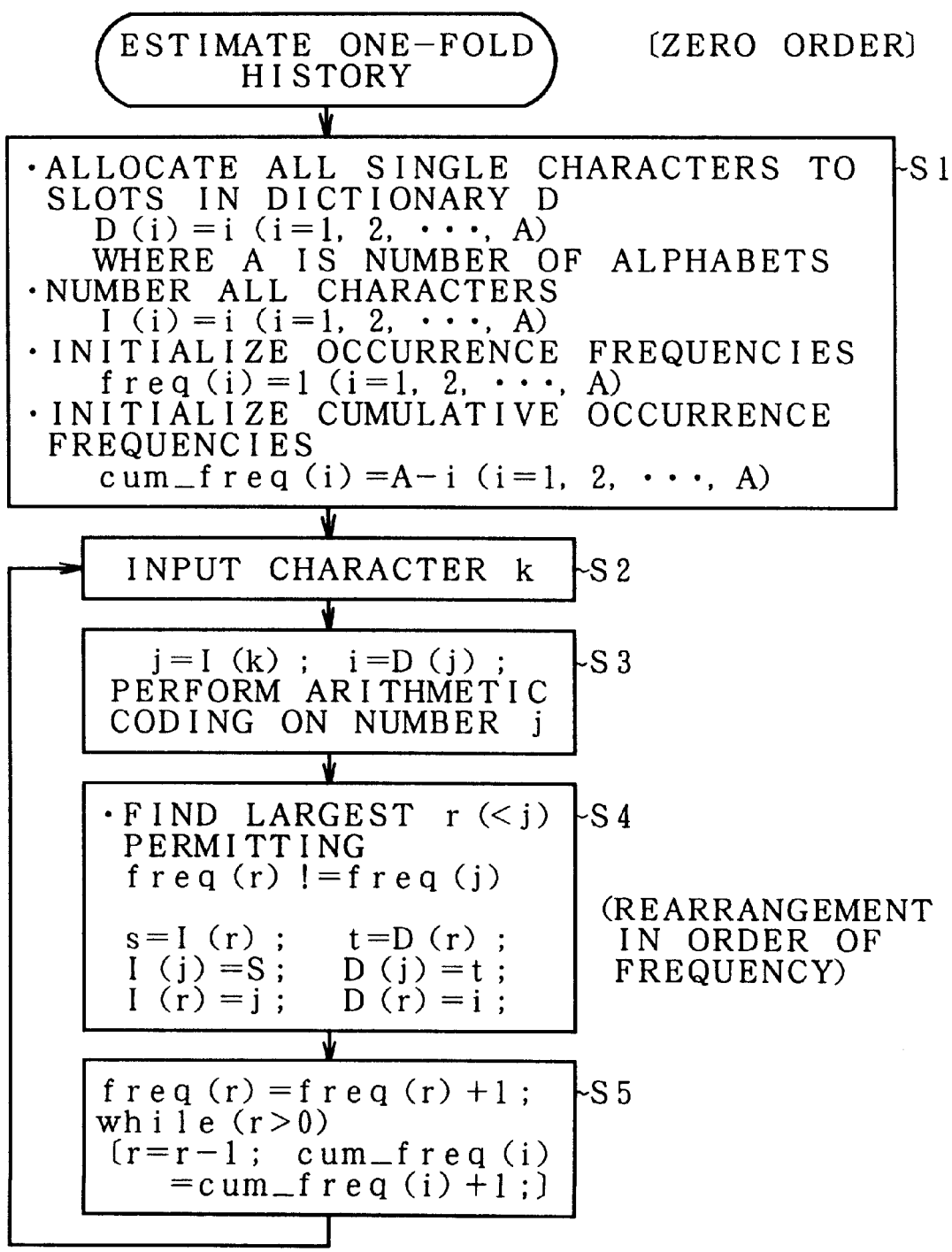
FIG. 5 is a flowchart describing known multi-value arithmetic coding based on one-fold history estimation.
Figure 6:
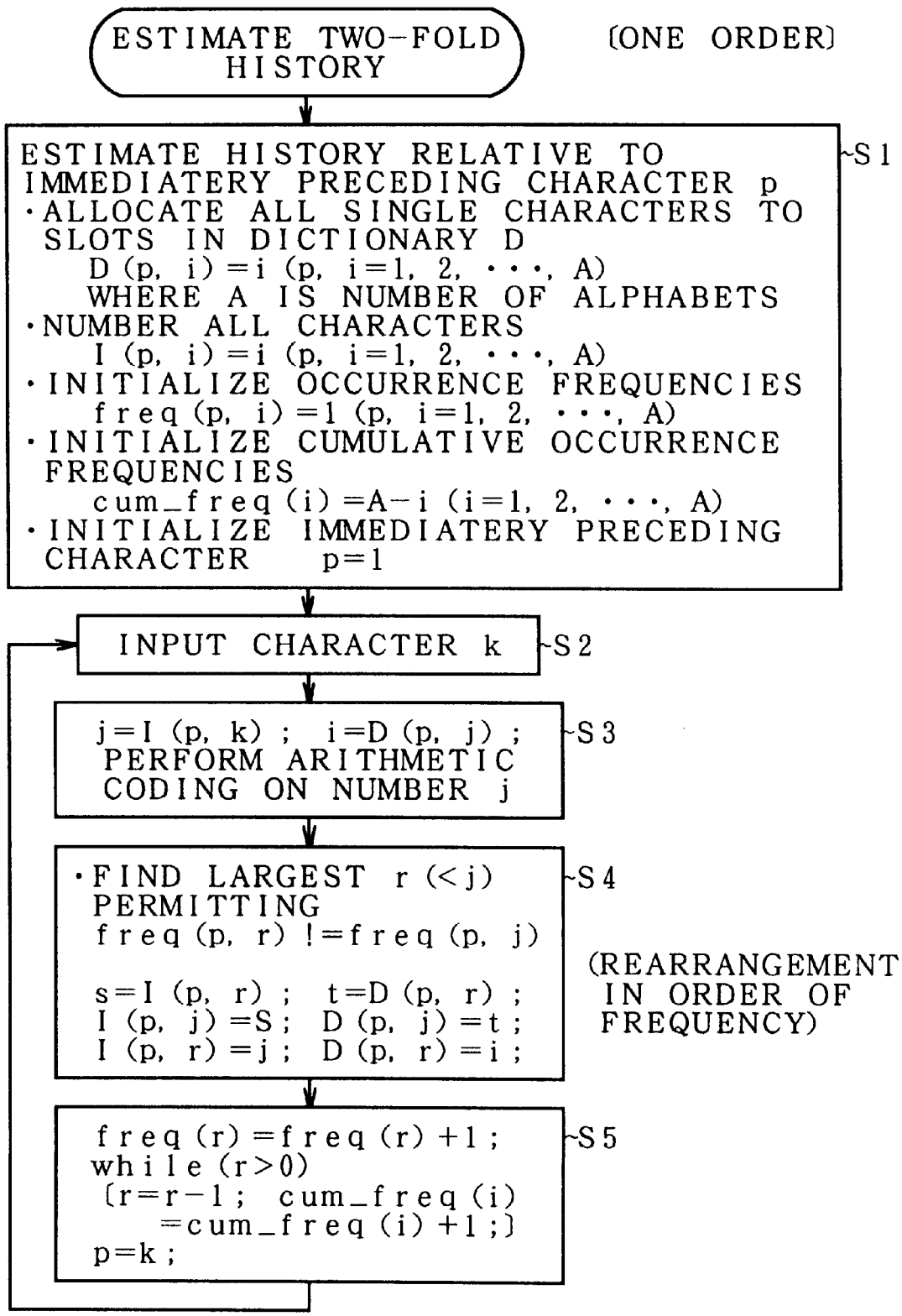
FIG. 6 is a flowchart describing known multi-value arithmetic coding based on two-fold history estimation.

Referring to FIG. 10, in the frequency data storage unit 25, character symbols K1 to K256 are registered in descending order of number of occurrences orderly from ranks 1 to 256. This registration structure of ranks and character symbols is equivalent to the dictionary 416 in the known system shown in FIG. 4. At the same time, the numbers of occurrences f(1) to f(256) of characters K1 to K256 are registered in one-to-one correspondence with ranks 1 to 256. Moreover, cumulative numbers of occurrences cf(1) to cf(246) are registered in one-to-one correspondence with the characters. The numbers of occurrences and cumulative numbers of occurrences are thus registered in the frequency data storage unit 25. An occurrence frequency is calculated as follows:

frequency=number of occurrences/total number of occurrences

A cumulative occurrence frequency is calculated as follows:

cumulative frequency=cumulative number of occurrences cf(s)/total number of occurrences S0 Incidentally, in an ordinary arithmetic coding algorithm, the number of occurrences is expressed as freq( ), and the cumulative number of occurrences is expressed as cum freq( ). In FIG. 10, however, abbreviated forms f( ) and cf( ) are employed.

Referring back to FIGS. 9A and 9B, the rank reading/updating unit 18 in the probability modeling unit 14 references the frequency data storage unit 25 at every input of a leading character of an input character string, and retrieves a registered number, i.e. rank corresponding to the input character. The result of character retrieval i.e. rank is fed to the character reading/updating unit 20. The character reading/updating unit 20 reads the rank, which is a dictionary register number associated with the retrieved input character, from the frequency data storage unit 25. The result of retrieval provided by the rank reading/updating unit 18 is also fed to the frequency reading/updating unit 22 and cumulative frequency reading/updating unit 24. The number of occurrences f( ) and cumulative number of occurrences cf( ) associated with the character are read from the frequency data storage unit 25. Furthermore, the total cumulative frequency reading/updating unit 26 reads a total number of occurrences cf(0) set at that time. The rank of the input character, the number of occurrences thereof, a cumulative number of occurrences thereof, and a total number of occurrences read from the frequency data storage unit 25 in the probability modeling unit 14 according to the input character are fed to the arithmetic coding unit 16. When reading and outputting frequency data associated with the input character is completed, the rank reading/updating unit 18, character reading/updating unit 20, frequency reading/updating unit 22, cumulative frequency reading/updating unit 24, and total cumulative frequency reading/updating unit 26 update the contents of the frequency data storage unit 25. Specifically, after the number of occurrences of the input character is incremented by one, the numbers of occurrences of characters and cumulative numbers of occurrences thereof are rearranged in descending order of number of occurrences. The arithmetic coding unit 16 computes an allotted space of an input character relative to ea previous code space as a new code space on the basis of the number of occurrences f(s) and cumulative number of occurrences cf(s) which are associated with the rank s of the input character, and the total number of occurrences cf(0)=S0, which are output from the probability modeling unit 14. For example, when an input character has rank s in FIG. 10, after the number of occurrences f(s) and cumulative number number of occurrences f(s) of the input character, and a total number of occurrences S0 are fed from the probability modeling unit 14, the cumulative number of occurrences cf(s-1) associated with rank s-1 that is next higher than rank s of the input character Ks is read, and the interval width Wnew, high level Hnew, and low level Lnew of a new interval serving as an allotted interval of the input character s are calculated. First, according to the expression (1), the previous interval width Wold is calculated. In the case of an initial character, an initial value 1.0 is set for the previous interval width Wold.

$$\text{Wold}=(\text{Hold}-\text{Lold})+1 \tag{1}$$

where Wold is a previous interval width (range), Hold is a previous upper extreme (high level), and Lold is a previous lower extreme (low level). Based on the interval width calculated according to the expression (1), the high level Hnew of the new interval and the low level Lnew thereof are calculated according to the following expressions (2) and (3):

$$\text{Hnew}=\text{Lold}+\{\text{Wold}\times cf(s-1)/S0\}-1 \tag{2}$$

where Hnew is a current upper extreme (high level), cf(s-1) is a cumulative number of occurrences associated with the next higher rank s-1, and S0 is a total number of occurrences;

$$\text{Lnew}=\text{Lold}+\{\text{Wold}\times cf(s)/S0\} \tag{3}$$

where Hnew is a current upper extreme (high level), cf(s) is a cumulative number of occurrences associated with the next higher rank s, and S0 is a total number of occurrences.

Calculating the high level Hnew of a code space according to the expressions (1) and (2) is carried out by the code space calculating unit 28. Calculating the low level Lnew of the code space according to the expressions (1) and (3) is carried out by the code space calculating unit 30. In short, the high level and low level of a new code space are calculated in parallel by the code space calculating units 28 and 30. For simplifying divisions performed by the code space calculating units 28 and 30, an inverse number calculating unit 32 calculates an inverse number 1/S0 of the total number of occurrences S0 output from the total cumulative frequency reading/updating unit 26. Owing to this calculation of the inverse number 1/S0, the divisions in the expressions (2) and (3) performed by the code space calculating units 28 and 30 can be performed as multiplication. This leads to faster processing. The high level and low level of the allotted space of the input character a which are calculated by the code space calculating units 28 and 30 are fed to an arithmetic code drawing unit 34.

Figure 11:
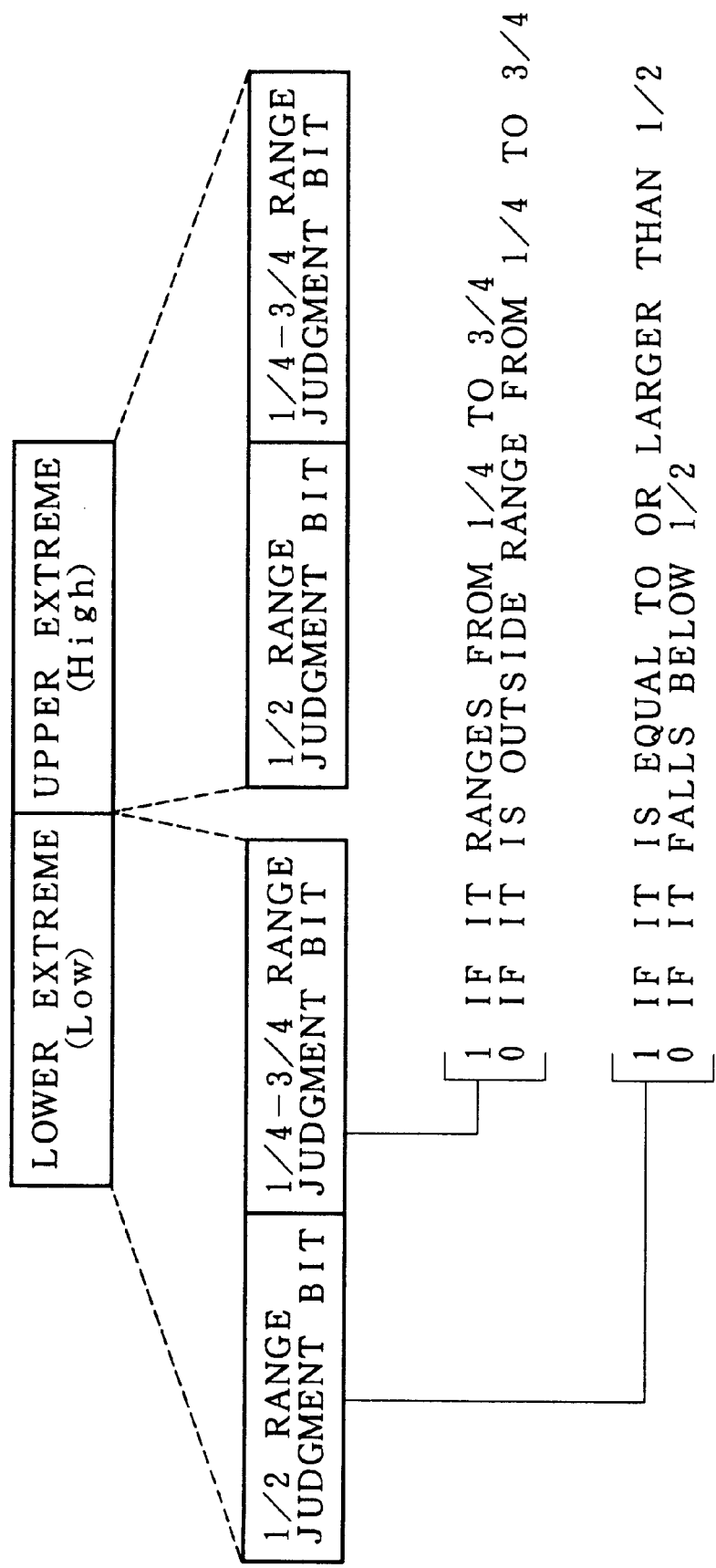
FIG. 11 is an explanatory diagram of a format of an output code resulting from arithmetic coding illustrated in FIG. 9B.

The arithmetic code drawing unit 34 produces bit information representing the high level and low level of a code space shown in FIG. 11. Specifically, as shown in FIG. 12, a previous code interval is normalized to [1, 0]. Thresholds ¼, ½, and ¾ are set in the interval [1, 0], whereby the interval is subdivided into four intervals. The newly-calculated high level and low level of an allotted interval of an input code are converted to bits in relation to subdivision intervals within the interval [1, 0]. In short, the calculated high level and low level are converted to bits under the two conditions below.

<Condition 1>

When a level is equal to or larger than ½, the level is converted to bit 1, while when the level falls below ½, it is converted to bit 0.

<Condition 2>

When a level is equal to or larger than ¼ and is equal to or smaller than ¾, the level is converted to bit 1, while when the level lies outside this range, it is converted to bit 0.

FIG. 12 shows calculated code intervals or allotted ranges within a normalized interval [1, 0] with bold lines. To begin with, the high levels of code spaces 38-1, 38-2, 39-3, and 38-4 are 1.0, and the low levels thereof lie in subdivision spaces orderly from above. In this case, an output code is represented by four bits b0, b1, b2, and b3 and assumes the values listed in FIG. 12. Taking the code space 38-1 for instance, the high level thereof is 1.0 or equal to or larger than ½ and therefore converted to b0=1 under Condition 1. Moreover, the high level is off the range from ¼ to ¾, and therefore converted to b1=0 under Condition 2. Next, the low level is equal to or larger than ½, and therefore converted to b2=1 under Condition 1. The low level is off the range from ¼ to ¾, and therefore converted to b3=0 under Condition 2. As for the code space 38-2, b0b1b2b3 becomes 1011. As for the code space 38-3, b0b1b2b3 becomes 1001. As for the code space 38-4, b0b1b2b3 becomes 1000. The high levels of the code spaces 38-1 to 38-4 are 1.0. If the high levels range from 1 to ¾, the output bits have the same values. In the case of code spaces 40-1 to 40-3, the high levels are ¾ and the low levels lie within subordinate subdivision spaces orderly. In this case, the output bits of the high levels, b0b1, are all 11, but the bits of the low levels, b2b3, are 11, 01, and 00 respectively. As for the code spaces 40-1 and 40-2, the high levels are ½ and the low levels lie within subordinate subdivision spaces orderly. In this case, the output bits of the high levels, b0b1, are 01, and the output bits of the low levels, b2b3, are 01 and 00 respectively. In the case of a code space 44, the high and low levels thereof lie within a subdivision space ranging from ¼ to 0. In this case, the output bits of both the levels, b0 to b3, are all 0. As seen from compression of the arithmetic code areas shown in. FIG. 11 with the subdivision code spaces in FIG. 12, an output code composed of bits representing low and high levels is 4-bit information composed of ½ range judgment bits and ¼–¾ range judgment bits.

Figure 13A:
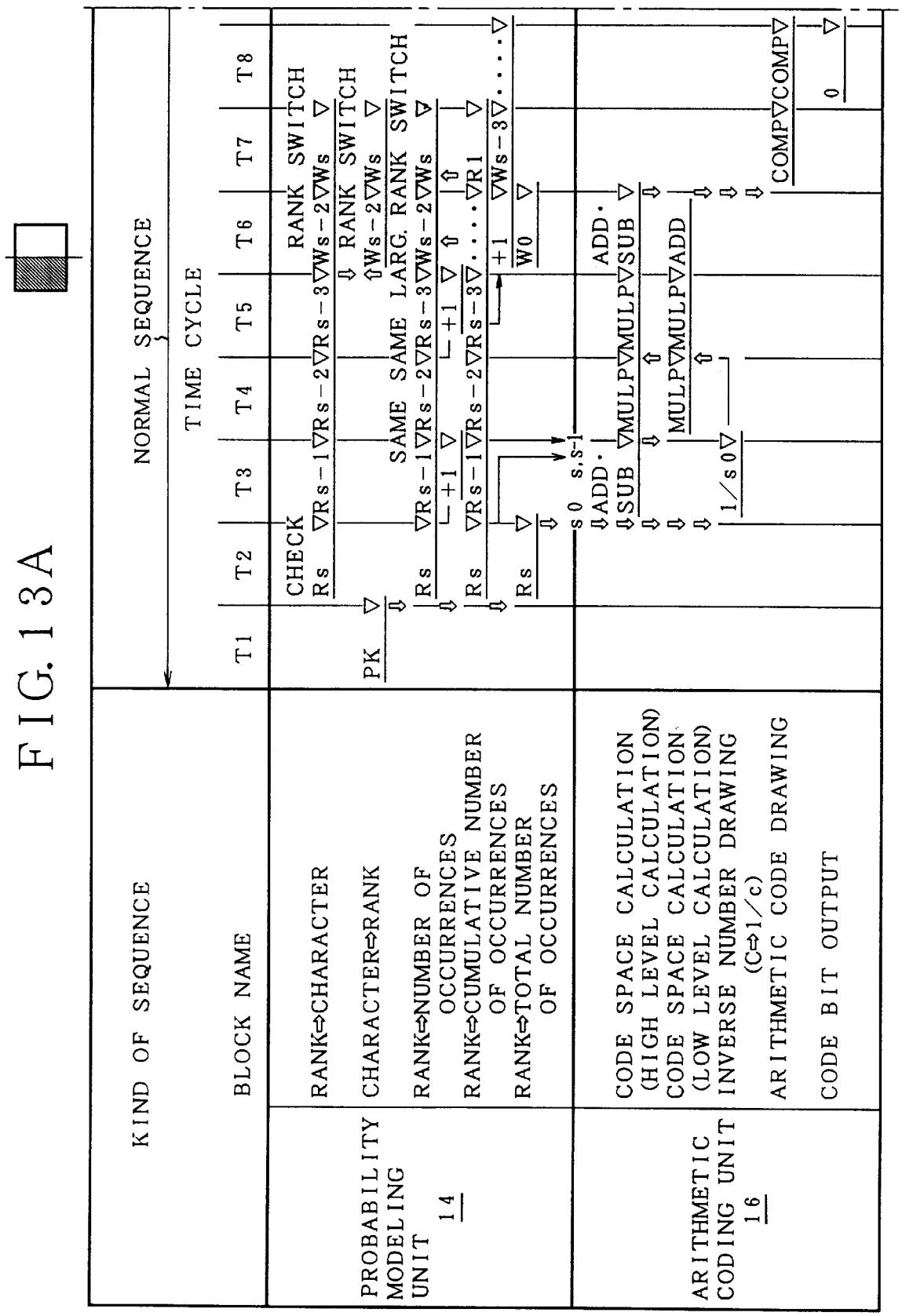
FIGS. 13A and 13B are timing charts of pipeline operations in the system shown in FIGS. 9A and 9B.
Figure 13B:
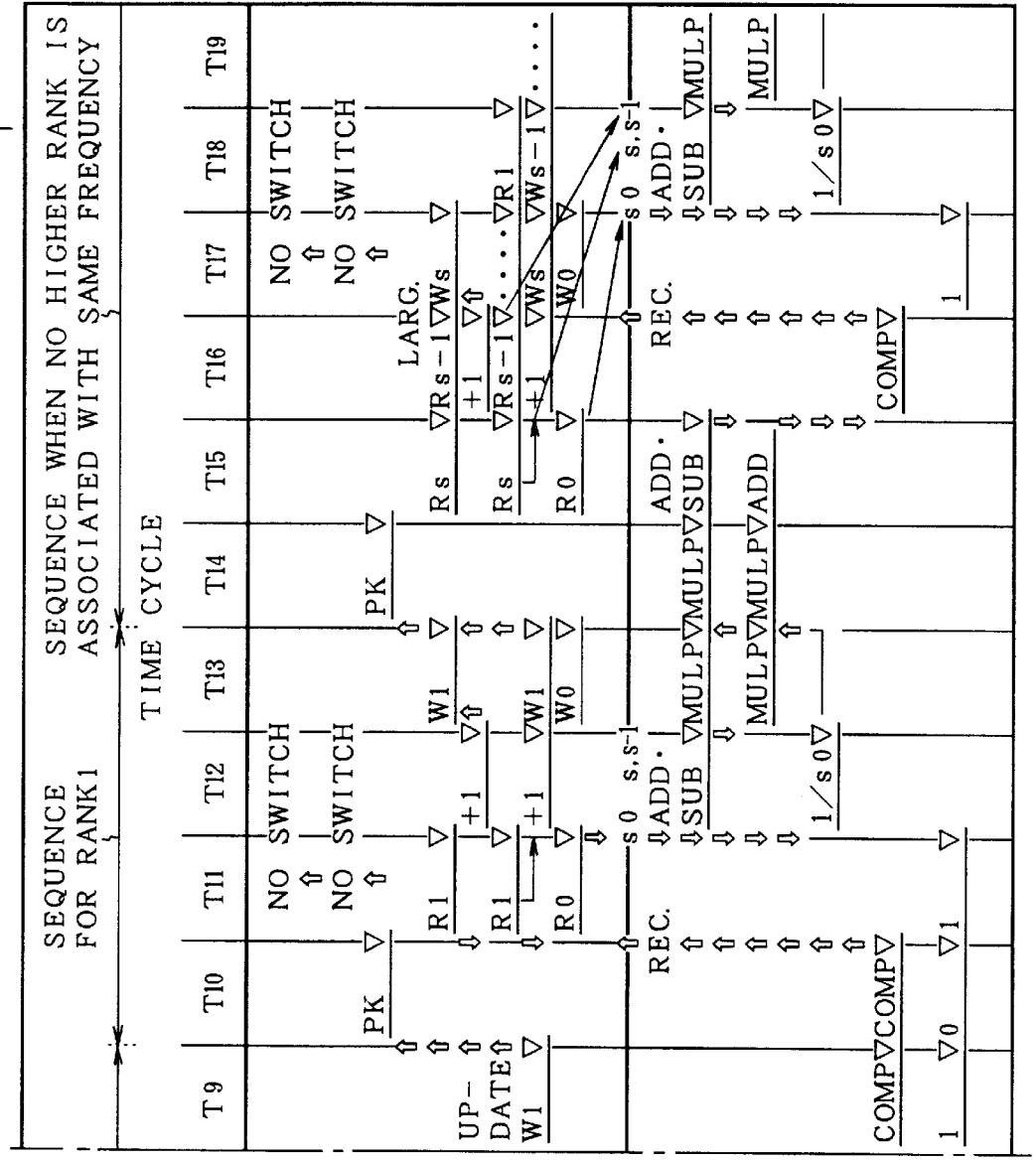

Next, referring to the timing charts of FIGS. 13A and 13B, pipelined operations for arithmetic coding in the data compression system shown in FIGS. 9A and 9B will be described. In FIGS. 13A and 13B, the pipelined operations are divided into time cycles T1 to T19. Cycles T1 to T9 of all the cycles constitute a sequence to be followed normally when an input character does not rank first. Cycles T10 to T13 constitute a sequence to be followed when an input character ranks first. Cycles T14 to T19 constitute a sequence to be followed when a character having the same frequency as an input character and ranking higher than the input character is not present.

To begin with, pipelined operations performed normally during cycles T1 to T9 will be described. The rank reading/updating unit 18 in the probability modeling unit 14 carries out processing RK (Read K), that is, inputs a character K to be encoded during cycle T1, and references the frequency data storage unit 25 to read rank s of the character. Rank s of the input character K read during cycle T1 is fed to the frequency reading/updating unit 22, cumulative frequency reading/updating unit 24, and total cumulative frequency reading/updating unit 26. During cycle T2, processing Rs, Rs, and R0 is carried out, that is, the number of occurrences f(s) associated with rank d, a cumulative number of occurrences cf(s) associated therewith, and a total number of occurrences S0 are read. In parallel, processing Rs-1 is carried out, that is, a character Ks-1 of rank s-1 that is next higher than rank s, the number of occurrences f(s-1) of the character, and a cumulative number of occurrences cf(s-1) thereof are read during cycle T3. The results of reading occurrence data performed by the probability modeling unit 14 during cycles T1 to T3 are fed to the arithmetic coding unit 16. The high level and low level of a code space are calculated in parallel during cycles T3 to T5. During cycle T3, for example, the code space calculating unit 28 carries out addition and subtraction so as to calculate a previous interval width Wold according to the expression (1). The result of this calculation is reflected on the code space calculating unit 30 for calculating a low level. Also during cycle T3, the inverse number calculating unit 32 calculates an inverse number 1/S0 of the total number of occurrences S0 and supplies the inverse number 1/S0 to the code space calculating units 28 and 30. During cycles T4 to T6, the code space calculating units 28 and 30 calculate in parallel a high level and low level according to the expressions (2) and (3) respectively. The results of calculating high and low levels of a code space during cycles T3 to T6 are fed to the arithmetic code drawing unit 34. Through comparison with the thresholds defining the subdivision spaces in FIG. 12 which is carried out during cycles T7 to T10, a code 0101 is drawn. The drawn arithmetic code is output as, for example, serial data from the code output unit 36. Meanwhile, during cycles T3 to T9 after necessary frequency data is output to the arithmetic coding unit 16, the probability modeling unit 14 updates the contents of the frequency data storage unit 25. During cycles T3 to T5, the highest one of ranks associated with the same number of occurrences as the number of occurrences f(s) of the input character K of rank s is detected. In other words, processing Rs-1, Rs-2, and Rs-3 are carried out during cycles T3 to T5, that is, the numbers of occurrences associated with high ranks are retrieved orderly, and the highest rank associated with the same number of occurrences as that associated with rank s is retrieved. This operation will be readily understood with reference to FIG. 10 showing the frequency data storage unit 25. Assuming that the rank of an input character is s, the number of occurrences is f(s). High ranks s1, s2, s3, etc. are handled during each cycle, and the associated numbers of occurrences f(s-1), f(s-2), f(s-3) are read and compared with the number of occurrences f(s) associated with rank s. Assuming that the number of occurrences associated with rank s-3 is larger than the number of occurrences f(s) associated with rank s, the rank associated with the same number of occurrences f(s) is s2. Hereinafter, before update is carried out for switching, the number of occurrences f(s) associated with rank s is incremented by one during cycle T3. After the highest rank s-2 associated with the same number of occurrences as that f(s) associated with rank s is obtained, the numbers of occurrences of the characters associated with ranks s and s-2, and the cumulative numbers of occurrences thereof are switched during cycles T6 and T7. Moreover, the cumulative numbers of occurrences cf(s-3) to cf(1) associated with the rank s-3 and higher are read consecutively and incremented by one, and thus rewritten. This processing is processing Ws-3 to W1. During cycle T6, processing W0 is carried out, that is, the total number of occurrences S0 is incremented by one. Thus, updating the contents of the occurrence data storage unit 25, which accompanies arithmetic coding of the character K, is completed. Cycles T10 to T13 constitute a sequence to be followed when an input character ranks first. In this case, it is unnecessary to switch characters and associated data items in the frequency data storage unit 25. The other operations are identical to those performed normally during cycles T1 to T9. Cycles T14 to T19 constitute a sequence to be followed when a higher rank associated with the same number of occurrences as the number of occurrences of an input character is not present. In this case, characters are not switched. However, the number of occurrences f(s) associated with rank s is incremented, the cumulative numbers of occurrences cf(s-1) to cf(1) associated with next higher rank s-1 and higher ranks are incremented, and the total number of occurrences S0 is incremented. The processing performed by the arithmetic coding unit 16 after the processing of cycles T10 to T13 or cycles T14 to T19 is identical to encoding succeeding the processing of cycles T1 to T9.

FIG. 14A shows the fundamental configuration of a data restoration system for restoring source data from compressed data produced by the data compression system shown in FIG. 7A. The data restoration system comprises, as shown in FIG. 14A, an entropy decoding unit 46, occurrence frequency modeling unit 48, and pipeline control unit 47. The entropy decoding unit 46 inputs codes of a code stream, which is compressed data, one by one, obtains a conditional appearance rate on the basis of an input code and an already-restored immediately preceding character, and outputs the conditional appearance rate to the occurrence frequency modeling unit 48. The occurrence frequency modeling unit 48 includes a frequency data storage unit in which the conditional appearance rate of an input character to be linked to an immediately preceding character string is registered for each character, restores a character by referencing the frequency data storage unit according to the conditional appearance rate derived from the input code output from the entropy decoding unit 46. The pipeline control unit 47 causes the entropy decoding unit 46 and occurrence frequency modeling unit 48 to operate in pipelining. Herein, the entropy decoding unit 46 adopts arithmetic decoding, dynamic Huffman decoding, or splay decoding in line with arithmetic coding, dynamic Huffman coding, or splay coding that is one kind of self-organization coding, which is adopted by the entropy coding unit 12 shown in FIG. 8.

FIG. 14B is a timing chart of pipelined operations of the entropy decoding unit 46 and occurrence frequency modeling unit 48 performed under the control of the pipeline control unit 47. During cycle T1, entropy decoding is carried out by inputting a code and obtaining a conditional appearance rate. At this time, the occurrence frequency modeling unit 48 does not restore any character because there is no result of previous decoding. During cycle T2, the entropy decoding unit 46 carries out entropy decoding so as to input the next code and obtain a conditional appearance rate. Concurrently, the occurrence frequency modeling unit 48 restores character a by referencing the frequency data storage unit according to the conditional appearance rate obtained during the previous cycle T1. Hereinafter, likewise, the entropy decoding unit 46 inputs and decodes a code. Concurrently, the occurrence frequency modeling unit 48 restores a character on the basis of the result of decoding provided during the previous cycle and outputs the character.

Figure 15A:
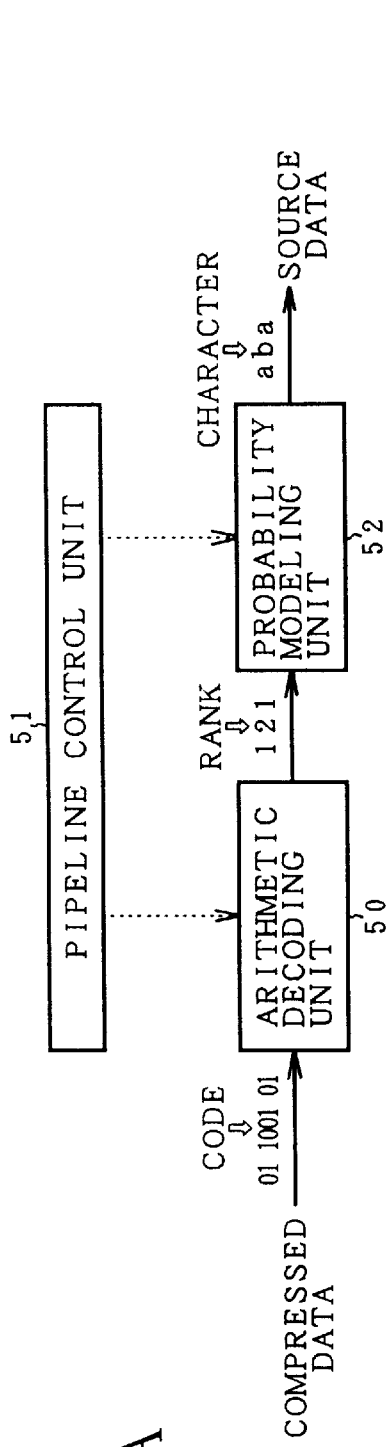
FIGS. 15A and 15B are block diagrams of the data restoration system, shown in FIGS. 14A and 14B, adopting arithmetic decoding as entropy decoding.

FIG. 15A shows a data restoration system for carrying out arithmetic decoding so as to restore a character from compressed data produced by the data compression system in FIG. 8A in which arithmetic coding is implemented. The data restoration system comprises an arithmetic decoding unit 50, probability modeling unit 52, and pipeline control unit 51. The arithmetic decoding unit 50 inputs codes 01, 1001, and 01, which are produced by the data compression system shown in FIG. 8A, one by one as compressed data, obtains the rank of an allotted code space derived from each code, and outputs the rank to the probability modeling unit 52. In this case, ranks 1, 2, and 1 are output consecutively. The probability modeling unit 52 includes an occurrence data storage unit of which structure is the same as the structure shown in FIG. 10 and in which characters are arranged and ranked in descending order of number of occurrences. The frequency data storage unit is referenced according to the ranks output from the arithmetic decoding unit 50, whereby associated characters a, b, and a are restored orderly.

Figure 15B:
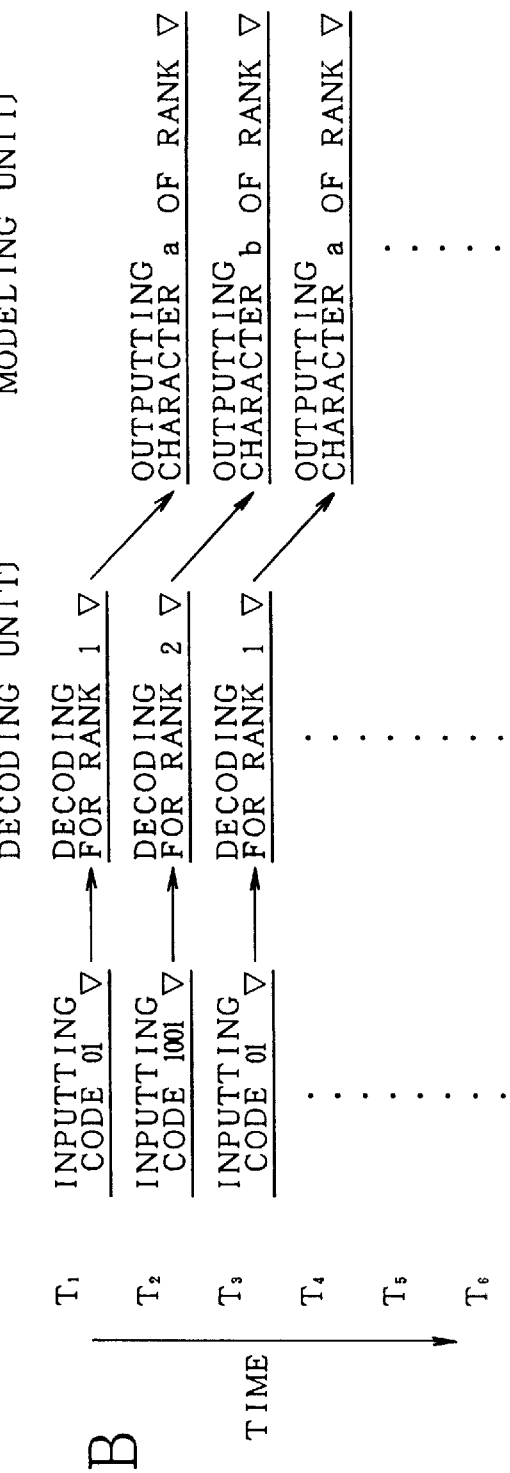
Figure 18A:
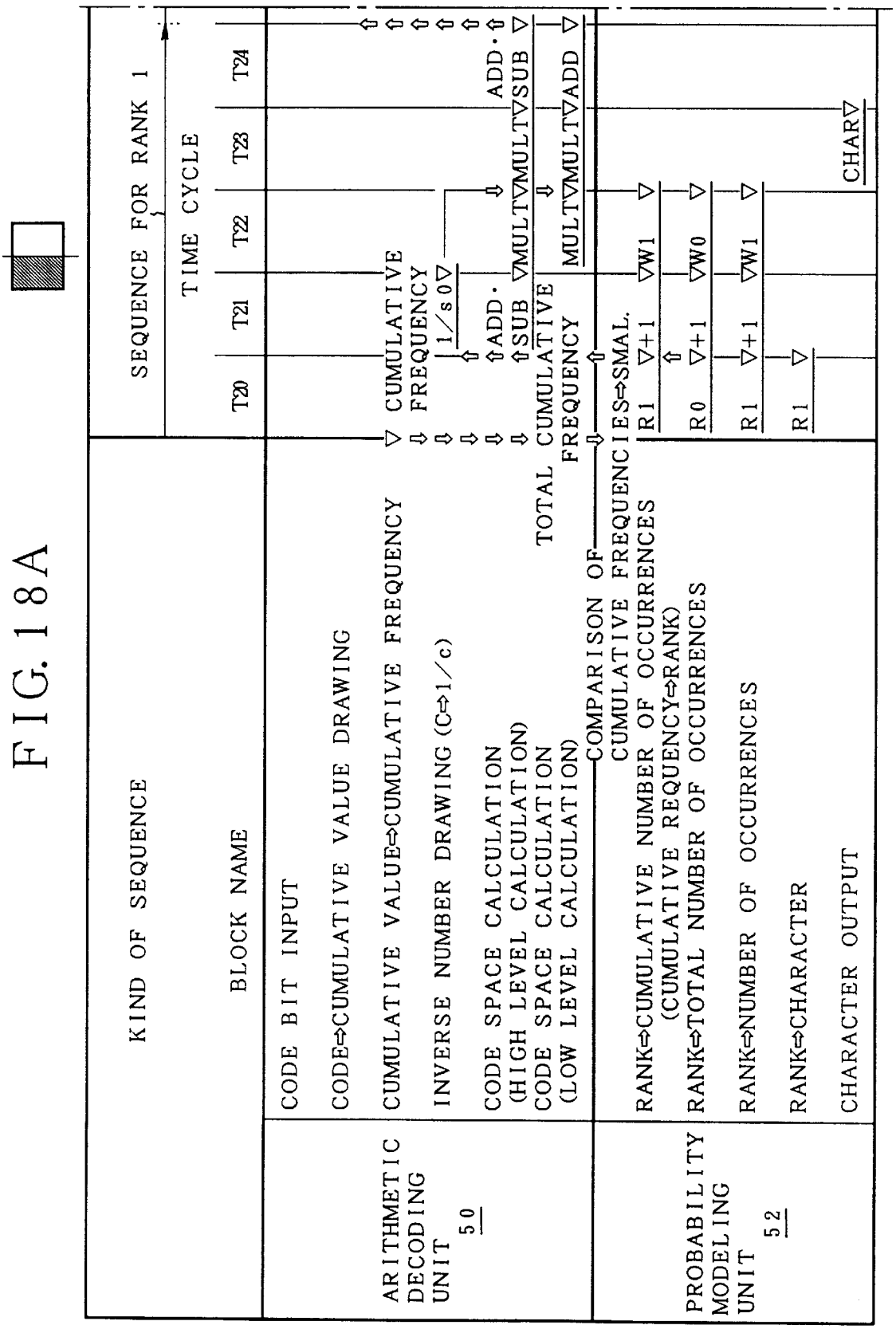
FIGS. 18A and 18B are timing charts of pipeline operations and continued from FIGS. 17A and 17B.
Figure 18B:
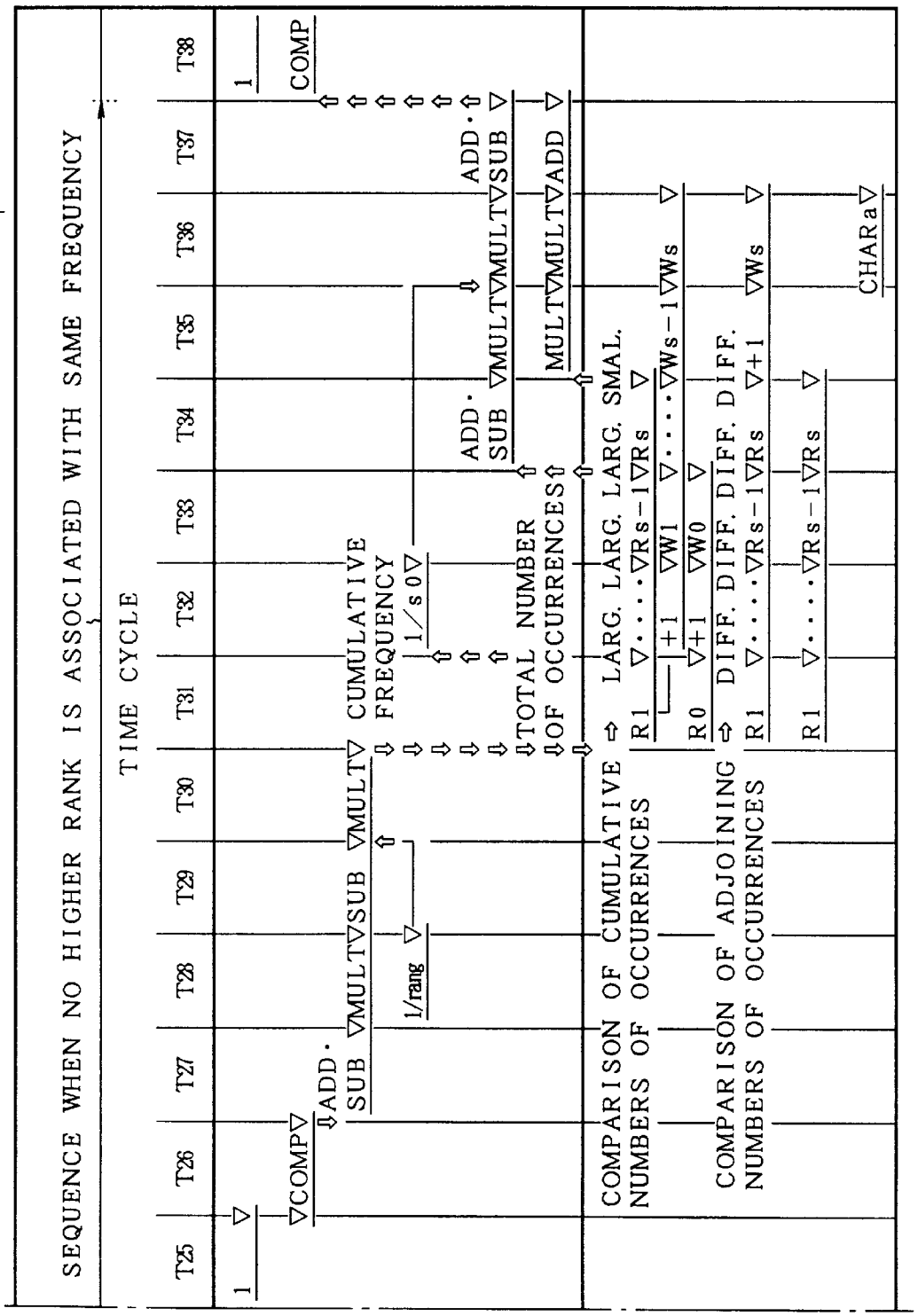

FIG. 15B is a timing chart of the pipelined operations of the arithmetic decoding unit 50 and probability modeling unit 52 performed under the control of the pipeline control nit 51 shown in FIG. 15A. First, the arithmetic decoding unit 50 inputs code 01 and decodes it to obtain rank 1. At this time, since a rank resulting from previous decoding is not input to the probability modeling unit 52, any character is not restored. During the next cycle T2, the arithmetic decoding unit 50 inputs the second code 1001 and decodes it to obtain rank 2. Concurrently, the probability modeling unit 52 references the frequency data storage unit according to rank 1 obtained during the previous cycle T1, and restores character a. Likewise, the arithmetic decoding unit 50 inputs a new code and decodes it to obtain a rank. Concurrently, the probability modeling unit 52 restores a character according to a rank resulting from previous decoding.

FIGS. 16A and 16B show the details of the data restoration system shown in FIG. 15A. The data restoration system comprises an arithmetic decoding unit 50, probability modeling unit 52, and pipeline control unit 51. The arithmetic decoding unit 50 includes a code input unit 54, a cumulative value drawing unit 56, a code space calculating unit 58 for calculating the high level of a code space, a code space calculating unit 60 for calculating the low level of the code space, an inverse number calculating unit 62 for calculating an inverse number 1/S0 of a total number of occurrences S0 employed in computing the code space defined with the high and low levels, a cumulative frequency drawing unit 64, and an inverse number calculating unit 66 for calculating an inverse number 1/Wold of a range Wold employed in drawing a cumulative frequency. The probability modeling unit 52 includes a rank drawing unit 58, occurrence data storage unit 70, character reading/updating unit 72, frequency reading/updating unit 74, cumulative frequency reading/updating unit 76, total cumulative frequency reading/updating unit 78, and character output unit 80. The arithmetic decoding unit 50 calculates a cumulative number of occurrences cf(code) derived from an input code at every input of a code. The cumulative number of occurrences cf(code) derived from a code is calculated according to the following expression:

$$cf(\text{code}) = [\{(\text{Value} - \text{Lold}) \times S0\} - 1]/\text{Wold} \quad (4)$$

where Value is a cumulative value derived from a code, Lold is a lower extreme (low level) of a previous interval, and Wold is an interval width (range) of the previous interval.

The expression (4) is an expression constructed by modifying the expression (2), according to which the high level of a new space is calculated for encoding on the basis of a cumulative number of occurrences cf(s-1) associated with rank s-1 that is next higher than the rank of an input character, and rewriting the modified expression as an expression for providing a cumulative number of occurrences cf(s-1). Specifically, the cumulative number of occurrences cf(s-1) associated with rank s-1 and included in the expression (2) is replaced with a cumulative number of occurrences cf(code) of a code, and the high level Hnew of a new space is replaced with a cumulative value Value. This results in the expression (4). In the expression (4), the cumulative value Value is determined through comparison of the high and low levels of a code space derived from an input code with the thresholds ¼, ½, and ¾ set in the normalized code interval [1, 0] under the following conditions:
<Condition 1>
when the low level of a new space derived from a code is equal to or larger than ½, the cumulative value Value equals to ½; and
<Condition 2>
when the low level of a new space derived from a code is equal to or larger than ¼ and the high level thereof falls below ¾, the cumulative value Value equals to ¼. Drawing the cumulative value Value under Conditions 1 and 2 is carried out by the cumulative value drawing unit 56. Calculating the high and low levels of a code space derived from a previously decoded code which are employed in calculating the expression (4) is carried out by the code space calculating units 58 and 60. The calculated values of the high and low levels of a code space are basically identical to those provided by the expressions (2) and (3). The cumulative frequency drawing unit 64 calculates the cumulative number of occurrences cf(code) of a code according to the expression (4). The inverse number calculating unit 66 calculates an inverse number 1/Wold of a range Wold, multiplies the calculated cumulative number of occurrences cf(code) of the code by the inverse number 1/Wold, and thus draws a cumulative frequency of the code. Meanwhile, in the probability modeling unit 52, the rank drawing unit 68 compares the cumulative number of occurrences derived from a code and output from the arithmetic decoding unit 50 with the cumulative numbers of occurrences of characters stored in the frequency data storage unit 70 in descending order of rank. Through the comparison of the cumulative number of occurrences of the code with the cumulative numbers of occurrences stored in the frequency data storage unit 70 in descending order of rank, a rank is drawn out. After the rank drawing unit 68 draws a rank according to the cumulative occurrence frequency of the code, the rank is fed to the character reading/updating unit 72. A character associated with the rank is read from the frequency data storage unit 70 and thus restored The character is output from the character output unit 80. The frequency reading/updating unit 74 increments the number of occurrences of a restored character by one. The cumulative frequency reading/updating unit 76 increments the cumulative numbers of occurrences that are associated with ranks higher than the rank of the restored character and larger than the cumulative number of occurrences of the restored character, and thus updates the cumulative numbers of occurrences. If any rank higher than the rank of the restored character is associated with the same cumulative number of occurrences, a character of the highest rank having the same cumulative number of occurrences as the cumulative number of occurrences of a restored character, and the restored character are switched together with the associated numbers of occurrences and cumulative numbers of occurrences. Furthermore, the total cumulative frequency reading/updating unit 78 increments the total number of occurrences by one.

FIGS. 17A to 18B are timing charts of the pipelined operations in the data restoration system shown in FIGS. 16A and 16B. In FIGS. 17A and 17B, cycles T1 to T13 constitute a normal sequence to be followed when a character restored from a code does not rank first. Cycles T14 in FIG. 17B to cycle T24 in FIG. 19 constitute a sequence to be followed when a character restored from a code ranks first. Cycles T25 to T38 in FIG. 18B constitute a sequence to be followed when a character restored from a code does not rank first but no higher ranking character has the same frequency as the restored character. To begin with, normal restoration to be performed during cycles T1 to T13 will be described. During cycles T1 and T2, the code input unit 54 inputs code bits and the cumulative value drawing unit 56 draws a cumulative value Value through comparison under the aforesaid Conditions 1 and 2. The code space drawing units 58 and 60 calculate the high and low levels of a previously restored code space during a cycle preceding cycle T1. During subsequent cycles T3 to T6, the cumulative frequency drawing unit 64 calculates the cumulative occurrence frequency of a code according to the expression (4). During cycle T4, the inverse number calculating unit 66 computes an inverse number of 1/Wold included in the expression (4) concurrently. The resultant inverse number is employed in the multiplication during cycle T6. The cumulative number of occurrences cf(code) of the code calculated during cycle T6 is fed to the probability modeling unit 52. During cycles T7 to T13, a character is restored and the contents of the frequency data storage unit 70 are updated. In parallel with the restoration of a character and update of the frequency data carried out in the probability modeling unit 52, in the arithmetic decoding unit 50, the code space calculating units 58 and 60 calculate in parallel the high and low levels of a code space concerning a character being restored during cycles T10 to T13. Prior to the calculation of the high and low levels of a code space during cycles T10 to T13, during T8, the inverse number calculating unit 62 calculates an inverse number 1/S0 of a total number of occurrences S0 and thus enables multiplication to be performed during cycle T12.

Restoration of a character and update of frequency data to be performed in the probability modeling unit 52 during cycles T7 to T12 will be described. During cycles T7 to T10, cumulative numbers of occurrences are read from the frequency data storage unit 70 in descending order of frequency. Depending on which of the read cumulative number of occurrences and a cumulative number of occurrences associated with a rank immediately higher than the rank with which the read cumulative number of occurrences is associated, it is inferred between which ranks the cumulative number of occurrences cf(code) of a code sent from the arithmetic decoding unit 50 ranks. In short, during cycles T7 to T10, processing R1 to Rs is carried out, that is, reading a cumulative number of occurrences associated with each rank and reading a character associated with each rank are carried out in parallel. As indicated with <1> in FIG. 17A, the cumulative number of occurrences, cf(code), of a code provided by the arithmetic decoding unit 50 is compared with the read cumulative numbers of occurrences associated with ranks. Since the cumulative number of occurrences cf(code) of the code ranks between the cumulative numbers of occurrences associated with ranks s and s-1, the character of rank s is restored and output during cycle T11. As indicated with <2> in FIG. 17A, every time a cumulative number of occurrences associated with each of ranks 1 to s is read, the cumulative number of occurrences is compared with an adjoining cumulative number of occurrences that is a cumulative number of occurrences associated with an immediately higher rank. In this case, when both the comparison performed at the time of reading a cumulative number of occurrences associated with rank s-1 and the one performed at the time of reading a cumulative number of occurrences associated with rank s reveal that the read cumulative number of occurrences is the same as a cumulative number of occurrences associated with a higher rank, the cumulative numbers of occurrences associated with ranks s-2, s-1, and s are the same mutually. During cycles T11 to T13, stored data of a restored character of rank s and stored data of a, character of rank s-2 that is the highest rank associated with the same cumulative number of occurrences as the cumulative number of occurrences associated with rank s are switched mutually. Prior to the switching, the cumulative numbers of occurrences associated with ranks s-3 and higher, which are read during cycles T8 to T10, are incremented by one. Moreover, a total cumulative number of occurrences is read through processing R0 during cycle T7, incremented by one during cycle T8, and written during cycle T9. The switching of frequency data associated with ranks s and s-2 to be performed during cycles T11 to T13 involves three items; the cumulative numbers of occurrences, numbers of occurrences, and characters. The sequence of cycle T14 in FIG. 17B to cycle T24 in FIG. 18A to be followed when a restored character ranks first is different from the foregoing sequence in a point that the probability modeling unit 52 does not switch frequency data of a restored character and another data. In the other points, the sequences are the same. The normal sequence of cycles T25 to T38 in FIG. 18B to be followed when a restored character does not rank first and when no higher ranking character has the same cumulative number of occurrences as that of the restored character is different from the foregoing sequence in a point that frequency data of a restored character and frequency data of a character of the highest rank having the same cumulative number of occurrences as the restored character are not switched mutually. In the other points, the sequence is identical to the normal sequence.

(Parallel processing of part of a blend context)

Figure 19A:
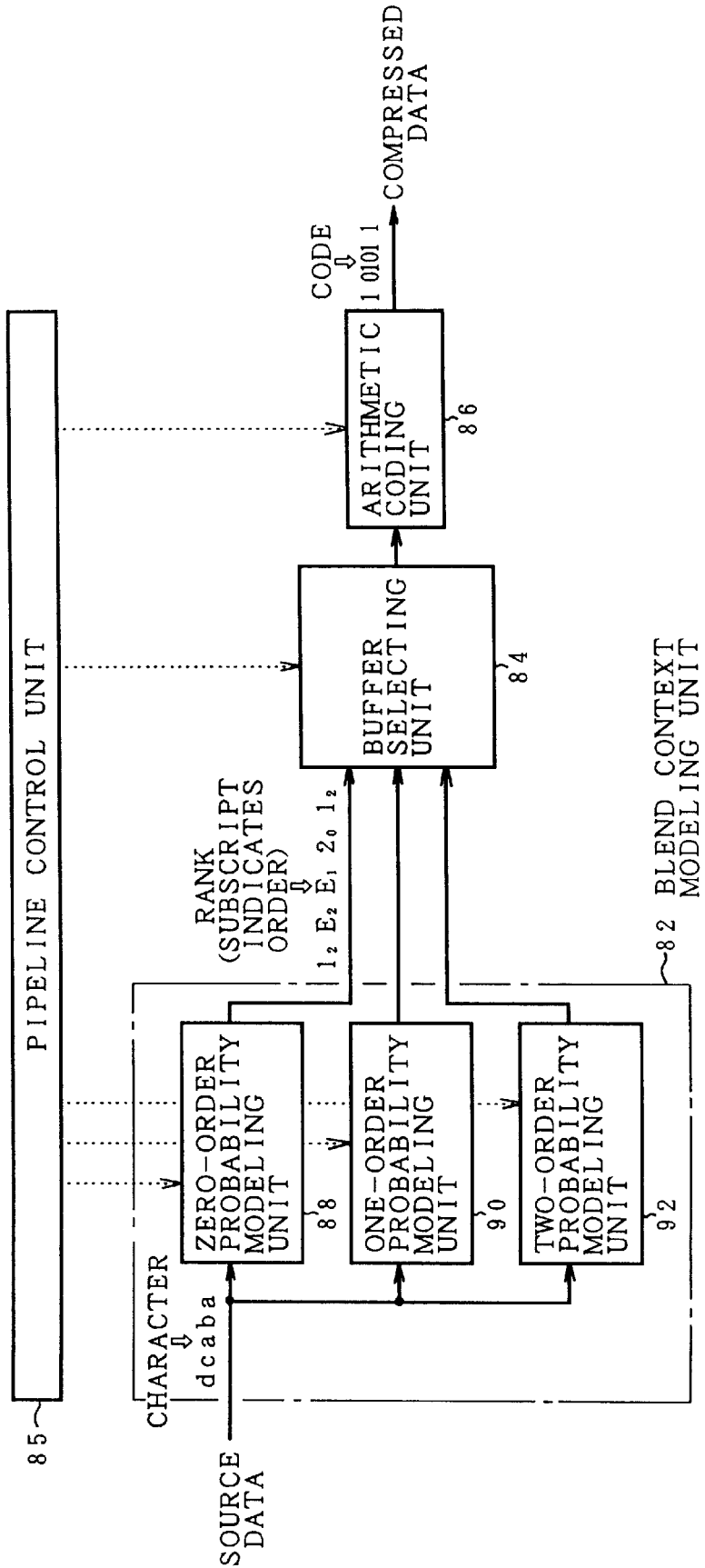
FIGS. 19A and 19B are explanatory diagrams of a basic block of a data compression system part of which operates in parallel so as to handle a blend context, and operations of the basic block.

FIG. 19A shows a data compression system of the present invention for handling a blend context. The data compression system is characterized in that a blend context probability modeling unit has probability modeling units associated with orders and operated in parallel, and pipelining is attained between the probability modeling units and an arithmetic coding unit. A blend context probability modeling unit 82 in this embodiment is formed with a parallel circuit composed of a zero-order probability modeling unit 80, one-order probability modeling unit 90, and two-order probability modeling unit 92. Each of the zero-order, one-order, and two-order probability modeling units 88, 90, and 92 inputs one character in parallel with the other units, calculates an occurrence frequency or a subordinate relationship relative to a context of each order, and outputs a rank. A buffer selecting unit 84 selects the ranks output from the zero-order, one-order, and two-order probability modeling units 88, 90, and 92 orderly from a large order to small order, and outputs a selected rank to an arithmetic coding unit 86. Specifically, when the two-order probability modeling unit 92 obtains an effective rank, the rank is output to the arithmetic coding unit 86 for arithmetic coding. If the two-order probability modeling unit 92 fails to obtain a rank and provides an escape code E, arithmetic coding is riot carried out but the escape code is merely output. When the output of the two-order probability modeling unit 90 is selected, if an effective rank is obtained, arithmetic coding is carried out on the basis of a rank output from the one-order probability modeling unit 90. If the one-order probability modeling unit 90 fails to obtain an effective rank and provides an escape code E, the rank output from the zero-order probability modeling unit 88 is selected, and arithmetic coding is carried out. Incidentally, the two-order probability modeling unit 92 or one-order probability modeling unit 90 provides an escape character in such a situation that: assuming that an input character placed in a storage unit is regarded as a parent and characters residing in the storage unit and corresponding to characters constituting a context of each order are regarded as children, an order indicates presence of children but no appropriate child is present. An occurrence frequency storage unit incorporated in each of the zero-order, one-order, and two-order probability modeling units 88, 90, and 92 has a dictionary covering all characters to be encoded. A character immediately preceding an input character to be employed is dynamically registered in the occurrence frequency storage unit in the one-order probability modeling unit 90 at every input of a character, while a character preceding an immediately preceding character of an input character to be employed is dynamically registered in the one in the two-order probability modeling unit 92 at every input of a character.

Figure 19B:
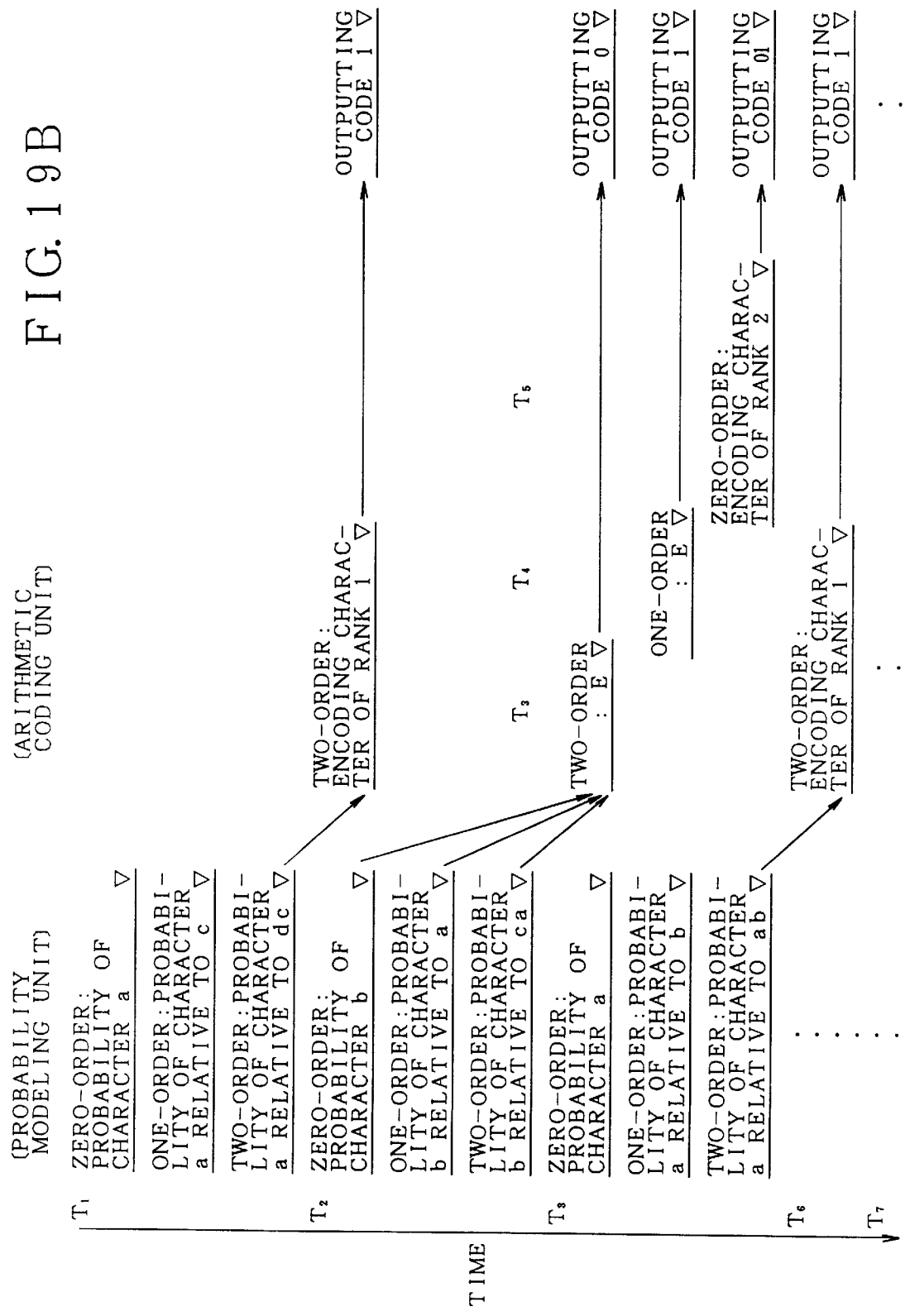

FIG. 19B is a timing chart of the pipelined operations in the data compression system shown in FIG. 19A in which the probability modeling units in the blend context probability modeling unit 82 are operated in parallel. Assume that source data, for example, characters dcaba are input successively to the blend context probability modeling unit 82, and two characters dc have already been encoded and the remaining characters aba are about to be encoded. First, during cycle T1, character a is input. Each of the zero-order, one-order, and two-order probability modeling units 88, 90, and 92 calculates an occurrence frequency of the character relative to each order in parallel with the other units, and obtains a rank thereof determined with the occurrence frequency. Assume that the character string dca or a combination of the character a with two preceding characters dc ranks first according to the occurrence frequency thereof in the two-order probability modeling unit 92. During the next cycle T2, the buffer selecting unit 84 selects an output $1_2$ of rank 1 output from the two-order probability modeling unit 92 and feeds the output to the arithmetic coding unit 86. Arithmetic coding provides code 1. Concurrently, during cycle T2, the next character b is input to each of the zero-order, one-order, and two-order probability modeling units 88, 90, and 92, and ranks are obtained according to calculated occurrence frequencies. If the two-order probability modeling unit 92 fails to retrieve children corresponding to two preceding characters ca, the arithmetic coding unit 86 outputs an escape code $E_2$ during the next cycle T3. During the cycle T3, the blend context probability modeling unit 82 inputs the third character a. Assume that the third character relative to two preceding characters ab ranks first in the two-order probability modeling unit 92. The arithmetic coding unit 86 outputs the escape code $E_2$ sent from the two-order probability modeling unit 92 during cycle T3, and attempts to select the output of the one-order probability modeling unit 92 during the next cycle T4 for arithmetic coding. However, like during cycle T2, if the one-order probability modeling unit 90 does not have a child corresponding to the character a immediately preceding the input character b and fails to obtain an effective rank, it provides an escape code $E_1$. In this case, the escape code $E_1$ is output as code 1 as it is. During cycle T5, an effective output $2_0$ of rank 2 output from the zero-order probability modeling unit 88 is fed to the arithmetic coding unit 86 for arithmetic coding. Code 01 is then output. Thus, based on the ranks of a character relative to zero-order, one-order, and two-order contexts output from the blend context probability modeling unit 82 through parallel processing, arithmetic coding is carried out on the basis of the two escape codes and rank relative to a zero-order context during the subsequent cycles T3, T4, and T5. Based on the output $1_2$ of rank 1 sent from the two-order probability modeling unit 92 in the blend context probability modeling unit 82 during cycle T3, arithmetic coding is carried out by the arithmetic coding unit 86 during the subsequent cycle T6. Consequently, code 1 is output.

Figure 20A:
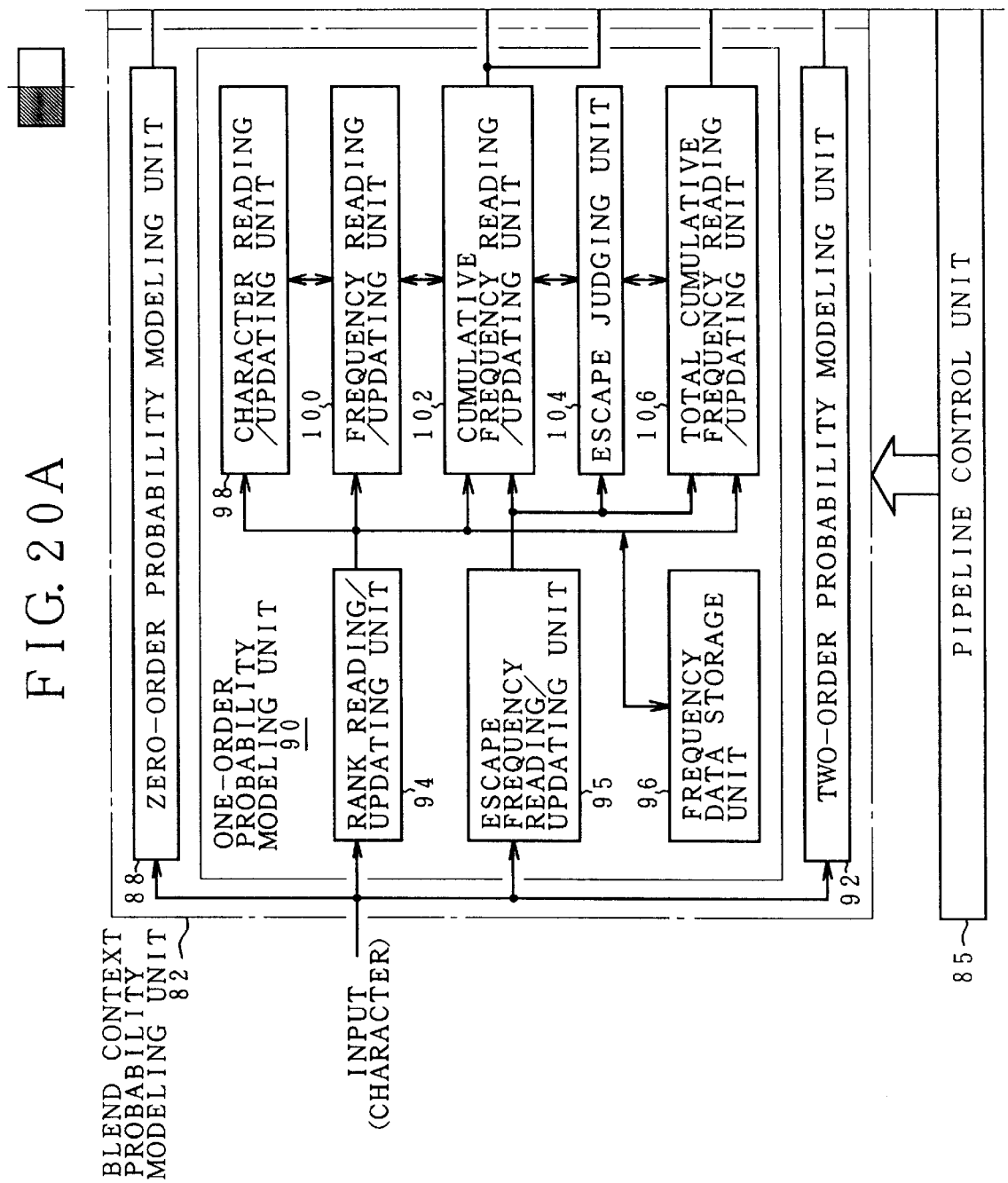
FIGS. 20A and 20B are block diagrams of the detailed configuration of the data compression system shown in FIG. 19A.
Figure 20B:
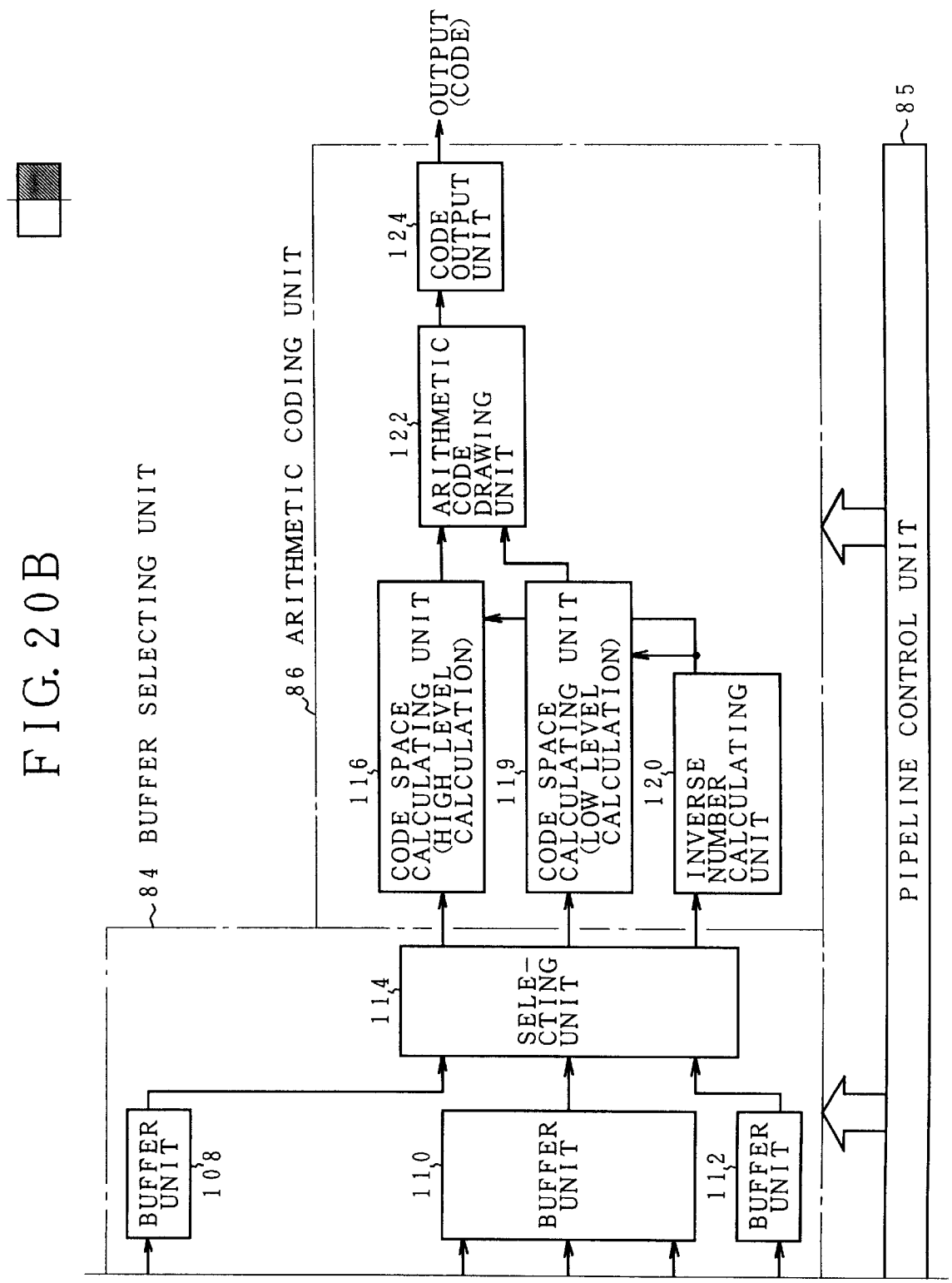

FIGS. 20A and 20B show the details of the data compression system for handling a blend context shown in FIG. 19A. The blend context probability modeling unit 82 has the zero-order probability modeling unit 88, one-order probability modeling unit 90, and two-order probability modeling unit 92 operated in parallel. The probability modeling units have the same configuration as the illustrated configuration of the one-order probability modeling unit 90. The one-order probability modeling unit 90 includes a rank reading/updating unit 94, character reading/updating unit 98, frequency reading/updating unit 100, cumulative frequency reading/updating unit 102, and total cumulative frequency reading/updating unit 106. These blocks are identical to the corresponding circuit units included in the probability modeling unit 14 for handing a fixed-order context shown in FIGS. 9A and 9B. In addition, the blend context probability modeling unit 82 includes an escape frequency reading/updating unit 95 and escape judging unit 104. The escape judging unit 104 judges whether a character immediately preceding an input character resides as a child in an associated dictionary in the frequency data storage unit 96. If no child is present, the escape judging unit 104 causes a buffer unit 110 to output an escape code. If an escape code is detected, the escape frequency reading/updating unit 95 increments the number of occurrences of an escape code, which is stored in the frequency data storage unit 96, by one. Moreover, since the number of occurrences of the escape code can be thought as the number of occurrences of a character, the total cumulative frequency reading/updating unit 106 is activated to increment a total number of occurrences. The buffer selecting unit 84 is composed of buffer units 108, 110, and 112 associated with orders, and a selecting unit 114. The selecting unit 114 selects any of ranks stored as probabilities in the buffer units 112, 110, and 108 orderly from a large order to small order, and supplies a selected rank to the arithmetic coding unit 86. The arithmetic coding unit 86 includes a code space calculating unit 116 for high-level calculation, a code space calculating unit 118 for low-level calculation, an inverse number calculating unit 120 for calculating an inverse number of a total number of occurrences, an arithmetic code drawing unit 112, and a code output unit 124. These components of the arithmetic coding unit 86 are identical to the corresponding blocks of the arithmetic coding unit 16 shown in FIGS. 9A and 9B.

Figure 21A:
FIGS. 21A and 21B are timing charts of pipeline operations in the system shown in FIGS. 20A and 20B.
Figure 21B:
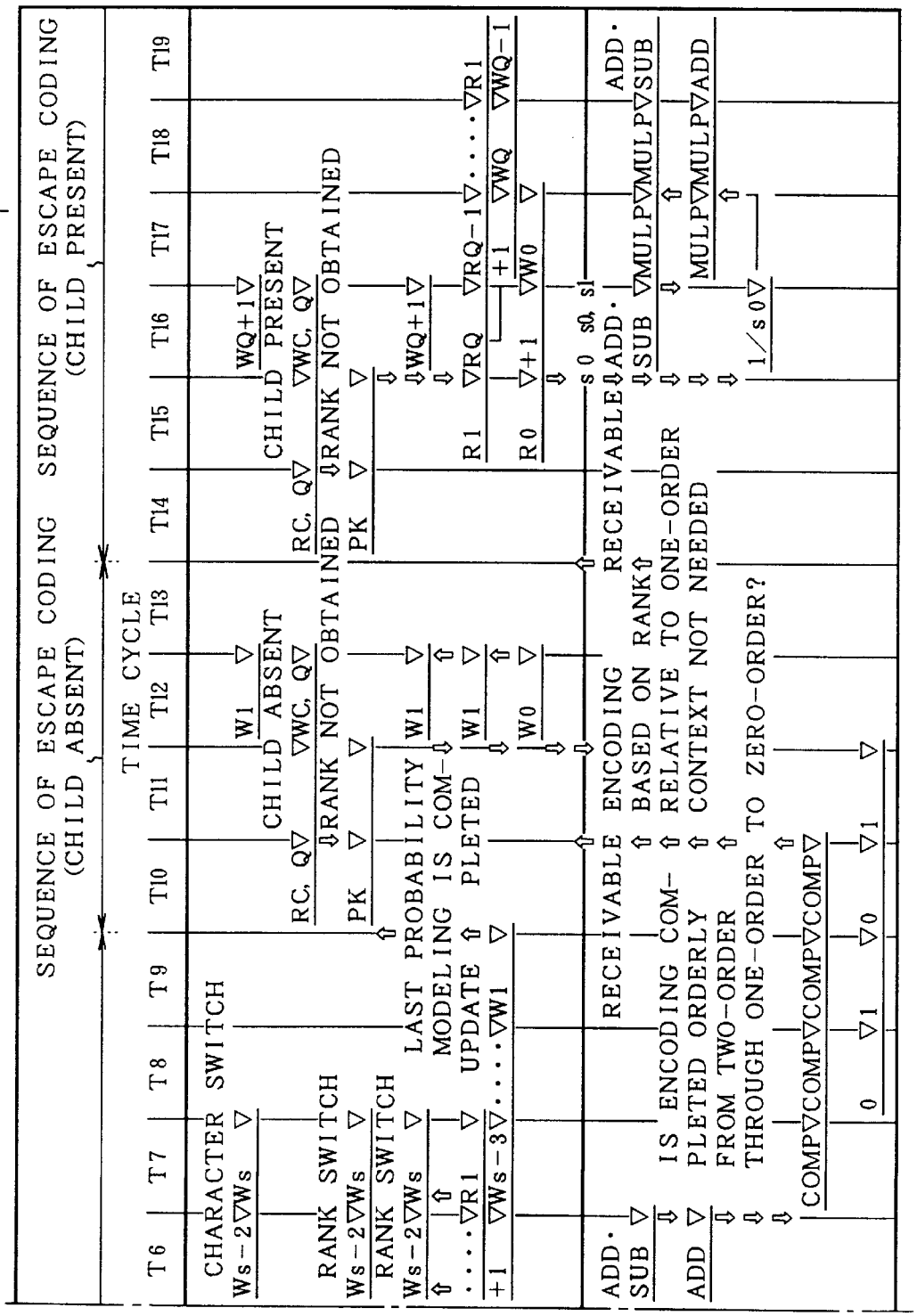

FIG. 21 is a flowchart describing the pipelined operations of the one-order modeling unit 90 and arithmetic coding unit 86 in the data compression system for handling a blend context shown in FIGS. 20A and 20B. In the drawing, cycles T1 to T9 constitute a sequence for encoding a character not ranking first. Cycles T10 to T13 constitute a sequence for outputting an escape code when no child resides. Cycles T14 to T19 constitute a sequence for outputting an escape code to when children reside but no corresponding child is present. Taking the sequence of cycles T1 to T9 for instance, the operations of the one-order probability modeling unit 90 are such that: it is detected during cycles T1 and T2 whether a child corresponding to a character immediately preceding an input character resides; and if a rank is obtained effectively, it is judged that the child is present, and the rank is output to the arithmetic coding unit 86 via the buffer selecting unit 84.

In the other points, the probability modeling units operate in the same way as the probability modeling unit for handling a fixed-order context illustrated in the timing charts of FIGS. 13A and 13B. The arithmetic coding unit 86 that is a shared unit is identical to the arithmetic coding unit 16 shown in FIG. 13A. During cycles T10 to T13 during which an escape code is output because no child is present, the one-order probability modeling unit 90 alone operates but the arithmetic coding unit does not. During cycles T14 to T19 during which an escape code is output because children reside but no corresponding child is present, the same processing as the one to be performed during cycles T1 to T8 is carried out and the arithmetic coding unit 86 outputs an escape code.

Figure 22A:
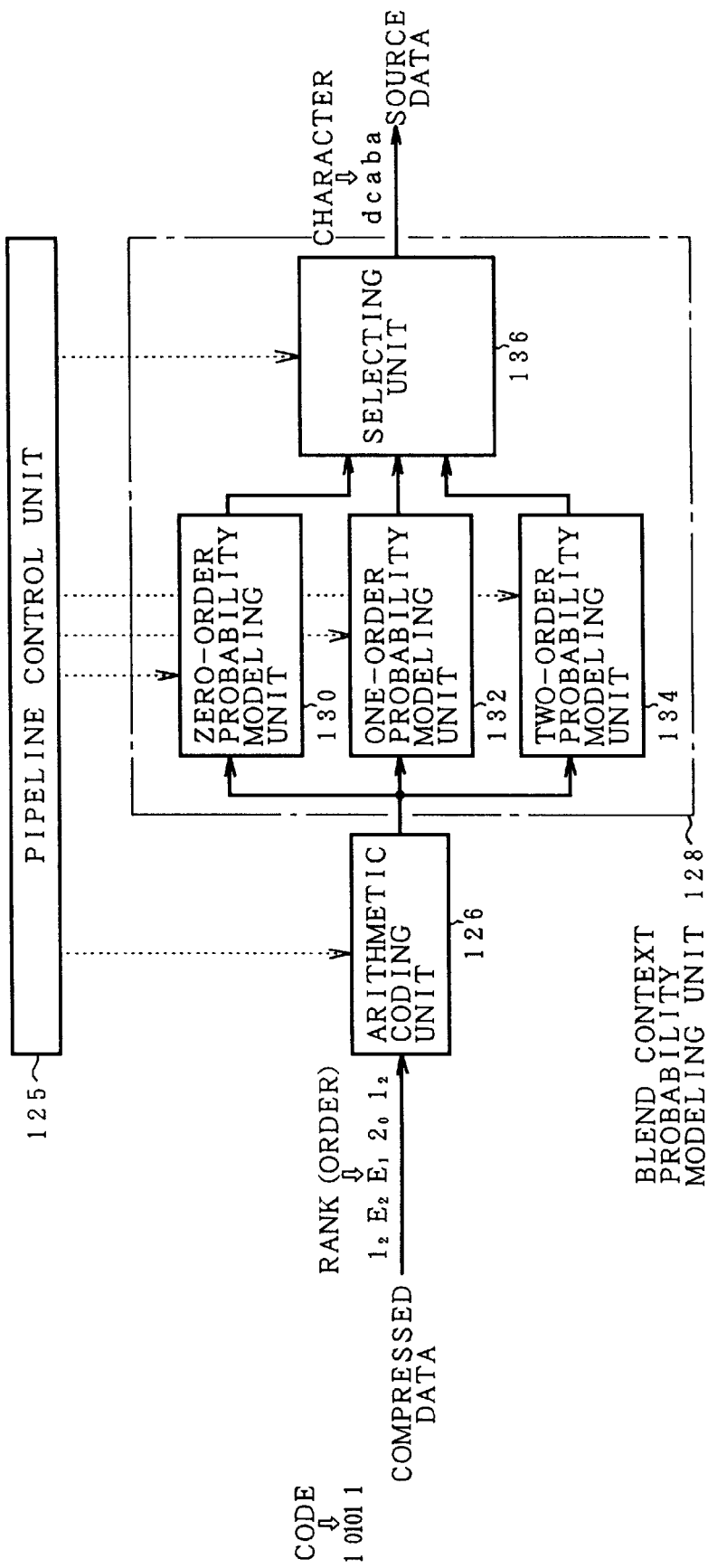
FIGS. 22A and 22B are explanatory diagrams of a basic block of a data restoration system part of which operates in parallel so as to handle a blend context, and operations of the basic block.

FIG. 22A shows the fundamental configuration of a data restoration system for handling a blend context which restores source data that is a character string from compressed data produced by the data compressing system, shown in FIG. 19A, having the probability modeling units in the blend context probability modeling unit operated in parallel. The data restoration system has a blend context probability modeling unit 128 on a stage following an arithmetic decoding unit 126. The blend context probability modeling unit 128 has, for example, a zero-order probability modeling unit 130, one-order probability modeling unit 132, and two-order probability modeling unit 134 operated in parallel, uses a selecting unit 136 to select any of the outputs of the modeling units, and thus restores a character string. Moreover, a pipeline control unit 125 is included to enable the arithmetic decoding unit 126 and blend context probability modeling unit 128 to operate in parallel.

Figure 22B:
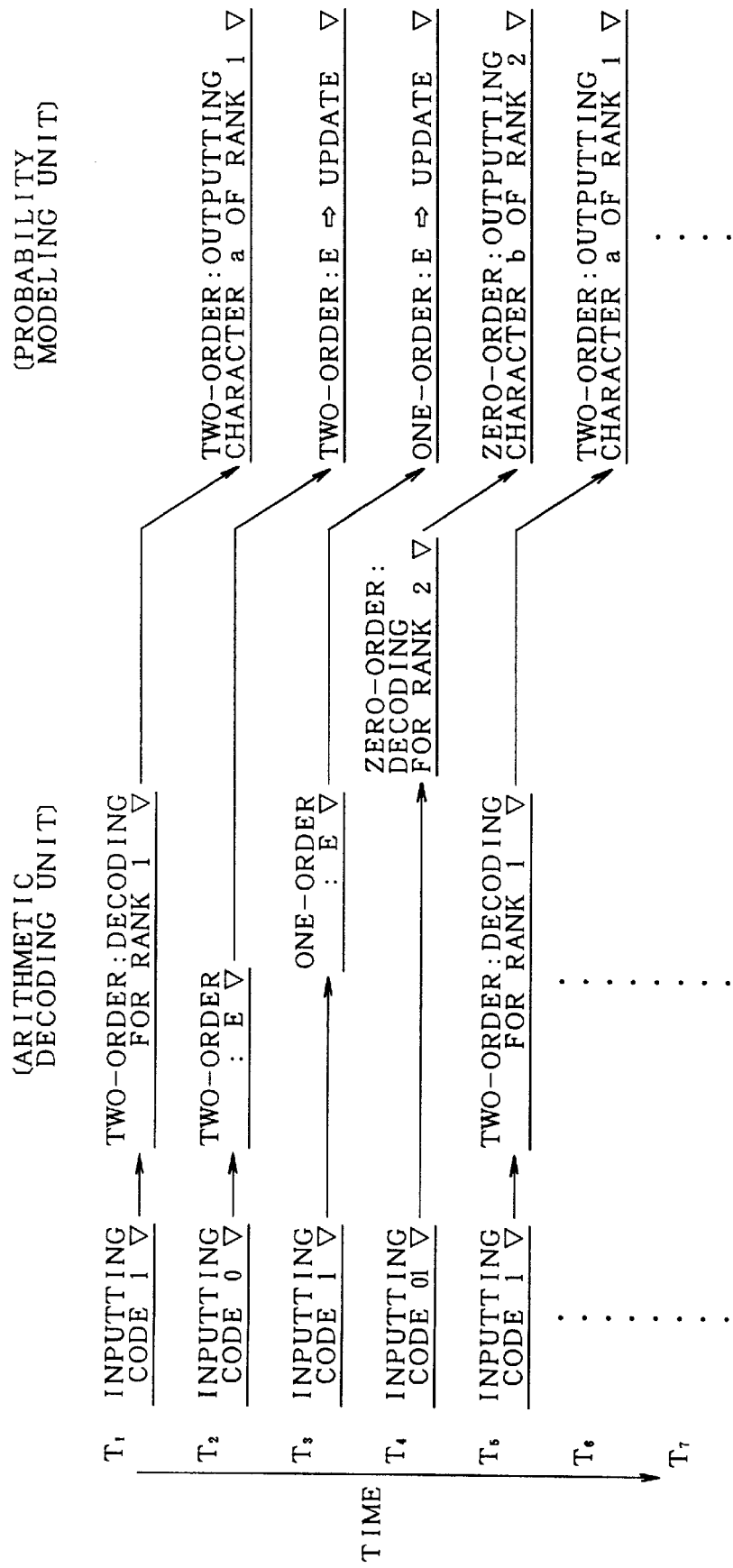
Figure 25A:
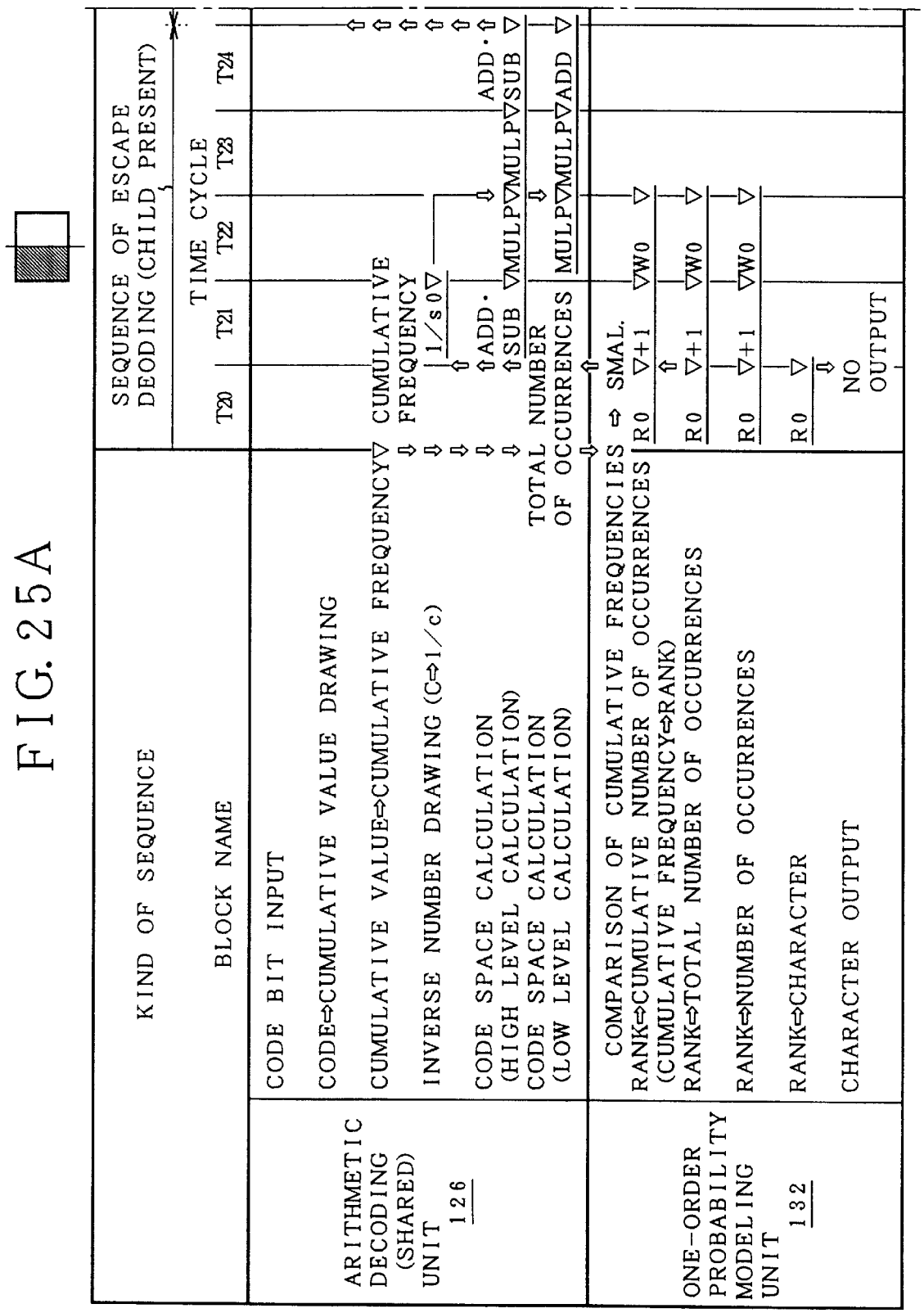
FIGS. 25A and 25B are timing charts of pipeline operations and continued from FIGS. 24A and 24B.
Figure 25B:
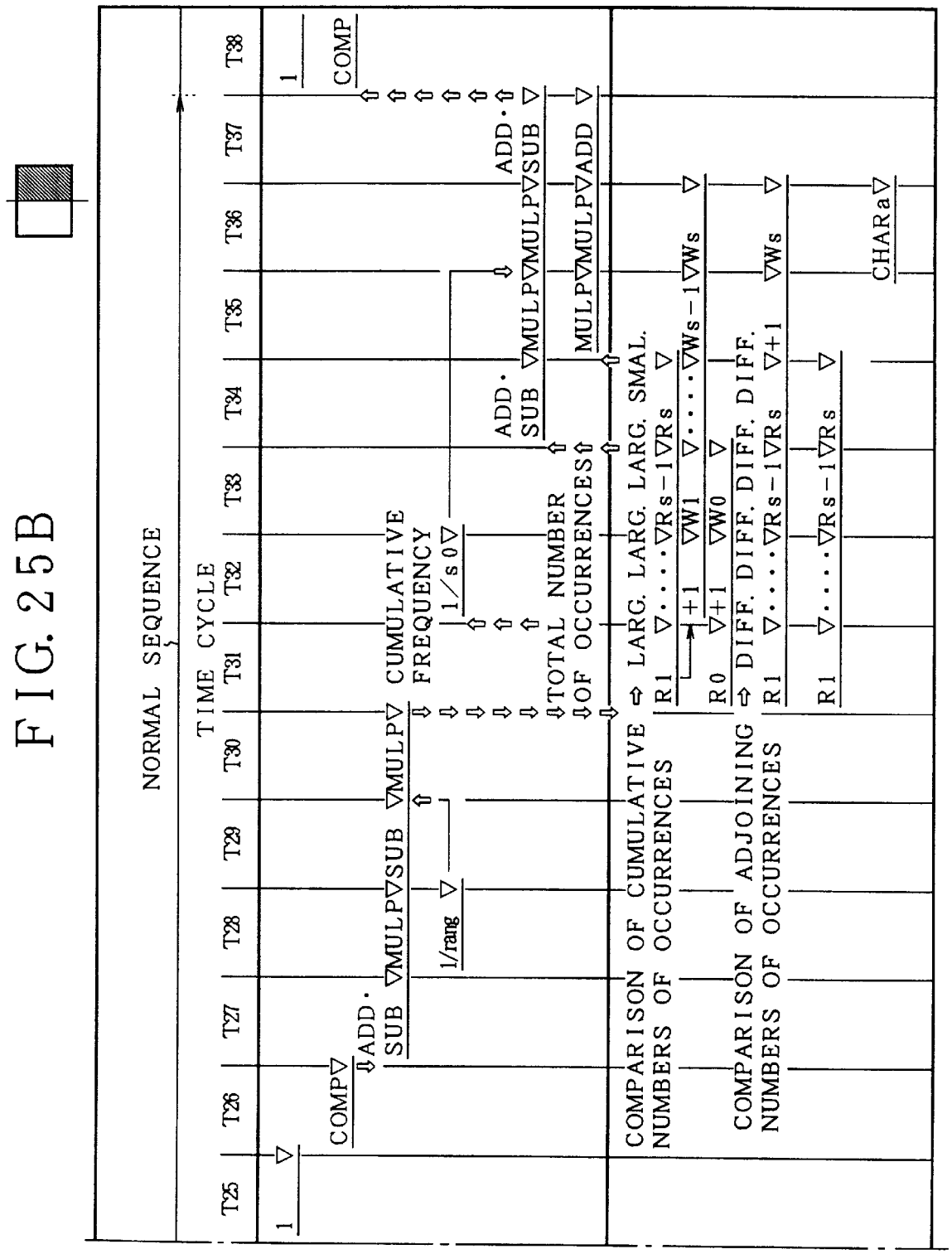

The pipelined operations in the data restoration system shown in FIG. 22A are illustrated in FIG. 22B. Assume that codes 1, 0101, and 1 produced by the data compression system shown in FIG. 19A have been supplied and characters dc have been restored from two preceding codes. During cycle T1, code 1 is input to the arithmetic decoding unit 126. A decoded output $1_2$ of rank 1 relative to a two-order context is output and supplied to each of the zero-order, one-order, and two-order probability modeling units 130, 132, and 134 included in the blend context probability modeling unit 128. During cycle T2, the arithmetic decoding unit 126 inputs a leading bit 0 of the second code and outputs an escape code $E_2$ relative to a two-order context. At this time, the two-order probability modeling unit 134 in the probability modeling unit 128 restores character a on the basis of the decoded output $1_2$ of rank 1 and outputs the character via the selecting unit 136. During cycle T3, the arithmetic decoding unit 126 inputs a bit 1 of the second code and outputs an escape code $E_1$ relative to a one-order context. Concurrently, the two-order probability modeling unit 134 updates the escape frequency data since the escape code $E_2$ relative to a two-order context is output during cycle T2. During cycle T4, the arithmetic decoding unit 126 inputs bits 01 of the second code and outputs a decoded output $2_0$ of rank 2 relative to a zero-order context. At this time, the one-order probability modeling unit 132 in the blend context probability modeling unit 128 updates the escape frequency data since the escape code $E_1$ relative to a one-order context is output. During cycle T5, the arithmetic decoding unit 126 inputs the third code 1 and outputs a decoded output $1_2$ of rank 1 relative to a two-order context. At this time, the zero-order probability modeling unit 130 in the blend context probability modeling unit 128 operates to restore character b on the basis of the decoded output 20 of rank 2 and output the character. During cycle T5, a decoded output $1_2$ is produced. During cycle T6, the two-order probability modeling unit 134 restores character a.

FIGS. 23A and 23B show the details of the data restoration system shown in FIG. 22A. The arithmetic decoding unit 126 consists of a code input unit 138, a cumulative value drawing unit 140, code space calculating units 142 and 144, an inverse number calculating unit 146, a cumulative frequency drawing unit 148, and an inverse number calculating unit 150. The components and capabilities of the arithmetic decoding unit 126 are identical to those of the arithmetic decoding unit 50 in the data restoration system for handling a fixed-order context shown in FIG. 16A. The blend context probability modeling unit 128 includes a zero-order probability modeling unit 130, one-order probability modeling unit 132, and two-order probability modeling unit 134. The probability modeling units have the same configuration as the illustrated one of the one-order probability modeling unit 132. The one-order probability modeling unit 132 includes a character reading/updating unit 156, frequency reading/updating unit 158, cumulative frequency reading/updating unit 160, and total cumulative frequency reading/updating unit 162. These blocks and capabilities are identical to those of the probability modeling unit 52 shown in FIG. 16B. Moreover, a rank drawing unit 152 is included as a unit shared by the zero-order, one-order, and two-order probability modeling units 130, 132, and 134. Furthermore, a frequency data storage unit 154 is also included as a shared unit. Three selecting units 136-1, 136-2, and 136-3 are included. The selecting unit 136-1 selects any of restored characters in the character reading/updating units 156 in the probability modeling units according to the order of a context of a character corresponding to an input code and outputs a selected character through a character output unit 164. The selecting unit 136-2 inputs the outputs of the cumulative frequency reading/updating units 160 in the probability modeling units, selects one of the outputs according to the order of a context of a restored character, and outputs the selected output to the code space calculating units 142 and 144 in the arithmetic decoding unit 126. The selecting unit 136-3 inputs the outputs of the total cumulative frequency reading/updating units 162 in the probability modeling units, selects one of the outputs according to the order of a context of a restored character, and outputs the selected total number of occurrences of the character relative to the order to the inverse number calculating unit 146 in the arithmetic decoding unit 126.

FIGS. 24A to 25B are timing charts of the pipelined operations in the data restoration system shown in FIGS. 23A and 23B, and shows the operations of the arithmetic decoding unit 126 that is a shared unit and the one-order probability modeling unit 132 that is representative of all probability modeling units included in the blend context probability modeling unit 128. Cycles T1 to T13 in FIGS. 24A and 24B constitute a sequence for decoding an input code on the basis of rank 1 derived from the input code. Cycles T14 in FIG. 24B to T24 in FIG. 25A constitute a sequence for outputting an escape code when a child is present. Cycles T25 to T38 constitute a sequence for decoding a code on the basis of any rank other than rank 1.
(Parallel processing of the whole of a blend context)

Figure 26A:
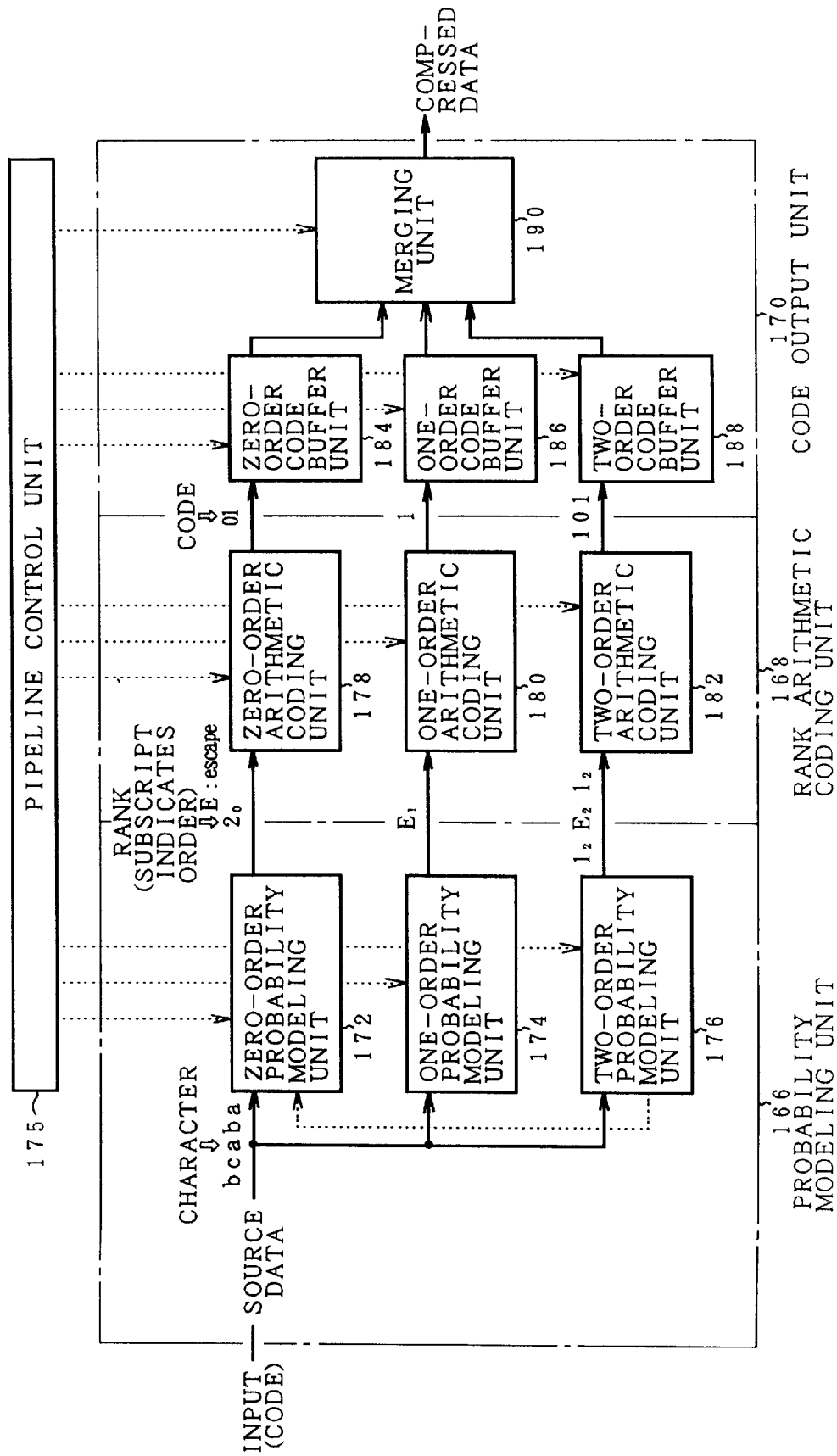

FIG. 26A shows another embodiment of a data compression system for handling a blend context. In this embodiment, all of a probability modeling unit 166, arithmetic coding unit 168, and code output unit 170 have component units thereof operated in parallel. Furthermore, a pipeline control unit 175 is included to enable the component units to operate in pipelining. This embodiment is designed for a blend context of two-order contexts. The probability modeling unit 166 includes zero-order, one-order, and two-order probability modeling units 172, 174, and 176. The arithmetic coding unit 168 includes zero-order, one-order, and two-order arithmetic coding units 178, 180, and 182. The code output unit 170 includes zero-order, one-order, and two-order code buffer units 184, 186, and 188. Any of code outputs relative to orders is selected by a selecting unit 190, and output as compressed data.

FIG. 26B is a timing chart of the pipelined operations in the data compression system shown in FIG. 26A. Assume that characters dcaba have been input, two characters dc have already been encoded, and characters aba are about to be encoded. First, during cycle T1, character a is input to each of the zero-order, one-order, and two-order probability modeling units 172, 174, and 176 in order to obtain ranks. Assume that the two-order probability modeling unit 176 has produced an encoded output 12 of rank 1 relative to the two registered and encoded characters dc. If a rank relative to a larger-order context is obtained effectively, the fact is reported to the smaller-order probability modeling units in order to prohibit the modeling units from providing an output. During cycle T1, therefore, the one-order probability modeling unit 176 alone provides the encoded output $1_2$ of rank 1. During cycle T2, the next character b is input to each of the zero-order, one-order, and two-order probability modeling units 172, 174, and 176 in order to obtain ranks. At this time, the two-order arithmetic coding unit 182 carries out arithmetic coding on the basis of the encoded output $1_2$ provided by the two-order probability modeling unit 176, and inputs code 1 to the two-order code buffer 188. During cycle T2, the two-order probability unit 176 in the probability modeling unit 166 does not have children corresponding two characters ca and therefore outputs an escape code $E_2$. The one-order probability modeling unit 174 does not have a child a, either, and therefore outputs an escape code $E_1$ relative to a one-order context. If such an escape code is output, the zero-order probability modeling unit 172 is validated ad produces an encoded output $2_0$ of a rank relative to a zero-order context. During cycle T3, the third character a is input. The zero-order, one-order, and two-order probability modeling units 172, 174, and 176 obtain ranks in parallel. In this case, the two-order probability modeling unit 176 provide an effective encoded output $1_2$ of rank 1 relative to a two-order context. During cycle T3, the zero-order, one-order, and two-order arithmetic coding units 178, 180, and 182 operate in parallel and store codes 01, 1, and 0 in the zero-order, one-order, and two-order code buffers 184, and 186, and 188. During cycle T4, a character is encoded by the two-order arithmetic coding unit 182 on the basis of the encoded output $1_2$ of rank 1 provided by the two-order probability modeling unit 176 during cycle T3, and then stored in the two-order code buffer unit 188.

Figure 27A:
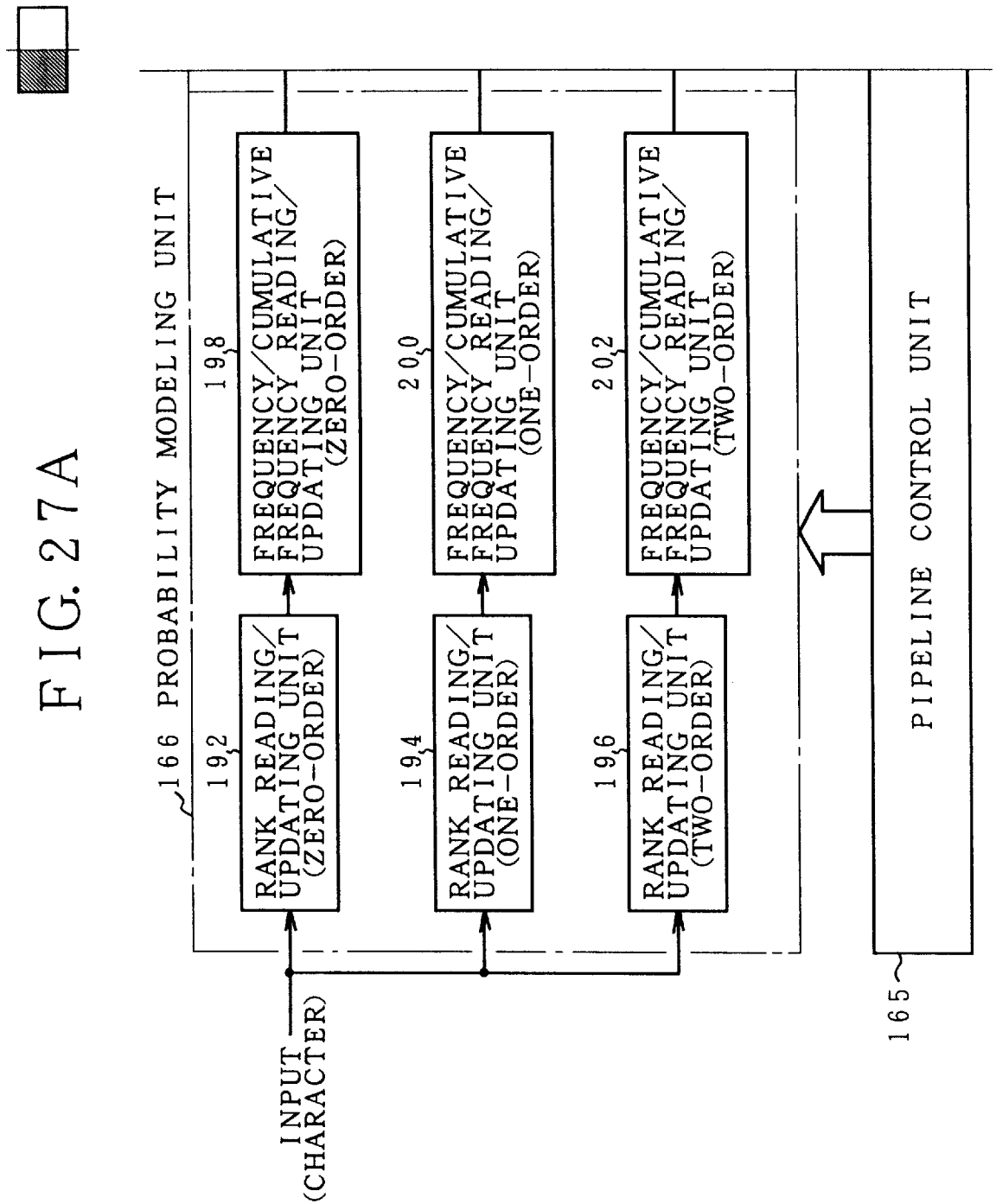

FIGS. 27A and 27B show the details of the data compression system in which component units associated with orders are operated in parallel as shown in FIG. 26A. The blend context probability modeling unit 166 has zero-order, one-order, and two-order rank reading/updating units 192, 194, and 196 operated in parallel, and zero-order, one-order, and two-order frequency/cumulative frequency reading/updating units 198, 200, and 202 connected in series with the preceding stages and operated in parallel. The arithmetic coding unit 168 has code space calculating units 260, 262, and 264, arithmetic code drawing units 266, 268, and 270, and serial-to-parallel conversion code output units 272, 274, and 276 which are associated with a zero-order, one-order, and two-order respectively. The code outputs relative to the respective orders of the arithmetic coding unit 168 are stored in the zero-order, one-order, and two-order code buffer units 184, 186, and 188 in the code output unit 170 shown in FIG. 26A, then merged by a merging unit 190, and output as compressed data. The merging unit 190 merges codes according to the data structure shown in FIG. 27C, so that characters having contexts of orders and corresponding to the codes can be restored mutually independently. The data structure followed by the merging unit 190 is such that zero-order, one-order, and two-order byte length indication areas 266, 268, and 270 for indicating the byte lengths of zero-order, one-order, and two-order buffer codes are defined at the start of the data structure, and the zero-order, one-order, and two-order buffer codes are placed thereafter. A pipeline control unit 160 is included to enable the blend context probability modeling unit 166 and arithmetic coding unit 168 to operate in pipelining.

Figure 28B:
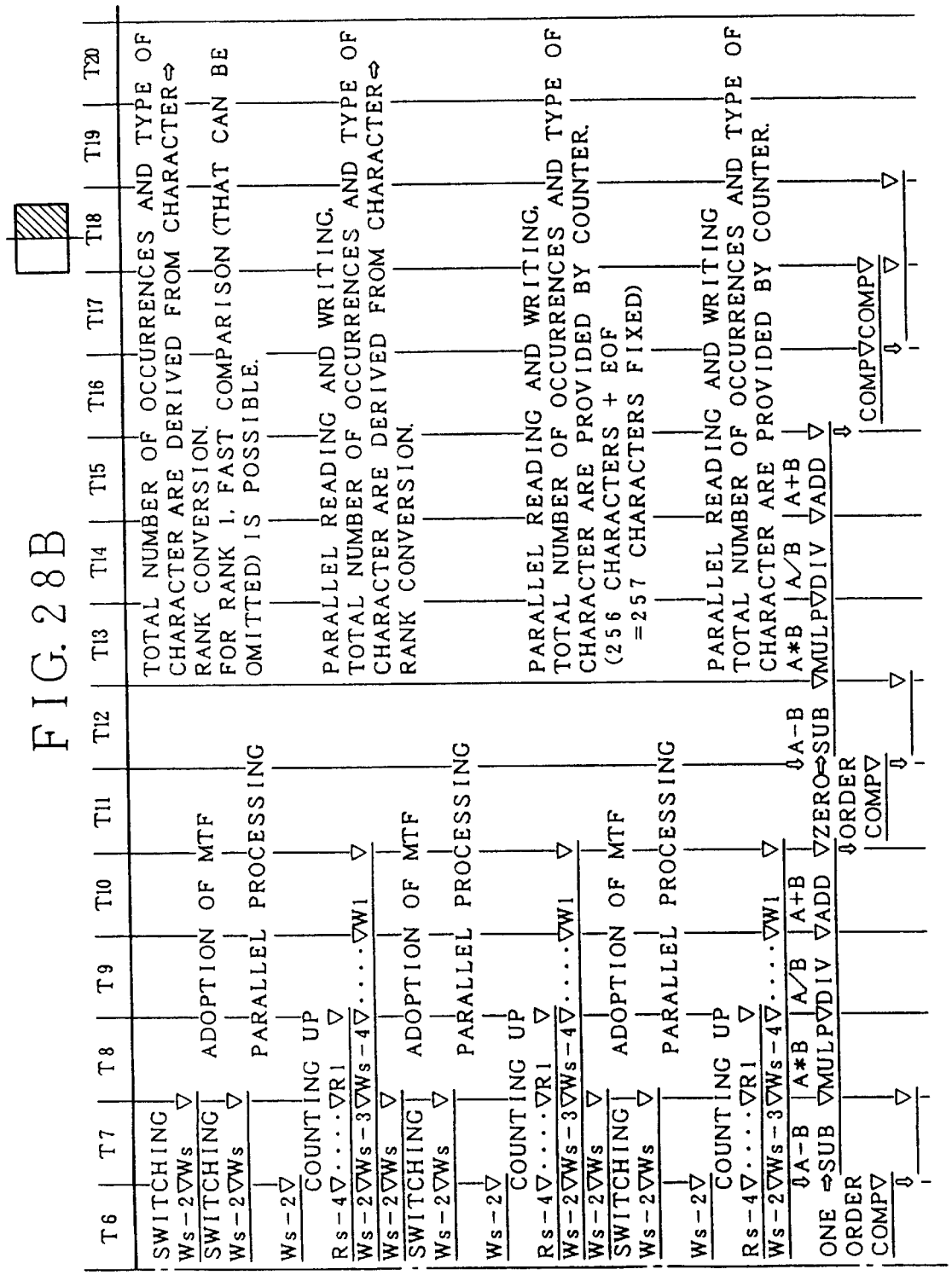

FIGS. 28A and 28B are timing charts of the pipelined operations in the data compression system shown in FIGS. 27A and 27B. During cycles T1 to T0, the blend context probability modeling unit 166 shown in FIG. 27A draws ranks of an input character relative to two-order, one-order, and zero-order contexts, and updates frequency data. Two-order, one-order, and zero-order arithmetic coding operations in the arithmetic coding unit 168 are shown to be carried out in series with one another during cycles T2 to T15 because of the limited space of the drawing. In reality, the two-order, one-order, and zero-order arithmetic coding operations are carried out in parallel during cycle T2 and thereafter. The pipelined operations of the probability modeling unit 166 and arithmetic coding unit 168 shown in FIGS. 28A and 28B are basically identical to those in the data compression system for handling a fixed-order context shown in FIGS. 13A and 13B.

Figure 27C:
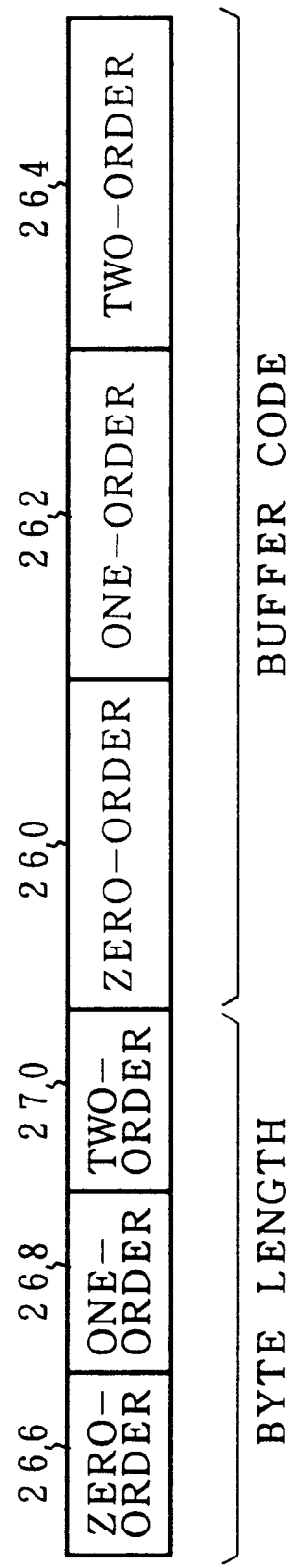
Figure 28B:
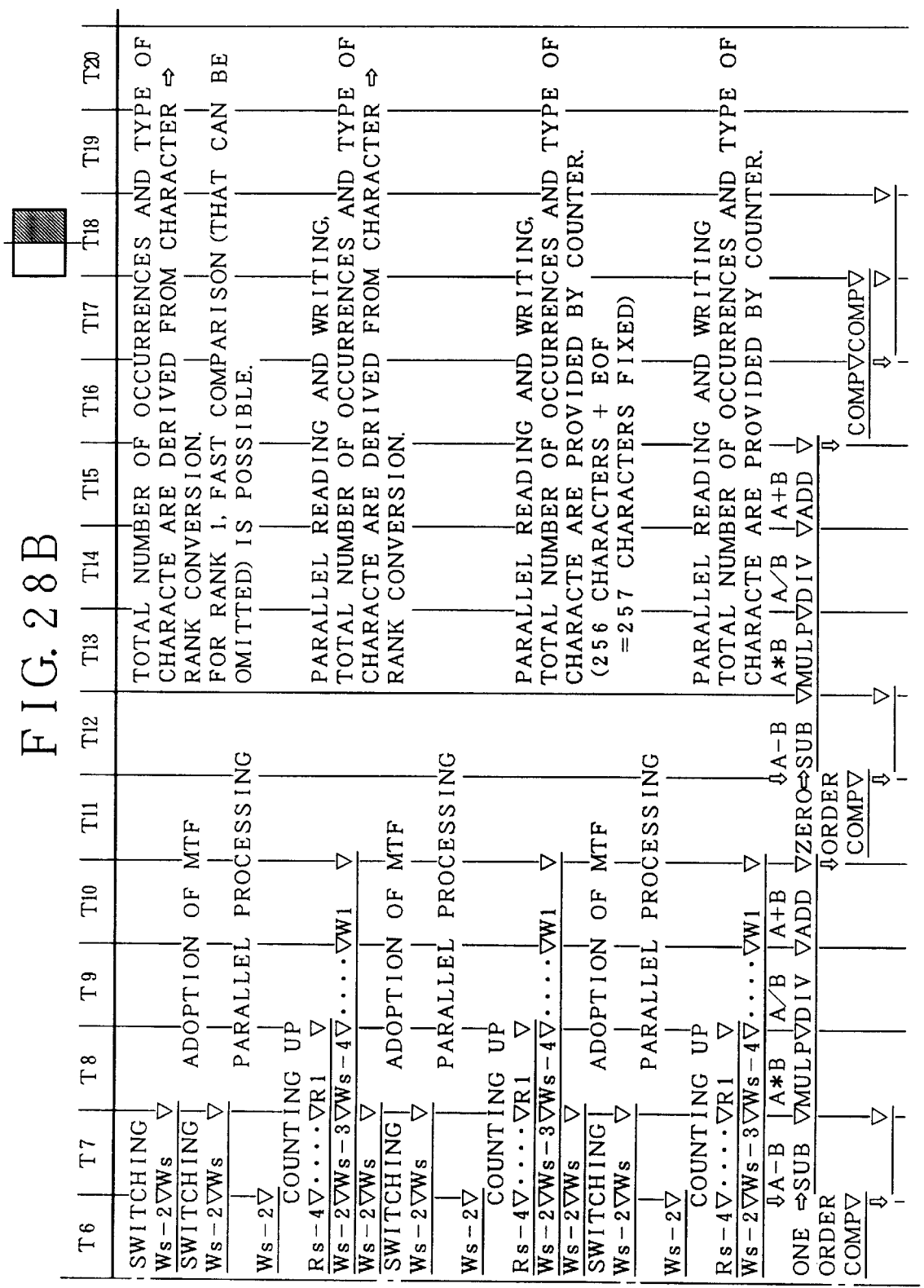
Figure 29A:
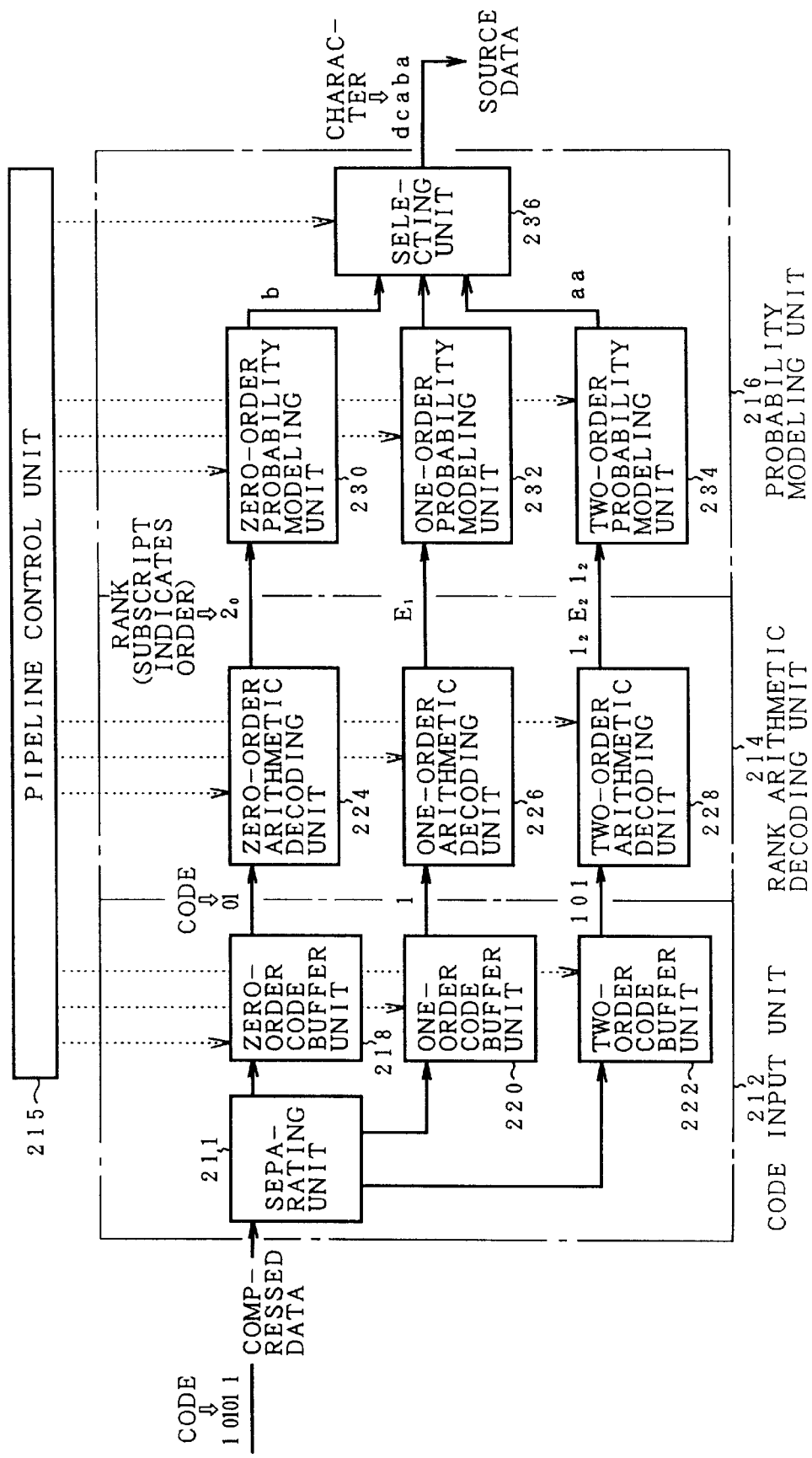
FIGS. 29A and 29B are explanatory diagrams of a basic block of a data restoration system the whole of which operates in parallel so as to handle a blend context, and operations of the basic block.

FIG. 29A shows the fundamental configuration of a data restoration system for restoring data from compressed data produced by the data compression system shown in FIG. 26A. The data restoration system comprises a code input unit 212, arithmetic decoding unit 214, and probability modeling unit 216. The code input unit 212 includes a separating unit 211, so that, for example, when compressed data having the data structure shown in FIG. 27C is input, the codes corresponding to characters having contexts of orders can be stored in zero-order, one-order, and two-order code buffer units 218, 220, and 222. The arithmetic decoding unit 214 has zero-order, one-order, and two-order arithmetic decoding units 224, 226, and 228 operated in parallel. The blend context probability modeling unit 216 has zero-order, one-order, and two-order probability modeling units 230, 232, and 234 operated in parallel. The characters restored by the probability modeling units are input to a selecting unit 236, whereby a character string is output.

Figure 29B:
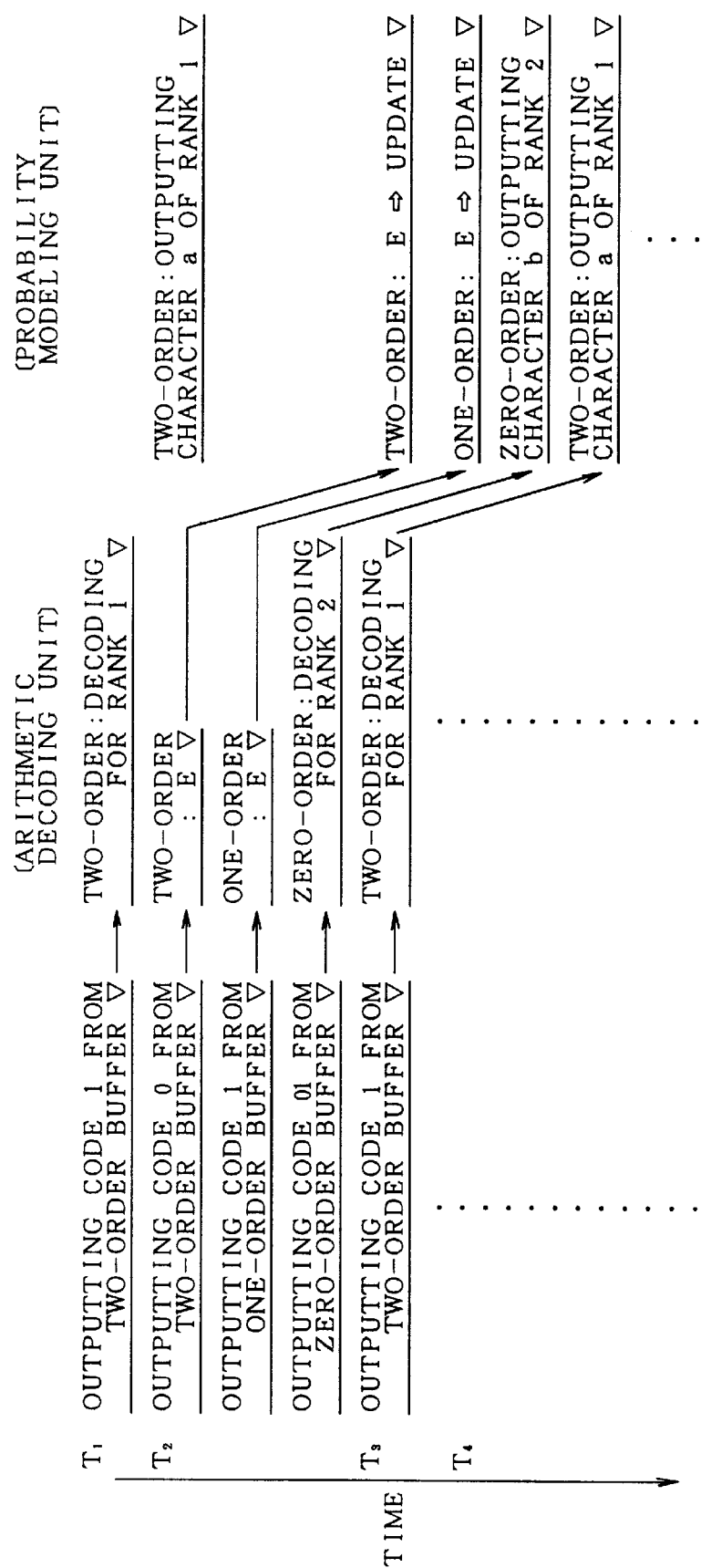

The pipelined operations in the data restoration system shown in FIG. 29A are as illustrated in FIG. 29B. The pipelined operations are carried out on the assumption that codes 1, 0101, and 1 compressed by the system shown in FIG. 26A are input and decoded to restore characters. Assume that characters cd have already been restored. During cycle T1, code 1 separated and placed in the two-order code buffer unit 222 is output to the two-order arithmetic decoding unit 228. Consequently, a decoded output $1_2$ of rank 1 relative to a two-order context is obtained. During the next cycle T2, the two-order, one-order, and zero-order arithmetic decoding units 228, 226, and 224 input an escape code 0 output from the two-order code buffer unit 222, an escape code 1 output from the one-order code buffer unit 220, and code 01 output from the zero-order code buffer 218 respectively, carry out decoding in parallel, and outputs an escape code $E_2$ relative to a two-order context, an escape code $E_1$ relative to a one-order context, and a decoded output $2_0$ of rank 2 relative to a zero-order context respectively.

During cycle T2, the two-order probability modeling unit 234 restores character a in response to the decoded output $1_2$ of rank 1 obtained during cycle T1 and outputs the character. During cycle T3, the two-order buffer unit 222 outputs the third code 1 to the two-order arithmetic decoding unit 228. Consequently, a decoded output $1_2$ of rank 1 is produced. Concurrently, during cycle T3, the two-order probability modeling unit 234 updates the number of occurrences of an escape code, the one-order probability modeling unit 232 updates the number of occurrences of an escape code, and the zero-order probability modeling unit 230 restores and outputs character b of rank 2. During cycle T3, a decoded output $1_2$ is produced by the two-order arithmetic decoding unit 228. During cycle T4, character a of rank 1 is restored and output by the two-order probability modeling unit 234.

Figure 30A:
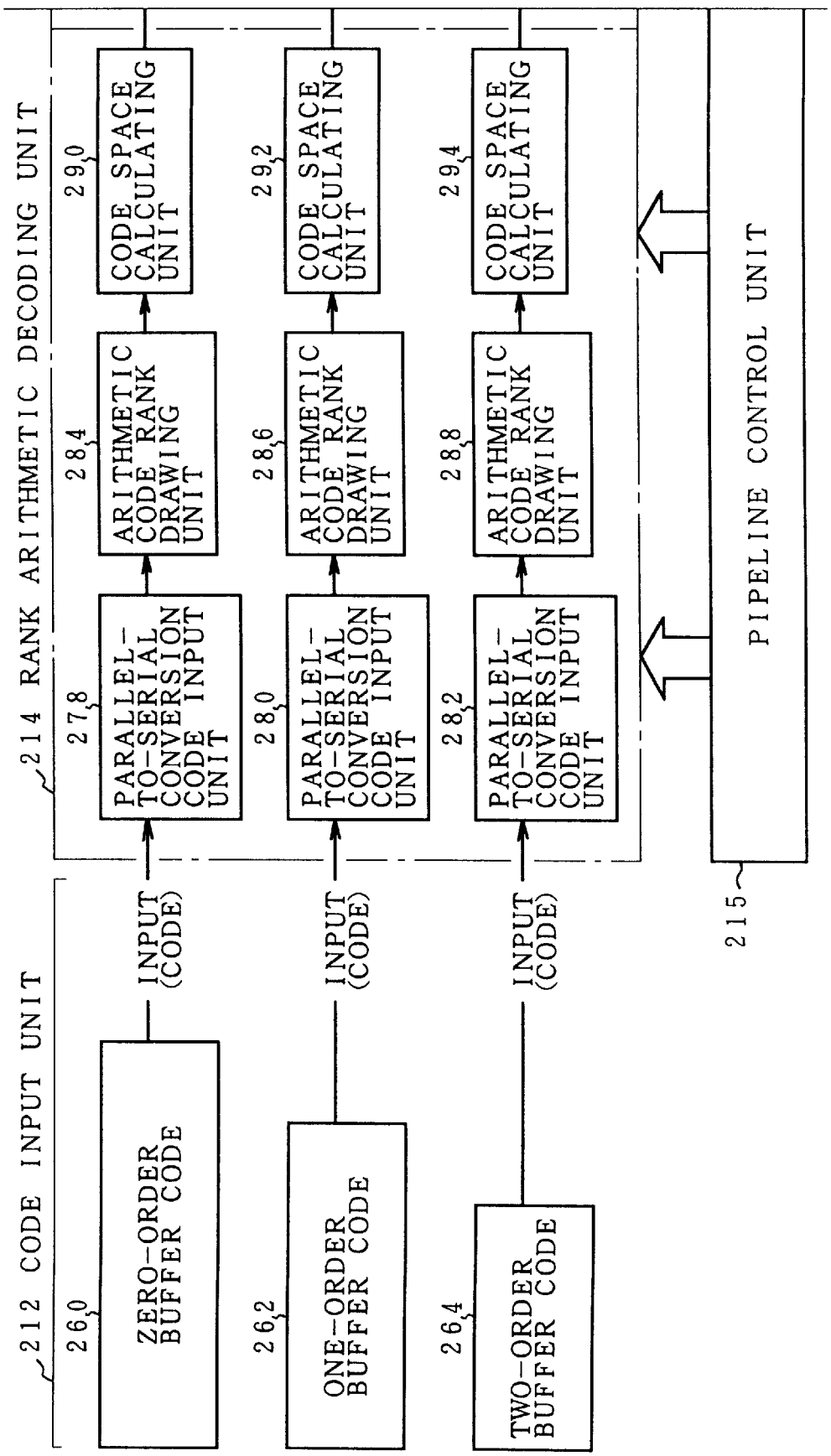
FIGS. 30A and 30B are block diagrams of the detailed configuration of the data restoration system shown in FIG. 29A.
Figure 30B:
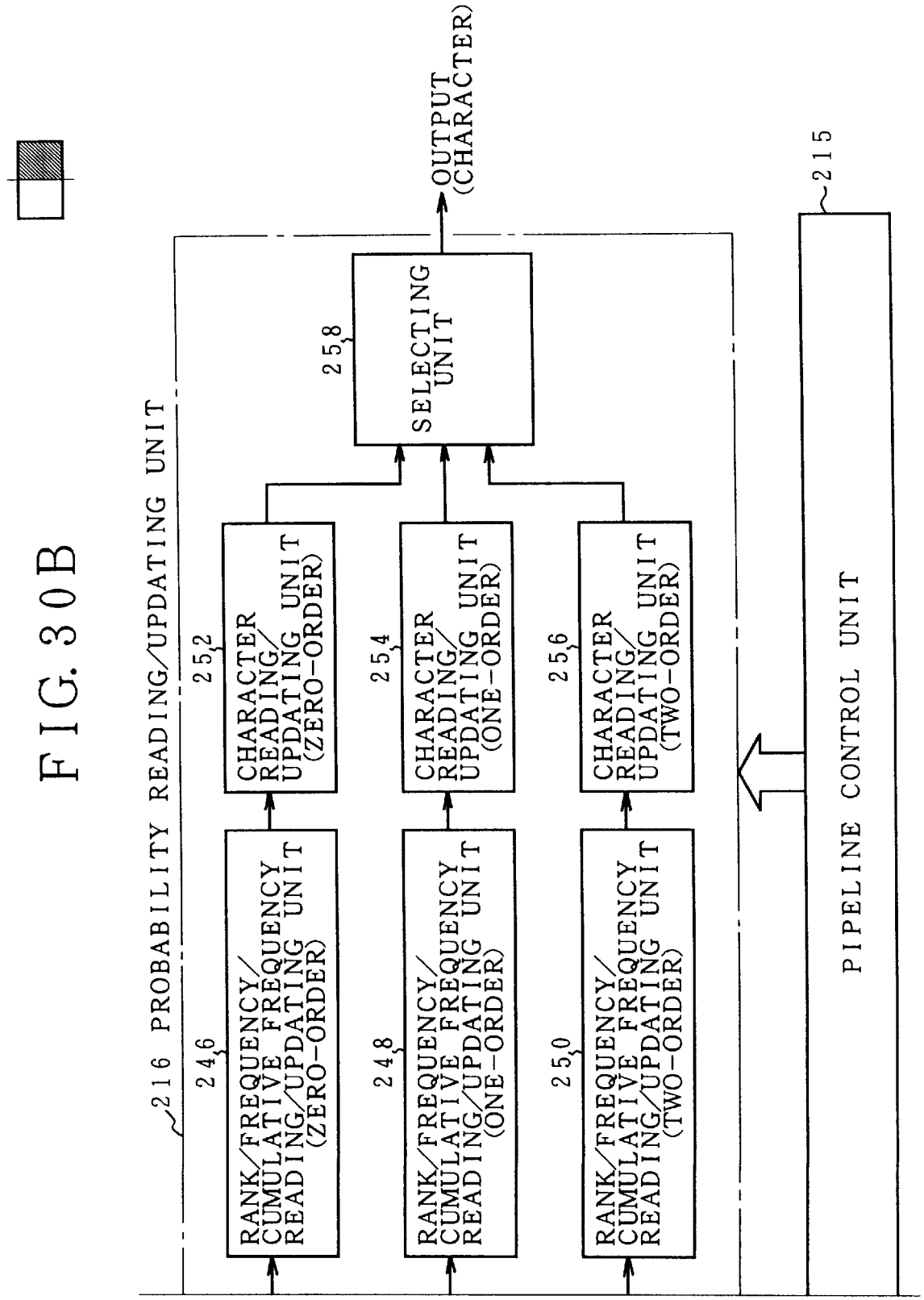

FIGS. 30A and 30B show the details of the data restoration system shown in FIG. 29A, wherein the arithmetic decoding unit 214 and blend context probability modeling unit 216 are shown. The arithmetic decoding unit 214 has parallel-to-serial conversion code input units 278, 280, and 282, arithmetic code rank drawing units 284, 286, and 288, and code space calculating units 290, 292, and 294, which are associated with zero-order, one-order, and two-order contexts, operated in parallel. The zero-order buffer code 260, one-order buffer code 262, and two-order buffer code 264 mutually separated by the code input unit 212 are input in parallel in order to calculate cumulative occurrence frequencies used to draw ranks of respective code spaces. The probability modeling unit 216 includes rank/frequency/cumulative frequency reading/updating units 246, 248, and 250 and character reading/updating units 252, 254, and 256 which are associated with zero-order, one-order, and two-order contexts. A selecting unit 258 selects and outputs any of characters restored by the zero-order, one-order, and two-order code probability modeling units. The arithmetic decoding unit 214 and blend context probability modeling unit 216, which have the foregoing component units associated with orders operated in parallel, operate in pipelining under the control of the pipeline control unit 215.

The timing charts of FIGS. 31A and 31B illustrates the pipelined operations in the data restoration system shown in FIGS. 30A and 30B. Bit code input, cumulative occurrence frequency calculation, and code space calculation to be carried out in the arithmetic decoding unit 214 are carried out in common among the zero-order, one-order, and two-order arithmetic decoding units. For the blend context probability modeling unit 216 on the subsequent stage, the parallel operations of the two-order, one-order, and zero-order probability modeling units are illustrated. The pipelined operations of the arithmetic decoding units and probability modeling units which are associated with orders are basically identical to those of the arithmetic decoding unit and probability modeling unit for handling a fixed-order context shown in FIGS. 17A to 18B. Since the arithmetic decoding units and probability modeling units which are associated with the orders thus operate mutually independently, decoding can be speeded up. Restoration may be suspended due to the output of an escape code. However, since the arithmetic decoding units and probability modeling units associated with the orders operate mutually independently, restoration will not be delayed.

(Access to frequency data in a hashing structure)

Figure 32:
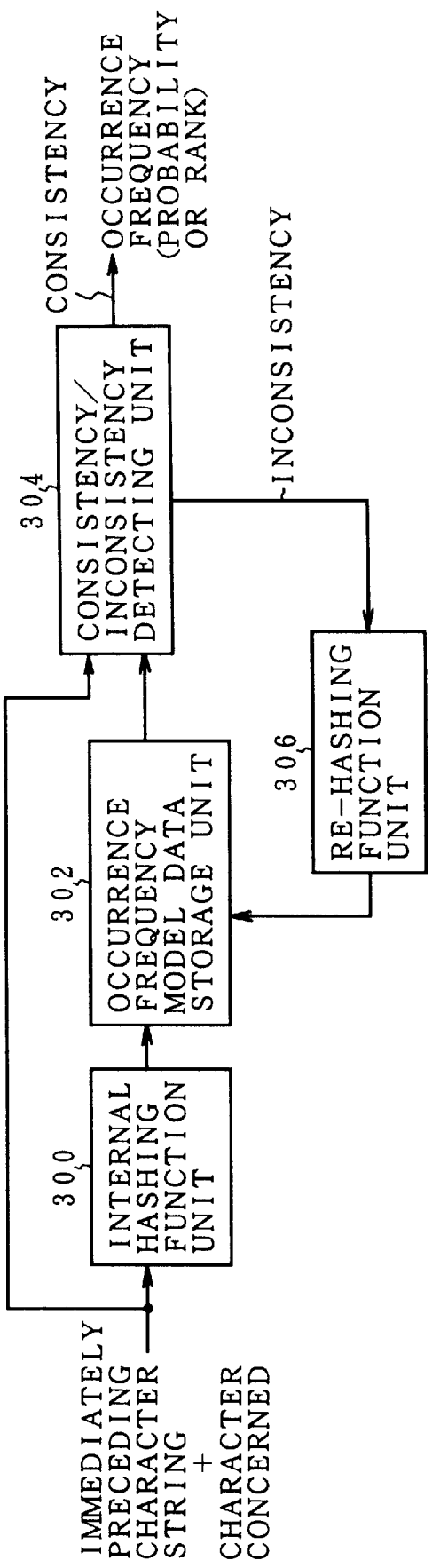
FIG. 32 is a block diagram of an internal hashing structure of a frequency data storage unit incorporated in an occurrence frequency modeling unit of the present invention.

FIG. 32 shows an embodiment of an access structure for reading and updating data existent in a frequency data storage unit incorporated in a probability modeling unit in a data compression system or data restoration system of the present invention. This embodiment is characterized by the adoption of an internal hashing structure. The internal hashing structure comprises an internal hashing function unit 300, occurrence frequency model data storage unit 302, consistency/inconsistency detecting unit 304, and re-hashing function unit 306. For referencing the occurrence frequency model data storage unit 302, a character string made by adding an immediately preceding character string that is a context of any order to an input character concerned is fed to the internal hashing function unit 300 in order to obtain a hash address. The occurrence frequency model data storage unit 302 is referenced according to the hash address, whereby, for example, a probability or rank that is an occurrence frequency is read. The consistency/inconsistency detecting unit 304 judges whether an input character string is consistent or inconsistent with a character string retrieved from the occurrence frequency model data storage unit 302 according to a hash address. If the character strings are consistent with each other, frequency data at the address is output. If the character strings are inconsistent with each other, it means that associated data is registered at an address resulting from re-hashing carried out because of an collision of accesses to the hash address. The hashing function unit 306 is therefore activated to restart a hashing function. The occurrence frequency model data storage unit 302 is referenced again in order to retrieve the immediately preceding character string and the input character subordinate to the preceding character string. The same applies to registration and update.

Figure 33:
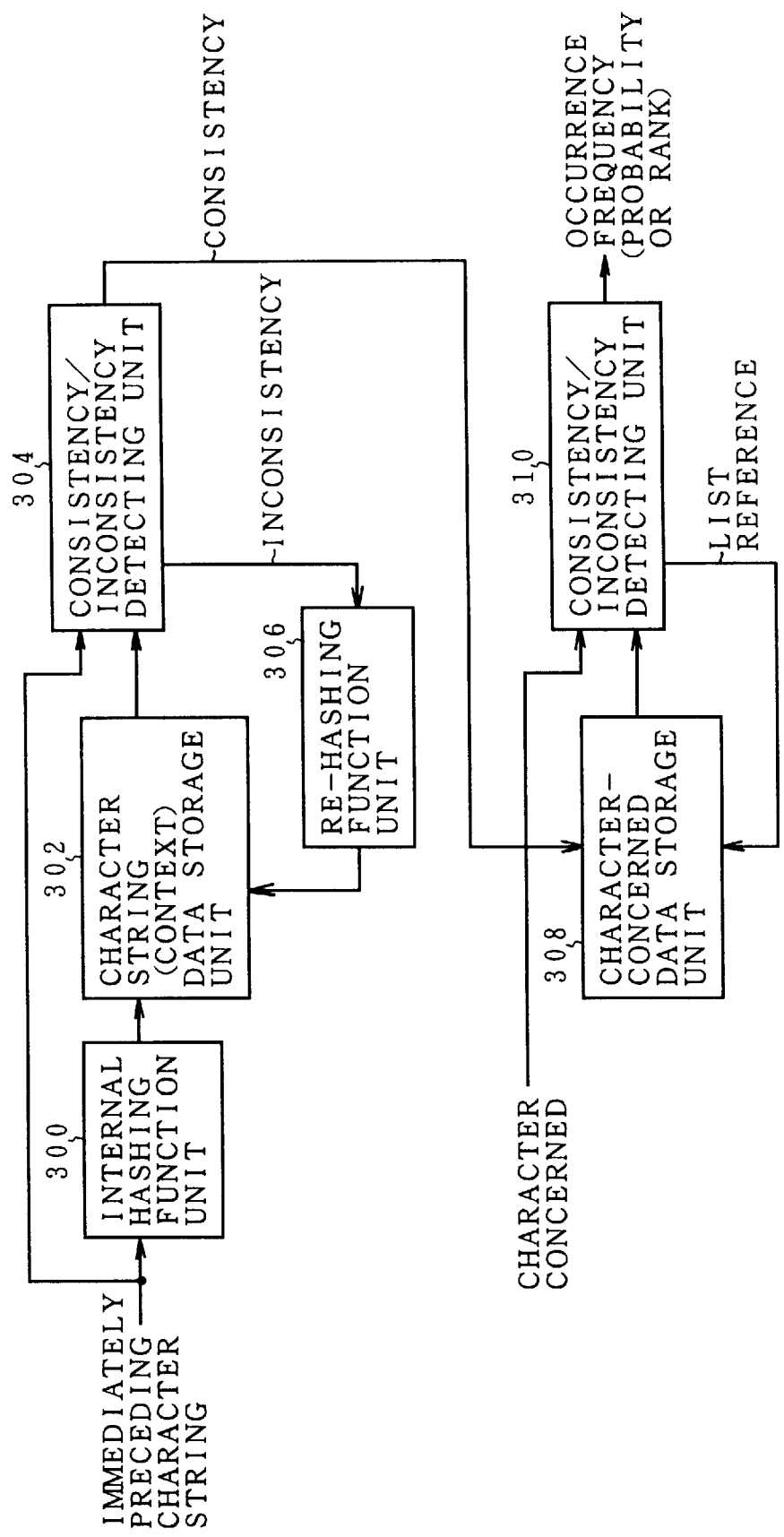
FIG. 33 is a block diagram of an internal hashing structure, which is incorporated in an occurrence frequency modeling unit of the present invention, and an external hashing structure.

FIG. 33 shows another embodiment of an occurrence frequency data access structure in an occurrence frequency modeling unit. This embodiment is characterized in that an internal hashing structure retrieves, registers, and updates an immediately preceding character string (context), and an external hashing structure retrieves, registers, and updates an input character (character concerned) subordinate to the immediately preceding character string (context). The internal hashing structure comprises an internal hashing function unit 300, occurrence frequency model data storage unit 302, consistency/inconsistency detecting unit 304, and re-hashing function unit 306. The external hashing structure for handling an input character concerned comprises a character-concerned data storage unit 308 and consistency/inconsistency detecting unit 310. For example, an input character is regarded as a character concerned. For reading the occurrence frequency such as the probability or rank of the character concerned relative to the immediately preceding character string, the immediately preceding character string is fed to the internal hashing function unit 300 in order to obtain a hash address, and then the occurrence frequency model data storage unit 302 is accessed in order to read character string data. If the read character string is consistent with the immediately preceding character string, the character-concerned data storage unit 308 serving as an external hashing structure is accessed to repeat list reference until the consistency/inconsistency detecting unit 310 judges that a retrieved character concerned subordinate to the immediately preceding character string becomes consistent with the input character concerned. If list reference reveals that the character read from the character-concerned data storage unit 308 is consistent with the input character concerned, the occurrence frequency of the character is output. Thus, access is given by the internal hashing structure shown in FIG. 32 or the combination of the internal hashing structure and external hashing structure shown in FIG. 33. Fast retrieval, registration, and update of the occurrence frequency of a character relative to a context having any order can therefore be achieved in an occurrence frequency modeling unit for data compression or data restoration.

(Encoding and decoding in a word-stream direction)

Figure 34:
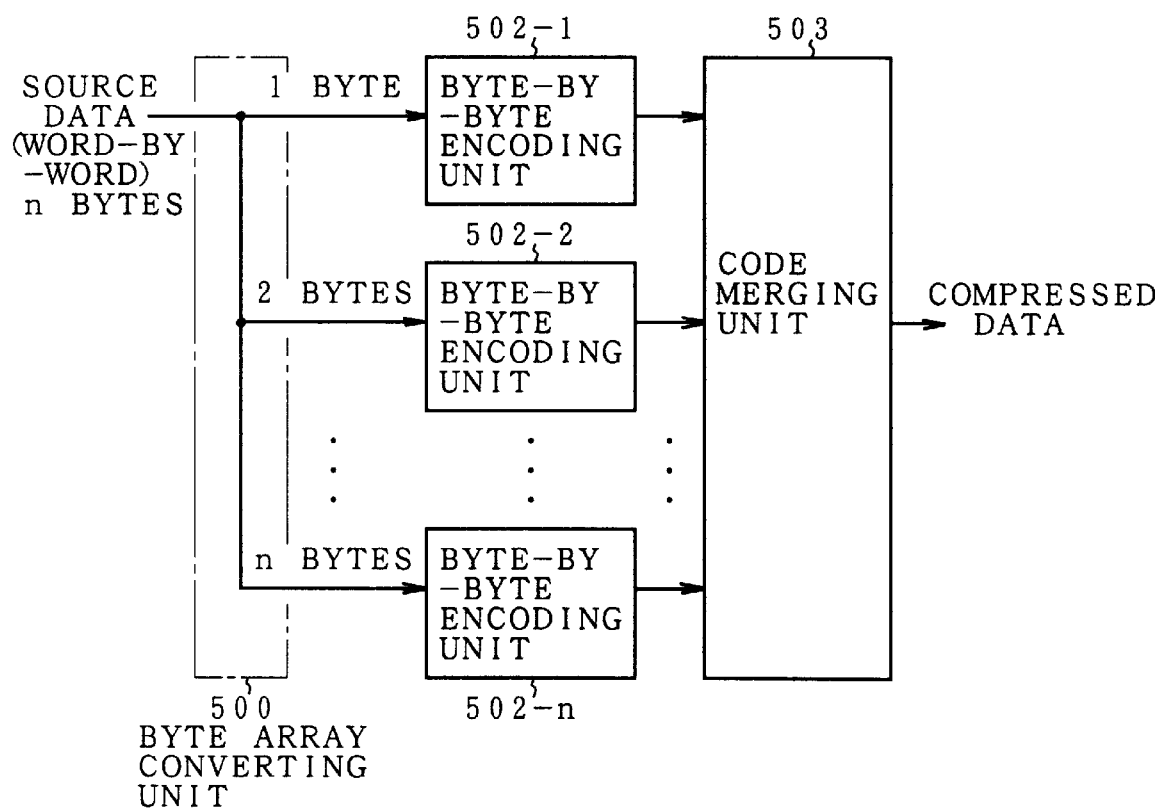
FIG. 34 is a block diagram of a data compression system for encoding data byte by byte in a word-stream direction.

FIG. 34 is a block diagram of a data compression system for encoding word data of a plurality of bytes long word by word. The data compression system is characterized in that a plurality of byte data items constituting one word are encoded in units of a byte data item in a byte-stream direction. Taking for instance word data of n bytes long, the data compression system comprises a byte array converting unit 500, byte-by-byte encoding units 502-1, 502-2, etc. and 502-n which are associated with n bytes, and a code merging unit 503. The byte array converting unit 500 inputs word data of one word of source data which is a byte stream composed of n bytes, separates the word data by byte position, and sets in array resultant byte data items. Specifically, the word data is separated into byte data items of the first byte, second byte, etc. and n-th byte, and the byte data items are arranged by byte position in a word-stream direction. The byte array converting unit 500 stores not only currently-input word data but also byte data items of byte positions of already-encoded preceding word data. As a result, the byte-by-byte encoding units 502-1, 502-2, etc. and 502-n each hold a byte data stream in which byte data items of the same byte position of current word data and already-encoded word data are lined up in the word-stream direction. Input byte data items of the same byte positions of the first byte to the n-th byte of a plurality of words, and already-encoded byte data streams are held, whereby byte data streams of the byte positions form byte data streams in the word-stream direction. Each of the byte-by-byte encoding units 502-1 to 502-n performs dictionary coding or probability statistical coding on a byte stream of each byte position lined up in the work-stream direction. A typical technique such as LZW or LZSS is used as the dictionary coding, and a decoding/coding method such as multi-value arithmetic coding/decoding, dynamic Huffman coding/decoding, or splay coding/decoding is used as the probability statistical coding. The code merging unit 503 merges byte data items of byte positions of input word data which have been encoded in parallel by the byte-by-byte encoding units 502-1 to 502-n, and outputs compressed data. The way of the code merging unit 504 of merging compressed data items includes two methods; a method in which compressed byte data items are uniformly arranged by byte position in the same byte format as that of word data and then merged word by word, and a method in which compressed byte data items of byte positions are merged file by file and used as compressed data.

Figure 35:
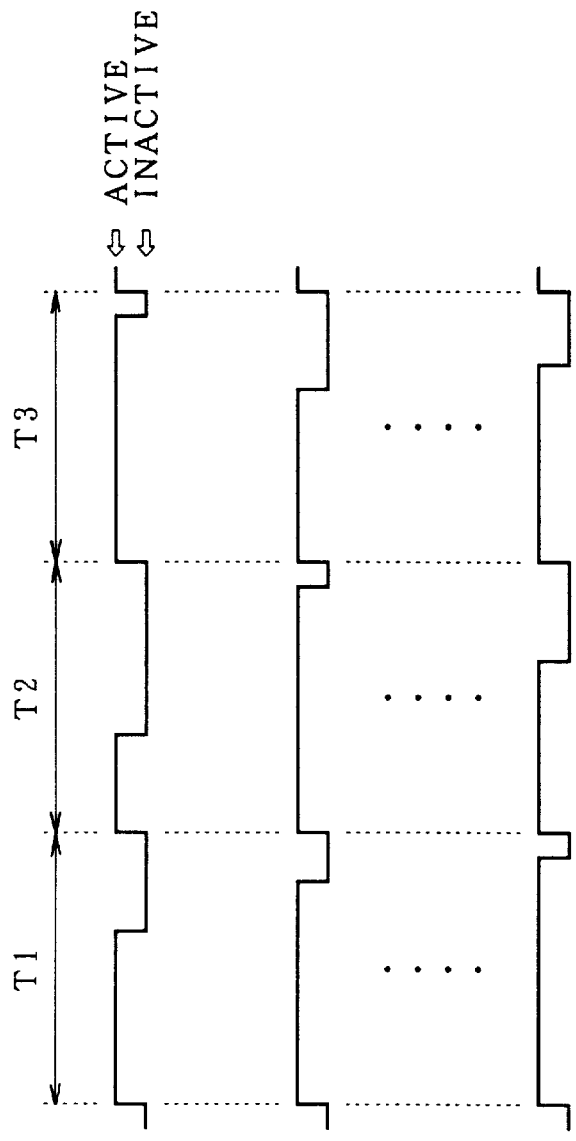
FIGS. 35A to 35C are timing charts concerning the encoding illustrated in FIG. 34.

FIGS. 35A to 35C are timing charts of encoding in a word-stream direction in the data compression system shown in FIG. 34, wherein encoding of the first byte, encoding of the second byte, and encoding of the n-th byte are illustrated in one-to-one correspondence with the byte-by-byte encoding units 502-1, 502-2, and 502-n. During cycle T1, the byte-by-byte encoding units 502-1 to 502-n encode byte data items of the first byte to the n-th byte of the first word. In this case, encoding the first byte is completed first, encoding the second byte is completed secondly, and encoding the n-th byte is completed finally. Encoded compressed byte data items are merged and buffered by the code merging unit 503, and then output as compressed data according to given timing. The processing cycle T1 for the first word is a certain elapsed time interval after the end of encoding performed by the byte-by-byte encoding unit 502-n for handling the last n-th byte, and varies depending on the contents of the encoding. During cycle T2, the byte-by-byte encoding units 502-1 to 502-n encode in parallel byte data items of the first byte to the n-th byte of the second word. During this cycle, the encoding of the second byte shown in FIG. 35B is carried out last. During cycle T3, the third word is encoded. Hereinafter, the same processing as the foregoing one is repeated until the last word data is handled.

Figure 36:
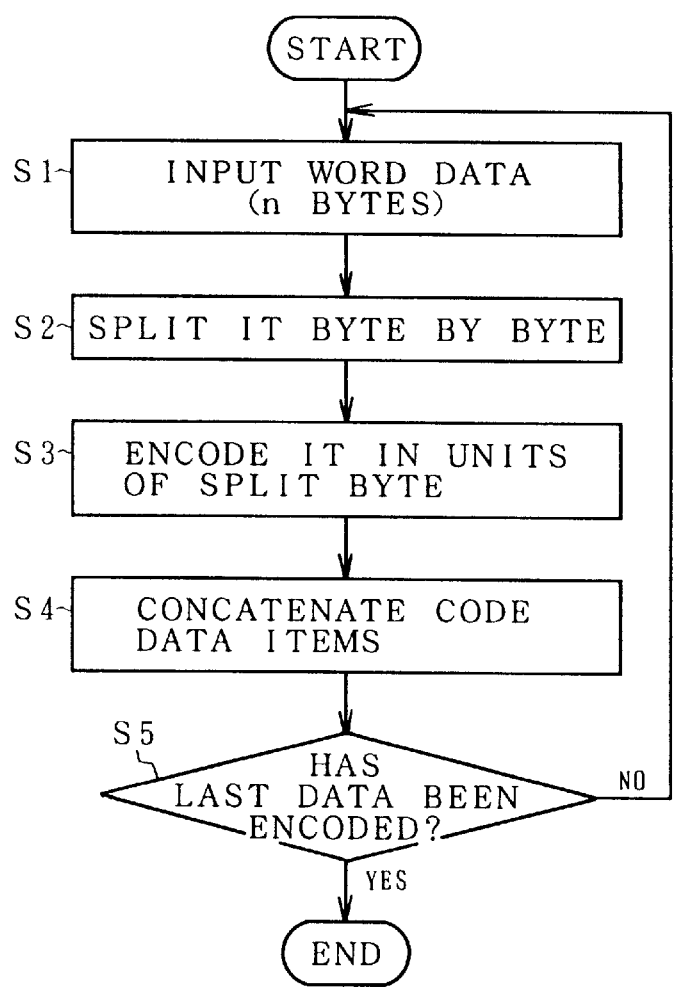
FIG. 36 is a flowchart describing encoding for concatenating compressed byte data items word by word.

FIG. 36 is a flowchart describing encoding in which the code merging unit 503 shown in FIG. 34 merges compressed byte data items word by word. First, at step S1, word data of n bytes long is input. At step S2, the byte array converting unit 500 splits the word data byte by byte. At step S3, the byte-by-byte encoding units 502-1 to 502-n encode in parallel split byte data items of byte positions. At step S4, the code data items are concatenated word by word. The processing from step S1 to S4 is repeated until it is judged at step S5 that the last word data has been encoded.

Figure 37:
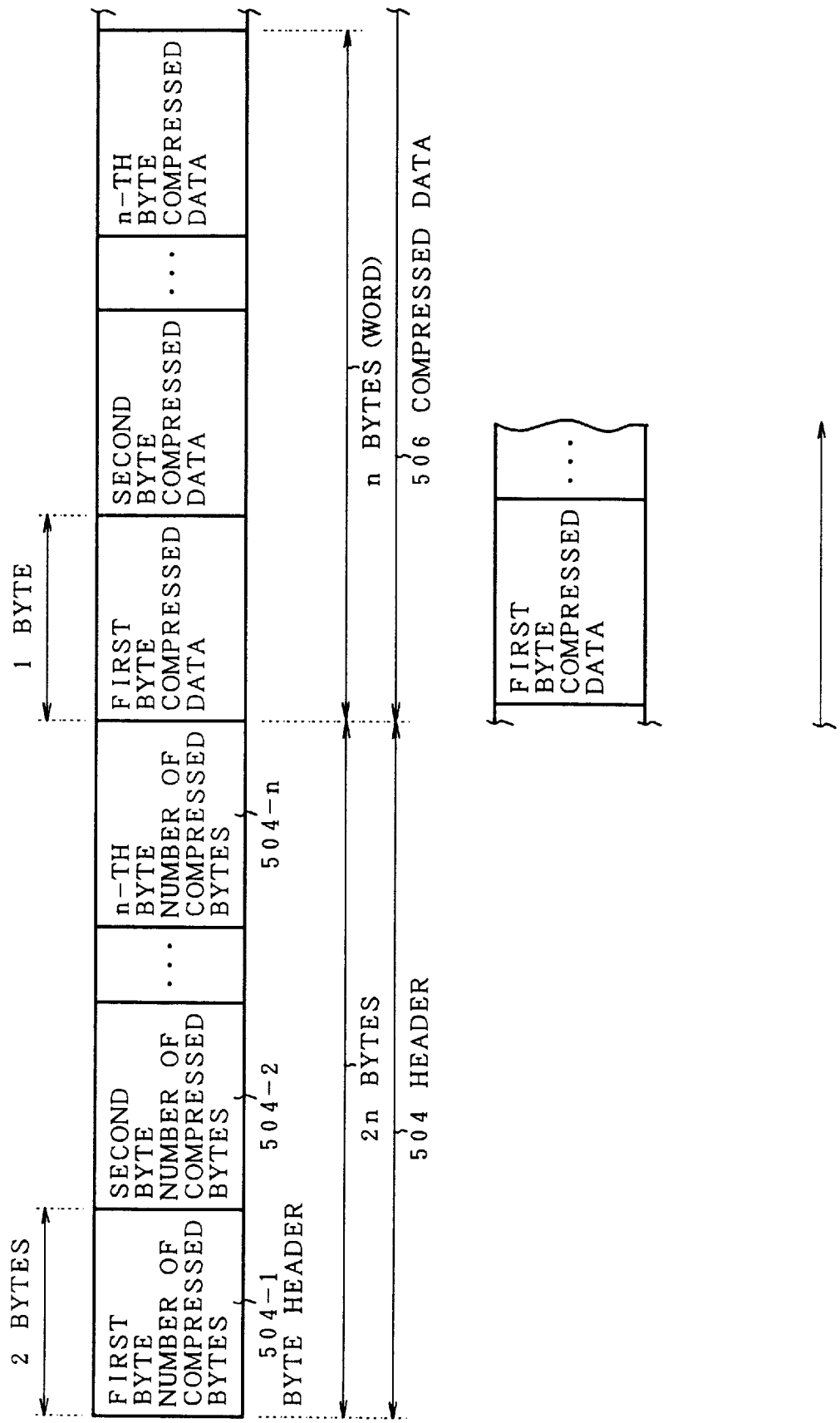
FIG. 37 is an explanatory diagram of the format of compressed data made by concatenating compressed byte data items word by word.

FIG. 37 is an explanatory diagram of a format of compressed data employed in merging compressed byte data items word by word. Each of compressed data items to be merged word by word is composed of a header 504 and compressed data 506. The header 504 includes byte headers 504-1, 504-2, etc., and 504-n associated with n bytes constituting one word data. Set in each of the byte headers 504-1 to 504-n are the number of compressed bytes of each byte position and the number of data items of each byte position to be produced when compressed byte data items are merged word by word. In the compressed data 506, n bytes constitute, like those of word data that has not been encoded, one word. The first-byte compressed data, second-byte compressed data, etc. and n-th-byte compressed data are set as byte positions of word data of n bytes long. A compressed byte data item corresponding to a byte data item of each byte position is different from any other data item in terms of a data size, that is, the number of bytes. If compressed byte data items corresponding to byte data items encoded word by word are set uniformly, the number of compressed byte data items corresponding to each byte position is different among byte positions. If an overflow occurs, excess compressed byte data items are set in a subsequent word.

FIG. 38 shows compressed data produced by successively inputting and encoding four words of word data items 508-1, 508-2, 508-3, and 508-4, wherein each word data item is four bytes long. The word data item 508-1 has contents A1, A2, A3, and A4 byte by byte, and is encoded and compressed to compressed data item 510-1 composed of compressed byte data items a1 to a4. The next word data item 508-2 is composed of byte data items B1 to B4, and encoded and compressed to a compressed data item 510-2 composed of compressed byte data items b1 to b4. The word data item 508-3 is composed of byte data items C1 to C4, and encoded to a compressed data item 510-3 composed of compressed byte data items c1 to c4. The word data item 508-4 is composed of byte data items D1 to D4, and encoded to a compressed data item 510-4 composed of byte data items d1 to d4. The compressed byte data items constituting the compressed data items 510-1 to 510-4 have different numbers of bytes. For example, the compressed byte data items a1, a2, and a4 are 0.25 byte long, while the compressed byte data item a3 is 0.5 byte long.

Figure 39A:
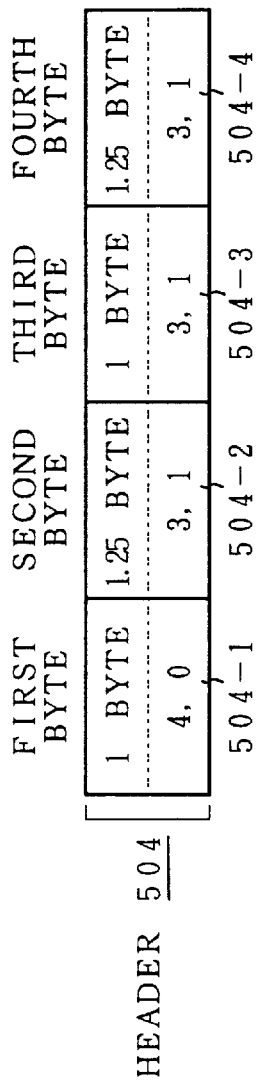
FIGS. 39A and 39B are particular explanatory diagrams of the format shown in FIG. 37 for use in handling compressed byte data items shown in FIG. 38.
Figure 39B:
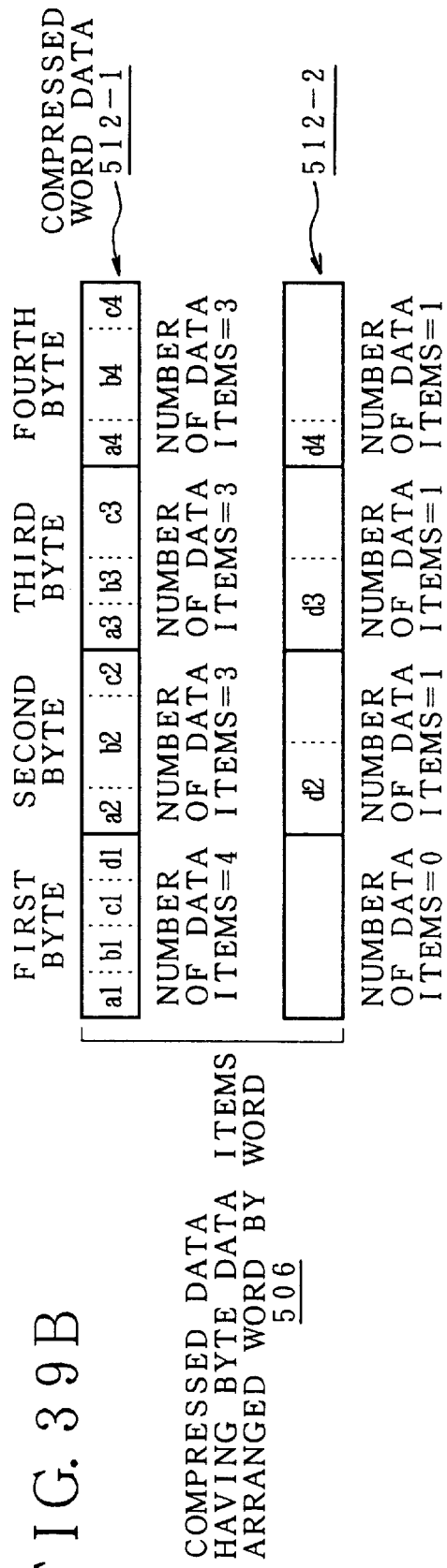

According to the format of compressed data shown in FIG. 37 according to which data items are grouped word by word, a header 504 shown in FIG. 39A and compressed data 506 shown in FIG. 39B are constructed from the data items 510-1 to 510-4, which are shown in FIG. 38, resulting from word-by-word encoding. To begin with, arranging the compressed data items 510-1 to 510-3, which are shown in FIG. 38, used to form compressed data 506 corresponding to words will be described. The compressed byte data items a1, a2, a3, and a4 of the compressed data item 510-1 resulting from encoding of the first word data item 508-1 are arranged uniformly as corresponding byte positions of the first to fourth bytes of a compressed word data item 512-1. In other words, the compressed byte data a1 is set in the first byte of the compressed word data item 512-1, the compressed byte data item a2 is set in the second byte thereof, the compressed byte data item a3 is set in the third byte thereof, and the compressed byte data item a4 is set in the fourth byte thereof. The compressed byte data items b1, b2, b3, and b4 of the compressed data item 510-2, which is shown in FIG. 38, resulting from encoding of the word data item 508-2 are allocated as indicated with b1, b2, b3, and b4 in the drawing to byte positions of the leading compressed word data item 512-1 shown in FIG. 39B. Likewise, the compressed data items 510-3 and 510-4 corresponding to the third and fourth words, which are shown in FIG. 38, are allocated as shown in FIG. 39B. The compressed byte data item d1 of the compressed byte data items d1 to d4 corresponding to the fourth word is set in the first byte of the leading compressed word data item 512-1. However, the remaining compressed byte data items d2 to d4 are set at corresponding byte positions of the next compressed word data item 512-2, because the second, third, and fourth bytes of the leading compressed word data item 512-1 have been completed. For outputting the compressed word data items 512-1 and 512-2 composed of compressed byte data items corresponding to four words altogether, the header 504 contains the numbers of bytes constituting the compressed byte data items of the first to fourth byte, and the numbers of compressed byte data items set at the byte positions of the compressed word data items 512-1 and 512-2. For example, a byte header 504-1 specifies one byte as the total number of bytes constituting the compressed byte data items a1 to d1. Moreover, since four compressed byte data items a1, b1, c1, and d1 are est in the first byte of the compressed word data item 512-1 and the number of data items set in the first byte of the next compressed word data item 512-2 is 0, "4, 0" is specified as the number of data items in the byte header 504-1. Using the header information of the byte headers 504-1 to 504-4 of the header 504 associated with byte positions, the compressed byte data items corresponding to four words can be separated word by word from the compressed word data items 512-1 and 512-2.

Figure 40:
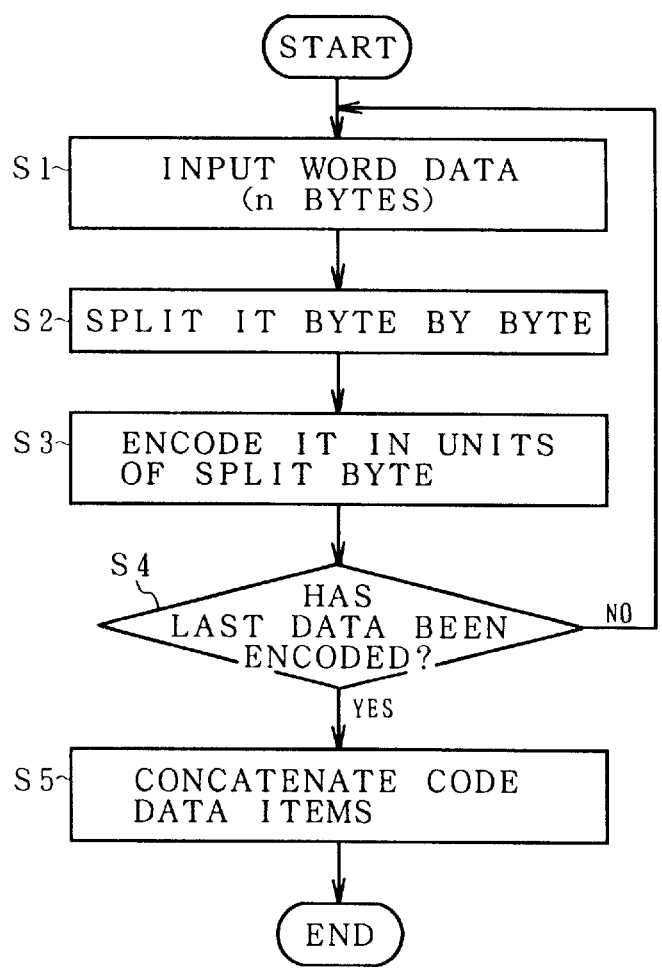
FIG. 40 is a flowchart describing encoding for concatenating compressed byte data items file by file.

The flowchart of FIG. 40 describes encoding in which encoded compressed byte data items are grouped by byte position into files. First, at step S1, word data of n bytes long is input. At step S2, the byte array converting unit 500 splits the word data byte by byte into n byte data items. At step S3, the byte-by-byte encoding units 502-1 to 502-n encode the byte data items in parallel. The byte-by-byte parallel encoding in a word-stream direction of steps S1 to S3 is repeated until it is judged at step S4 that encoding the last word data is completed. When a sequence for encoding a word stream is completed, code data items grouped by byte position into files are concatenated and output as compressed data.

Figure 41:
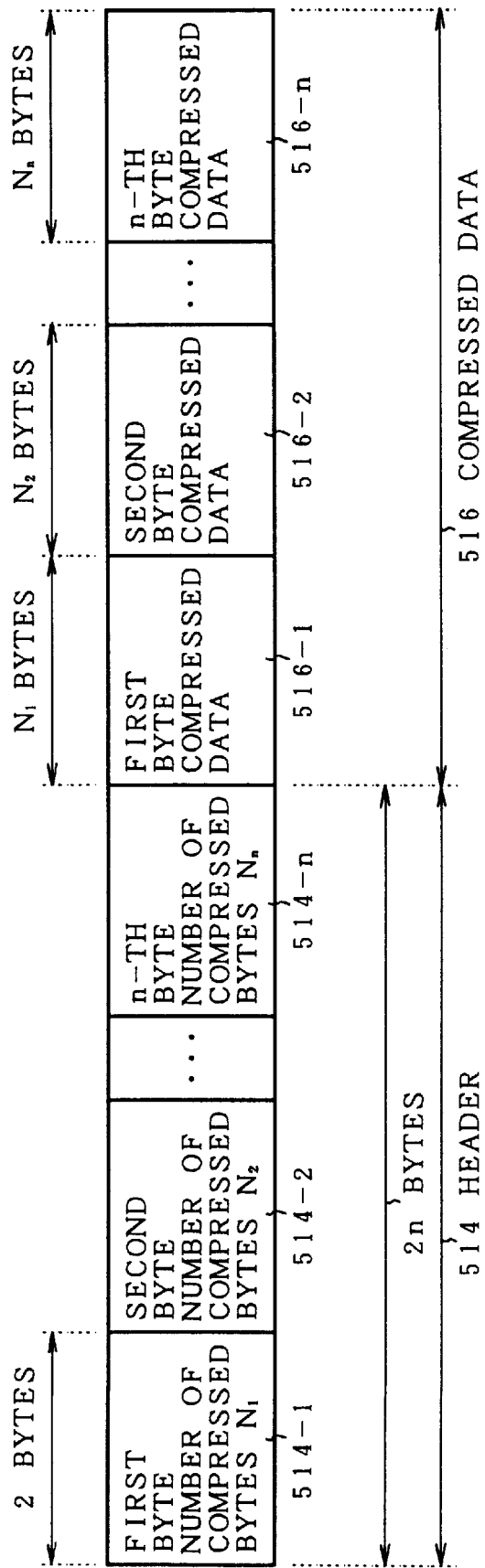
FIG. 41 is an explanatory diagram of the format of compressed data made by concatenating compressed byte data items file by file.

FIG. 41 shows a format of compressed data according to which compressed byte data items are grouped into files as described in FIG. 40. The format of compressed data is composed of a header 514 and compressed data 516. The header 514 includes n file headers 514-1 to 514-n associated with byte positions of word data. The file headers specify the numbers of bytes n1, n2, etc., and $n_n$ constituting the files. The compressed data 516 has compressed data items 516-1 to 516-n corresponding to the first, second, etc., and n-th bytes of the word data set as files.

Figure 42A:
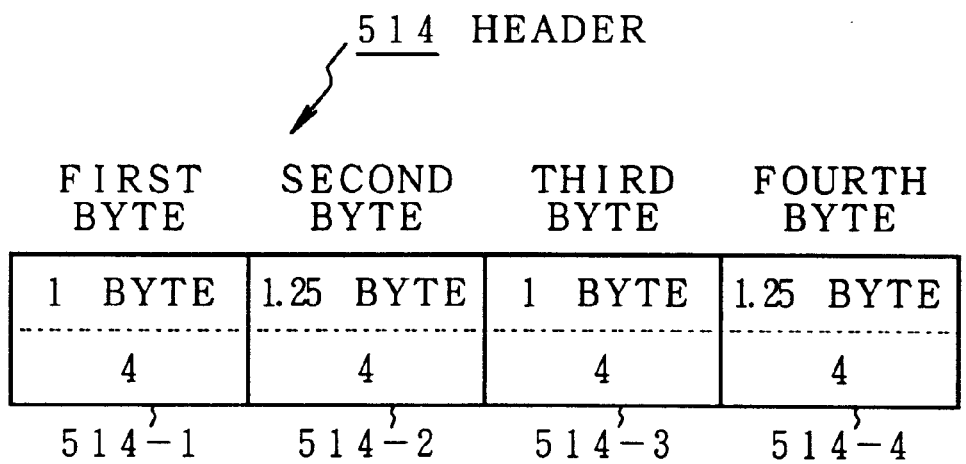
FIGS. 42A and 42B are particular explanatory diagrams of the format shown in FIG. 39 for use in handling compressed byte data items shown in FIG. 38.
Figure 42B:
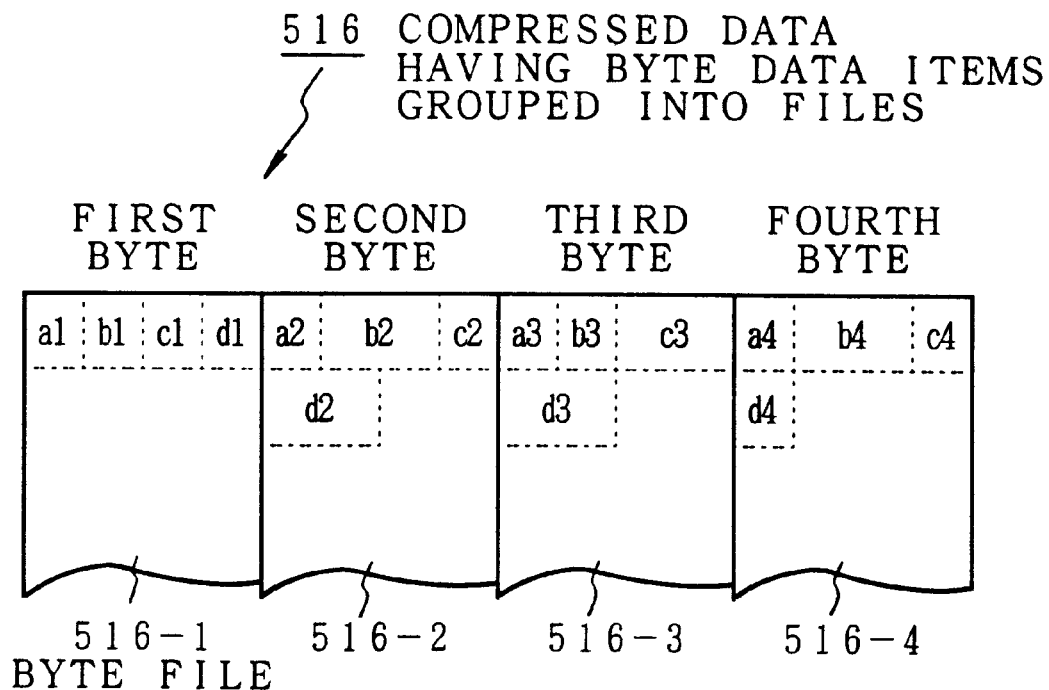

FIGS. 42A and 42B show examples of compressed data in which the compressed data items 510-1 to 510-4 resulting from encoding of the word data items 508-1 to 508-4 of four words shown in FIG. 38 are grouped into files as shown in FIG. 41. Compressed data 516 composed of files shown in FIG. 42B has byte files 516-1 to 516-4 set at byte positions of the first byte, second byte, third byte, and fourth byte thereof. The byte files 516-1 to 516-4 are constructed by setting the compressed byte data items constituting the compressed byte data items corresponding to four words at corresponding byte positions. In line with the set state of the compressed data 516 having compressed byte data items grouped into files, file headers 514-1 to 514-4 of a header 514 shown in FIG. 42A specify the numbers of bytes constituting compressed byte data items forming the byte files 516-1 to 516-4, and the numbers of data items. Note that the numbers of data items are basically the same. Even for compressed data having compressed byte data items grouped into files, using the header information of the header 514, the compressed byte data items corresponding to byte positions of word data items can be separated from a code stream during restoration.

Figure 43B:
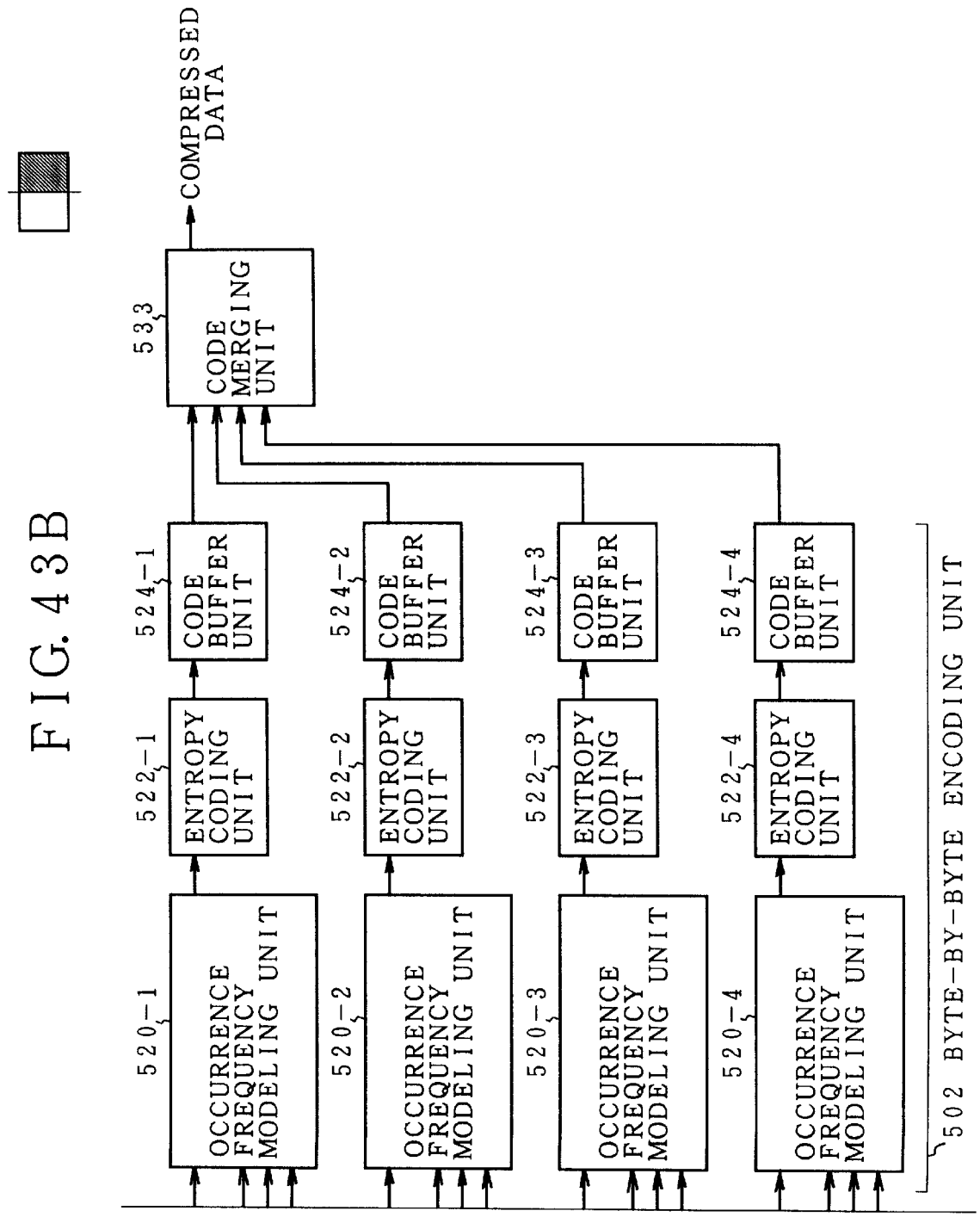

FIGS. 43A and 43B show an exemplary embodiment of the data compression system shown in FIG. 34. The embodiment is characterized in that probability statistical coding is performed on word data of four bytes long. The byte array converting unit 500 includes groups of registers 518-1, 518-2, 518-3, and 518-4, each of which is composed of four registers, associated with the first byte, second byte, third byte, and fourth byte of word data. The registers belonging to the group of registers 518-1 associated with the first byte are registers R11 to R14. The registers belonging to the group of registers 518-2 associated with the second byte are registers R21 to R24. The registers belonging to the group of registers 518-3 associated with the third byte are registers R31 to R34. The registers belonging to the group of registers 518-4 associated with the fourth byte are registers R41 to R44. Input source data is separated into byte data items of the first byte, second byte, third byte, and fourth byte, and held in the registers R11, R21, R31, and R41 on the first stage. Word data is 32 bits long or four bytes long, whereby one byte consists of eight bits. Byte data items of word data encoded immediately previously are held in the registers R12, R22, R32, and R42 on the second stage. Byte data items of word data encoded immediately before the byte data items held in the registers R12, R22, R32, and R42 are held in the registers R13, R23, R33, and R43 on the third stage. Byte data items of word data encoded immediately before the byte data items held in the registers R13, R23, R33, and R43 are held in the registers R14, R24, R34, and R44. In the groups of registers 518-1 to 518-4 associated with the first byte to the fourth byte of word data, byte data items of current word data as well as immediately preceding encoded byte data items thereof, encoded byte data items preceding the immediately preceding ones, and encoded byte data items preceding the byte data items preceding the immediately preceding ones are held by byte position in a word-stream direction. The byte-by-byte encoding unit 502 adopts probability statistical coding, therefore includes occurrence frequency modeling units 520-1 to 520-4 and entropy coding units 522-1 to 522-4, which are associated with byte positions, and further includes code buffer units 524-1 to 524-4 on the last stage. The occurrence frequency modeling units 520-1 to 520-4 each detect a conditional appearance rate based on a model of an occurrence frequency according to a correlation of a current byte data item to be encoded relative to already-encoded past byte data items corresponding to three words, that is, a context of the current byte data item. Based on the conditional appearance rates (ranks) detected by the occurrence frequency modeling units 520-1 to 520-4, the entropy coding units 522-1 to 522-4 carry out statistical entropy coding, thus convert byte data items into codes that are compressed data items arranged byte by byte, and store the codes temporarily in the code buffer units 524-1 to 524-4. In the code buffer units 524-1 to 524-4, when compressed byte data items are arranged byte by byte according to the format shown in FIG. 37 or grouped into files according to the format shown in FIG. 41, codes corresponding to the same byte positions are concatenated by the code merging unit 533. The resultant compressed data stream is then output with a header appended thereto.

FIGS. 44A to 44D are timing charts of byte-by-byte encoding in the data compression system for carrying out probability statistical coding shown in FIGS. 43A and 43B. FIG. 44A is concerned with occurrence frequency modeling and entropy coding for the first byte, FIG. 44B is concerned with those for the second byte, FIG. 44C is concerned with those for the third byte, and FIG. 44D is concerned with those for the fourth byte. For example, during cycle T1, occurrence frequency modeling is carried out for each of byte data items of byte positions. In this example, occurrence frequency modeling is completed orderly from the third byte through the second byte and first byte to the fourth byte. When occurrence frequency modeling is completed, entropy coding to be performed during cycle T2 is activated in a given elapsed time interval after last occurrence frequency modeling is completed. Concurrently, occurrence frequency modeling is performed on the next word data. Thus, occurrence frequency modeling and entropy coding are pipelined. Likewise, during cycles T3, T4, T5, and T6, occurrence frequency modeling and entropy coding are carried out for handling byte positions in parallel.

Figure 45:
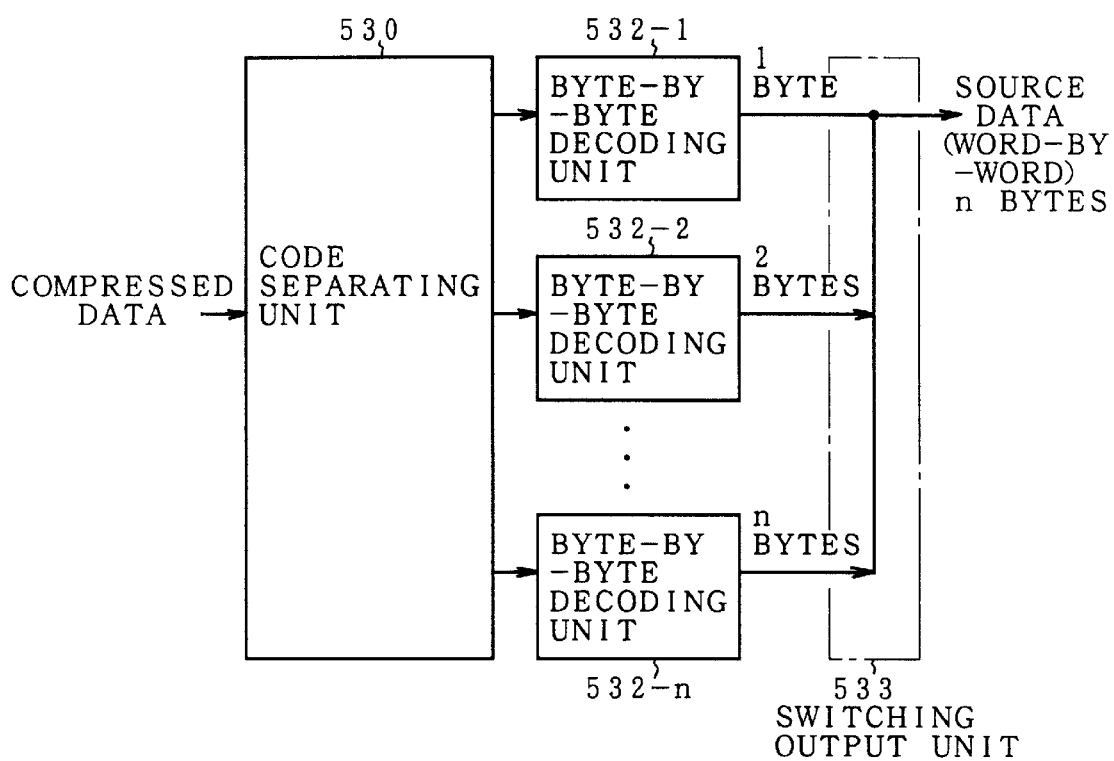
FIG. 45 is a block diagram of a data restoration system for restoring data byte by byte in a word-stream direction.

FIG. 45 is a fundamental block diagram of a data restoration system for inputting compressed data output from the data compression system for carrying out byte-by-byte encoding in a word-stream direction shown in FIG. 34 and restoring word data items. The data restoration system comprises a code separating unit 530, byte-by-byte decoding units 532-1, 532-2, etc., and 532-n associated with byte positions of word data of n bytes long to be restored, and an output switching unit 533. The code separating unit 530 inputs compressed data structured according to the format permitting byte-by-byte arrangement shown in FIG. 37 or the format permitting file-by-file grouping shown in FIG. 41, separates codes, which are compressed byte data items corresponding to byte positions constituting one word data item, according to header information, and outputs the codes in parallel to the byte-by-byte decoding units 532-1 to 532-n. The byte-by-byte decoding units 532-1 to 532-n each input a code corresponding to each byte position, and restores the byte data item of any of the first byte to n-th byte in parallel with the other units by reversing the sequence of encoding. The switching output unit 533 concatenates byte data items output from the byte-by-byte decoding units 532-1 to 532-n by byte position, thus restores word data of n bytes long, and outputs the word data as source data. The byte-by-byte decoding units 532-1 to 532-n carry out dictionary decoding or probability statistical decoding in line with the data compression system shown in FIG. 34. A technique represented by LZW or LZSS is adopted as the dictionary decoding. As the probability statistical decoding, multivalue arithmetic decoding, dynamic Huffman decoding, or code tree decoding such as splay decoding can be adopted.

Figure 46:
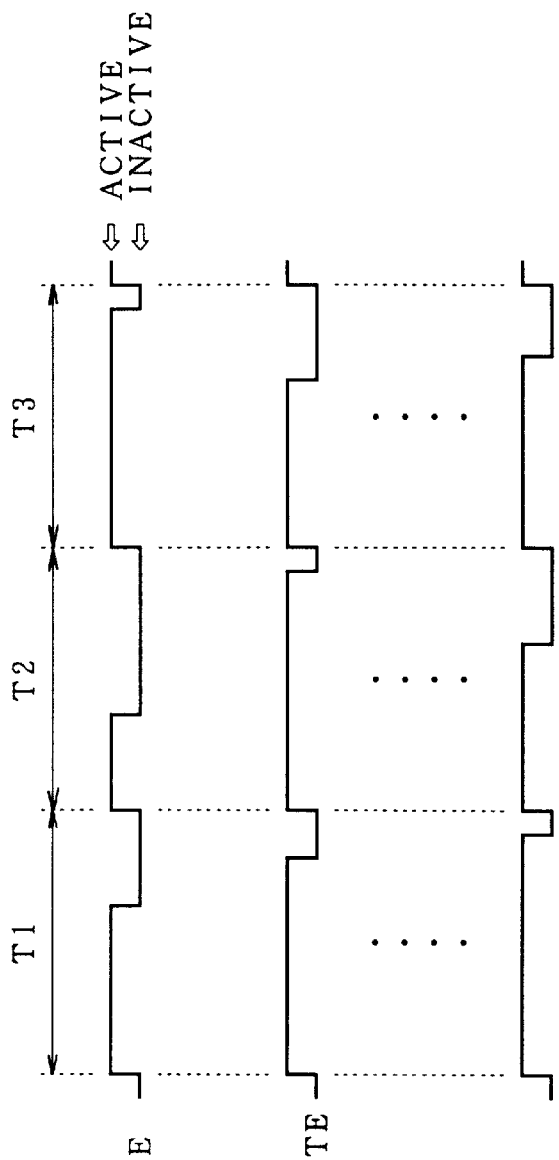
FIGS. 46A to 46C are timing charts of decoding in the system shown in FIG. 45.

FIGS. 46A to 46C show byte-by-byte decoding in the data restoration system shown in FIG. 45, and illustrate decoding for the first byte, second byte, and n-th byte respectively. For example, during cycle T1, codes that are compressed byte data items corresponding to byte positions constituting one word and separated by the code separating unit 530 are input in parallel to the byte-by-byte decoding units 532-1 to 532-n. Byte data items are then restored after the passage of different decoding time intervals. During cycle T1, decoding for the n-th byte is carried out last. Thereafter, in a given elapsed time interval, codes corresponding to byte positions constituting the next word data are decoded in parallel during the next cycle T2. This sequence is repeated.

Figure 47:
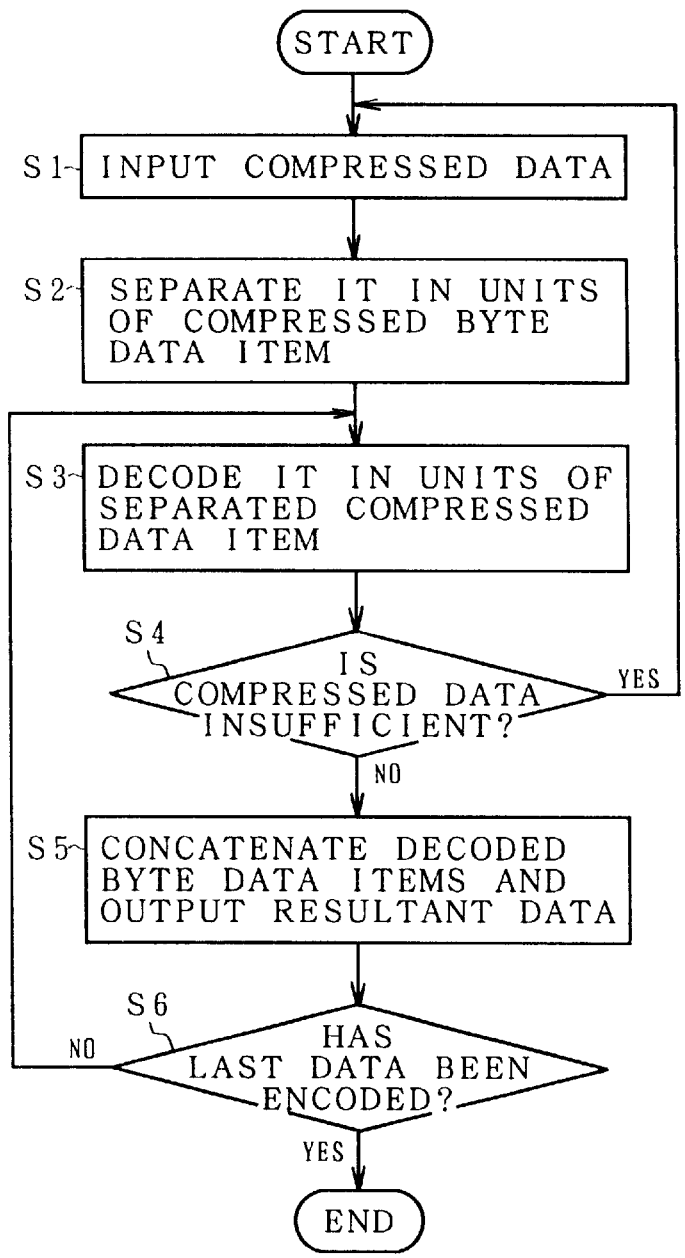
FIG. 47 is a flowchart describing decoding of compressed data made by concatenating compressed byte data items word by word.

The flowchart of FIG. 47 describes decoding of compressed data in which data items are arranged word by word according to the format shown in FIG. 37. First, at step S1, compressed data is input. At step S2, codes corresponding to byte positions of n bytes constiLtuting word data are separated from one another according to header information appended to compressed data. In other words, compressed byte data items are separated byte by byte, and decoded in parallel at step S3. If it is found at step S4 that compressed data items are not insufficient, control is passed to step S5. Restored byte data items arranged byte by byte are concatenated, whereby word data representing one word is output. The processing of steps S3 to S5 is repeated until restoring last data is completed at step S6.

Figure 48:
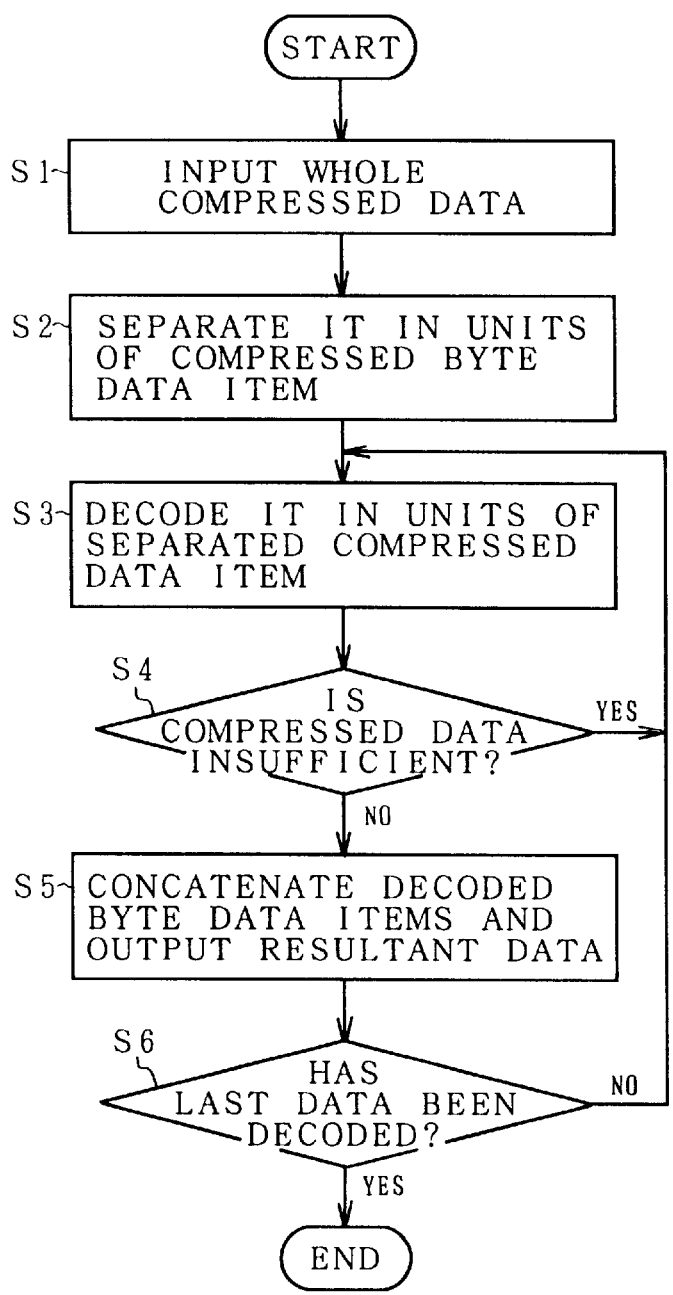
FIG. 48 is a flowchart describing decoding of compressed data made by concatenating compressed byte data items file by file.

The flowchart of FIG. 48 describes restoration of compressed data grouped into files according to the formate shown in FIG. 41. At step S1, the whole compressed data is input. At step S2, all codes contained in the compressed data, that is, compressed byte data items are separated from one another by byte position of word data to be restored. At step S3, separated compressed data items which are arranged word by word are decoded in parallel. If the compressed data items are not insufficient, control is passed to step S5. The restored byte data items constituting one word are concatenated, whereby word data is output. The processing of steps S3 to S5 is repeated until restoring last word data is completed at step S6.

FIGS. 49A and 49B show an exemplary embodiment of the data restoration system shown in FIG. 45. The data restoration system is a data restoration system in line with a data compression system for encoding one word of four bytes long through probability statistical coding. The data restoration system includes a byte-by-byte decoding unit 532 on a stage succeeding a code separating unit 530. Since one word is four bytes long, code buffer units 534-1 to 534-4, entropy decoding units 536-1 to 536-4, and occurrence frequency modeling units 538-1 to 538-4 are operated in parallel while being associated with the first byte, second byte, third byte, and fourth byte. The code buffer units 534-1 to 534-4 each buffer a code that is one of compressed byte data items corresponding to byte positions constituting one word and separated by the code separating unit 530. The entropy decoding unit 536-1 to 536-4 each detect a conditional appearance rate on the basis of an input code and an already-restored immediately preceding byte data stream. The occurrence frequency modeling units 538-1 to 538-4 each register the conditional appearance rate of a current restored byte data item, which is to be linked to an already-restored immediately preceding byte data stream, as frequency data, restore a byte data item by referencing frequency data on the basis of the conditional appearance rate obtained by an associated one of the entropy decoding units 536-1 to 536-4, and update the frequency data. An output switching unit 533 on a stage succeeding the occurrence frequency modeling units 538-1 to 538-4 includes groups of registers 540-1 to 540-4 for storing restored byte data items representing byte positions of three words. The group of registers 540-1 associated with the first byte is composed of registers R110 to R130, the group of registers 540-2 associated with the second byte is composed of registers R210 to R230, the group of registers 540-3 associated with the third byte is composed of registers R310 to R,330, and the group of registers 540-4 associated with the fourth byte is composed of registers R410 to R430. In the groups of registers 540-1 to 540-4, the conditional appearance rates of restored byte data items representing byte positions of three words, which are to be linked to immediately preceding byte data streams, obtained by the occurrence frequency modeling units 538-1 to 538-4 are registered and updated. In the output switching unit 533, restored byte data items of byte positions are fetched as source data items of the first to fourth bytes from the registers R110, R210, R310, and R410, concatenated orderly from the first to fourth bytes, and the output as word data.

FIGS. 50A to 50D are timing charts of entropy decoding and occurrence frequency modeling in the data restoration system shown in FIG. 47. FIG. 50A is concerned with the first byte, FIG. 50B is concerned with the second byte, FIG. 50C is concerned with the third byte, and FIG. 50D is concerned with the fourth byte. Taking cycle T1 for instance, separated codes corresponding to byte positions of the first to fourth bytes are input, and entropy decoding is carried out in order to obtain the conditional appearance rates on the basis of already-restored immediately preceding byte data streams. In this case, the second-stage occurrence frequency modeling to be performed during cycle T2 is started in a given elapsed time interval after last entropy decoding for the fourth byte is completed. Concurrently, separated codes corresponding to byte positions used to restore subsequent word data are input, and entropy decoding is carried out in parallel. Thereafter, the same sequence is repeated during cycles T3, T4, T5, T6, etc.

Figure 51A:
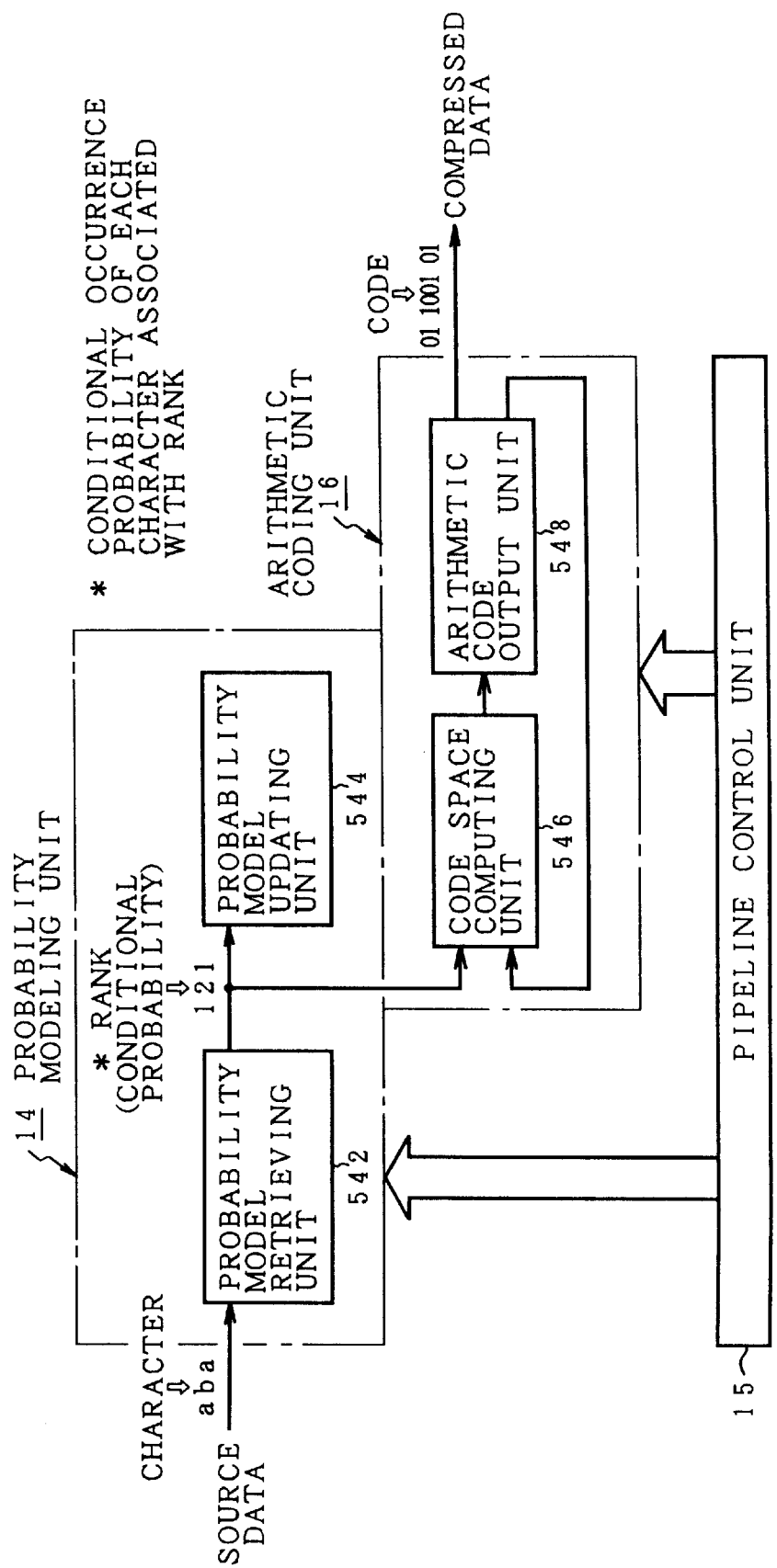
FIGS. 51A and 51B are explanatory diagrams of pipeline control given when arithmetic coding is adapted for encoding byte data in a word-stream direction.

FIG. 51A shows an example of pipeline control for the occurrence frequency modeling unit 520-1 and entropy coding unit 522-1 out of the occurrence frequency modeling units and entropy coding units, which are associated with the first to fourth bytes, in the data compression system shown in FIGS. 43A and 43B, wherein arithmetic coding is adopted as probability statistical coding. In this configuration for attaining pipeline control and realizing arithmetic coding, like the configuration for attaining pipeline control shown in FIG. 8A, a pipeline control unit 15 is included in addition to a probability modeling unit 14 and arithmetic coding unit 16. In the configuration for attaining pipeline control and realizing arithmetic coding shown in FIG. 51A, the probability modeling unit 14 is divided into a probability model retrieving unit 542 and probability model updating unit 544, and the arithmetic coding unit 16 is divided into a code space computing unit 546 and arithmetic code output unit 548. The probability modeling unit 14 has the components shown in FIGS. 9A and 9B. By contrast, the probability model retrieving unit 542 has all the reading abilities of the rank reading/updating unit 18, character reading/updating unit 20, frequency reading/updating unit 22, cumulative frequency reading/updating unit 24, and total cumulative frequency reading/updating unit 26. The probability model updating units has all the other updating abilities thereof. The arithmetic coding unit 16 is divided into the code space computing unit 546 and arithmetic code output unit 548. The code space computing unit 546 has the capabilities of the code space calculating unit 28, code space calculating unit 30, and inverse number calculating unit 32 included in the arithmetic coding unit 16 shown in FIG. 9B. The arithmetic code output unit 548 has the capabilities of the arithmetic code drawing unit 34 and code output unit 36 included in the arithmetic coding unit 16 shown in FIG. 9B. The pipeline control unit 15 is different from the one in the embodiment shown in FIGS. 8A to 9B in a point that the probability model updating unit 544 and code space computing unit 546 are operated in pipelining.

Figure 51B:
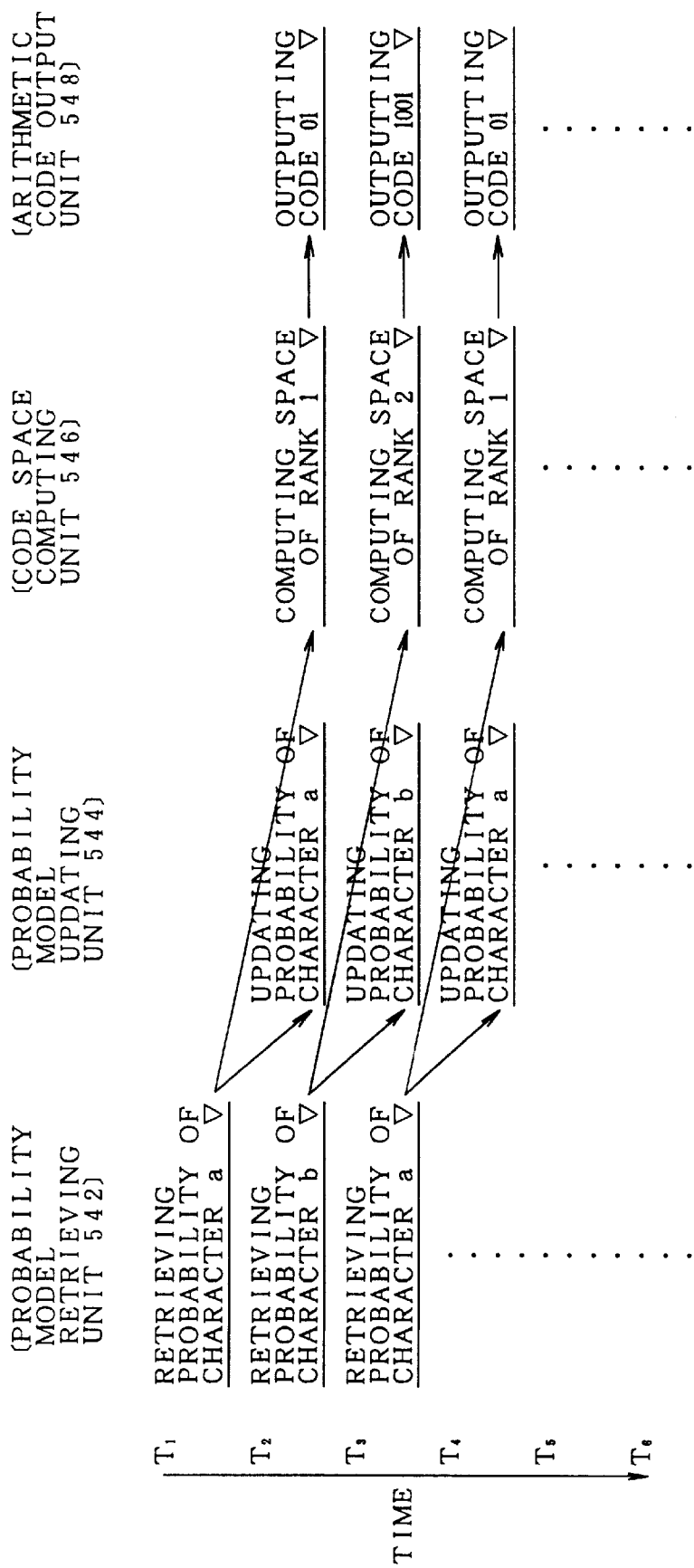

FIG. 51B illustrates pipelined processing for arithmetic coding carried out in the configuration shown in FIG. 51A. Similarly to FIG. 8B, FIG. 51B illustrates encoding to be carried out when characters a, b, and a are input. A difference from the pipelined processing shown in FIG. 8B, the pipelined processing shown in FIG. 51B is such that the probability model updating unit 544 and code space computing unit 546 operates in parallel concurrently after the probability model retrieving unit 542 operates. Compared with the configuration shown in FIGS. 8A to 9B, this configuration permits improved processing performance owing to the pipelined processing.

Figure 52A:
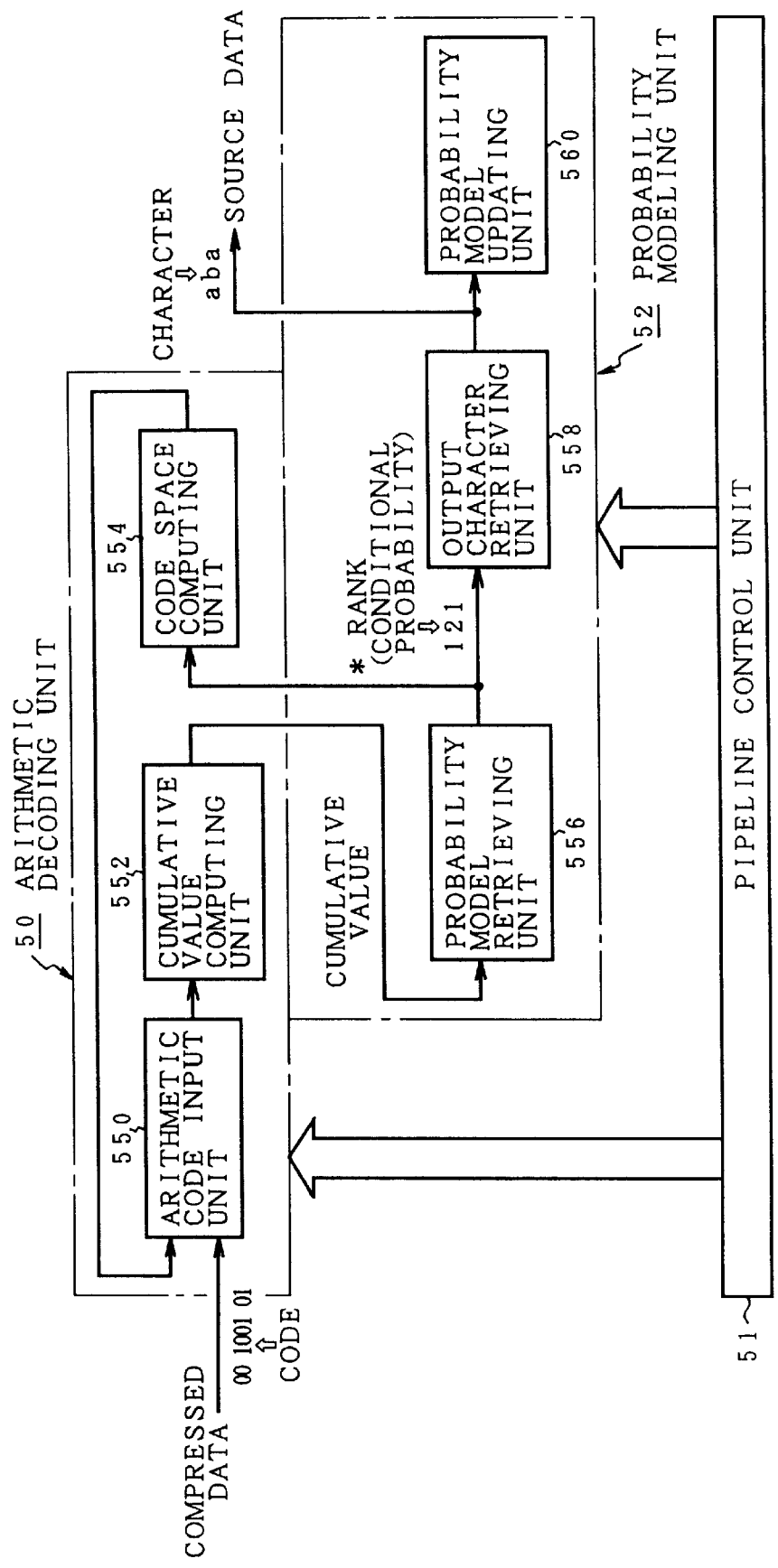
FIGS. 52A and 52B are explanatory diagrams of pipeline control given when arithmetic decoding is adapted for encoding byte data in a word-stream direction.
Figure 52B:
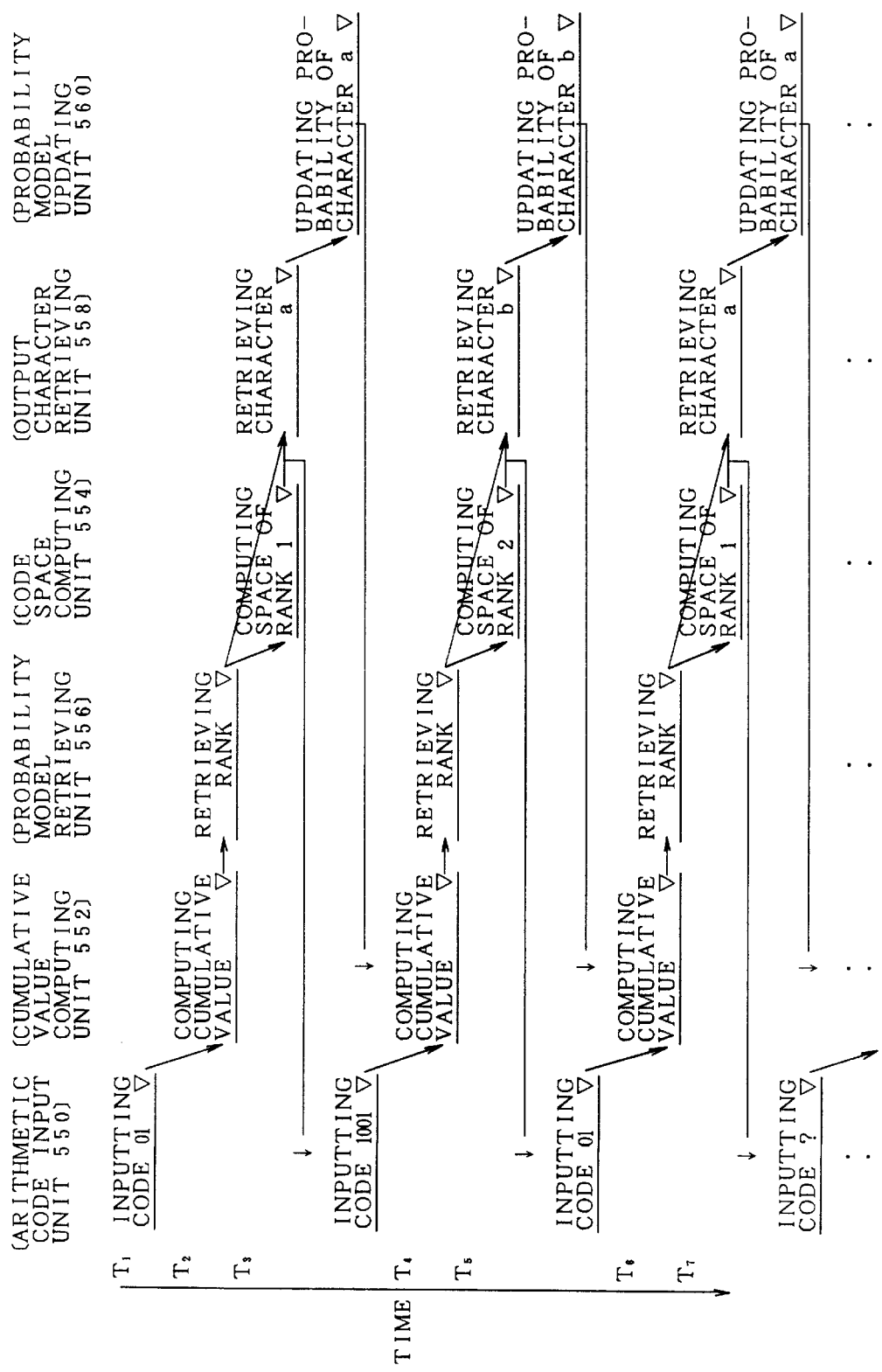

FIGS. 52A and 52B show an embodiment in which arithmetic decoding is adapted for carrying out entropy decoding and occurrence frequency modeling for each of the first to fourth bytes in the data restoration system shown in FIGS. 49A and 49B. FIGS. 52A and 52B show one of parallel processing units associated with four bytes as a representative. When arithmetic decoding is implemented in a data restoration system, entropy decoding and occurrence frequency modeling are realized by an arithmetic decoding unit 50 and probability modeling unit 52. The arithmetic decoding unit 50 has the same components as the one shown in FIG. 15A. The details of FIG. 15A are shown in FIGS. 16A and 16B.

The arithmetic coding unit 50 shown in FIG. 52 is divided into an arithmetic code input unit 550, cumulative value computing unit 552, and code space computing unit 554. As for the correspondence with the embodiment shown in FIG. 16, the arithmetic coding unit 550 corresponds to the code input unit 54 shown in FIG. 16A. The cumulative value computing unit 550 corresponds to the cumulative value drawing unit 56, cumulative frequency drawing unit 64, and inverse number calculating unit 66. The code space computing unit 554 corresponds to the code space calculating units 58 and 60 and inverse number calculating unit 62. The probability modeling unit 52 shown in FIG. 52 is divided into a probability model retrieving unit 556, output character retrieving unit 558, and probability model updating unit 560. As for the correspondence with the probability modeling unit 52 shown in FIG. 16B, the probability model retrieving unit 556 and output character retrieving unit 558 have the reading abilities of the rank drawing unit 68, character reading/updating unit 72, frequency reading/updating unit 74, cumulative frequency reading/updating unit 76, and total cumulative frequency reading/updating unit 78, and also have the capability of the character output unit 80. The probability model updating unit 560 has the updating abilities of these units shown in FIG. 16B. The arithmetic coding unit 50 and probability modeling unit 52 shown in FIG. 14 operate in parallel in pipelining. A difference of the embodiment shown in FIGS. 52A and 52B from that shown in FIG. 14 lies in that the code space computing unit 554 in the arithmetic coding unit 50 and the probability model retrieving unit 556 in the probability modeling unit 52 also operate in parallel in pipelining.

FIG. 52B illustrates decoding carried out in the system shown in FIG. 50A, wherein the same codes as those shown in FIG. 15B are input in order to restore characters. The output of the probability model retrieving unit 556 is supplied to each of the output character retrieving unit 558 and code space computing unit 554. The pipelined operations of these units according to the same timing are thus enabled. This results in improved processing performance.

Figure 53A:
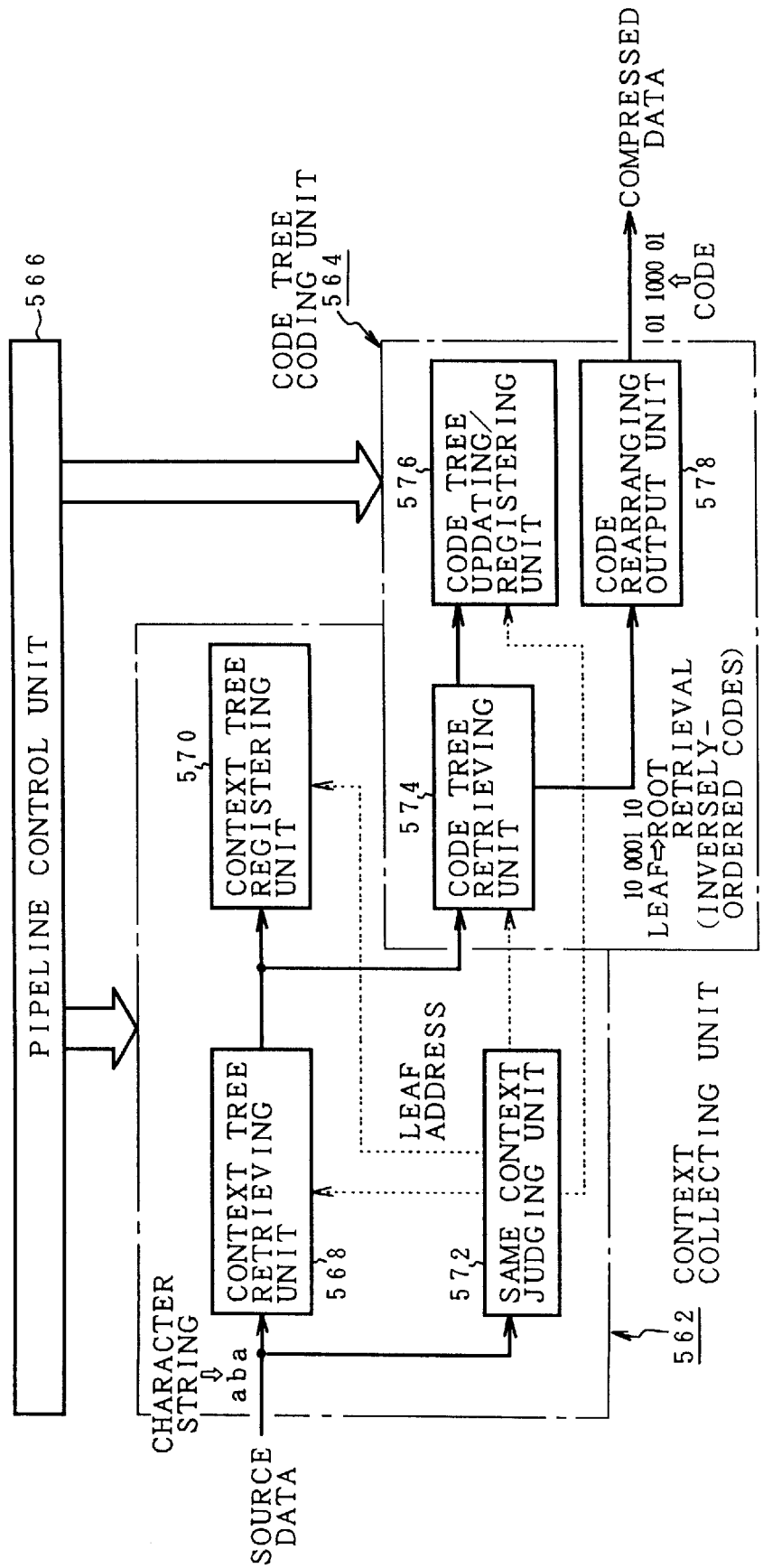
FIGS. 53A and 53B are explanatory diagrams of pipeline control given when code tree coding is adapted for encoding byte data in a word-stream direction.

FIG. 53A shows an embodiment in which code tree coding such as dynamic Huffman coding or splay coding is adapted for carrying out occurrence frequency modeling and entropy coding for each byte position illustrated in FIGS. 43A and 43B. An embodiment of the configuration for realizing code tree coding includes a context collecting unit 562 and a code tree coding unit 564. The context collecting unit 562 consists of a context tree retrieving unit 568, context tree registering unit 570, and same context judging unit 572, and collects contexts represented by input byte data so as to produce a context tree. The code tree coding unit 564 consists of a code tree retrieving unit 574, code tree updating/registering unit 570, and code rearrangement output unit 578, and produces and updates a code tree while performing splay coding or dynamic Huffman coding according to the results of retrieving contexts of input byte data provided by the context collecting unit 562. Above all, in this embodiment, the code tree coding unit 564 has the code tree updating/registering unit 576 and code rearrangement output unit 578 operated in parallel with the code tree retrieving unit 574. As seen from the example of encoding characters a, b, and a shown in FIG. 53B, the results of retrieval performed by the code tree retrieving unit 564 are input to each of the code tree updating/registering unit 576 and code rearrangement output unit 578. The pipelined operations are carried out according to the same timing, whereby encoding time is shortened.

Figure 53B:
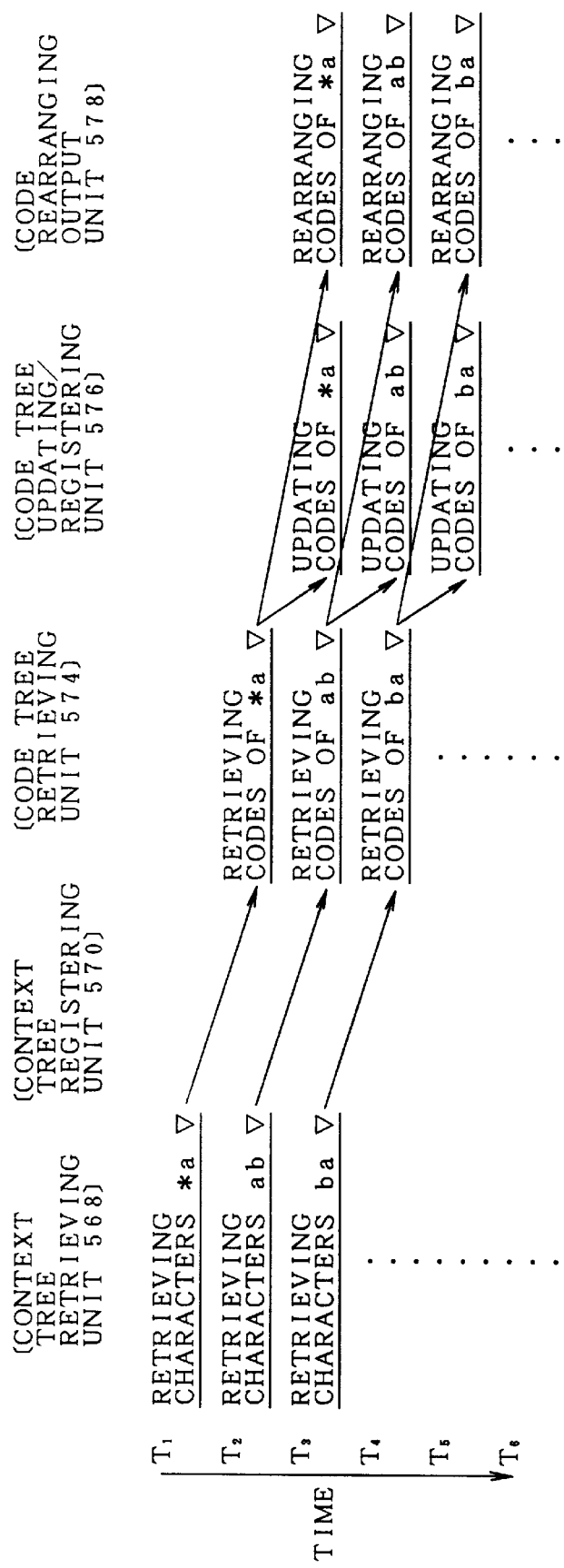

FIG. 54A shows an embodiment for carrying out code tree decoding in line with code tree coding illustrated in FIGS. 53A and 53B. The embodiment comprises a code tree decoding unit 580 and context collecting unit 582. The code tree decoding unit 580 consists of a code tree retrieving unit 586 and code tree updating/registering unit 588, inputs code data, produces and updates a code tree while carrying out code tree decoding such as splay decoding or dynamic Huffman decoding, and collects contexts of restored byte data so as to produce a context tree. Even in this embodiment for carrying out code tree decoding, the results of retrieval performed by the code tree retrieving unit 586 are input to each of the code tree updating/registering unit 588 and context tree retrieving unit 590. As shown in FIG. 54B, the code tree updating/registering unit 588 and context tree retrieving unit 590 operate in parallel according to the same timing so as to handle the results of retrieval provided by the code tree retrieving unit 582. Thus, pipelining is attained in order to shorten decoding time.

The details of the operations performed in the systems shown in FIGS. 53A and 54A when splay coding or decoding is used as code tree coding or decoding are disclosed in Japanese Unexamined Patent Publication No. 8-30432 (publication before examination of an application on Feb. 2, 1996).

(Timely switching of a word-stream direction and byte-stream direction)

Figure 55:
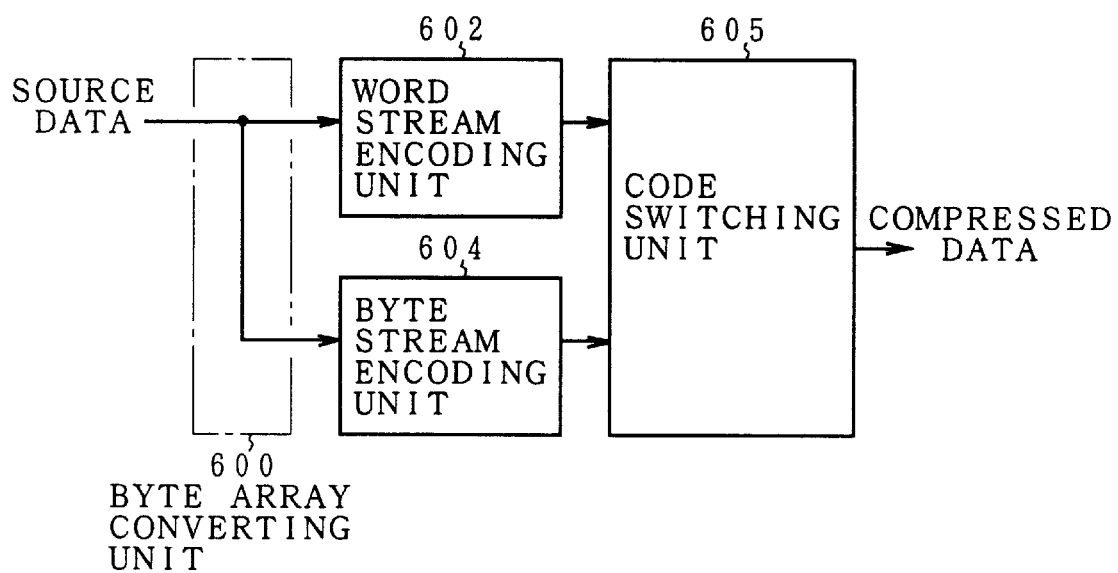
FIG. 55 is a block diagram of a data compression system for switching encoding in a word-stream direction into encoding in a byte-stream direction or vice versa.

FIG. 55 shows an embodiment of a data compression system in which encoding in a word-stream direction in accordance with the present invention illustrated in FIG. 34 is timely switched to conventional encoding in a byte-stream direction or vice versa according to encoding efficiency. The data compression system for encoding a byte stream and word stream in parallel comprises a byte array converting unit 600, word-stream encoding unit 602, byte-stream encoding unit 604, and code switching unit 605. The byte array converting unit 600 inputs word data of a plurality of bytes long as source data word by word, and separates the word data into byte data items of byte positions. The plurality of byte data items are arranged by byte position in a word direction and input to the word-stream encoding unit 602 as data bytes arranged in a word-stream direction. To the byte-stream encoding unit 604, the byte data items are input as byte data items arranged in a byte-stream direction in the same manner as bytes constituting a data stream of word data. The byte array unit 600 can be realized with the same groups of registers as those included in the byte array converting unit 500 shown in FIG. 43A in which one word consists of four bytes. In FIG. 43A, a direction in which the registers in the groups of registers associated with the same byte positions are juxtaposed is the word-stream direction, and a vertical direction perpendicular to the word-stream direction and defining the byte positions is the byte-stream direction. Encoding to be carried out by the word-stream encoding unit 602 is implemented in a system having the fundamental configuration shown in FIG. 34, or more particularly, in the system shown in FIGS. 43A and 43B in which a data structure that one word consists of four bytes can be adopted. As for a particular example of probability statistical coding to be performed for each byte position, the arithmetic coding illustrated in FIG. 44 or the code tree coding illustrated in FIG. 52B can be employed. The byte-stream encoding unit 604 has the same fundamental configuration as the word-stream encoding unit 602 but differs from it in a point that byte data items constituting one word and being input from the byte array converting unit 600 are arranged in the byte-stream direction. The code switching unit 605 selects either of the results of encoding performed in parallel by the word-stream coding unit 602 and byte-stream coding unit 604, and outputs the selected result as compressed data.

FIGS. 56A to 56C are timing charts for switching word-stream encoding to byte-stream encoding or vice versa in the embodiment shown in FIG. 55. FIG. 56A is concerned with word-stream encoding, while FIG. 56B is concerned with byte-stream encoding. FIG. 56C shows selection code output. For example, during the initial cycle T1, the word-stream encoding unit 602 and byte-stream encoding unit 604 encode in parallel byte data items that are separated from word data by the byte array converting unit 600. As a result, word data that has been subjected to dictionary coding or probability statistical coding is arranged in the word-stream or byte-stream direction. During cycle T1, byte-stream encoding illustrated in FIG. 56B is completed earlier, and word-stream encoding illustrated in FIG. 56A is then completed. In a given time interval after the word-stream encoding is completed, the next cycle T2 starts or word-stream encoding of word data and byte-stream encoding thereof start. In parallel with the encoding, a selection code indicating a word-stream code or byte-stream code is appended, and a selected code is output. In short, during encoding of cycle T1, for example, a byte-stream code 608 is output with a leading selection code 606-1 indicating selection of the byte-stream code 608 appended. During the next cycle T2, a word-stream code 610 is selected. During cycle T3, a selection code 606-2 indicating selection of the word-stream code 610 is appended, and then the word-stream code 610 is output as compressed data.

Figure 57A:
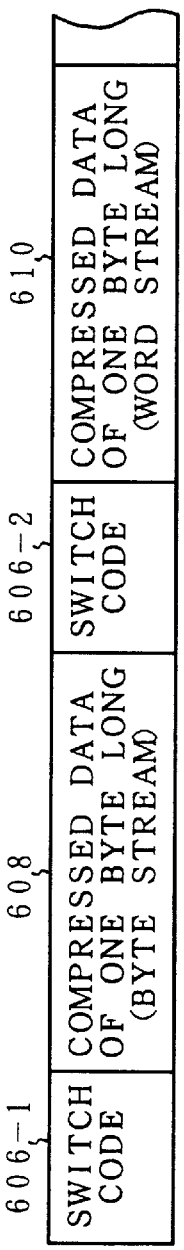
FIGS. 57A and 57B are explanatory diagrams of the format of compressed data provided according to the timing charts of FIGS. 56A to 56C.
Figure 57B:
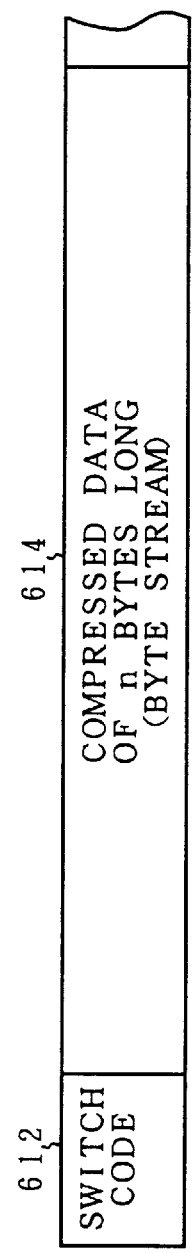

Selection of a word-stream code or byte-stream code by the code switching unit 606 shown in FIG. 55 may be carried out byte by byte or word by word. FIG. 57A shows a format for byte-by-byte code switching. Taking for instance encoding of word data in which one word consists of four bytes, the word-stream encoding unit 602 and byte-stream encoding unit 604 encode in parallel a byte data item of each of the first, second, third, and fourth bytes. When both the word-stream encoding and byte-stream encoding are completed, a word-stream code and byte-stream code which correspond to the first byte are compared with each other. If the byte-stream code is selected, compressed data 608 that is the byte-stream code corresponding to one byte of word data is output with a leading switch code 606-1 appended. Thereafter, a word-stream code and byte-stream code which correspond to the second byte are compared with each other. If the word-stream code is selected, a switch code 606-2 is appended to the word-stream code and the resultant word-stream code is output as compressed data 610 corresponding to one byte of word data. Likewise, appending a switch code byte by byte and outputting compressed data corresponding to one byte of word data are repeated. FIG. 57B illustrates word-by-word code switching, wherein after parallel encoding word data items constituting one word is completed, compressed data items that are word-stream codes corresponding to one word or the number of bytes of one word are compared with compressed data items that are byte-stream codes corresponding thereto. If the byte-stream codes are selected, the byte-stream codes that are compressed byte data items corresponding to n bytes constituting one word are output with a leading switch code 612 appended.

The flowchart of FIG. 58 describes encoding in which code switching is carried out byte by byte as illustrated in FIG. 57A. First, at step S1, word data of n bytes long is input. At step S2, the word data is split byte by byte. At steps S3 and S4, byte-by-byte encoding in a word-stream direction and byte-by-byte encoding in a byte-stream direction are carried out in parallel. At step S5, encoding efficiencies in the word-stream and byte-stream directions are compared with each other byte by byte. Either a word-stream code or byte-stream code resulting from higher-efficiency encoding is selected byte by byte at step S6. The selected code corresponding to one byte is output with a switch code or selection code appended at step S7. The processing of steps S1 to S7 is repeated until encoding last word data is completed.

Figure 59:
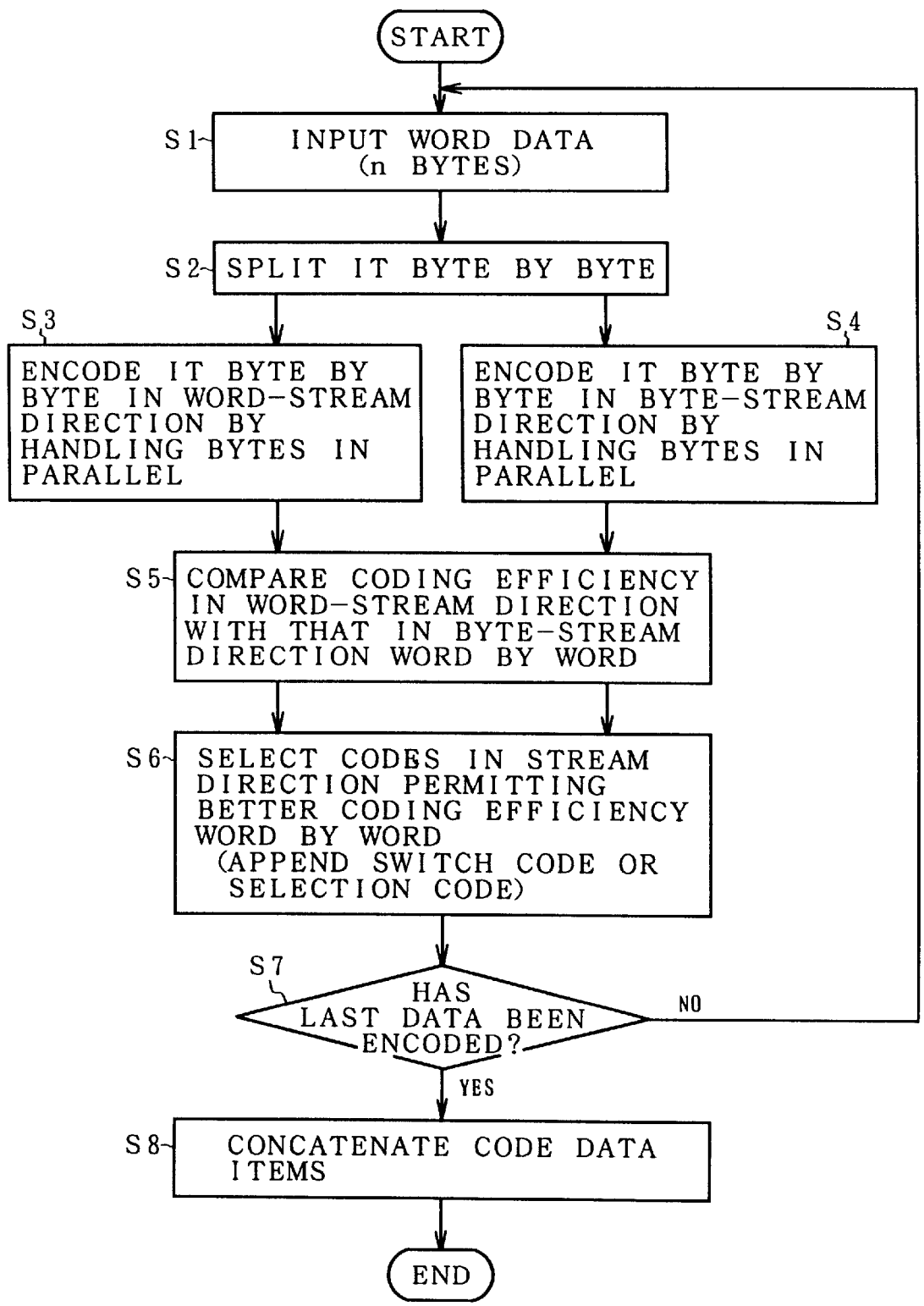
FIG. 59 is a flowchart of encoding in which a switch selection code is appended to each compressed word.

The flowchart of FIG. 59 describes encoding in which word-by-word code switching is carried out as illustrated in FIG. 57B. First, at step S1, word data of n bytes long is input. At step S2, the word data is split byte by byte into n bytes. At steps S3 and S4, word-stream encoding and byte-stream encoding are performed in parallel on each byte data item. After the encoding is completed, encoding efficiencies in the word-stream and byte-stream directions are compared with each other word by word. At step S6, either word-stream codes or byte-stream codes resulting from higher-efficiency encoding and corresponding to one word are selected according to the result of comparison, and appended a switch code or selection code. The processing of steps S1 to S6 is repeated until encoding last word data is completed at step S7. At step S8, code data items are concatenated and output as compressed data.

Figure 60B:
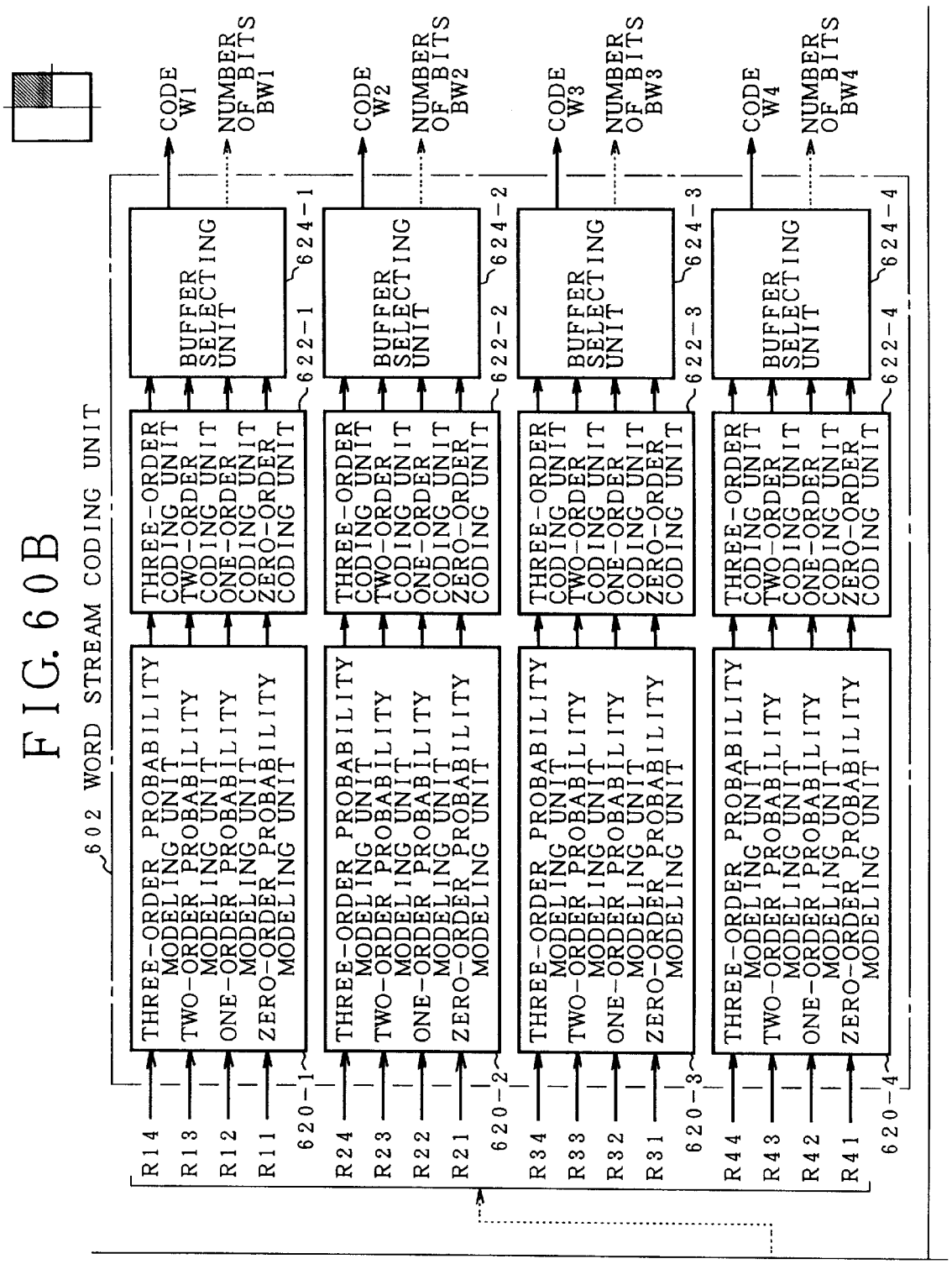
Figure 60C:
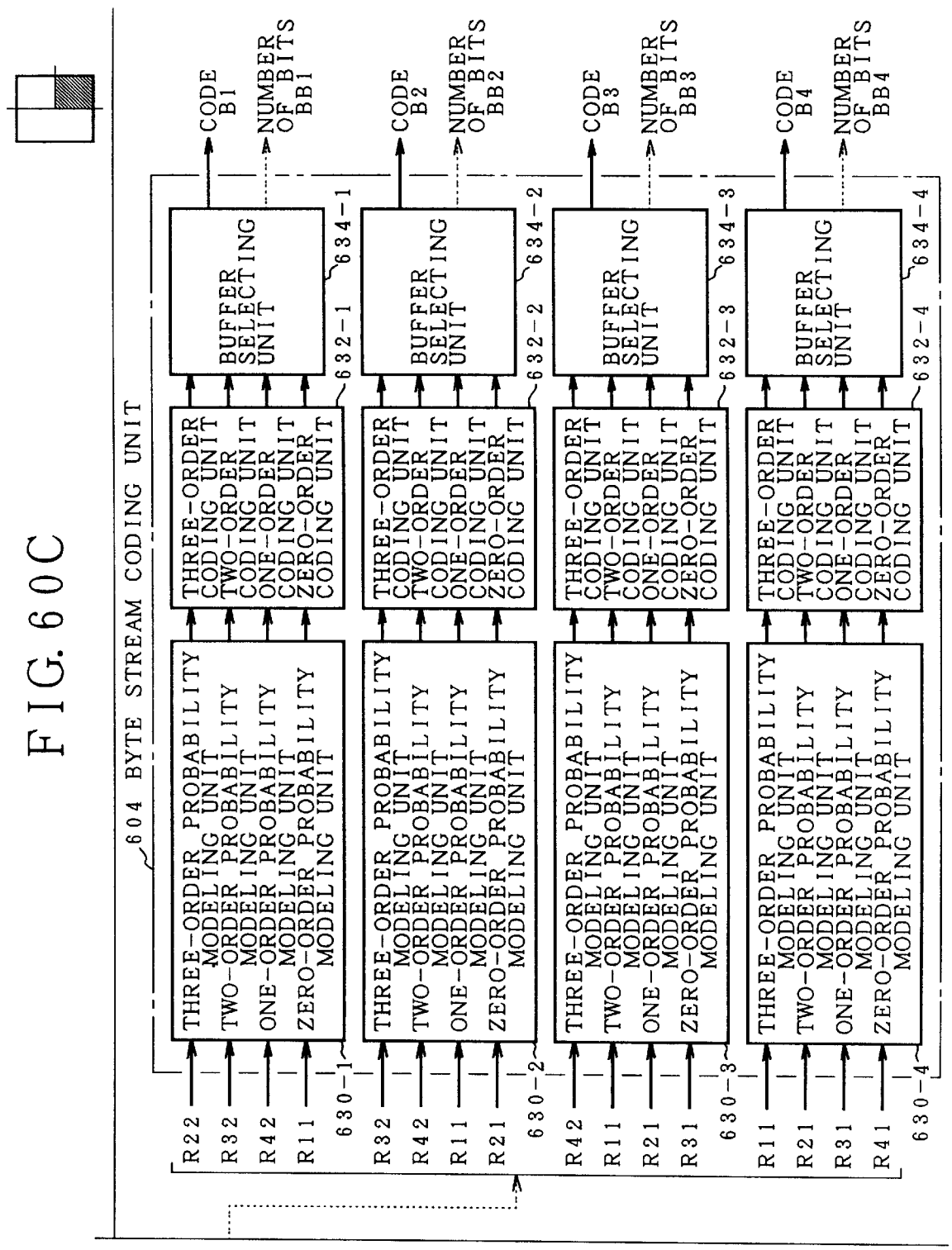

FIGS. 60A to 60C show an embodiment in which the data compression system shown in FIG. 55 is designed to handle data in which each word consists of four bytes, and probability statistical coding is adopted as coding. The byte array converting unit 600 includes groups of registers 618-1 to 618-4, which are associated with the first, second, third, and fourth byes of word data and each of which has four registers connected in series, as groups of registers for context fetching. Assuming that source data of 4 bytes long input to be encoded is 32 bits long, the source data is split in units of one byte or 8 bits and then held in parallel in the registers R1, R2, R3, and R4 on the first stage. At this time, byte data items corresponding to byte positions constituting three preceding words, which have already been encoded, are held in the registers R1 t o R4 on the second stage, the registers R13 to 43 on the third stage, and the registers R14 to R44 on the fourth stage. Among the groups of registers for context fetching, for example, the register R41 holding a byte data item constituting the fourth byte of word data and being about to be encoded is taken into account. A direction in which the registers R41 to R44 are juxtaposed is the word-stream direction in which byte data items are arranged. By contrast, the byte-stream direction is a direction in which the registers R31, R32, and R1 holding byte data items preceding a data item held in the register R41. As for byte data items held in the groups of registers in the byte array converting unit 600, byte data items that correspond to three words and precede data items of byte positions, which are held in the registers R11 to R14 and which are about to be encoded, in the word-stream direction, are input to the word-stream encoding unit 602 for context fetching. In other words, the word-stream encoding unit 600 has probability modeling units 620-1 to 620-4, entropy coding units 622-1 to 622-4, and buffer selecting units 624-1 to 624-4 associated with the first, second, third, and fourth bytes of source data. Each of the probability modeling units 620-1 to 620-4 has four probability modeling units of zero-order, one-order, two-order, and three-order probability modeling units operated in parallel. Accordingly, each of the entropy coding units 622-1 to 622-4 has zero-order, one-order, two-order, and three-order entropy coding units operated in parallel. That is to say, the word-stream encoding unit 600 is realized with a data compression system shown in FIG. 26 in which all component units are operated in parallel in order to handle a blend context. The details of the data compression system shown in FIG. 26 in which all component units are operated in parallel in order to handle a blend context are identical to those shown in FIGS. 27A to 28B. Data is input from context fetching registers R11 to R44 in the byte array converting unit 600 to the probability modeling units 620-1 to 620-4 on the first stage in the word-stream encoding unit 602 orderly from the registers R11 to R44. Take for instance the probability modeling unit 620-1 associated with the first byte. The zero-order probability modeling unit inputs a byte data item of the first byte which is held in the register R11 and about to be encoded. The one-order probability modeling unit inputs a byte data item that resides in the register R12 associated with the first byte and has been encoded immediately previously. The two-order probability modeling unit inputs a byte data item that resides in the register R13 associated with the first byte and has been encoded immediately before the byte data item residing in the register R11. The three-order probability modeling unit inputs a byte data item that resides in the register R14 associated with the first byte and has been encoded immediately before the byte data item residing in the register R13. The same applies to the modeling units 620-1 to 620-4 associated with the second, third, and fourth bytes. That is to say, the zero-order, one-order, two-order, and three-order probability modeling units incorporated in each of the modeling units 620-1 to 620-4 input data items from the registers associated with each byte position. By the way, the byte-stream encoding unit 604 has, like the word-stream encoding unit 602 in which all component units are operated in parallel in order to handle a blend context, probability modeling units 630-1 to 630-4 on the first stage, entropy coding units 632-1 to 632-4 on the second stage, and buffer selecting units 634-1 to 634-4 associated with byte positions and operated in parallel. Byte data items arranged in the byte-steam direction with respect to origins that are byte data items residing in the registers R11, R21, R31, and R41 associated with the zero-order probability modeling units in the probability modeling units 630-1 to 630-4, which input byte data items of byte positions of word data about to be processed, are input from the context fetching registers in the byte array converting unit 600 to the byte-stream coding unit 620. Take for instance the probability modeling unit 630-4 associated with the fourth byte. The fourth byte of word data that is currently an object of processing is input to the zero-order probability modeling unit. The immediately preceding third byte of the word data is input to the one-order probability modeling unit. The second byte of the word data preceding the immediately preceding third byte is input from the register R21 to the two-order probability modeling unit. The leading first byte residing in the register R11 is input to the three-order probability modeling unit. A byte data item serving as the third byte of the word data that is currently an object of processing is input from the register R31 to the zero-order probability modeling unit in the probability modeling unit 630-3. A byte data item corresponding to the second byte of the word data immediately preceding the third byte is input from the register R21 to the one-order probability modeling unit therein. A byte data item corresponding to the first byte thereof preceding the second byte is input from the register R11 to the two-order probability modeling unit therein. A byte data item corresponding to the fourth byte of preceding word data is input from the register R42 to the three-order probability modeling unit therein. Likewise, when the probability modeling unit 630-2 inputs a byte data item corresponding to the second byte of word data from the register R21 to the zero-order probability modeling unit therein, byte data items are input from the registers R11, R42, and R32 juxtaposed in the byte-stream direction to the one-order, two-order, and three-order probability modeling units therein. Even in the probability modeling unit 630-1 in which a byte data item of the first byte of word data is input from the register R11 to the zero-order probability modeling unit, byte data items preceding the byte data item of the first byte in the byte-stream direction are input from the registers R42, R32, and R22 to the one-order, two-order, and three-order probability modeling units. The byte-by-byte input in the byte-stream direction does not mind a word. Since the word-stream encoding unit 602 and byte-stream encoding unit 604 thus encode byte positions in parallel, the buffer selecting units 624-1 to 624-4 and buffer selecting units 634-1 to 634-4 output word-stream codes W1 to W4 and numbers of bits BW1 to BW4, and byte-stream codes B1 to B4 and numbers of bits BB1 to BB4 respectively.

Figure 61A:
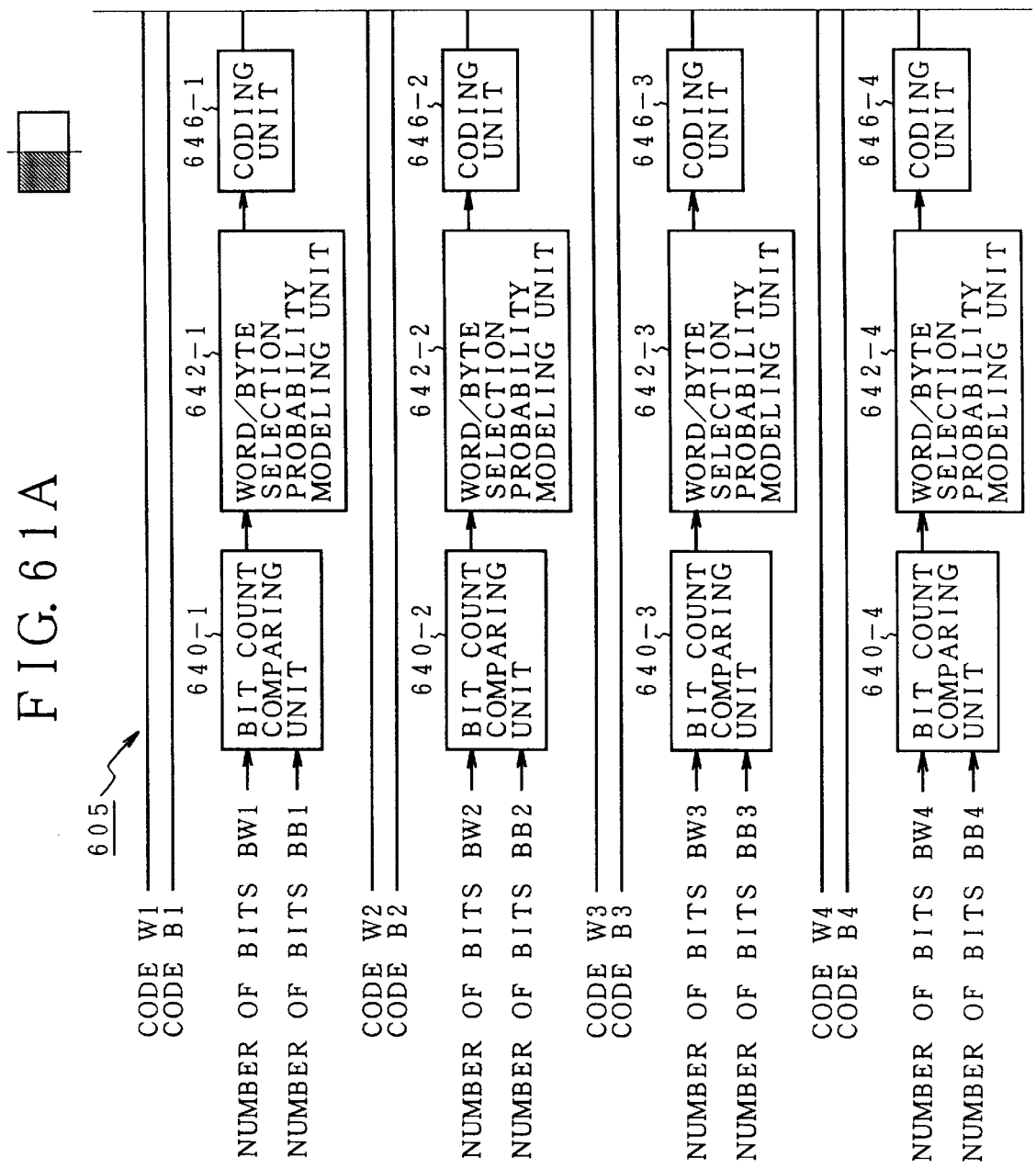
FIGS. 61A and 61B are block diagrams of a switching output unit of the embodiment, shown in FIG. 55, in which probability statistical coding for processing all the contexts of a blend context in parallel is implemented.
Figure 61B:
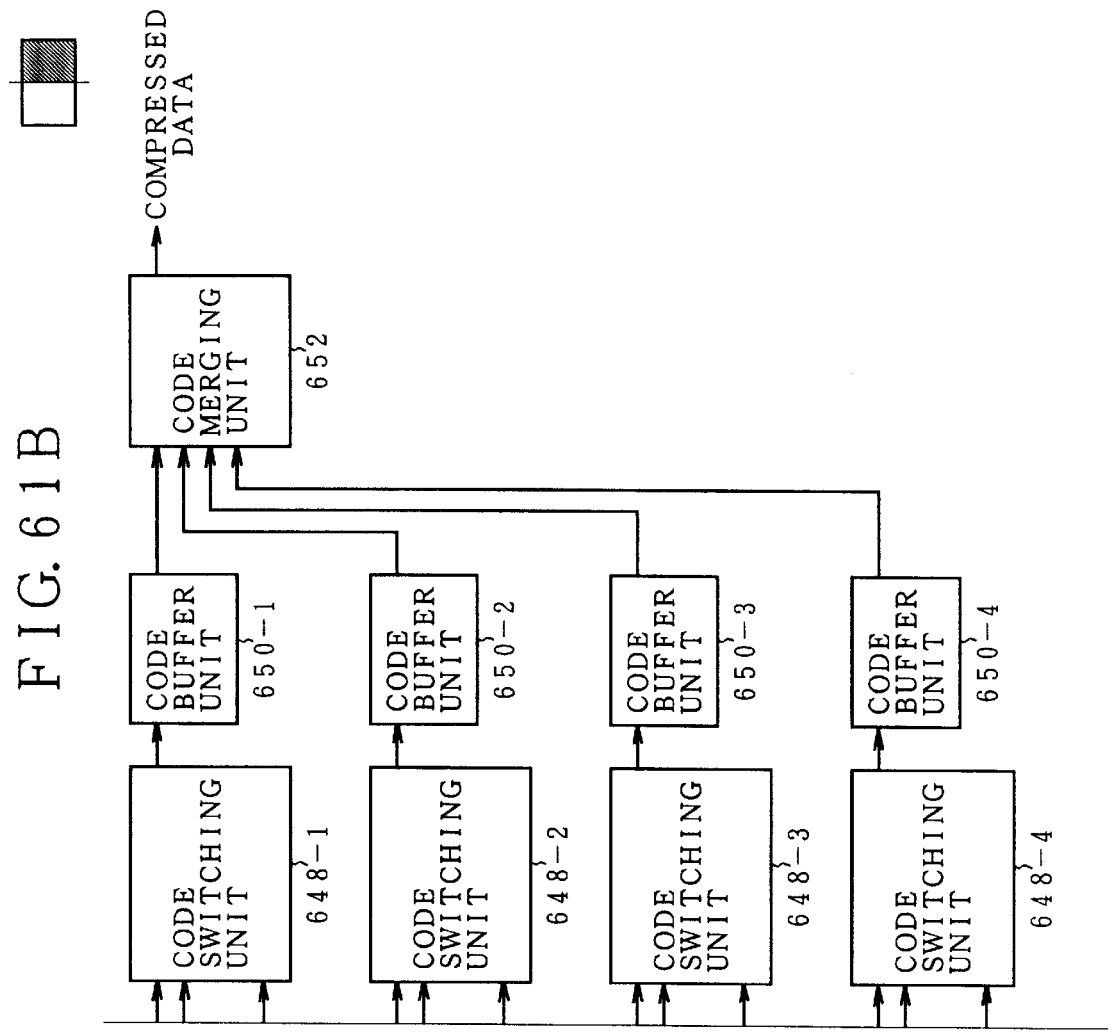

FIGS. 61A and 61B show an embodiment of the code switching unit 605 shown in FIG. 55. The code switching unit inputs code outputs of the word-stream encoding unit 602 and byte-stream encoding unit 604 shown in FIGS. 60A to 60C respectively in parallel. The code switching unit 605 has code switching units 648-1 to 648-4 and code buffers 650-1 to 650-4 associated with the first, second, third, and fourth byte of word data and operated in parallel. A code merging unit 652 merges codes and outputs compressed data. For selecting codes, bit count comparing units 640-1 to 640-4, word/byte selection probability modeling units 642-1 to 642-4, and coding units 646-1 to 646-4 are included in relation to the code switching units 648-1 to 648-4 associated with byte positions. The bit count comparing units 640-1 -to 640-4 compare numbers of bits BW1 to BW4 of word-stream codes W1 to W4 corresponding to bit positions with numbers of bits of BB1 to BB4 of byte-stream codes B1 to B4, selects codes having smaller code lengths, and outputs the results of selection to the word/byte selection probability modeling units 642-1 to 642-4. The word/byte selection probability modeling units 642-1 to 642-4 each obtain a probability on the basis of the frequency of a word-stream code and byte-stream code. The coding units 646-1 to 646-4 each produce a switch code for switching codes on the basis of the output of an associated one of the word/byte selection probability modeling units 642-1 to 642-4. The code switching units 648-1 to 648-4 each select a code and append a leading selection code. When a certain amount of code data arranged word by word or grouped into files is accumulated in each of the code buffers 650-1 to 650-4, the code merging unit 652 concatenates the code data items and outputs a compressed data stream.

Figure 62:
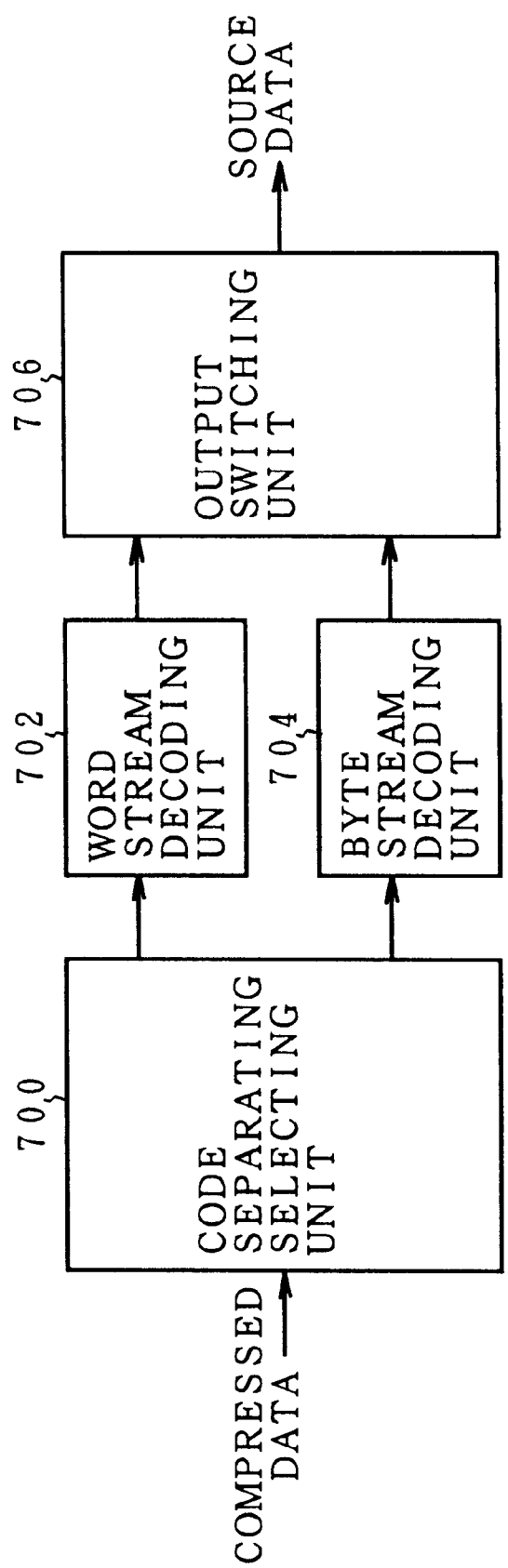
FIG. 62 is a block diagram of a data restoration system in which decoding in a word-stream direction is switched into decoding in a byte-stream direction or vice versa.

FIG. 62 shows an embodiment of a data restoration system for restoring original word data from compressed data produced by the data compression system shown in FIG. 55. The data restoration system comprises a code separating unit 700, word-stream decoding unit 702, byte-stream decoding unit 704, and output switching unit 706. The code separating unit 700 inputs either compressed data which has a switch code in units of a compressed byte data item according to the format shown in FIG. 57A, or compressed data which has a switch code in units of compressed byte data items corresponding to a word according to the format shown in FIG. 57B, separates the input compressed data into word-stream codes or byte-stream codes according to the switch code contained in the compressed data, and inputs the codes into the word-stream decoding unit 702 or byte-stream decoding unit 704. The word-stream decoding unit 702 has fundamentally the same components as the data restoration system shown in FIG. 34 or 43, decodes codes corresponding to bytes constituting one word in parallel, and restores corresponding byte data items of byte positions. The byte-stream decoding unit 704 has, like the word-stream decoding unit 702, decoding circuits associated with byte positions constituting one word operated in parallel as decoding facilities. The decoding circuit has the byte-by-byte decoding units 502-1 to 502-n shown in FIG. 34 operated in parallel. Taking probability statistical decoding for instance, the same circuit as the byte-by-byte decoding unit 532 shown in FIG. 49A can be employed. The byte-stream decoding unit 704 differs from the word-stream decoding unit 702 in a sole point that byte-stream codes separated by the code separating unit 700 are input and decoded.

Figure 63:
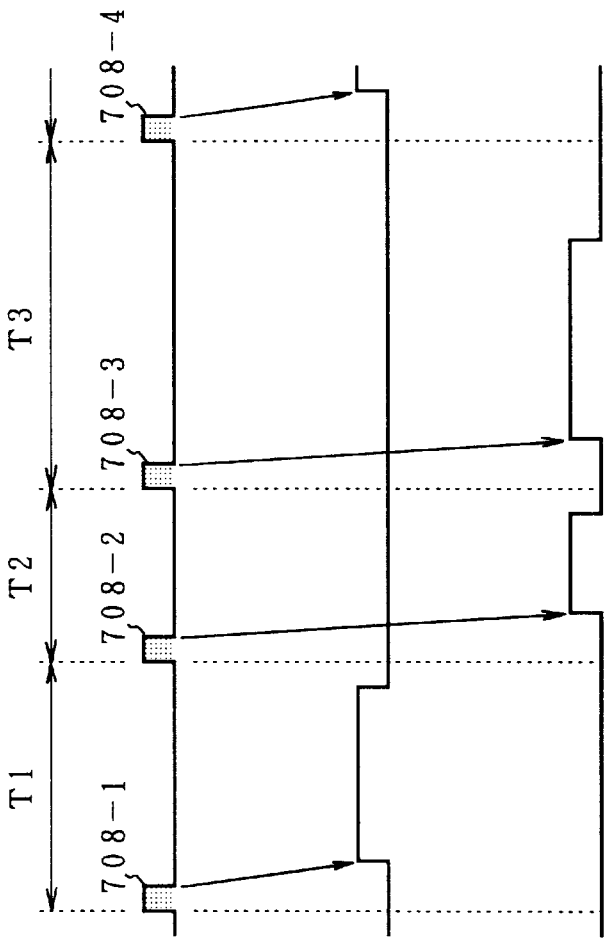
FIGS. 63A to 63C are timing charts of decoding in the system shown in FIG. 62.

FIGS. 63A to 63C are timing charts of decoding carried out in the data restoration system shown in FIG. 62. FIG. 63A illustrates decoding of a selection code, FIG. 63B illustrates decoding of word-stream codes, and FIG. 63C illustrates decoding of byte-stream codes. First, during the first cycle T1, the code separating unit 700 decodes a selection code used for switching appended to the start of input compressed data, and recognizes whether succeeding compressed data is a word-stream code or byte-stream code. During cycle T1, a word-stream code is identified by decoding a selection code. The code data item is fed to the word-stream decoding unit 702 and then decoded. If a byte-stream code is identified by decoding a selection code 708-2 during the next cycle T2, the code data item is fed to the byte-stream decoding unit 704 and then decoded. Likewise, word-stream codes or byte-stream codes are identified by decoding selection codes 708-3, 70B-4, etc. and then decoded. Consequently, byte data items are restored.

Figure 64:
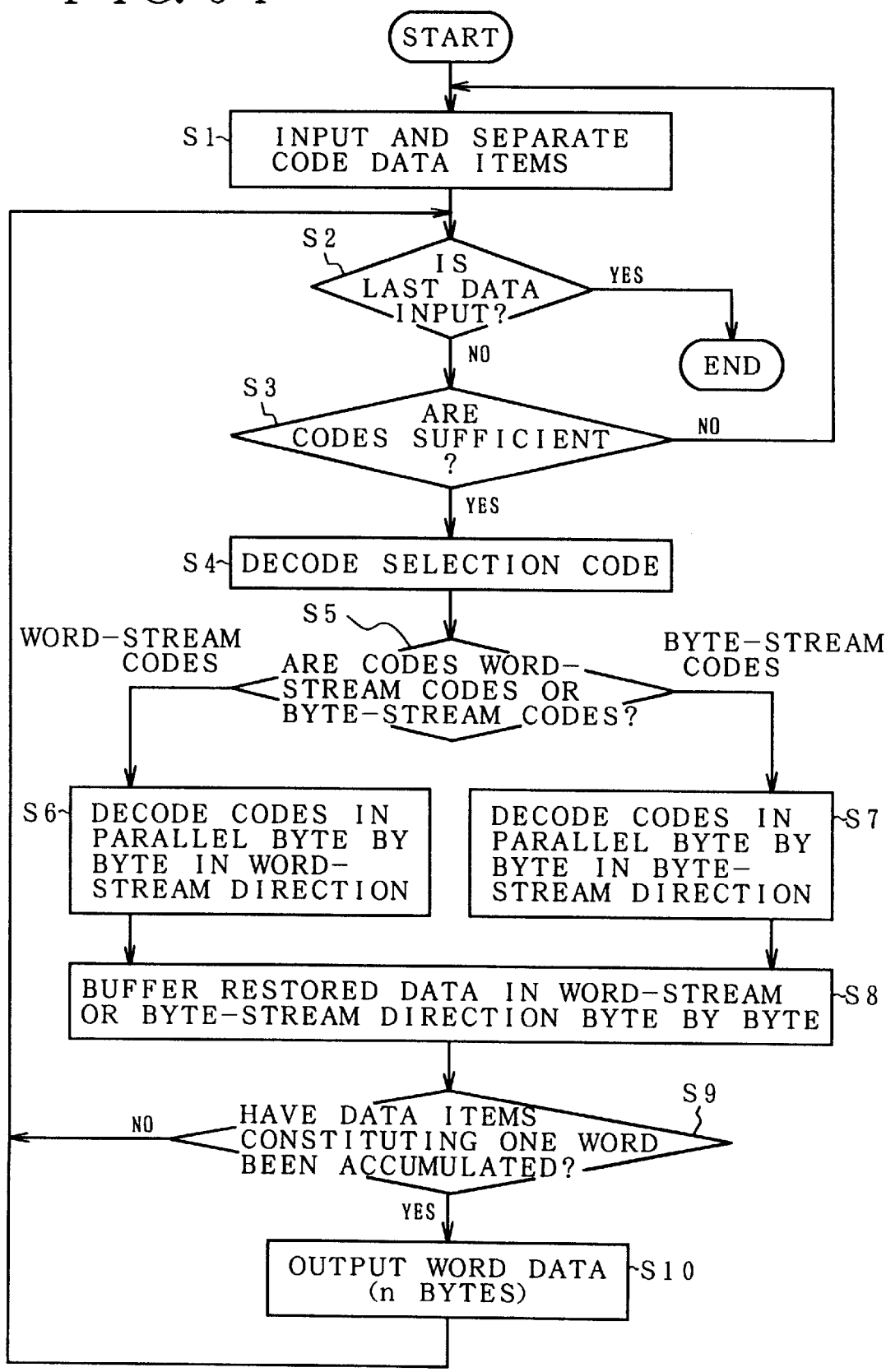
FIG. 64 is a flowchart describing decoding of compressed data, in which a switch selection code is appended to each compressed byte data item, in the system shown in FIG. 62.

The flowchart of FIG. 64 describes data restoration to be carried out by the data restoration system shown in FIG. 62 for handling compressed data having a switch code appended to each code that is a compressed data item corresponding to one byte according to the format shown in FIG. 57A. First, at step S1, code data items are input and separated. If it is found at step S2 that input data is not last data, it is checked at step S3 if codes corresponding to one word have been input and separated. If codes corresponding to one word have been input and separated, selection codes are decoded at step S4. It is then checked at step S5 on the basis of the results of decoding the selection codes whether the codes corresponding to bytes constituting one word are word-stream codes or byte-stream codes. The codes are then input to the word-stream decoding unit 702 or byte-stream decoding unit 704 shown in FIG. 62 according to whether the codes are word-stream codes or byte-stream codes. At steps S6 and 57, word-stream codes and byte-stream codes are decoded byte by byte in parallel. At step S8, byte data items restored byte by byte and arranged in the word-stream direction and restored byte data items arranged in the byte-stream direction are buffered. If it is found at step S9 that byte data items constituting one word have been accumulated, the byte data items are concatenated in ascending order of byte number and thus word data representing one word is output at step S10. Control is then returned to step S2. It is then checked if restoration of last data is completed. If it is not completed, control is returned from step S3 to S1. The above sequence is then repeated.

The flowchart of FIG. 65 describes data restoration for handling compressed data having a selection code appended word by word according to the format shown in FIG. 57B. First, at step S1, all compressed data items to be decoded are input and separated into codes. At step S2, if restoration of last data has not been completed, control is passed to step S3. A selection code input and separated first is decoded and checked to see if a succeeding code is a word-stream code or byte-stream code. If the succeeding code is a word-stream code, control is passed to step S5. Codes corresponding to bytes constituting one word are decoded in parallel, thus restoring byte data items. If the succeeding code is a byte-stream code, control is passed to step S6. Codes corresponding to bytes constituting one word are decoded in parallel, thus restoring byte data items. At step S7, the byte data items restored word by word and arranged in the word-stream direction or byte-stream direction are buffered. At step S8, the restored word data of n bytes long is output. This sequence is repeated until restoration of last word data is completed at step S2.

An exemplary embodiment of the data restoration system shown in FIG. 62 for decoding compressed data produced by a data compression system having all component units thereof operated in parallel in order to handle a blend context as shown in FIGS. 60A to 61B will be described below. In the data restoration system for decoding compressed data produced by the data compression system having all component units thereof operated in parallel in order to handle a blend context, an embodiment shown in FIG. 66 is included as the code separating/selecting unit 700 shown in FIG. 62, embodiments shown in FIG. 67A and 67B are included as the word-stream decoding unit 702 and byte-stream decoding unit 704 shown in FIG. 62, end an embodiment shown in FIG. 68 is included as the output switching unit 706. Furthermore, this embodiment handles compressed data in which each word consists of four bytes and a selection code is appended byte by byte according to the format shown in FIG. 57A.

Figure 66A:
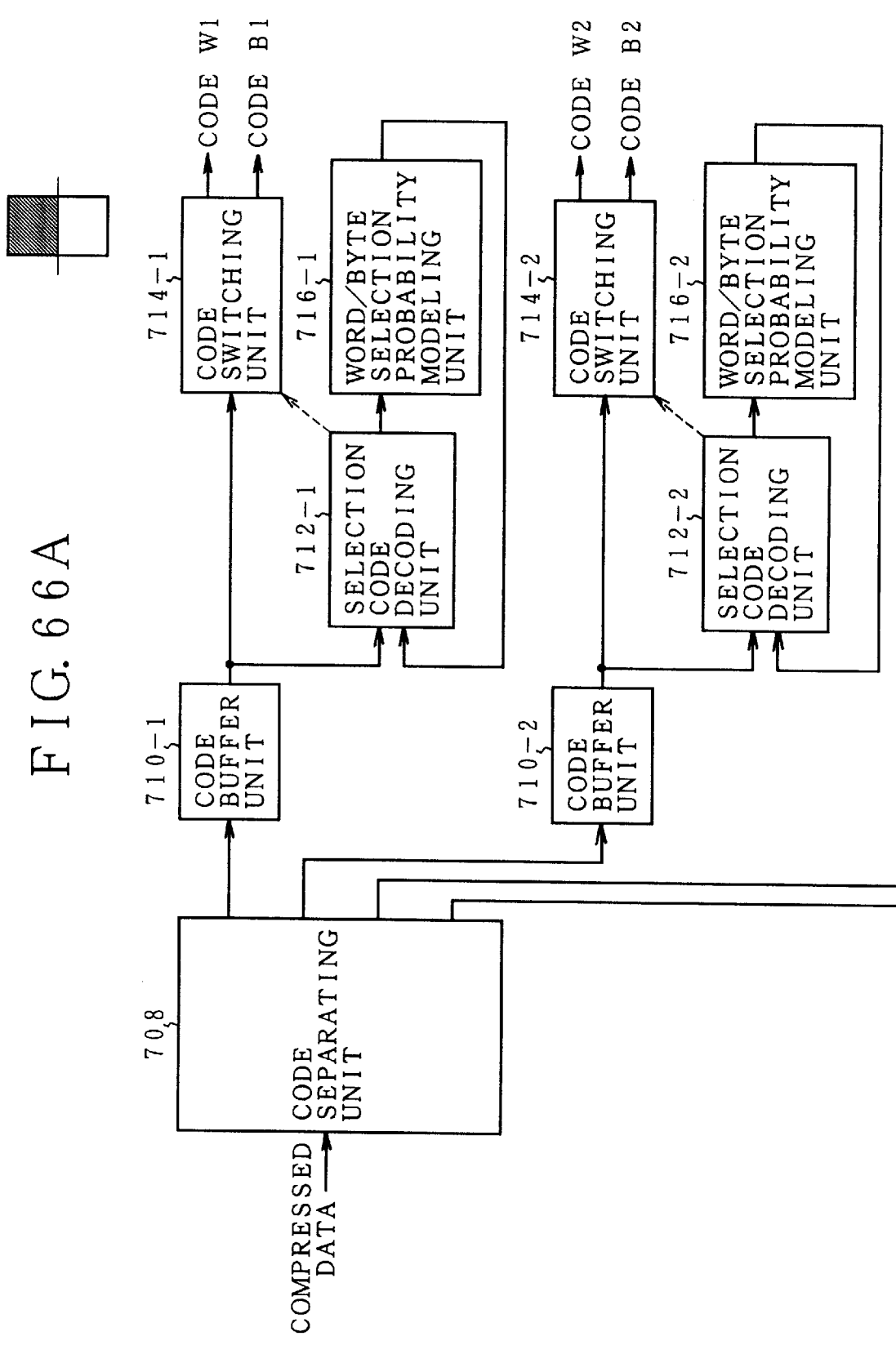
FIGS. 66A and 66B are block diagrams of a code separation selecting unit included in the embodiment of the data restoration system, shown in FIG. 62, in which probability statistical coding for processing all the contexts of a blend context in parallel is implemented.
Figure 66B:
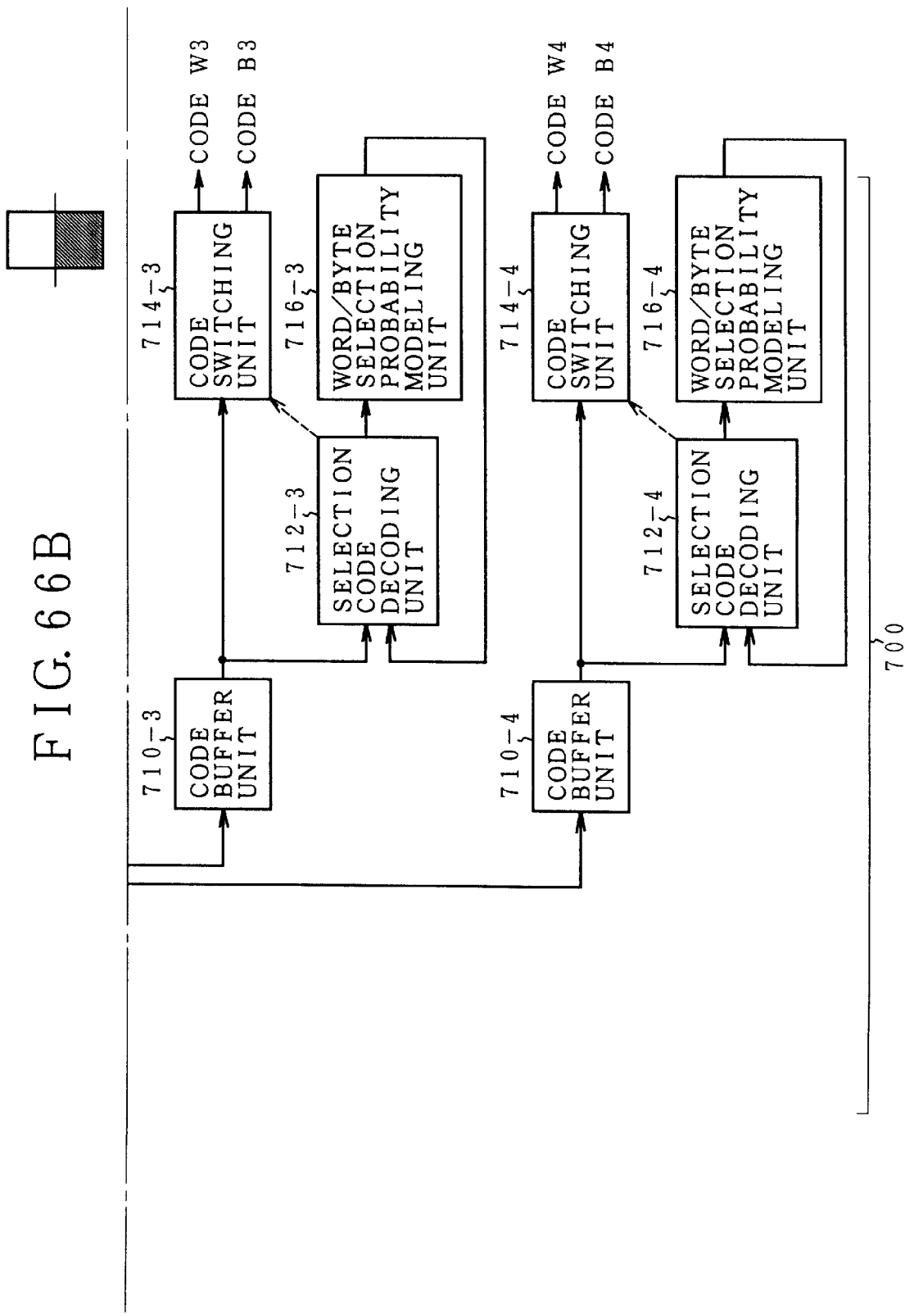
Figure 67B:
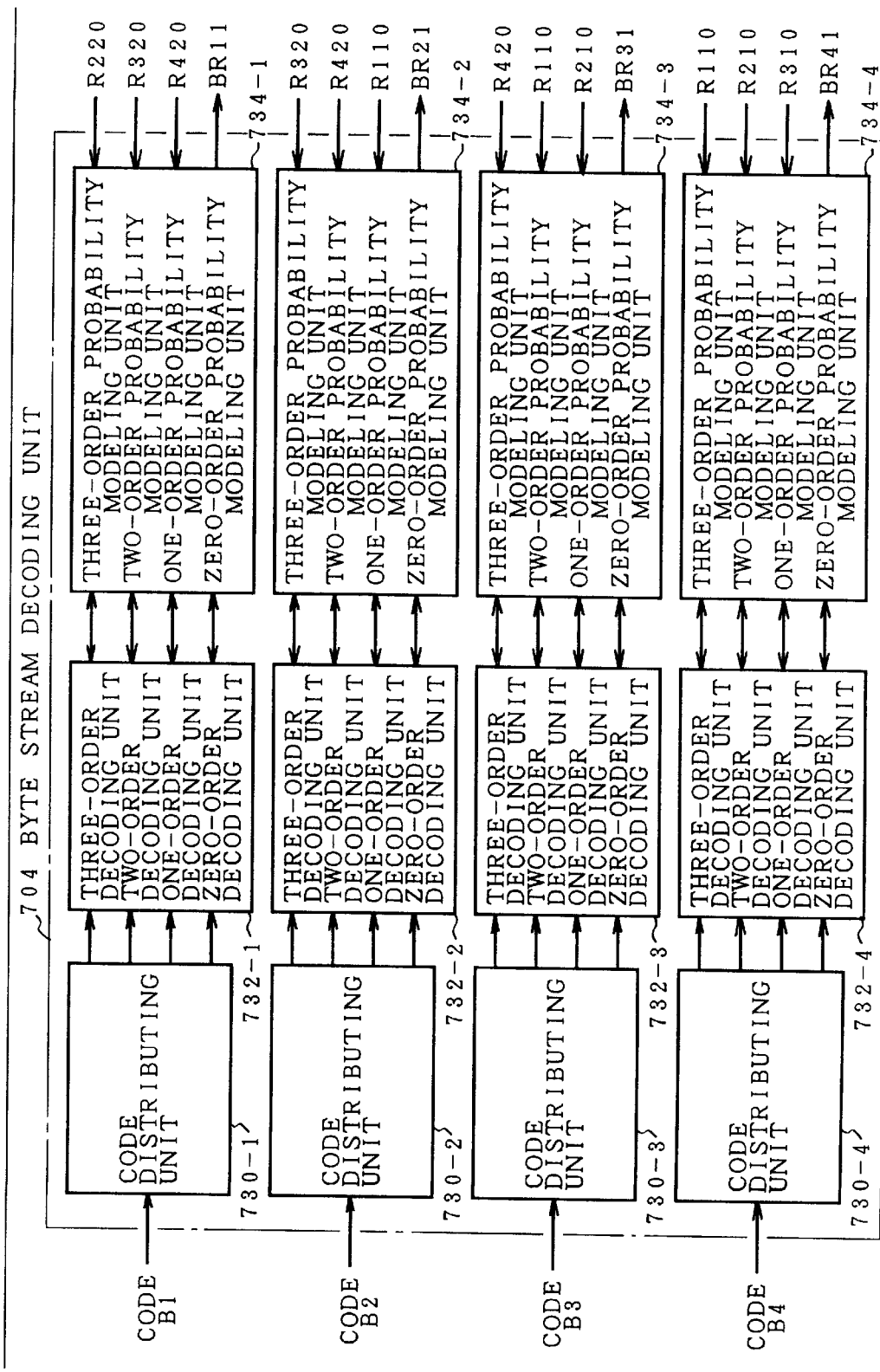

The code separating/selecting unit 700 shown in FIGS. 66A and 66B includes a code separating unit 708 on the input stage. The code separating unit 708 inputs compressed data, separates it into codes corresponding to bytes constituting one word, that is, four bytes, and stores the codes in code buffer units 710-1 to 710-4 associated with the first, second, third, and fourth bytes of word data. The separated codes each have a leading selection code as shown in FIG. 57A and a code data item that is a compressed byte data item. The code buffer units 710-1 to 710-4 are succeeded by selection code decoding units 712-1 to 712-4, word/byte selection probability modeling units 716-1 to 716-4, and code switching units 714-1 to 714-4 which are associated with byte positions and operated in parallel. Taking the first byte of word data for instance, the selection code decoding unit 712-1 inputs a leading selection code of a code data item corresponding to the first byte from the code buffer unit 710-1, obtains a conditional appearance rate on the basis of an already-decoded immediately preceding selection code stream, and decodes the selection code to see if the selection code indicates a word-stream code or byte-stream code. The word/byte selection probability modeling unit 716-1 stores for each code frequency data containing conditional appearance rate of an input selection code to be linked to an immediately preceding selection code stream, restores data from the selection code by referencing the frequency data on the basis of the conditional appearance rate provided by the selection code decoding unit 712-1, and updates the frequency data according to the result of restoration. The code switching unit 714-1 inputs the code residing in the code buffer unit 710-1 as a word-stream code W1 or byte-stream code B1 to a block associated with the first byte within the word-stream decoding unit 702 shown in FIG. 67A or a block associated therewith within the byte-stream decoding unit 704 shown in FIG. 67B. The same applies to the other blocks in FIGS. 66A and 66B associated with the second, third, and fourth bytes of word data in principle.

The word-stream decoding unit 702 and byte-stream decoding unit 704 shown in FIGS. 67A and 67B decode in parallel word-stream codes and byte-stream codes corresponding to byte positions and being separated and selected by the code separating/selecting unit 700 shown in FIGS. 66A and 66B. The word-stream decoding unit 702 has code distributing units 720-1 to 720-4, decoding units 722-1 to 722-4, and probability modeling units 724-1 to 724-4 associated with word-stream codes W1 to W4 corresponding to the first, second, third, and fourth bytes of word data. The decoding units 722-1 to 722-4 each have zero-order to three-order decoding units operated in parallel so as to handle any blend context ranging from a zero-order context to a three-order context. Likewise, the probability modeling units 724-1 to 724-4 each has zero-order to three-order probability modeling units operated in parallel. Each of the code distributing units 720-1 to 720-4 recognizes the order of a context, that is, a zero-order, one-order, two-order, or three-order in terms of the bit configuration of an associated one of the input codes W1 to W4 corresponding to the first to fourth bytes, and inputs the order to a decoding unit for handling a context of the order within an associated one of the decoding units 722-1 to 722-4. For the details of the decoding units 722-1 to 722-4 for decoding all contexts of orders of a blend context in parallel and the probability modeling units 724-1 to 724-4, see FIGS. 29 to 31B. By the way, the byte-stream decoding unit 704 has, like the word-stream decoding unit 702, a configuration permitting parallel decoding of all contexts of orders of a blend context. Specifically, the byte-stream decoding unit 704 has code distributing units 730-1 to 730-4, decoding units 732-1 to 732-4 each having zero-order to three-order decoding units operated in parallel, and probability modeling units 734-1 to 734-4 each having zero-order to three-order probability modeling units operated in parallel associated with input byte-stream codes B1 to B4 corresponding to the first to fourth bytes of word data. Owing to the word-stream decoding unit 702 and byte-stream decoding unit 704, four codes corresponding to four bytes constituting one word, which are selected by the code separating/selecting unit 700 on the preceding stage shown in FIGS. 66A and 66B, are input as effective input codes to the word-stream decoding unit 702 or byte-stream decoding unit 704. Consequently, byte data items constituting one word are restored in parallel. In word-by-word restoration, four codes out of the input codes W1 to W4 and B1 to B4 fed to the word-stream decoding unit 702 and byte-stream decoding unit 704 are effective input codes. Only the effective input codes are decoded. The system not provided with effective input codes is prohibited from decoding any code.

The output switching unit 706 shown in FIG. 68 inputs byte data items decoded in parallel by the word-stream decoding unit 702 and byte-stream decoding unit 704 shown in FIGS. 67A and 67B, that is, decoded byte data items WR11 to WR41, which are arranged in a word-stream direction, and decoded byte data items BR11 to BR41, which are arranged in a byte-stream direction, in relation to byte positions of the first byte to fourth byte. Byte data items restored by decoding effective input codes are selected by output selecting units 840-1 to 840-4 and fed to a context fetch register unit 842. The context fetch register unit 842 includes groups of registers 842-1 to 842-4 which are associated with byte positions and each of which has four registers connected in series. The group of registers 842-1 associated with the first bytes consists of registers R110 to R140, the group of registers 842-2 associated with the second byte consists of registers R210 to R240, the group of registers 842-3 associated with the third byte consists of registers R310 to R340, and the group of registers 842-4 associated with the fourth byte consists of registers R410 to R440. Restored byte data items of byte positions constituting one word are held in the registers R110, R210, R310, and R410 on the first stage within the context fetch register unit 842. Word data of one word that is restored source data is produced by reading in parallel the byte data items from the registers R110 to R410. At this time, restored byte data items constituting an immediately preceding word, a word preceding the immediately preceding word, and a word preceding the word preceding the immediately preceding word respectively are held in the registers R120 to R420 on the second stage, the registers R130 to R430 on the third stage, and the registers R140 to R440 on the fourth stage respectively. The already-restored byte data items of the words have been fetched as contexts into the probability modeling units within the word-stream decoding unit 702 and byte-stream decoding unit 704 shown in FIGS. 67A and 67B. As for context fetching, byte data items arranged in the word-stream direction are fetched from the context fetch register unit 842 shown in FIG. 68 into the one-order to three-order probability modeling units within each of the probability modeling units 724-1 to 724-4 incorporated in the word-stream decoding unit 702 shown in FIG. 67A. Taking for instance the probability modeling unit 724-1 associated with the first byte, the restored byte data items of the first bytes of an immediately preceding word, a word preceding the immediately preceding word, and a word preceding the word preceding the immediately preceding word are, as shown in FIG. 67A, fetched as contexts from the registers R120, R130, and R140 into the one-order to three-order probability modeling units. By contrast, byte data items arranged in the byte-stream direction in the context fetch register unit 842 are fetched into the probability modeling units 734-1 to 734-4 incorporated in the byte-stream decoding unit 704 shown in FIG. 67B. Taking for instance the probability modeling unit 734-4 associated with the fourth byte, byte data items being arranged in the byte-stream direction and preceding a byte data item to be restored by the zero-order probability modeling unit are fetched as one-order, two-order, and three-order contexts from the registers R310, R210, and R110. Talking of the zero-order modeling unit in any of the probability modeling units 724-1 to 724-4 in the word-stream decoding unit 702 and in any of the probability modeling units 734-1 to 734-4 in the byte-stream decoding unit 704, data decoded by the zero-order decoding unit on the preceding stage is fed to the zero-order modeling unit as it is. Any byte data item need therefore not be fetched from the context fetch register unit 842 shown in FIG. 68.

As described so far, according to the present invention, a probability modeling unit and entropy coding unit are operated in pipelining for data compression of a fixed-order context. Even for data restoration, the entropy decoding unit and probability modeling unit are operated in pipelining. Consequently, probability statistical coding and decoding that have been though to be complex and time-consuming can be achieved quickly.

As for compressing or restoring data having a blend context, at least probability modeling units are operated in parallel, and pipelining is attained. Thus, compression and restoration based on probability statistical coding can be realized for data having a blend context at a high speed permitting practical processing time.

According to the present invention, dictionary coding or probability statistical coding is carried out byte by byte in a word-stream direction. In encoding for compressing word data such as a Uni code or Japanese code of two bytes long, a full-color image represented by three-byte red, green, and blue data, or a program code of four or eight bytes long, a correlation of data items of the same byte position within word data can be refected on encoding. This results in higher compression efficiency. Even in this case, the pipelined decoding and encoding enables compression and restoration requiring use time that is shortened to a practical level.

In compression or restoration of word data, byte data items constituting the word data are encoded in a word-stream direction and byte-stream direction, and codes produced by either word-stream or byte-stream encoding exhibiting higher compression efficiency are selected. Consequently, efficient compression in which both, the merits of word-stream encoding and byte-stream encoding are made the most of can be realized.

As for encoding or decoding in the word-stream direction in any of the aforesaid embodiments, word data is separated into a plurality of byte data items and then compressed or restored. The present invention is not limited to this mode. Alternatively, operation codes constituting a program may be separated by type in units of a plurality of bits, and encoding and decoding may be performed on separated data items.

In the aforesaid embodiments, probability statistical coding and decoding are taken for instance. Aside from these, the embodiments can be adapted to dictionary decoding and coding represented by LZW or LZSS.

What is claimed is:

1. A data compression system for encoding an input character on the basis of a conditional appearance rate relative to a context of each order orderly from a high-order context that is an immediately preceding long character string to a low-order context that is an immediately preceding short character string, comprising:

a plurality of occurrence frequency modeling units, associated with orders, each having a frequency data storage unit in which the conditional appearance rate of an input character to be linked to an immediately preceding character string is registered for each character relative to a context of each order, and operating in parallel with the other modeling units to retrieve the conditional appearance rate of an input character to be linked to an immediately preceding character string that is a context of each order, and to update the contents of said frequency data storage unit; and an entropy coding unit to encode an input character on the basis of a conditional appearance rate relative to a context of each order, which is obtained by each of said plurality of occurrence frequency modeling units, orderly from a large-order context to a small-order context; and a pipeline control unit to enable said plurality of occurrence frequency modeling units and said entropy coding unit to operate in pipelining, wherein said pipeline control unit repeats processes such that, at a first cycle, a head character of an input character string is inputted to said plurality of occurrence frequency modeling units in parallel and a conditional appearance rate of each order is obtained in parallel and, at second and, subsequent cycles, the conditional appearance rate of each order obtained at the first cycle is outputted to said entropy coding unit and is sequentially arithmetically encoded in accordance with the order from the code of the large-order context to the code of the small-order context, a next character of said input character string is inputted to said plurality of occurrence frequency modeling units, and the occurrence frequency of each order is obtained in parallel.

2. A data compression system according to claim 1, wherein said occurrence frequency modeling units each retrieve, register, and update information used to draw a conditional appearance rate as a rank, a number of occurrences, a cumulative number of occurrences, and a total number of occurrences within a context, and said entropy coding unit carries out arithmetic coding.

3. A data compression system according to claim 2, wherein said pipeline control unit enables pipelined reading, addition, and writing of the rank, the number of occurrences, the cumulative number of occurrences, and the total number of occurrences within a context, which are used to draw a conditional appearance rate and are stored in each of said occurrence frequency modeling unit.

4. A data compression system according to claim 2, wherein said pipeline control unit enables parallel computation of a high level and a low level defining of an arithmetic code space.

5. A data restoration system for restoring a character from an input code in relation to a context of each order from a large-order context that is an already-restored immediately preceding long character string to a small-order context that is an already-restored immediately preceding short character string, comprising:

an entropy decoding unit to obtain a conditional appearance rate on the basis of an input code in relation to a context of each order that is an already-restored immediately preceding character string orderly from a large-order context to a small-order context; and a plurality of occurrence frequency modeling units, associated with orders, each having a frequency data storage unit in which the conditional appearance rate of an input character to be linked to an immediately preceding character string is registered for each character relative to a context of each order, and operating in parallel with the other modeling units in relation to each order so as to restore a character by referencing said frequency data storage unit according to a conditional appearance rate relative to each order which is provided by said entropy decoding unit, and to update the contents of said frequency data storage unit; and a pipeline control unit to enable, said entropy decoding unit and said plurality of occurrence frequency modeling units to operate in pipelining, wherein said pipeline control unit repeats processes such that, at a first cycle, a head code of the input code string is inputted to said entropy decoding units and a conditional appearance rate of a certain order is obtained and is inputted in parallel to said plurality of occurrence frequency modeling units, and at second and subsequent cycles, the character restored by said occurrence frequency modeling unit corresponding to the order of the conditional appearance rate outputted at said first cycle is outputted and, at the same time, a next code of said input code string is inputted to said entropy decoding unit, and a conditional appearance rate of a certain order is obtained and is outputted to said plurality of occurrence frequency modeling units in parallel.

6. A data restoration system according to claim 5, wherein said occurrence frequency modeling units each retrieve, register, and update information used to draw a conditional appearance rate as a rank, a number of occurrences, a cumulative number of occurrences, and a total number of occurrences within a context, and said entropy decoding unit carries out arithmetic decoding.

7. A data restoration system according to claim 6, wherein said pipeline control unit enables pipelined reading, addition, and writing of the rank, the number of occurrences, the cumulative number of occurrences, and the total number of occurrences within a context, which are used to draw a conditional appearance rate and are stored in each of said occurrence frequency modeling units.

8. A data restoration system according to claim 5, wherein said pipeline control unit enables parallel computation of a high level and a low level defining of an arithmetic code space.

9. A data compression system for encoding an input character on the basis of a conditional appearance rate relative to a context of each order orderly from a large-order context that is an immediately preceding long character string to a small-order context that is an immediately preceding short character string, comprising:

a plurality of occurrence frequency modeling units, independently associated with orders, each having a frequency data storage unit in which the conditional appearances rate of an input character to be linked to an immediately preceding character string is registered for each character relative to a context of each order, and operating in parallel with the other modeling units in relation to each order so as to retrieve the conditional appearance rate of an input character to be linked to an immediately preceding character string that is a context of each order by referencing said frequency data storage unit, and to update the contents of said frequency data storage unit;

a plurality of entropy coding units, independently associated with orders, to operate in parallel in relation to the orders so as to carry out entropy coding on the basis of conditional appearance rates relative to the orders obtained by said plurality of occurrence frequency modeling units;

a code merging unit to merge codes output from said entropy coding units associated with orders; and a pipeline control unit to enable said plurality of occurrence frequency modeling units and said plurality of entropy coding units which are provided in parallel every order to operate in pipelining every order;

wherein said pipeline control unit repeats processes such that, at a first cycle, a head character of the input character string is inputted to said plurality of occurrence frequency modeling units in parallel and a conditional appearance rate of each order is obtained in parallel and is outputted to each of said plurality of occurrence frequency modeling units corresponding to each order, and at second and subsequent cycles, the conditional appearance rate of each order obtained at said first cycle is inputted to said corresponding plurality of entropy coding units and is encoded to each code of the contents in a range from the large-order context to the small-order context and is outputted and, at the same time, a next character of said input character string is inputted to said plurality of occurrence frequency modeling units, and an occurrence frequency of each order is obtained in parallel and is outputted to each of said plurality of occurrence frequency modeling units corresponding to each order.

10. A data compression system according to claim 9, further comprising a pipeline control unit to enable said plurality of occurrence frequency modeling units and said plurality of entropy coding units, which are associated with orders and operated in parallel, to operate in pipelining in relation to the orders.

11. A data compression system according to claim 10, wherein said pipeline control unit enables pipelined reading, addition, and writing of the rank, the number of occurrences, the cumulative number of occurrences, and the total number of occurrences within a context, which are used to draw a conditional appearance rate and are stored in each of said occurrence frequency modeling units.

12. A data compression system according to claim 10, wherein said pipeline control unit enables parallel computation of a high level and a low level defining of an arithmetic code space.

13. A system according to claim 10, wherein in the case where the conditional appearance rate of each order is obtained by each of said plurality of occurrence frequency modeling units, said pipeline control unit permits an output of the conditional appearance rate obtained by the occurrence frequency modeling unit having the largest order and inhibits the output of the conditional appearance rates obtained by the other occurrence frequency modeling units having the small orders.

14. A data compression system according to claim 9, wherein said occurrence frequency modeling units each retrieve, register, and update information used to draw a conditional appearance rate as a rank, a number of occurrences, a cumulative number of occurrences, and a total number of occurrences within a context, and said entropy coding units carry out arithmetic coding.

15. A data restoration system for restoring a character from an input code in relation to a context of each order orderly from a large-order context that is an immediately preceding long character string to a small-order context that is an immediately preceding short character string, comprising:

a code separating unit to separate input codes into codes corresponding to characters having context of orders;

entropy decoding units, independently associated with orders, to operate in parallel in relation to the orders so as to obtain conditional appearance rates relative to the orders on the basis of codes, which correspond to characters having contexts of the orders and are separated by said separating unit, in relation to already-restored immediately preceding character strings that are contexts of the orders; and a plurality of occurrence frequency modeling units, each associated with orders and each having a frequency data storage unit in which the conditional appearance rate of an input character to be linked to an immediately preceding character string is registered for each character relative to each order, and operating in parallel with the other modeling units in relation to each order so as to restore a character by referencing said frequency data storage unit according to a conditional appearance rate relative to each order obtained by each of said plurality of entropy decoding units, and to update the contents of said frequency data storage unit; and a pipeline control unit to enable said plurality of entropy decoding units and said plurality of occurrence frequency modeling units which are provided in parallel every order to operate in pipelining every order;

wherein said pipeline control unit repeats processes such that, at a first cycle, a code of each order constructing a head code of the input code string separated by said code separating unit is inputted to said plurality of entropy decoding units in parallel and conditional appearance rates are obtained and are outputted to said plurality of occurrence frequency modeling units in parallel, and at second and subsequent cycles, the conditional appearance rate of each order obtained at said first cycle is inputted to said corresponding plurality of occurrence frequency modeling units, a character restored by a specific occurrence frequency modeling unit is outputted, and at the same time, a code of each order constructing a next code of the input code string separated by said code separating unit is inputted to said plurality of entropy decoding units in parallel, and conditional appearance rates are obtained and are outputted to said plurality of occurrence frequency modeling units in parallel.

16. A data restoration system according to claim 15, wherein said occurrence frequency modeling units each retrieve, register, and update information used to draw a conditional appearance rate as a rank, a number of occurrences, a cumulative number of occurrences, and a total number of occurrences within a context, and said entropy decoding units carry out arithmetic decoding.

17. A data restoration system according to claim 15, wherein said pipeline control unit enables parallel computation of a high level and a low level defining of an arithmetic code space.

18. A system according to claim 15, wherein said pipeline control unit permits an output of the conditional appearance rate obtained by said one or plurality of entropy decoding units corresponding to the codes of one or a plurality of orders separated by said code separating unit and inhibits an output of the other entropy decoding units.

19. A data restoration system according to claim 16, wherein said pipeline control unit enables pipelined reading, addition, and writing of the rank, the number of occurrences, the cumulative number of occurrences, and the total number of occurrences within a context, which are used to draw a conditional appearance rate and are stored in each of said occurrence frequency modeling units.

20. A data compression system for encoding word data of a plurality of bytes long word by word, comprising:

a byte array converting unit to separate word data byte by byte and to convert the separated word data into a byte data stream having a plurality of byte positions;

a plurality of probability statistical encoding units to encode input byte data items of the byte positions provided by said byte array converting unit on the basis of conditional appearance rates relative to encoded byte data items; and a merging unit to merge and output codes provided by said plurality of probability statistical encoding units in pipelining, wherein each of said probability statistical encoding units includes:

a plurality of occurrence modeling units, associated with orders, each having an updatable frequency data storage unit in which the conditional appearance rate of an input byte data item to be linked to an immediately preceding byte data stream is retrievable registered for each byte data item relative to a context of each order ranging from a high-order context (long byte data stream) to a low-order context (short byte data stream);

a plurality of entropy encoding units to encode byte data items on the basis of the conditional appearance rates relative to orders obtained by said plurality of occurrence frequency modeling units orderly from a high-order context to a low-order context; and a pipeline control unit to enable said plurality of occurrence frequency modeling units and entropy encoding units to operate in pipelining.

21. A data compression system according to claim 20, wherein said occurrence frequency modeling units each retrieve, register, and update information used to draw a conditional appearance rate as a rank, a number of occurrences, a cumulative number of occurrences, and a total number of occurrences within a context, and said entropy encoding units carry out arithmetic coding.

22. A data restoration system for restoring word data of a plurality of bytes long from codes, which have been produced by separating word data byte by byte and encoding input byte data items of byte positions on the basis of conditional appearance rates relative to encoded byte data items, comprising:

a code separating unit to separate codes corresponding to byte positions constituting the word data from an input code stream;

a plurality of probability statistical decoding units to restore byte data items from input codes corresponding to the byte positions, which have been separated by said code separating unit, on the basis of the conditional appearance rates relative to already-restored byte data items of the same byte positions as the input codes;

an output switching unit to arrange byte data items, which are restored by said plurality of probability statistical decoding units by byte position, and to output the restored byte data items as word data in pipelining, wherein each of said probability statistical decoding units includes:

a plurality of entropy decoding units to obtain conditional appearance rates on the basis of input codes in relation to already-restored immediately preceding byte data streams that are contexts of orders ranging from a large-order context to a small-order context orderly from the large-order context to the small-order context;

a plurality of occurrence frequency modeling units, associated with orders, each having a frequency data storage unit in which the conditional appearance rate of an input byte data item to be linked to an immediately preceding byte data stream is registered for each byte data item relative to each order, and a byte data item is restored by referencing said frequency data storage unit according to a conditional appearance rate relative to each order which is obtained by said entropy decoding unit and, by updating the contents of said frequency data storage unit; and a pipeline control unit to enable each of said entropy decoding units and each of said plurality of occurrence frequency modeling units to operate in pipelining.

23. A data restoration system according to claim 22, wherein said occurrence frequency modeling units each retrieve, register, and update information used to draw a conditional appearance rate as a rank, a number of occurrences, a cumulative number of occurrences, and a total number of occurrences within a context, and said entropy decoding units carry out arithmetic decoding.

* * * * *

UNITED STATES PATENT AND TRADEMARK OFFICE
CERTIFICATE OF CORRECTION

PATENT NO. : 6,026,198
DATED : 02/15/2000
INVENTOR(S) : Yoshiyuki OKADA

It is certified that error appears in the above-identified patent and that said Letters Patent is hereby corrected as shown below:

[56] References cited insert --5,418,532 5/1995 Lei 341/107
WO9519662 7/1995 Europe--

Col. 57, line 1, delete ","

Col. 57, line 50, delete ","

Col. 58, line 28, change "appearances" to --appearance--

Col. 60, line 67, change "retrievable" to --retrievably--

Signed and Sealed this

Sixth Day of February, 2001

Attest:

Q. TODD DICKINSON

*Attesting Officer*  *Director of Patents and Trademarks*